US011335872B2

(12) United States Patent
Adachi et al.

(10) Patent No.: US 11,335,872 B2
(45) Date of Patent: May 17, 2022

(54) ORGANIC LIGHT-EMITTING DEVICE

(71) Applicant: KYULUX, INC., Fukuoka (JP)

(72) Inventors: Junji Adachi, Fukuoka (JP); Ayataka Endo, Fukuoka (JP); Ping Kuen Daniel Tsang, Fukuoka (JP); Hidetoshi Fujimura, Fukuoka (JP); Kiyomasa Sueishi, Fukuoka (JP); Asuka Yoshizaki, Fukuoka (JP); Keiro Nasu, Fukuoka (JP)

(73) Assignee: KYULUX, INC., Fukuoka (JP)

( * ) Notice: Subject to any disclaimer, the term of this patent is extended or adjusted under 35 U.S.C. 154(b) by 618 days.

(21) Appl. No.: 16/305,180

(22) PCT Filed: Sep. 6, 2017

(86) PCT No.: PCT/JP2017/032083
§ 371 (c)(1),
(2) Date: Nov. 28, 2018

(87) PCT Pub. No.: WO2018/047853
PCT Pub. Date: Mar. 15, 2018

(65) Prior Publication Data

US 2021/0234113 A1 Jul. 29, 2021

(30) Foreign Application Priority Data

Sep. 6, 2016 (JP) ............................ JP2016-173412
Feb. 10, 2017 (JP) ............................ JP2017-022986

(51) Int. Cl.
*H01L 51/50* (2006.01)

(52) U.S. Cl.
CPC ........ *H01L 51/5004* (2013.01); *H01L 51/502* (2013.01); *H01L 51/5016* (2013.01);
(Continued)

(58) Field of Classification Search
CPC ............................ H01L 51/50; H01L 51/5056
See application file for complete search history.

(56) References Cited

U.S. PATENT DOCUMENTS

2014/0034927 A1 2/2014 Satoshi et al.
2014/0034930 A1* 2/2014 Seo .................... H01L 51/5056 257/40

(Continued)

FOREIGN PATENT DOCUMENTS

CN 105074951 A 11/2015
CN 105580153 A 5/2016

(Continued)

OTHER PUBLICATIONS

Office Action for Chinese Patent Application No. 201780032575.3, dated Dec. 17, 2019.

(Continued)

*Primary Examiner* — Alia Sabur
(74) *Attorney, Agent, or Firm* — Browdy and Neimark, PLLC

(57) ABSTRACT

An organic light emitting device having an exciton generation layer that contains a compound having a difference between the lowest excited singlet energy level $E_{S1}$ and the lowest excited triplet energy level $E_{T1}$ thereof of 0.3 eV or less, or an exciplex to emit delayed fluorescence, and a light emitting layer that contains a light emitting material has a high efficiency and a long lifetime.

18 Claims, 1 Drawing Sheet

(52) U.S. Cl.
CPC .... *H01L 51/5072* (2013.01); *H01L 2251/552* (2013.01); *H01L 2251/558* (2013.01)

(56) References Cited

U.S. PATENT DOCUMENTS

| | | | | |
|---|---|---|---|---|
| 2017/0163010 | A1* | 6/2017 | Nakanotani | H01L 51/5004 |
| 2017/0256733 | A1* | 9/2017 | Tsukamoto | H01L 51/5004 |
| 2020/0176692 | A1* | 6/2020 | Watabe | H01L 51/5064 |

FOREIGN PATENT DOCUMENTS

| | | | | |
|---|---|---|---|---|
| EP | 3 419 070 | A1 | 12/2018 | |
| JP | 2009087754 | A1 | 7/2009 | |
| JP | 2011249698 | A | 12/2011 | |
| JP | 2013116975 | A | 6/2013 | |
| JP | 2013-253121 | A | 12/2013 | |
| JP | 2013256490 | A | 12/2013 | |
| JP | 2014009224 | A | 1/2014 | |
| JP | 2014009352 | A | 1/2014 | |
| JP | 2014135466 | A | 7/2014 | |
| JP | 2015129240 | A | 7/2015 | |
| JP | 2016-92134 | A | 5/2016 | |
| TW | 201624791 | A | 7/2016 | |
| TW | 201628228 | A | 8/2016 | |
| WO | 2013/011954 | A1 | 1/2013 | |
| WO | 2013/011955 | A1 | 1/2013 | |
| WO | 2013/081088 | A1 | 6/2013 | |
| WO | 2013133359 | A1 | 9/2013 | |
| WO | 2013154064 | A1 | 10/2013 | |
| WO | 2013161437 | A1 | 10/2013 | |
| WO | 2014034535 | A1 | 3/2014 | |
| WO | 2014115743 | A1 | 7/2014 | |
| WO | 2014122895 | A1 | 8/2014 | |
| WO | 2014126200 | A1 | 8/2014 | |
| WO | 2014133121 | A1 | 9/2014 | |
| WO | 2014136758 | A1 | 9/2014 | |
| WO | 2014136860 | A1 | 9/2014 | |
| WO | 2014168101 | A1 | 10/2014 | |
| WO | 2014189122 | A1 | 11/2014 | |
| WO | 2014196585 | A1 | 12/2014 | |
| WO | 2014203840 | A1 | 12/2014 | |
| WO | 2015002213 | A1 | 1/2015 | |
| WO | 2015008580 | A1 | 1/2015 | |
| WO | 2015016200 | A1 | 2/2015 | |
| WO | 2015019725 | A1 | 2/2015 | |
| WO | 2015041157 | A1 | 3/2015 | |
| WO | 2015072470 | A1 | 3/2015 | |
| WO | 2015072537 | A1 | 5/2015 | |
| WO | 2015080182 | A1 | 6/2015 | |
| WO | 2015080183 | A1 | 6/2015 | |
| WO | 2015108049 | A1 | 7/2015 | |
| WO | 2015129714 | A1 | 9/2015 | |
| WO | 2015129715 | A1 | 9/2015 | |
| WO | 2015133501 | A1 | 9/2015 | |
| WO | 2015136880 | A1 | 9/2015 | |
| WO | 2015137136 | A1 | 9/2015 | |
| WO | 2015137202 | A1 | 9/2015 | |
| WO | 2015137244 | A1 | 9/2015 | |
| WO | 2015146541 | A1 | 10/2015 | |
| WO | 2015159541 | A1 | 10/2015 | |
| WO | 2016027760 | A1 | 2/2016 | |
| WO | 2016068877 | A1 | 5/2016 | |
| WO | WO-2016068277 | A1 * | 5/2016 | C09K 11/06 |

OTHER PUBLICATIONS

Japanese and English version of International Preliminary Report on Patentability for PCT/JP2017/032083, dated Mar. 12, 2109.
International Search Report and Search Opinion for PCT/JP2017/032083, dated Nov. 7, 2017.
Zhao et al., "Doping-free hybrid white organic light-emnitting diodes with fluorescent blue, phosphorescent green and red emission layers", Organic Electronics,pp. 207-211, vol. 27, (Oct. 2015).
Office Action dated Sep. 7, 2020 issued in the corresponding Chinese patent application No. 201780032575.3 with its English Machine Translation.
Zhang Peng et al., "-bianthracene-cored molecule enjoying twisted intramolecular charge transfer to enhance radiative-excitons generation for highly efficient deep-blue OLEDs", Organic Electronics, vol. 14,3, 2013.
Zhang et al., Preparation and properties of white phosphorescent OLEDs, Photoelectron and Laser, 25(3);425-428 (2014).
European Search Report dated Mar. 10, 2020 issued in the corresponding European patent application No. 17848791.4.
Office action dated Jun. 15, 2021, from corresponding Japanese Patent Application No. 2018-538435 with English machine translation.
Office action dated May 14, 2021, from corresponding aiwanese patent application No. 106130480.
Office Action dated Oct. 25, 2021 issued in corresponding Korean patent application No. 10-2019-7009627 with its English Machine Translation.
European Office action dated Jan. 4, 2022, from corresponding European Application No. 17 848 791.4.

* cited by examiner

[FIG. 1]
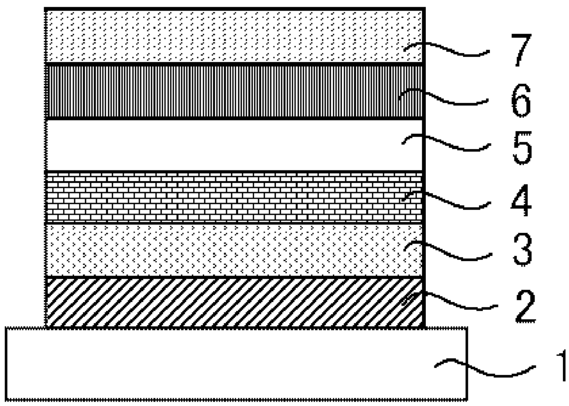
[FIG. 2]
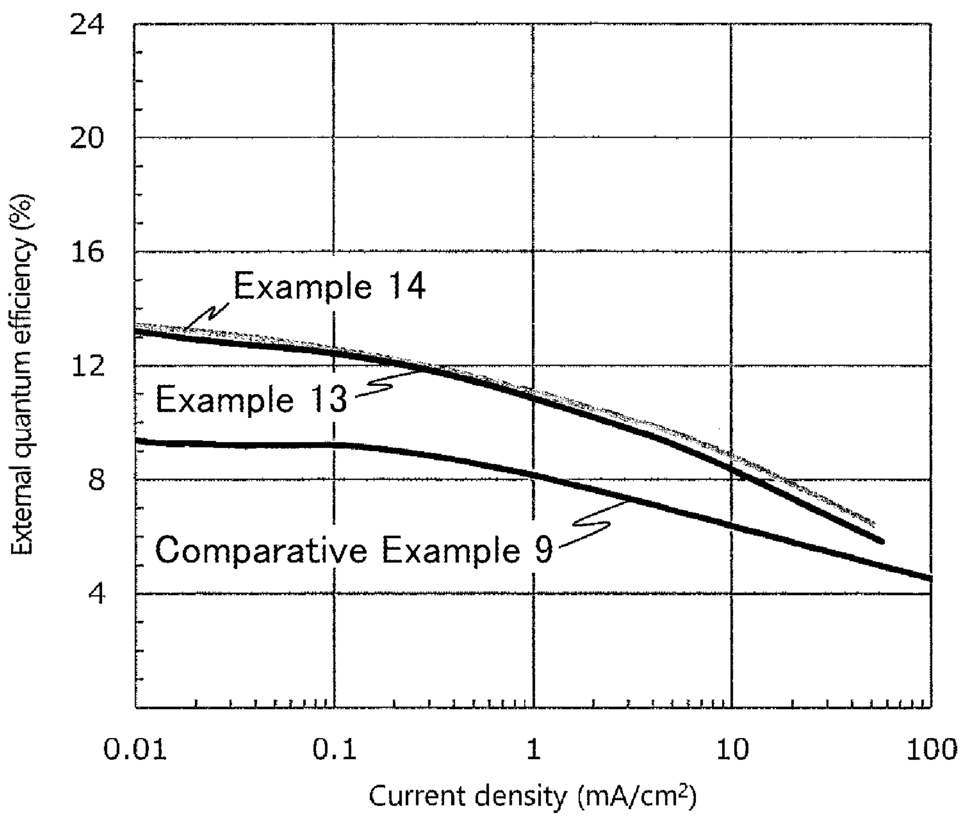

ORGANIC LIGHT-EMITTING DEVICE

TECHNICAL FIELD

The present invention relates to a high-efficiency long-life organic light emitting device.

BACKGROUND ART

Studies for enhancing the emission efficiency of organic light emitting devices such as organic electroluminescent devices (organic EL devices) are being made actively. For example, regarding materials for light emitting layers, studies relating to use of compounds capable of undergoing reverse intersystem crossing from an excited triplet state to an excited singlet state are being made actively. Under current excitation at room temperature, an ordinary fluorescent light emitting material forms singlet excitons and triplet excitons with a probability of 35/75, and the singlet excitons among them emit fluorescence through radiative deactivation to be in a ground singlet state, while the triplet excitons have a long lifetime and therefore lose energy through thermal radiation to undergo radiationless deactivation before transition to be in a ground state. Consequently, the energy of triplet excitons having a high generation efficiency could not be effectively used for emission. As opposed to this, in a compound capable of undergoing reverse intersystem crossing from an excited triplet state to an excited singlet state, the singlet excitons formed through reverse intersystem crossing from an excited triplet state to an excited singlet state can also emit fluorescence during transition to be in a ground singlet state, and therefore the energy of the triplet excitons having a high generation efficiency can be made to indirectly contribute toward fluorescence emission. Consequently, as compared with the case of using an ordinary fluorescent light emitting material not undergoing reverse intersystem crossing, the compound of the type can be expected to provide an extremely superior emission efficiency.

As an organic light emitting device using such a compound capable of undergoing reverse intersystem crossing, there have been proposed many examples having a single light emitting layer formed through co-evaporation of a thermally-activating delayed fluorescent material and a host material (for example, see PTLs 1 and 2). Here, the thermally-activating delayed fluorescent material is a compound that undergoes reverse intersystem crossing from an excited triplet state to an excited singlet state through absorption of heat energy, and with the compound, observation of fluorescence radiation from the singlet excitons directly excited from a ground singlet state therein is followed by delayed observation of fluorescence radiation from the singlet excitons formed through reverse intersystem crossing therein (delayed fluorescence radiation).

CITATION LIST

Patent Literature

PTL 1: JP 2013-256490 A
PTL 2: JP 2014-135466 A

SUMMARY OF INVENTION

Technical Problem

However, the present inventors actually produced the above-mentioned organic light emitting device having a light emitting layer of a single co-evaporated film composed of a thermally-activating delayed fluorescent material and a host material, and evaluated the device characteristics thereof, and have known that the efficiency of the device is low and the driving lifetime thereof is not sufficiently long, and there is room for further improvement of the device.

Given the situation, the present inventors have further made assiduous studies for the purpose of providing an organic light emitting device having a high efficiency and having a long driving lifetime.

Solution to Problem

As a result of assiduous studies, the present inventors have found that, using a layered configuration where an exciton generation layer containing a compound such that the difference $\Delta E_{ST}$ between the lowest excited single energy level $E_{S1}$ and the lowest excited triplet energy level $E_{T1}$ thereof is small is arranged on one side or both sides of a light emitting layer containing a light emitting material, an organic light emitting device capable of attaining a high efficiency and having a long driving lifetime can be realized. The present invention has been proposed on the basis of such findings, and has the following constitution.

[1] An organic light emitting device having an exciton generation layer containing a compound that satisfies the following expression (1) or an exciplex that emits delayed fluorescence, and a light emitting layer containing a light emitting material:

$$\Delta E_{ST} \leq 0.3 \text{ eV} \quad (1)$$

wherein $\Delta E_{ST}$ is a difference between the lowest excited singlet energy level $E_{S1}$ and the lowest excited triplet energy level $E_{T1}$ of the compound.

[2] The organic light emitting device according to [1], having an isolation layer between the exciton generation layer and the light emitting layer.

[3] The organic light emitting device according to [1] or [2], having the exciton generation layer on any one of the anode side or the cathode side of the light emitting layer.

[4] The organic light emitting device according to [1] or [2], having the exciton generation layer on both of the anode side and the cathode side of the light emitting layer.

[5] The organic light emitting device according to [4], having a first isolation layer between the light emitting layer and the exciton generation layer formed on the anode side than the light emitting layer, and having a second isolation layer between the light emitting layer and the exciton generation layer formed on the cathode side than the light emitting layer.

[6] The organic light emitting device according to [1] or [2], having the light emitting layer on each of the anode side and the cathode side of the exciton generation layer.

[7] The organic light emitting device according to [6], having a first isolation layer between the exciton generation layer and the light emitting layer formed on the anode side than the exciton generation layer, and having a second isolation layer between the exciton generation layer and the light emitting layer formed on the cathode side than the exciton generation layer.

[8] The organic light emitting device according to [5] or [7], wherein the first isolation layer and the second isolation layer contain a carrier transporting compound (provided that the carrier transporting compound is a compound differing from all of the compound satisfying the expression (1), the delayed fluorescence emitting exciplex and the light emitting material).

[9] The organic light emitting device according to any one of [1] to [8], wherein the light emitting layer contains a carrier transporting compound (provided that the carrier transporting compound is a compound differing from all of the compound satisfying the expression (1), the delayed fluorescence emitting exciplex and the light emitting material).

[10] The organic light emitting device according to any one of [1] to [9], wherein the exciton generation layer (or at least one exciton generation layer of plural exciton generation layers, if any) contains a carrier transporting compound (provided that the carrier transporting compound is a compound differing from all of the compound satisfying the expression (1), the delayed fluorescence emitting exciplex and the light emitting material).

[11] The organic light emitting device according to [10], wherein the light emitting layer and the exciton generation layer (or at least one exciton generation layer of plural exciton generation layers, if any) contain the same carrier transporting compound.

[12] The organic light emitting device according to any one of [9] to [11], which is so configured that the layer containing a carrier transporting compound is in direct contact with the anode side of the layer formed most closely to the anode side among the light emitting layer and the exciton generation layer.

[13] The organic light emitting device according to any one of [9] to [12], which is so configured that the layer containing a carrier transporting compound is in direct contact with the cathode side of the layer formed most closely to the cathode side among the light emitting layer and the exciton generation layer.

[14] The organic light emitting device according to any one of [1] to [13], wherein the light emitting layer contains a quantum dot.

[15] The organic light emitting device according to any one of [1] to [14], which emits delayed fluorescence.

Advantageous Effects of Invention

According to the invention, there can be realized an organic light emitting device having a high efficiency and having a markedly long lifetime.

BRIEF DESCRIPTION OF DRAWINGS

FIG. 1 This is a schematic cross-sectional view showing a layer configuration example of an organic electroluminescent device.

FIG. 2 This is a graph showing current density-external quantum efficiency characteristics of the organic electroluminescent devices of Comparative Example 9, Example 13 and Example 14.

DESCRIPTION OF EMBODIMENTS

The contents of the invention will be described in detail below. The constitutional elements may be described below with reference to representative embodiments and specific examples of the invention, but the invention is not limited to the embodiments and the examples. In the description, a numerical value range expressed using "A to B" denotes a range including numerical values before and after "to" as a minimum value and a maximum value, respectively. The hydrogen atom that is present in a molecule of the compound used in the invention is not particularly limited in isotope species, and for example, all the hydrogen atoms in the molecule may be $^{1}$H, and all or a part of them may be $^{2}$H (deuterium D).

The organic light emitting device of the present invention contains an exciton generation layer containing a compound that satisfies the following expression (1) or an exciplex that emits delayed fluorescence, and a light emitting layer containing a light emitting material.

$$\Delta E_{ST} \leq 0.3 \text{ eV} \quad (1)$$

In the expression (1), $\Delta E_{ST}$ is a difference between the lowest excited singlet energy level $E_{S1}$ and the lowest excited triplet energy level $E_{T1}$ of the compound.

An isolation layer may be formed between the exciton generation layer and the light emitting layer. Plural exciton generation layers may be formed in the device, in which the exciton generation layer may be formed on the anode side of the light emitting layer, or on the cathode side of the light emitting layer, or on both the anode side and the cathode side of the light emitting layer. In the case where the exciton generation layer is formed on both the anode side and the cathode side of the light emitting layer, the isolation layer may be formed only between the light emitting layer and the exciton generation layer on the anode side, or the isolation layer may be formed only between the light emitting layer and the exciton generation layer on the cathode side, or the isolation layer may be formed on both the anode side and the cathode side. Further in the present invention, the light emitting layer may be formed on both the anode side and the cathode side of the exciton generation layer. In this case, the isolation layer may be formed only between the exciton generation layer and the light emitting layer on the anode side, or the isolation layer may be formed only between the exciton generation layer and the light emitting layer on the cathode side, or the isolation layer may be formed between both the anode side and the cathode side.

Specifically, the organic light emitting device of the present invention has at least a layered configuration of "exciton generation layer/(isolation layer)/light emitting layer", or a layered configuration of "light emitting layer/(isolation layer)/exciton generation layer". Also the organic light emitting device may have a layered configuration of "exciton generation layer/(isolation layer)/light emitting laver/(isolation layer)/exciton generation layer", or a layered configuration of "light emitting layer/(isolation layer)/exciton generation layer/(isolation layer)/light emitting layer". Here, "/" indicates a boundary between layers, and means that the layers on both sides of "/" are layered. Regarding the expression of the layered configuration, the left side is the anode side and the right side is the cathode side. The layer described in "( )" (the parenthesized layer) is an optional layer. The same shall apply to "/" and "( )" in the layered configurations to be mentioned hereinunder.

In the organic light emitting device of the present invention, a compound satisfying the expression (1) or an exciplex that emits delayed fluorescence, and a light emitting material are contained in separate layers so as to have a layered configuration having, as arranged on one side or both side of a light emitting layer containing a light emitting material, an exciton generation layer containing a compound satisfying the expression (1) or an exciplex that emits delayed fluorescence, and consequently, the organic light emitting device of the present invention having such a layered configuration can realize a high efficiency and a long lifetime. In the following, the contents relating to discussion on the mechanism of attaining such a high efficiency are described.

Specifically, it is presumed that, when given excitation energy to be in an excited triplet state, the compound satisfying the expression (1) may undergo reverse intersystem crossing from the excited triplet state to an excited singlet state with a fixed probability since $\Delta E_{ST}$ thereof is small. On the condition that the compound satisfying the expression (1) and a light emitting material are made to coexist in a single light emitting layer, a part of the compound satisfying the expression (1) that has been in an excited triplet state could undergo to transition to be in an excited singlet state, but the other part of the compound satisfying the expression (1) that has been in an excited triplet state would deactivate since the excited triplet energy thereof may move toward the light emitting material owing to Dexter electron transfer. Here, the excited single energy of the compound satisfying the expression (1) that has transitioned to be in an excited singlet state through reverse intersystem crossing moves toward the light emitting material owing to Foerster mechanism or Dexter electron transfer so that the light emitting material transitions to be in an excited singlet state. With that, when deactivating to be in a ground singlet state, the light emitting material emits fluorescence and the light emitting layer thus emits light. On the other hand, the light emitting material having given excited triplet energy from the compound satisfying the expression (1) through Dexter electron transfer may transition to be in an excited triplet state, but the transition from the excited triplet state to the ground singlet state takes much time because it is spin-forbidden transition, and almost all light emitting materials would lose energy through thermal emission during the time to result in radiationless deactivation. Consequently, in the case where a compound satisfying the expression (1) and a light emitting material are made to coexist in a single light emitting layer, the excited triplet energy of another part of the compound satisfying the expression (1) and having been in an excited triplet state (that is, the excited triplet energy to transfer from the compound satisfying the expression (1) toward the light emitting material through Dexter electron transfer) could not be consumed for emission and the emission efficiency may be therefore low.

On the other hand, according to the present invention, a compound satisfying the expression (1) and a light emitting material are contained in separate layers, and therefore, the distance between the compound satisfying the expression (1) and the light emitting material can be long. Here, the energy transfer from a molecule in an excited triplet state to a molecule in a ground single state is forbidden in Foerster mechanism and may occur only in Dexter electron transfer, but the energy movable distance in Dexter electron transfer is 0.3 to 1 nm and is far shorter than the Foerster movable distance (1 to 10 nm). Consequently, when the distance between the compound satisfying the expression (1) and the light emitting material is long, the energy transfer from the compound satisfying the expression (1) and being in an excited triplet state to the light emitting material in a ground singlet state through Dexter electron transfer is markedly forbidden, and at that rate, the probability that the compound satisfying the expression (1) could undergo reverse intersystem crossing from the excited triplet state to an excited singlet state may increase. As a result, the proportion of the light emitting material that receives the excited singlet energy to emit fluorescence may increase and therefore the emission efficiency can increase. The above explains that the present invention realizes a high emission efficiency.

Basically owing to the same principle as above, the exciplex to emit delayed fluorescence can realize a high emission efficiency.

Further, the organic light emitting device of the present invention can be driven even at a low voltage and, in addition, the full width at half maximum of the emission peak thereof is narrow, and therefore the organic light emitting device is excellent in chromaticity and color purity.

In the following, the layered configuration containing the exciton generation layer and the light emitting layer and optionally the isolation layer that the organic light emitting device has are described in detail.

[Exciton Generation Layer]

The exciton generation layer contains a compound that satisfies the following expression (1) or an exciplex that emits delayed fluorescence:

$$\Delta E_{ST} \leq 0.3 \text{ eV} \quad (1)$$

The compound satisfying the expression (1) that the exciton generation layer contains may be one kind of a compound group satisfying the expression (1) or may be a combination of two or more kinds thereof. The compound may be a single compound or an exciplex. An exciplex is an associate of two or more different kinds of molecules (acceptor molecule and donor molecule), and, when given excitation energy, this is converted to be an excited state through electron transfer from one molecule to another molecule.

$\Delta E_{ST}$ in the expression (1) is a value to be calculated from $\Delta E_{ST}=E_{S1}-E_{T1}$ in which $E_{S1}$ is the lowest excited singlet energy level and $E_{T1}$ is the lowest excited triplet energy level of the compound.

(1) Lowest Excited Singlet Energy Level $E_{S1}$

A compound to be analyzed and mCP are co-evaporated in such a manner that the concentration of the compound to be analyzed could be 6% by weight to thereby prepare a sample having a deposited film with a thickness of 100 nm on an Si substrate. At room temperature (300 K), the fluorescent spectrum of the sample is measured. The emission immediately after excitation light incidence up to 100 nanoseconds after the light incidence is integrated to draw a fluorescent spectrum on a graph where the vertical axis indicates the emission intensity and the horizontal axis indicates the wavelength. The fluorescent spectrum indicates emission on the vertical axis and the wavelength on the horizontal axis. A tangent line is drawn to the rising of the emission spectrum on the short wavelength side, and the wavelength value λedge [nm] at the intersection between the tangent line and the horizontal axis is read. The wavelength value is converted into an energy value according to the following conversion expression to calculate $E_{S1}$.

$$E_{S1}[\text{eV}]=1239.85/\lambda\text{edge} \quad \text{Conversion Expression:}$$

For emission spectrum measurement, for example, a nitrogen laser (MNL200, by Lasertechnik Berlin Corporation) may be used as the excitation light source, and a streak camera (C4334, by Hamamatsu Photonics K.K.) may be used as a detector.

(2) Lowest Excited Triplet Energy Level $E_{T1}$

The same sample as that for measurement of the lowest excited singlet energy level $E_{S1}$ is cooled to 5 [K], and the sample for phosphorescence measurement is irradiated with excitation light (337 nm), and using a streak camera, the phosphorescence intensity thereof is measured. The emission in 1 millisecond after excitation light incidence up to 10 milliseconds after the light incidence is integrated to draw a phosphorescent spectrum on a graph where the vertical axis indicates the emission intensity and the horizontal axis indicates the wavelength. A tangent line is drawn to the rising of the phosphorescent spectrum on the short wavelength side, and the wavelength value λedge [nm] at the intersection between the tangent line and the horizontal axis is read. The wavelength value is converted into an energy value according to the following conversion expression to calculate $E_{T1}$.

$$E_{T1}[\text{eV}]=1239.85/\lambda\text{edge} \qquad \text{Conversion Expression:}$$

The tangent line to the rising of the phosphorescent spectrum on the short wavelength side is drawn as follows. While moving on the spectral curve from the short wavelength side of the phosphorescent spectrum toward the maximum value on the shortest wavelength side among the maximum values of the spectrum, a tangent line at each point on the curve toward the long wavelength side is taken into consideration. With rising thereof (that is, with increase in the vertical axis), the inclination of the tangent line increases. The tangent line drawn at the point at which the inclination value has a maximum value is referred to as the tangent line to the rising on the short wavelength side of the phosphorescent spectrum.

The maximum point having a peak intensity of 10% or less of the maximum peak intensity of the spectrum is not included in the maximum value on the above-mentioned shortest wavelength side, and the tangent line drawn at the point which is closest to the maximum value on the shortest wavelength side and at which the inclination value has a maximum value is referred to as the tangent lint to the rising on the short wavelength side of the phosphorescent spectrum.

Preferably, $\Delta E_{ST}$ of the compound satisfying the expression (1) is lower, and specifically, the value is preferably 0.3 eV or less, more preferably 0.2 eV or less, even more preferably 0.1 eV or less, and ideally 0 eV.

The compound satisfying the expression (1) is a compound heretofore known as a compound that emits delayed fluorescence, and as a result of measurement of $\Delta E_{ST}$ thereof, the compound having $\Delta E_{ST}$ of 0.3 e or less can be widely employed here.

Preferred examples of the compound that emits delayed fluorescence (delayed fluorescent material) usable herein include compounds described in paragraphs 0008 to 0048 and 0095 to 0133 in WO2013/154064, paragraphs 0007 to 0047 and 0073 to 0085 in WO2013/011954, paragraphs 0007 to 0033 and 0059 to 0066 in WO2013/011955, paragraphs 0008 to 0071 and 0118 to 0133 in WO2013/081088, paragraphs 0009 to 0046 and 0093 to 0134 in JP 2013-256490 A, paragraphs 0008 to 0020 and 0038 to 0040 in JP 2013-116975 A, paragraphs 0007 to 0032 and 0079 to 0084 in WO2013/133359, paragraphs 0008 to 0054 and 0101 to 0121 in WO2013/161437, paragraphs 0007 to 0041 and 0060 to 0069 in JP 2014-9352 A, and paragraphs 0008 to 0048 and 0067 to 0076 in JP 2014-9224 A, especially exemplified compounds therein. The patent publications described here are incorporated herein as a part of this description by reference.

Also, preferred examples of the compound that emits delayed fluorescence (delayed fluorescent material) usable herein include compounds described in JP 2013-253121 A, WO2013/133359, WO2014/034535, WO2014/115743, WO2014/122895, WO2014/126200, WO2014/136758, WO2014/133121, WO2014/136860, WO2014/1%585, WO2014/189122, WO2014/168101, WO2015/008580, WO2014/203840, WO2015/002213, WO2015/016200, WO2015/019725, WO2015/072470, WO2015/108049, WO2015/080182, WO2015/072537, WO2015/080183, JP 2015-129240 A, WO2015/129714, WO2015/129715, WO2015/133501, WO2015/136880, WO2015/137244, WO2015/137202, WO2015/137136, WO2015/146541, and WO2015/159541, especially exemplified compounds therein. The patent publications described here are incorporated herein as a part of this description by reference.

Specific examples of the compound satisfying the equation (1) are exemplified below. However, the compound satisfying the equation (1) usable in the present invention should not be limitatively interpreted by these specific examples.

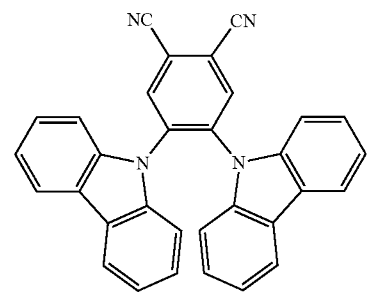

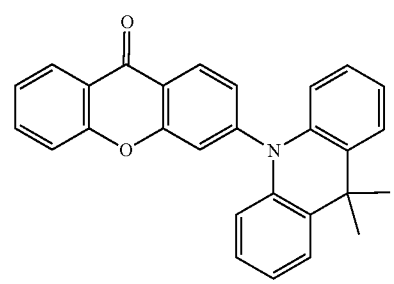

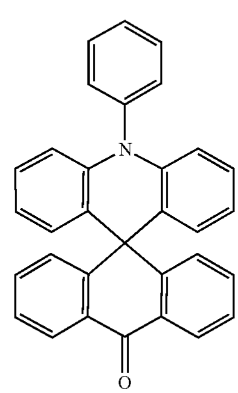

-continued
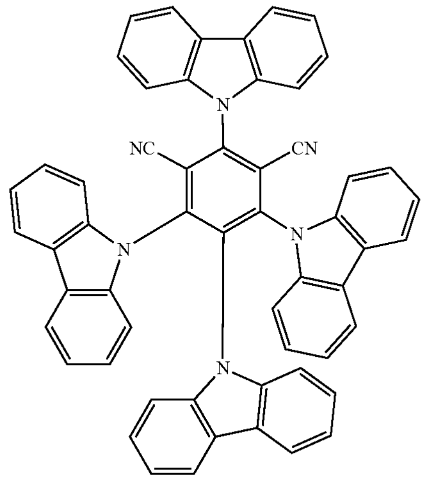
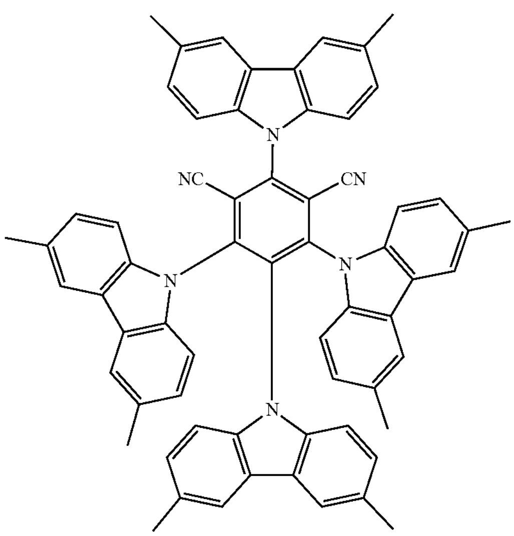
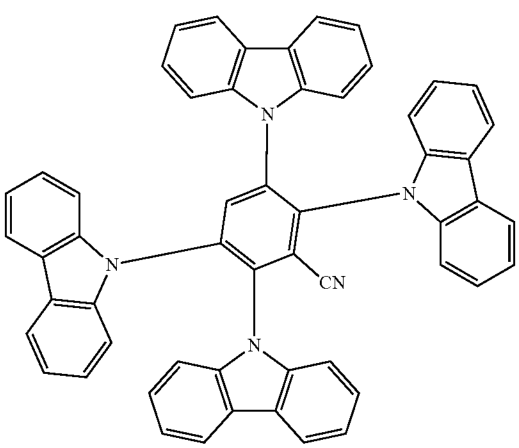
-continued
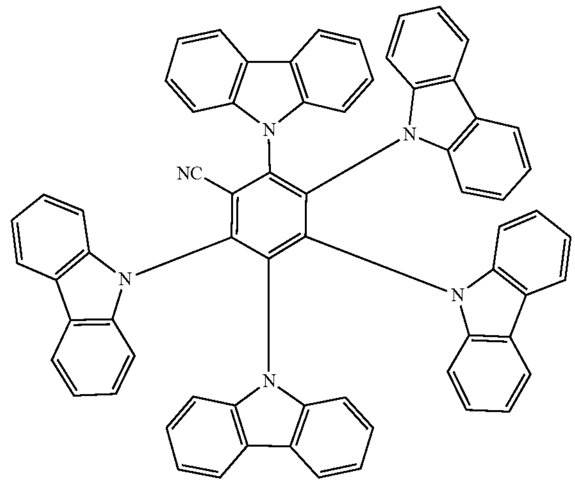
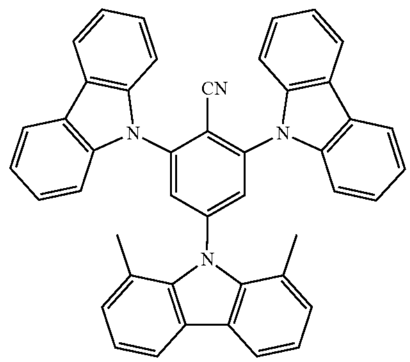
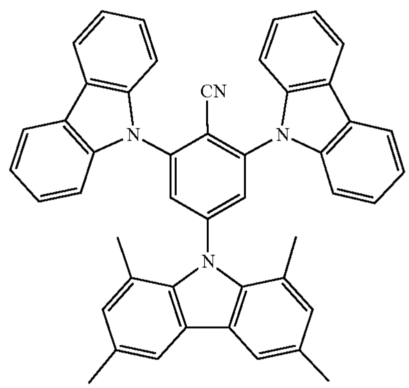
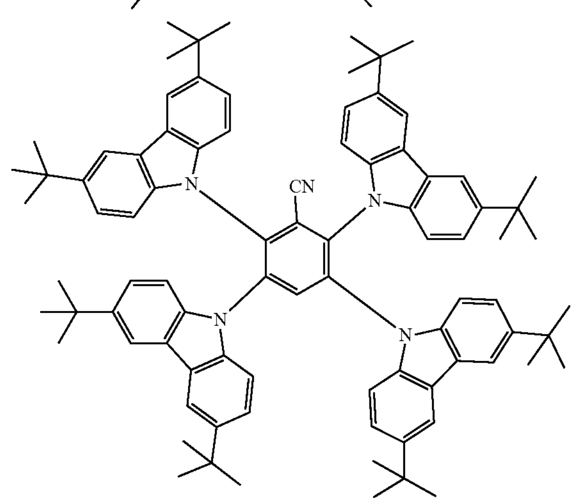

-continued
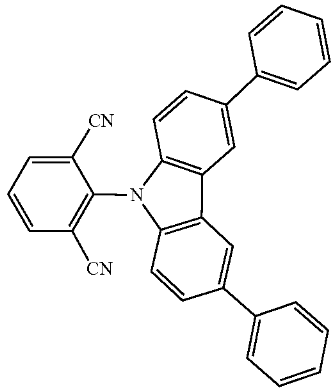
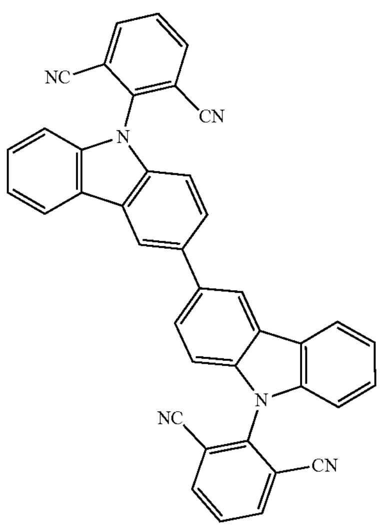
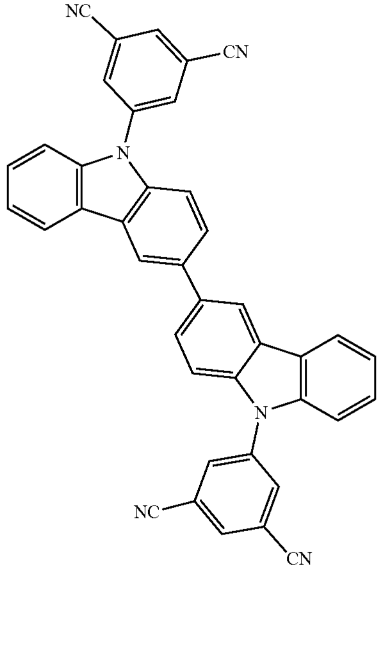
-continued
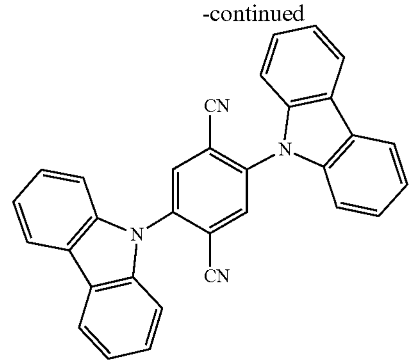
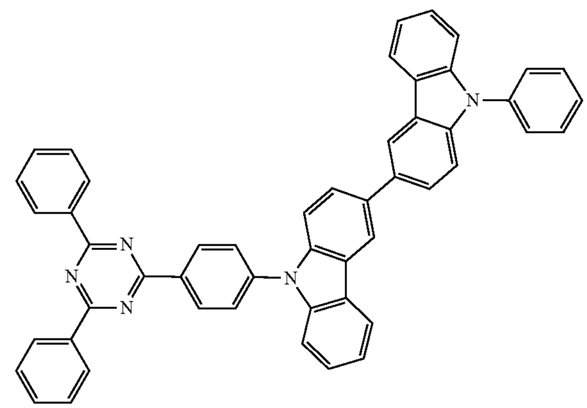
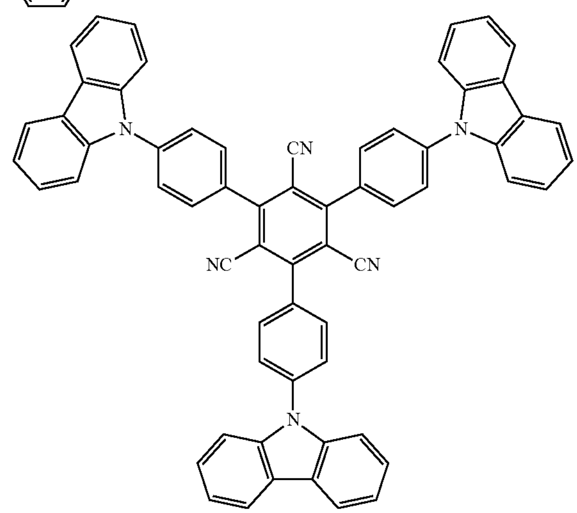
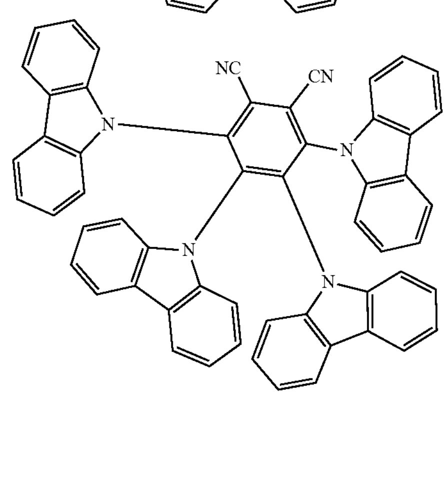

Further, compounds represented by the following general formulae (A) to (G) and satisfying the expression (1) are also favorably used in the exciton generation layer in the present invention.

First, the compounds represented by the general formula (A) are described.

General Formula (A)

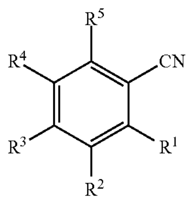

In the general formula (A), 0 to 4 of $R^1$ to $R^5$ each represent a cyano group, at least one of $R^1$ to $R^5$ represents a substituted amino group, and the remaining $R^1$ to $R^5$ each represent a hydrogen atom, or any other substituent than a cyano group and a substituted amino group.

Here, the substituted amino group is preferably a diarylamino group, and the two aryl groups constituting the diarylamino group may bond to each other to be, for example, a carbazolyl group. Any of $R^1$ to $R^5$ may be a substituted amino group, and for example, a combination of $R^1$, $R^3$ and $R^4$ or a combination of $R^2$ and $R^4$ may be preferably exemplified.

Regarding the compound group represented by the general formula (A) and specific examples of the compound, reference may be made to WO2015/080183 and WO2015/129715 that are incorporated herein as a part of this description by reference.

Next, the compounds represented by the general formula (B) are described. The general formula (B) and the general formula (C) are ones generalized as examples of preferred compound groups among those included in the general formula (A).

General Formula (B)

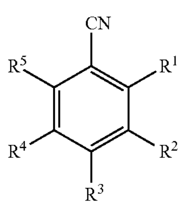

In the general formula (B), one or more of $R^1$, $R^2$, $R^3$, $R^4$ and $R^5$ each independently represent a 9-carbazolyl group having a substituent at at least one of 1-position and 8-position, a 10-phenoxazyl group having a substituent at at least one of 1-position and 9-position, or a 10-phenothiazyl group having a substituent at at least one of 1-position and 9-position. The remaining substituents each represent a hydrogen atom or a substituent, but the substituent is not a 9-carbazolyl group having a substituent at at least one of 1-position and 8-position, a 10-phenoxazyl group having a substituent at at least one of 1-position and 9-position, or a 10-phenothiazyl group having a substituent at at least one of 1-position and 9-position. One or more carbon atoms constituting each ring skeleton of the 9-carbazolyl group, the 10-phenoxazyl group and the 10-phenothiazyl group may be substituted with a nitrogen atom.

Specific examples (m-D1 to m-D9) of the "9-carbazolyl group having a substituent at at least one of 1-position and 8-position" that one or more of $R^1$, $R^2$, $R^3$, $R^4$ and $R^5$ represent are shown below.

m-D1

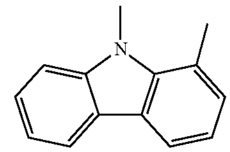

m-D2

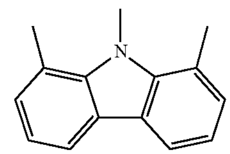

m-D3

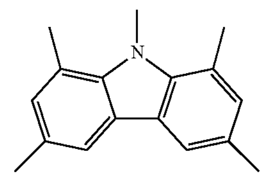

m-D4

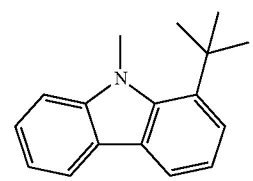

m-D5

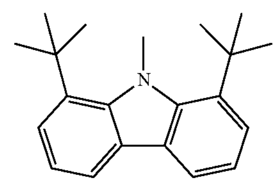

m-D6

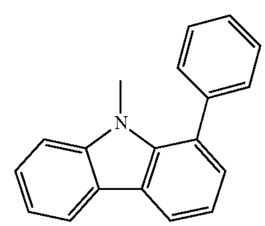

m-D7

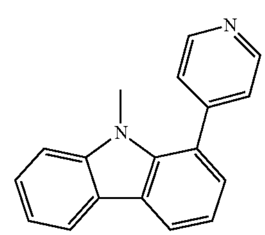

m-D8

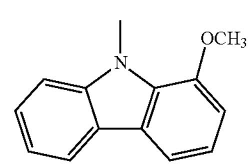

-continued
m-D9
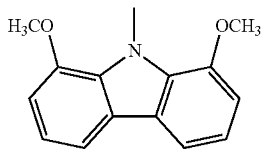
Specific examples (Cz, Cz-1 to Cz-12) of the "substituent" that the other groups than the above-mentioned "one or more" of $R^1$, $R^2$, $R^3$, $R^4$ and $R^5$ represent are shown below.
Cz
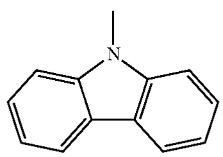
Cz1
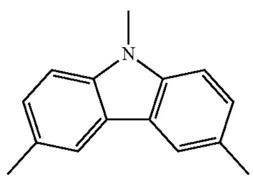
Cz2
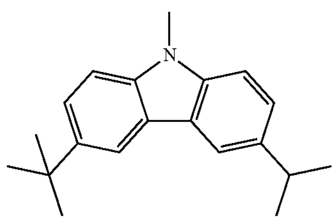
Cz3
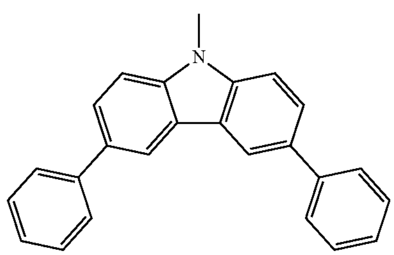
Cz4
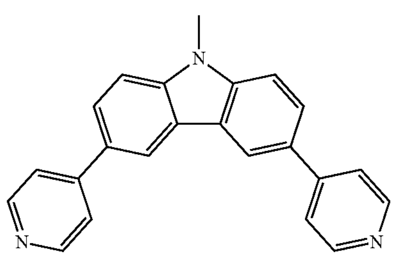
Cz5
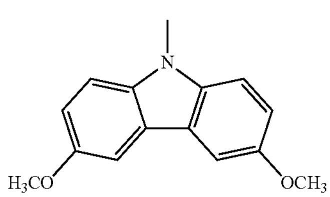
-continued
Cz6
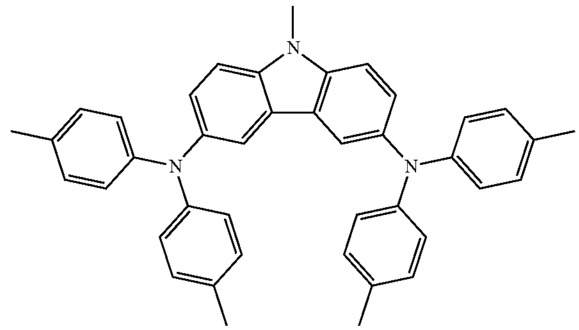
Cz7
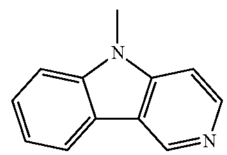
Cz8
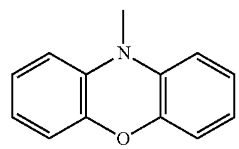
Cz9
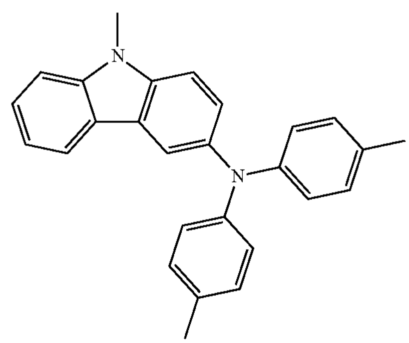
Cz10
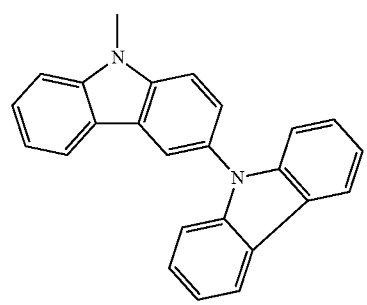
Cz11
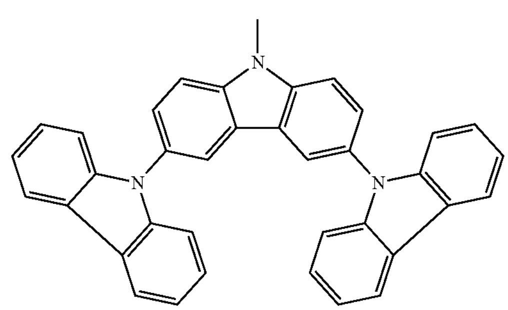

-continued

Cz12

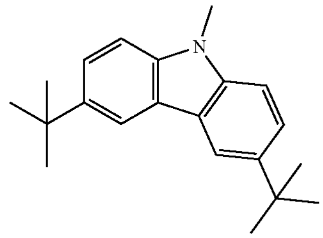

A specific example of the compounds represented by the general formula (B) is shown below.

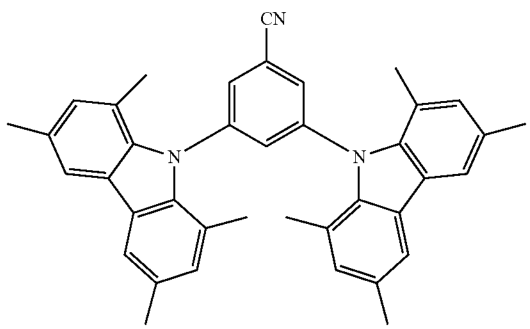

Next, the compounds represented by the following general formula (C) are described.

General Formula (C)

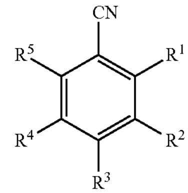

In the general formula (C), 3 or more of $R^1$, $R^2$, $R^4$ and $R^5$ each independently represent a substituted or unsubstituted 9-carbazolyl group, a substituted or unsubstituted 10-phenoxazyl group, a substituted or unsubstituted 10-phenothiazyl group, or a cyano group. The remaining substituents each represent a hydrogen atom or a substituent, but the substituent is not a substituted or unsubstituted 9-carbazolyl group, a substituted or unsubstituted 10-phenoxazyl group, or a substituted or unsubstituted 10-phenothiazyl group. One or more carbon atoms constituting each ring skeleton of the 9-carbazolyl group, the 10-phenoxazyl group and the 10-phenothiazyl group may be substituted with a nitrogen atom. $R^3$ each independently represents a hydrogen atom or a substituent, but the substituent is not a substituted or unsubstituted 9-carbazolyl group, a substituted or unsubstituted 10-phenoxazyl group, a cyano group, a substituted or unsubstituted 10-phenothiazyl group, a substituted or unsubstituted aryl group, a substituted or unsubstituted heteroaryl group or a substituted or unsubstituted alkynyl group.

Specific examples (D1 to D42) of $R^1$, $R^2$, $R^4$ and $R^5$ in the general formula (C) are shown below.

D1

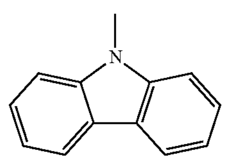

D2

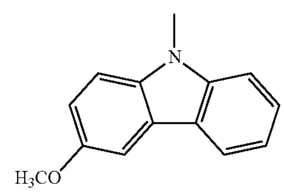

D3

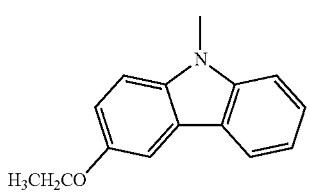

D4

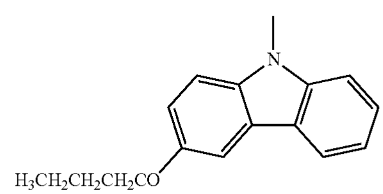

D5

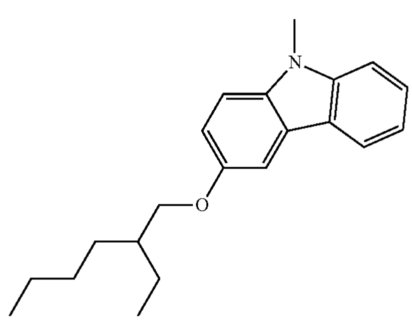

D6

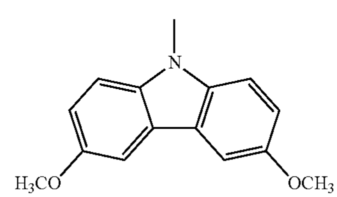

-continued
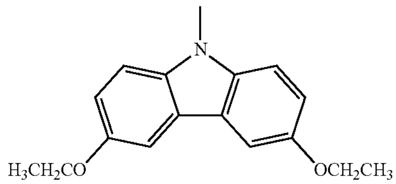
D7
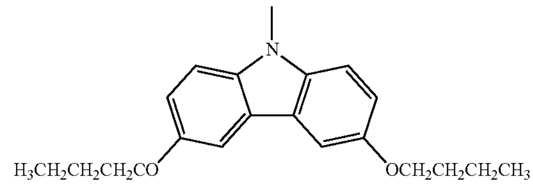
D8
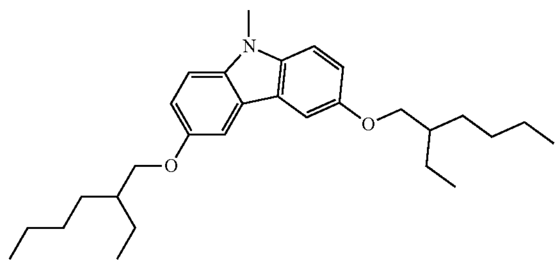
D9
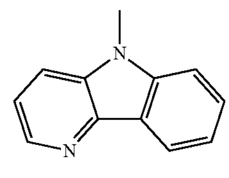
D10
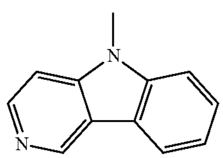
D11
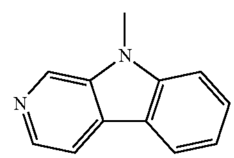
D12
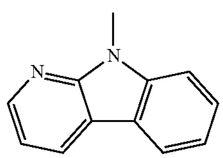
D13
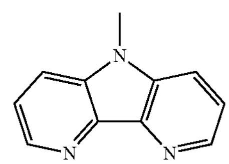
D14
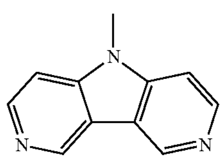
D15
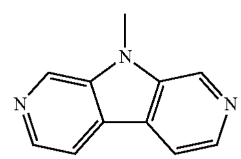
D16
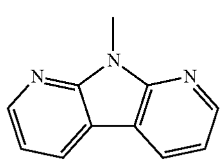
D17
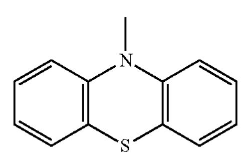
D18
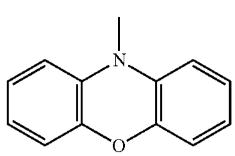
D19
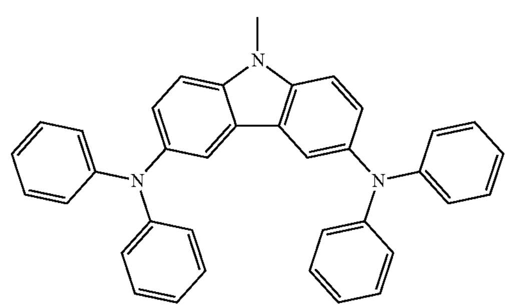
D20

-continued
D21
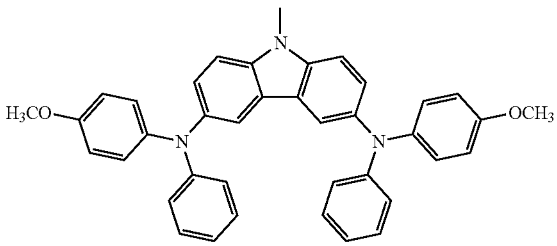
D22
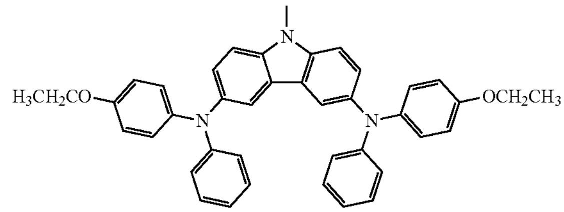
D23
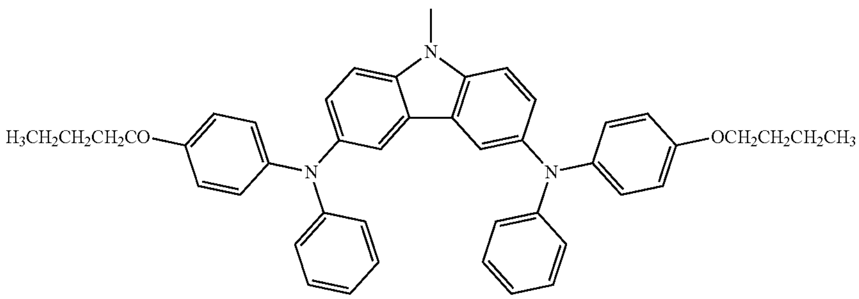
D24
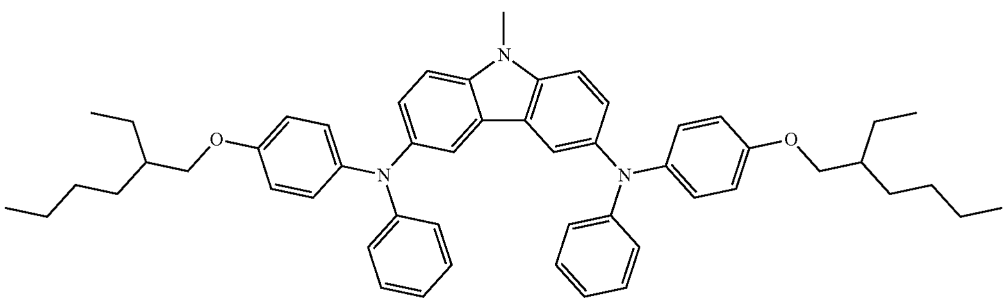
D25
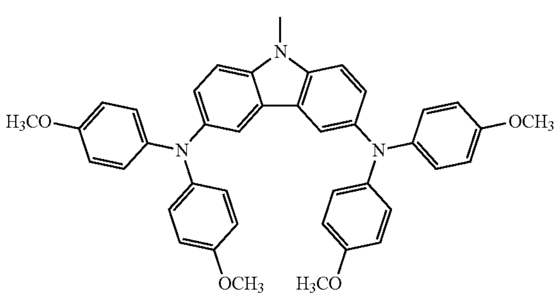
D26
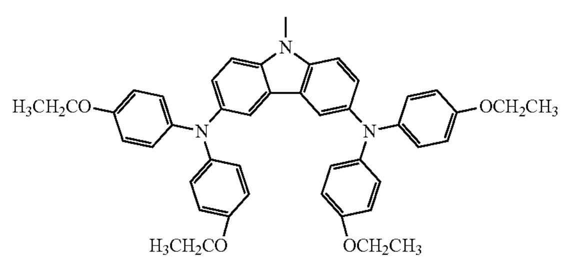
D27
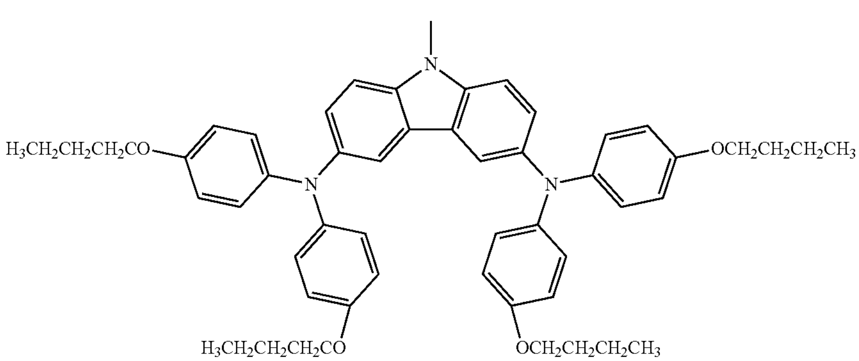

-continued
D28
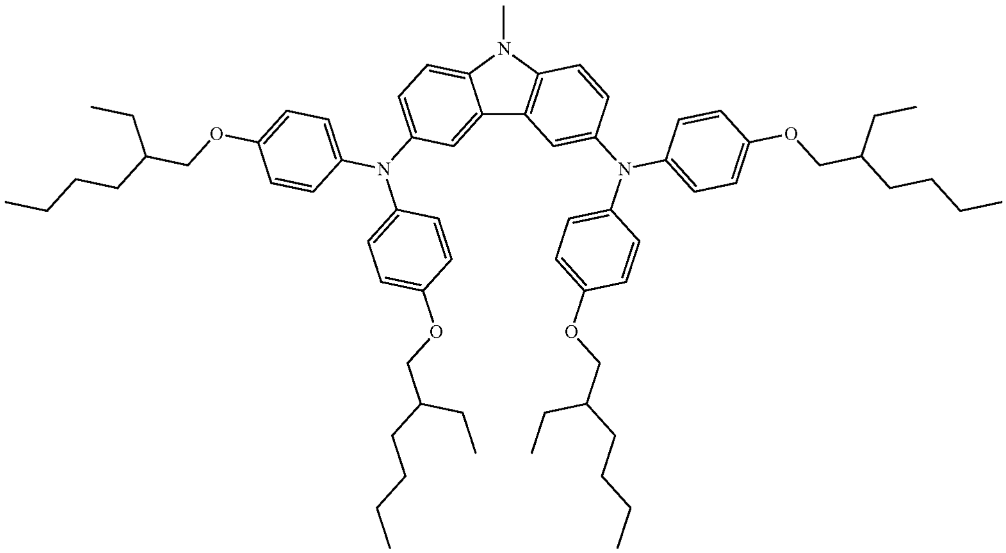
D29
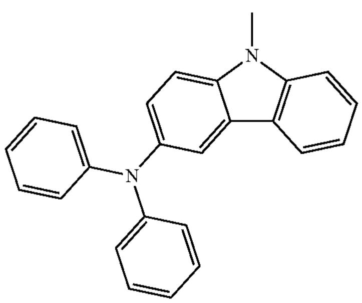
D30
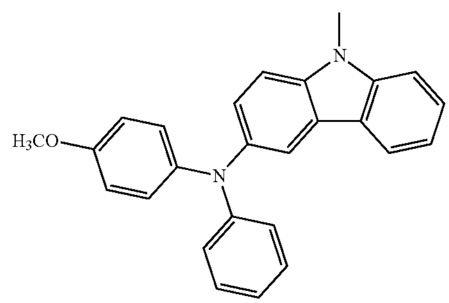
D31
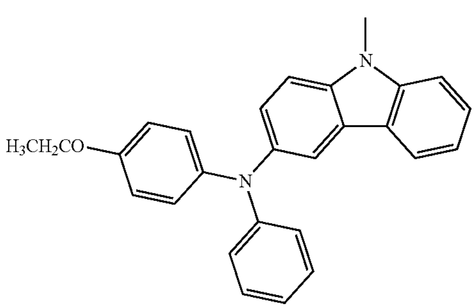
D32
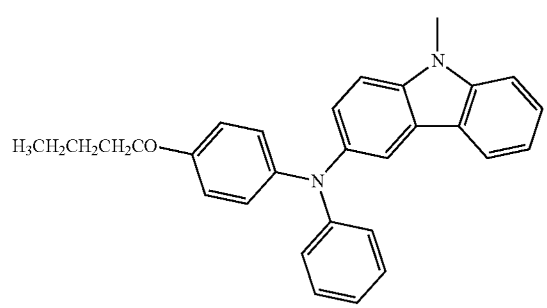
D33
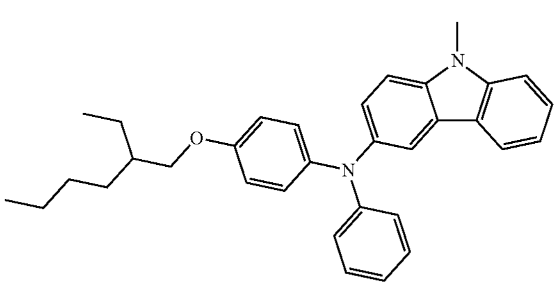
D34
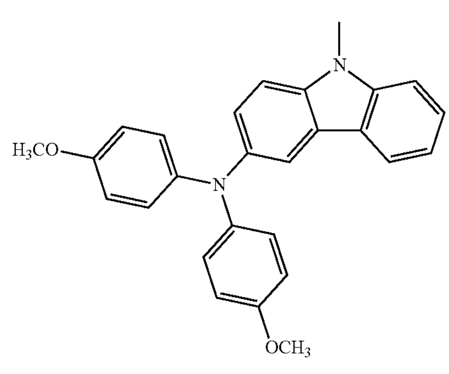

-continued
D35
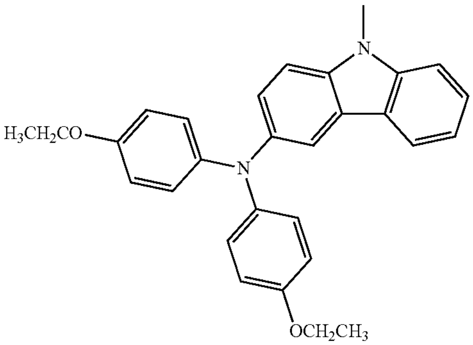
D36
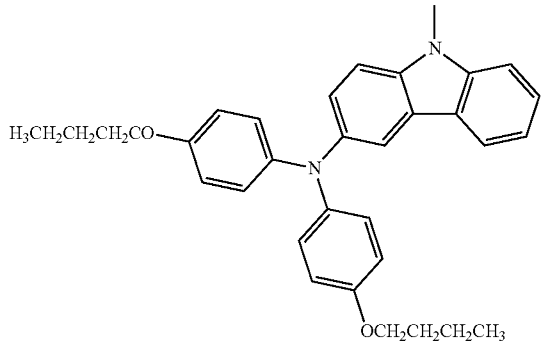
D37
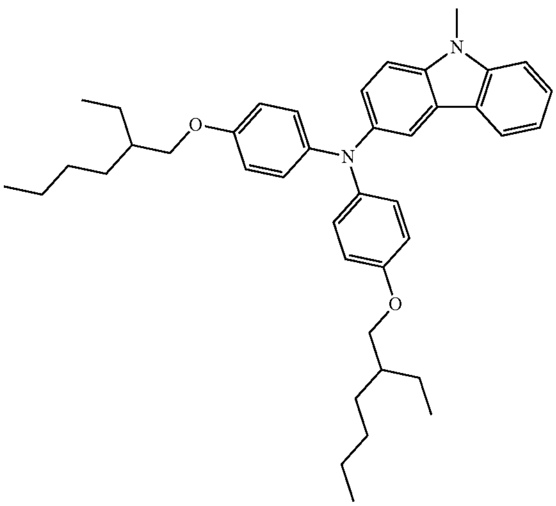
D38
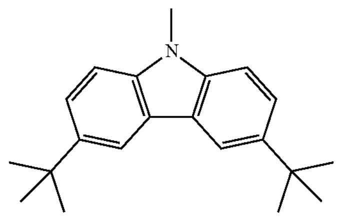
D39
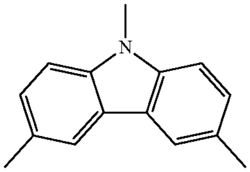
D40
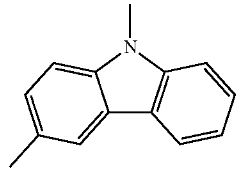
D41
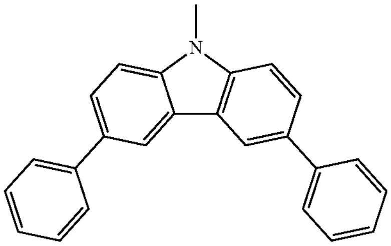
D42
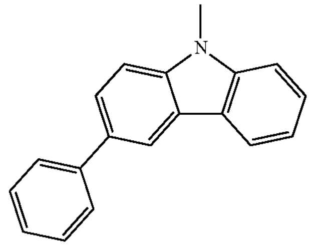

Specific examples of the compounds represented by the general formula (C) are shown below.

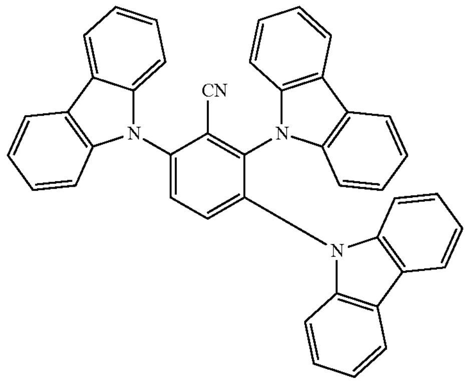

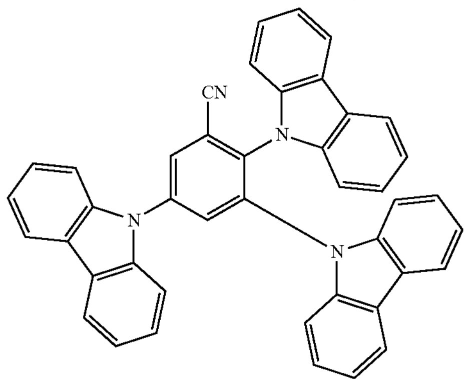

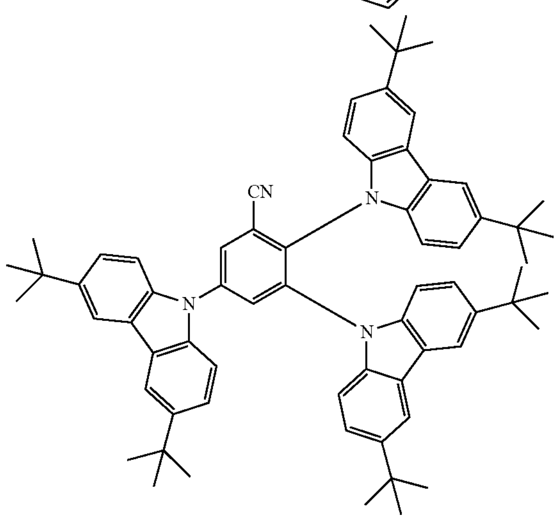

Next, the compounds represented by the general formula (D) are described.

General Formula (D)

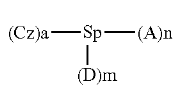

In the general formula (D):

Sp represents a benzene ring or a biphenyl ring.

Cz represents a 9-carbazolyl group having a substituent at at least one of 1-position and 8-position (here, at least one carbon atom at the 1- to 8-positions constituting the ring skeleton of the carbazole ring of the 9-carbazolyl group may be substituted with a nitrogen atom, but both the 1-position and the 8-position are not substituted with a nitrogen atom), D represents a substituent having a negative Hammett constant $\sigma_p$.

A represents a substituent having a positive Hammett constant $\sigma_p$ (but excepting a cyano group), a represents an integer of 1 or more, m represents an integer of 0 or more, n represents an integer of 1 or more, but a+m+n is not more than the maximum number of the substituents with which the benzene ring or the biphenyl ring represented by Sp may be substituted.

Specific examples (m-D1 to m-D14) of the "9-carbazolyl group having a substituent at at least one of 1-position and 8-position" that Cz represents are shown below.

m-D1

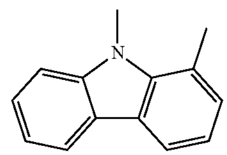

m-D2

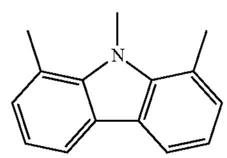

m-D3

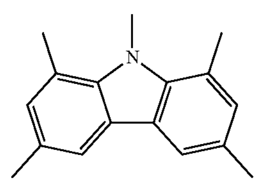

m-D4

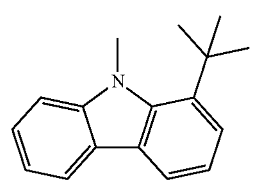

m-D5

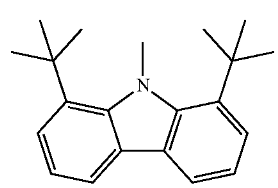

m-D6

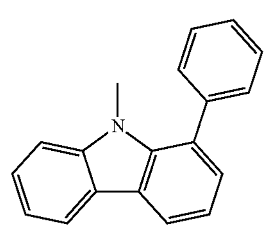

-continued
m-D7
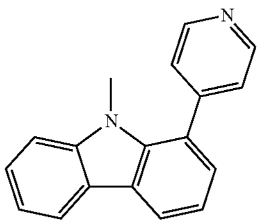
m-D8
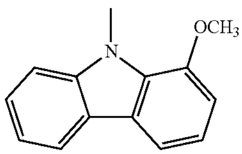
m-D9
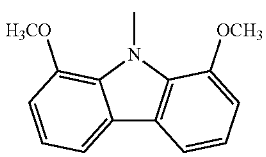
m-D10
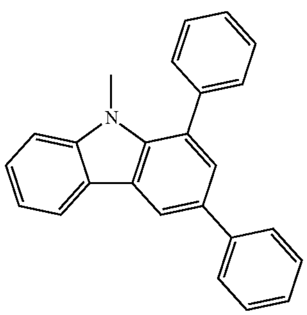
m-D11
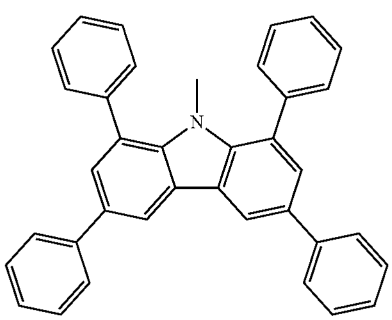
m-D12
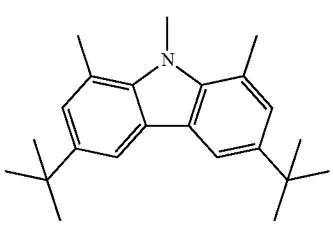
-continued
m-D13
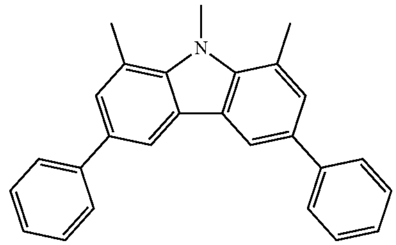
m-D14
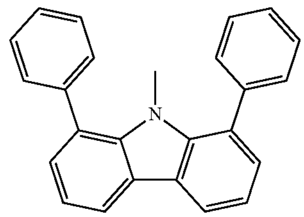
Specific examples (Cz, Cz-1 to Cz-12) of the substituent that D represents are shown below.
Cz
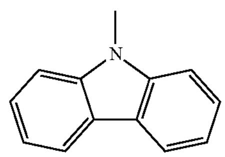
Cz1
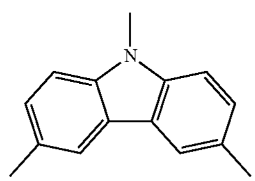
Cz2
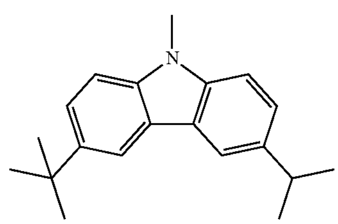
Cz3
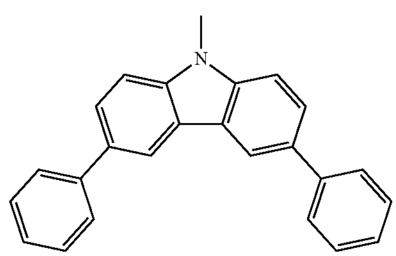

-continued
Cz4
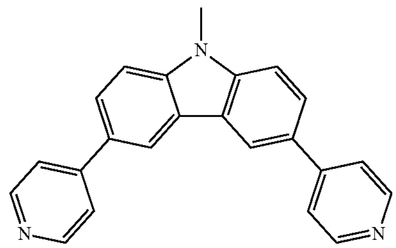
Cz5
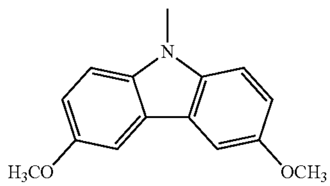
Cz6
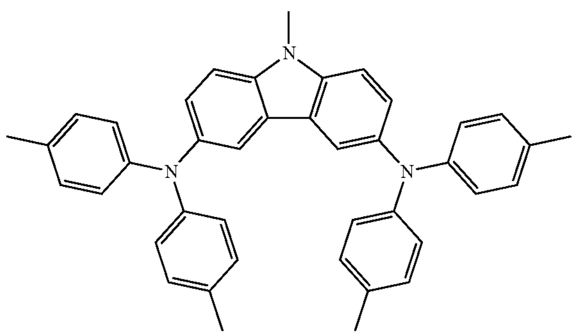
Cz7
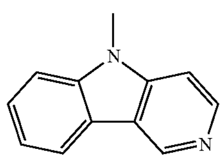
Cz8
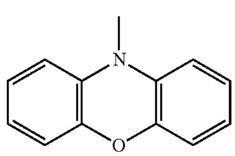
Cz9
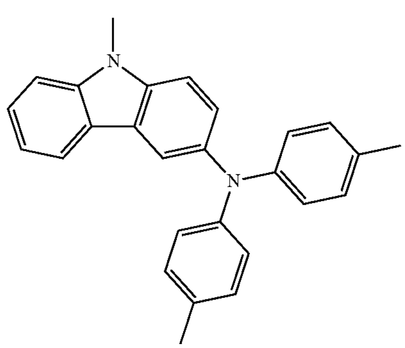
-continued
Cz10
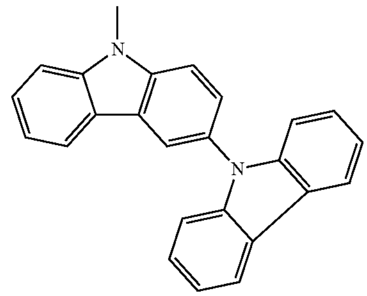
Cz11
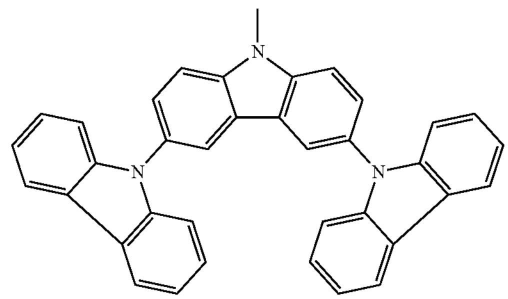
Cz12
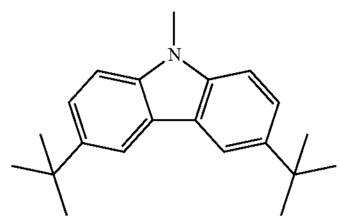
Specific examples (A-1 to A-77) of the substituent that A represents are shown below. * indicates a bonding position.
A-1
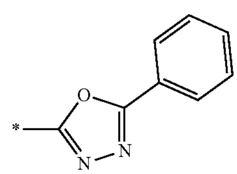
A-2
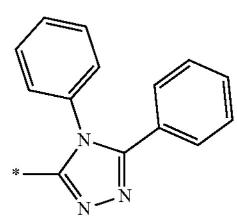
A-3
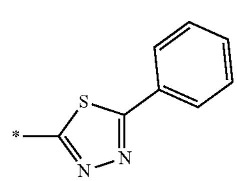

-continued
A-4
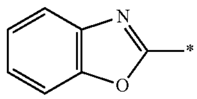
A-5
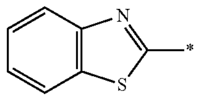
A-6
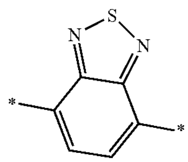
A-7
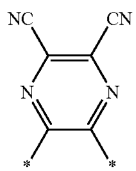
A-8
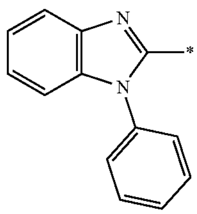
A-9
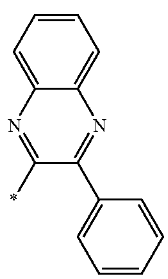
A-10
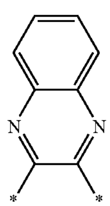
A-11
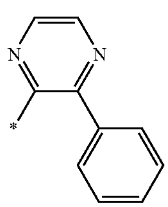
A-12
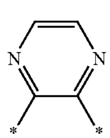
-continued
A-13
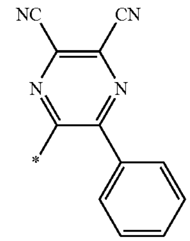
A-14
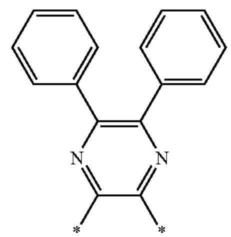
A-15
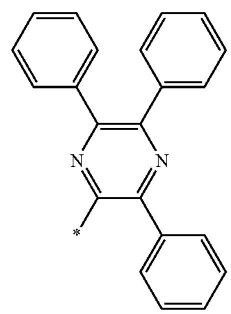
A-16
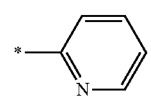
A-17
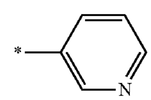
A-18
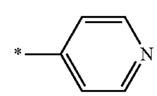
A-19
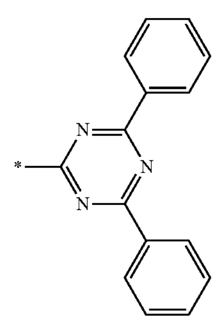

-continued
A-20
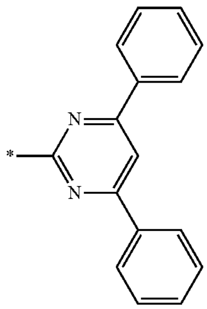
A-21
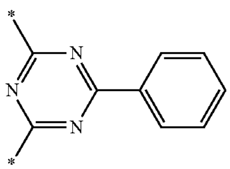
A-22
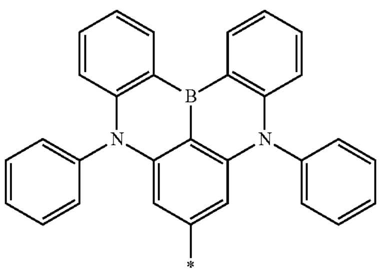
A-23
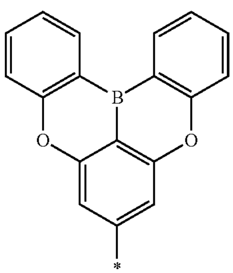
A-24
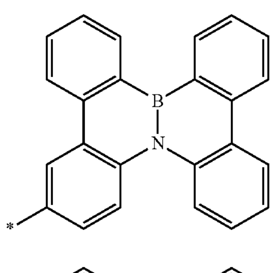
A-25
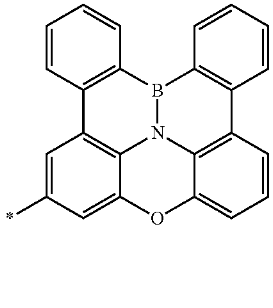
-continued
A-26
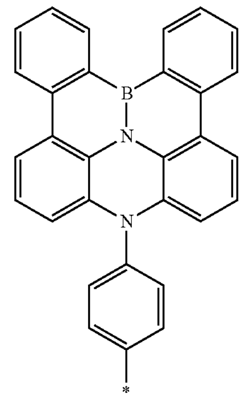
A-27
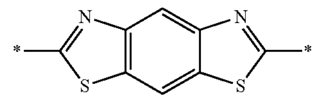
A-28
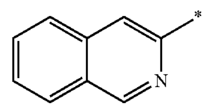
A-29
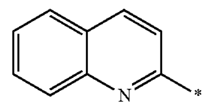
A-30
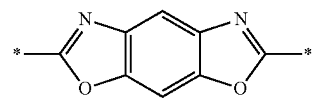
A-31
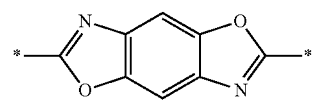
A-32
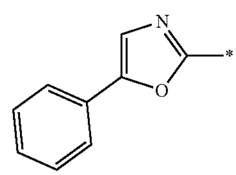
A-33
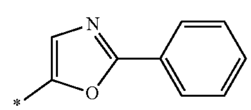
A-34
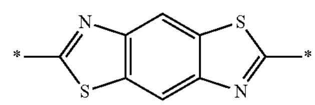
A-35
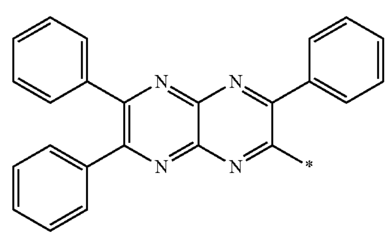

-continued
A-36
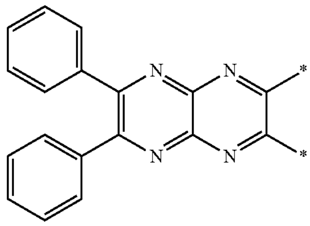
A-37
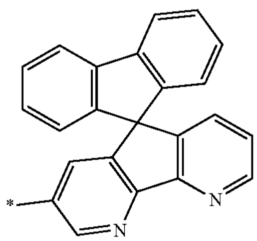
A-38
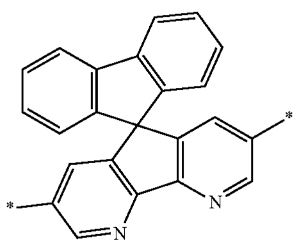
A-39
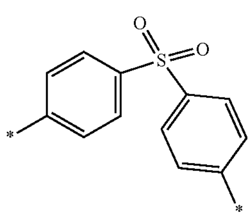
A-40
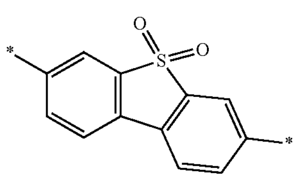
A-41
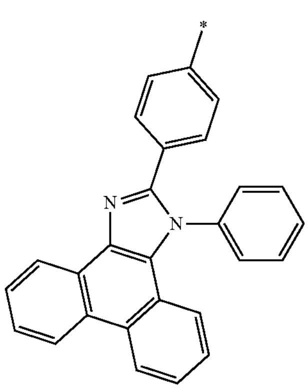
-continued
A-42
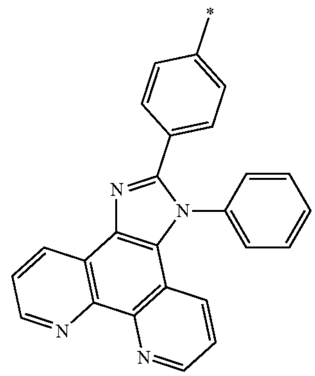
A-43
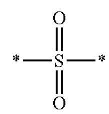
A-44
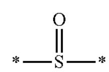
A-45
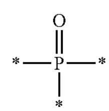
A-46
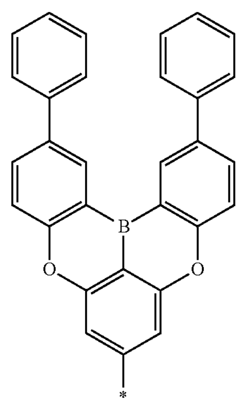
A-47
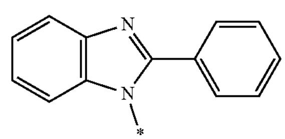
A-48
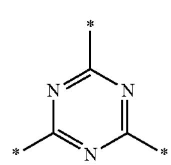
A-49
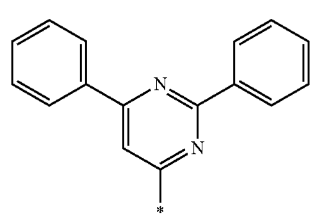

-continued
A-50
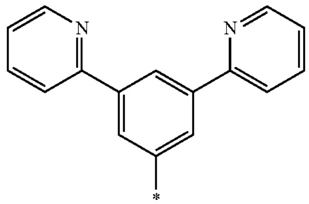
A-51
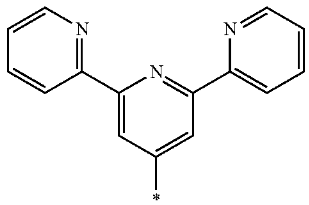
A-52
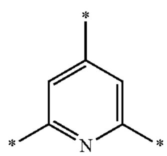
A-53
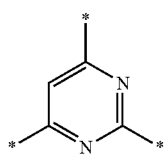
A-54
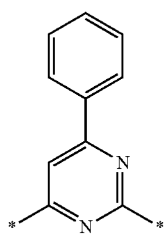
A-55
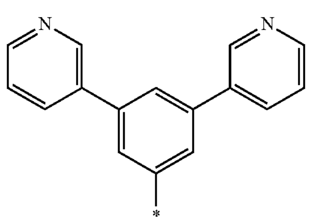
A-56
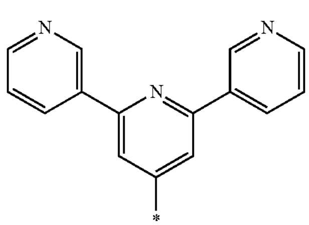
-continued
A-57
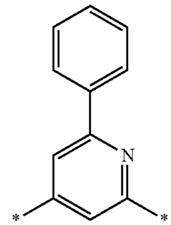
A-58
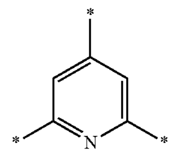
A-59
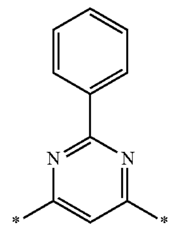
A-60
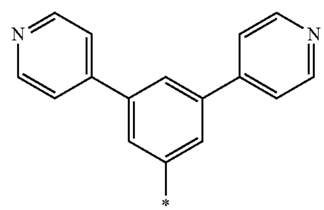
A-61
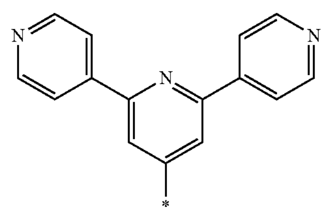
A-62
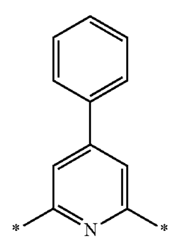
A-63
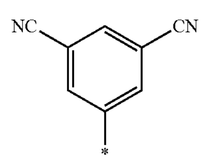
A-64
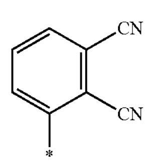

-continued

A-65

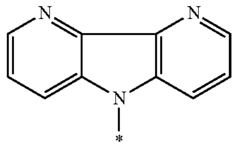

A-66

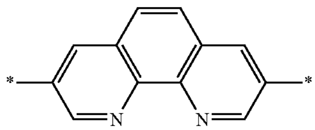

A-67

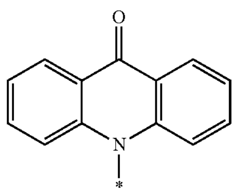

A-68

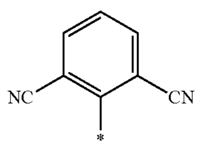

A-69

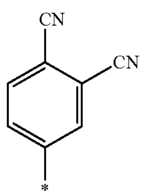

A-70

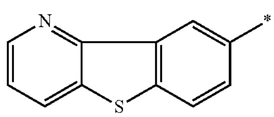

A-71

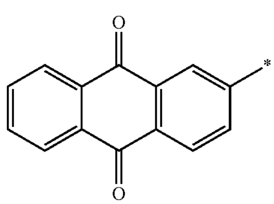

A-72

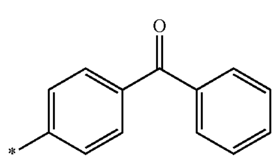

A-73

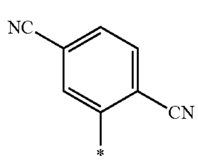

-continued

A-74

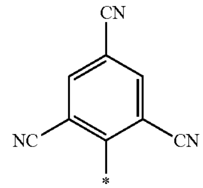

A-75

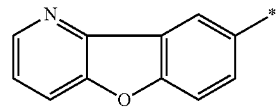

A-76

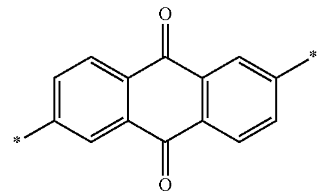

A-77

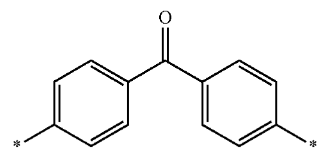

The compounds represented by the general formula (D) are preferably compounds represented by the following general formulae S-1 to S-18. $R^{11}$ to $R^{15}$, $R^{21}$ to $R^{24}$, and $R^{26}$ to $R^{29}$ each independently represent any of the substituent Cz, the substituent D or the substituent A. However, the general formulae S-1 to S-18 each have at least one substituent Cz and at least one substituent A in any of $R^{11}$ to $R^{15}$, $R^{21}$ to $R^{24}$, and $R^{26}$ to $R^{29}$ therein. $R^a$, $R^b$, $R^c$, and $R^d$ each independently represent an alkyl group. $R^a$'s, $R^b$'s, $R^c$'s, and $R^d$'s each may be the same as or different from each other.

S-1

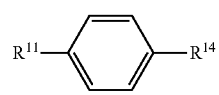

S-2

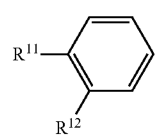

S-3

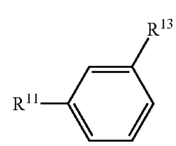

S-4

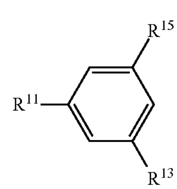

-continued
S-5
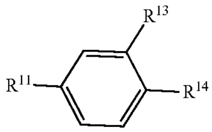
S-6
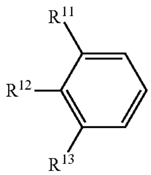
S-7
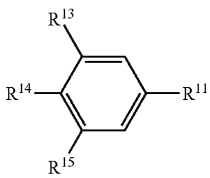
S-8
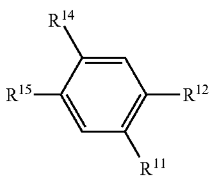
S-9
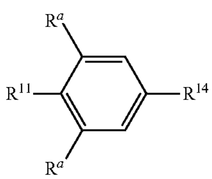
S-10
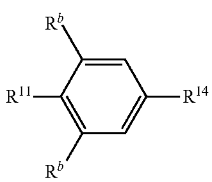
S-11
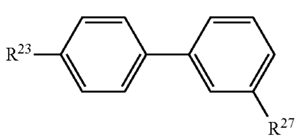
S-12
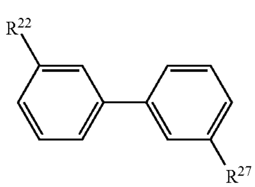
S-13
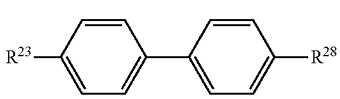
-continued
S-14
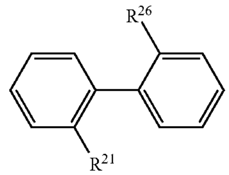
S-15
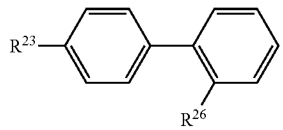
S-16
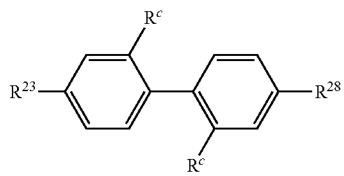
S-17
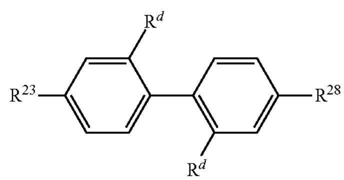
S-18
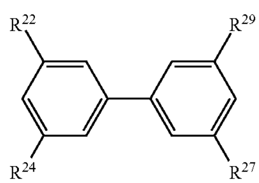
Specific examples of the compounds represented by the general formula (D) are described.
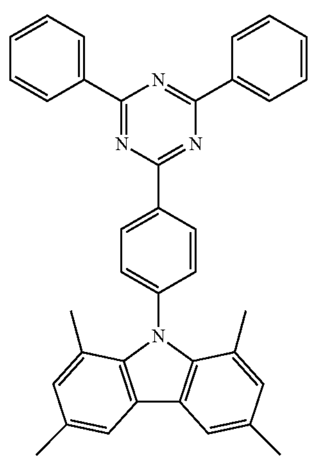

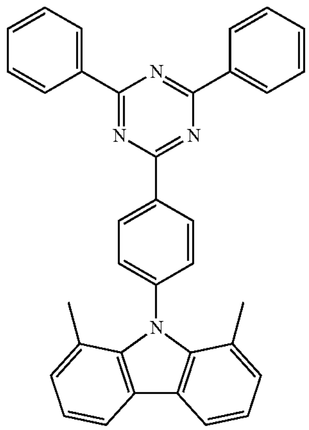

Next, the compounds represented by the general formula (E) are described.

General Formula (E)

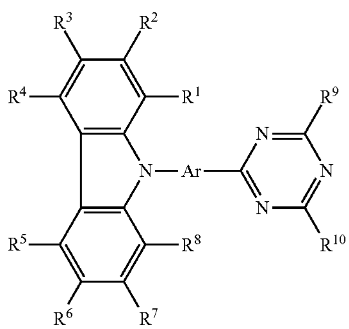

In the general formula (E):

Ar represents a substituted or unsubstituted phenylene group, a substituted or unsubstituted biphenyldiyl group, or a substituted or unsubstituted heteroarylene group.

$R^1$ to $R^{10}$ each represent a hydrogen atom or a substituent, and at least one of $R^1$ and $R^8$ is a substituent. At least one of $R^1$ and $R^8$ is a dibenzofuryl group or a dibenzothienyl group.

Specific examples of the carbazolyl group bonding to Ar in the general formula (E) are shown below.

m-D1

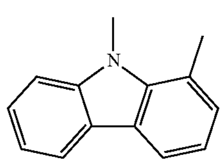

m-D2

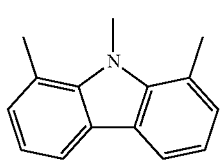

m-D3

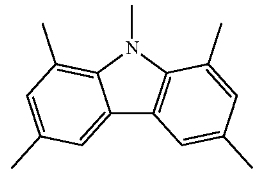

m-D4

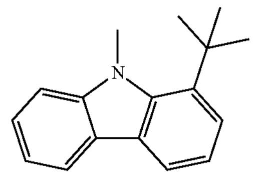

m-D5

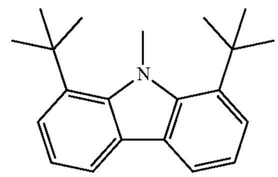

m-D6

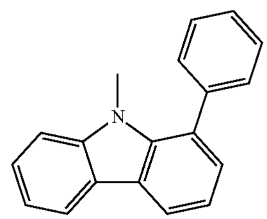

m-D7

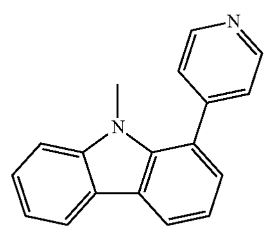

m-D8

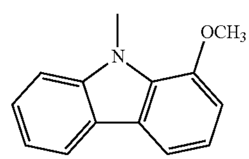

m-D9

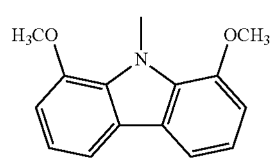

m-D10

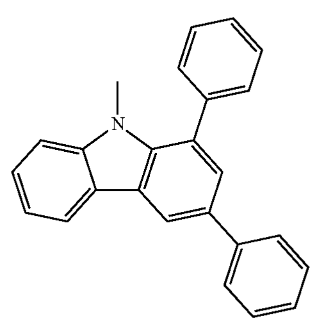

-continued
m-D11
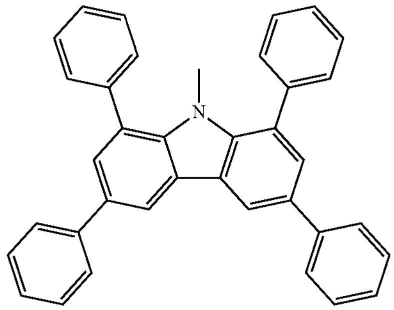
m-D12
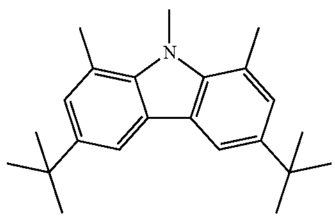
m-D13
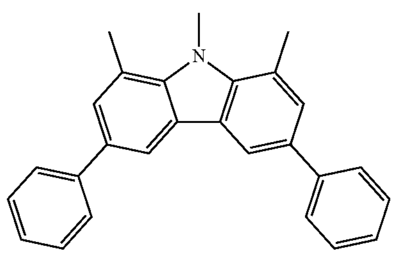
m-D14
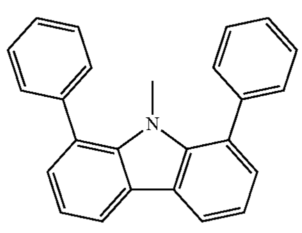
Specific examples of the compounds represented by the general formula (E) are shown below. In the following, X represents O or S.
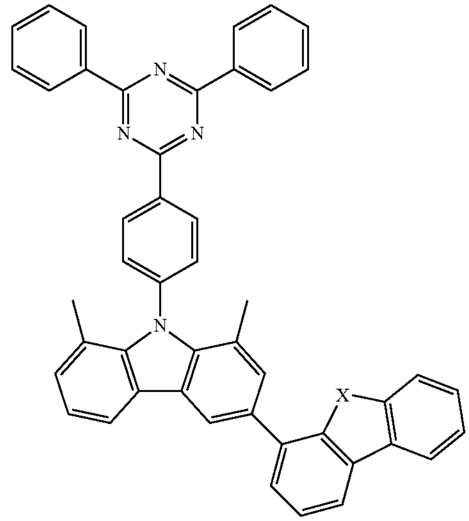
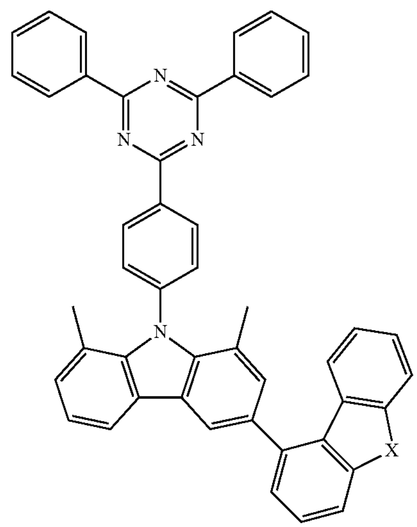
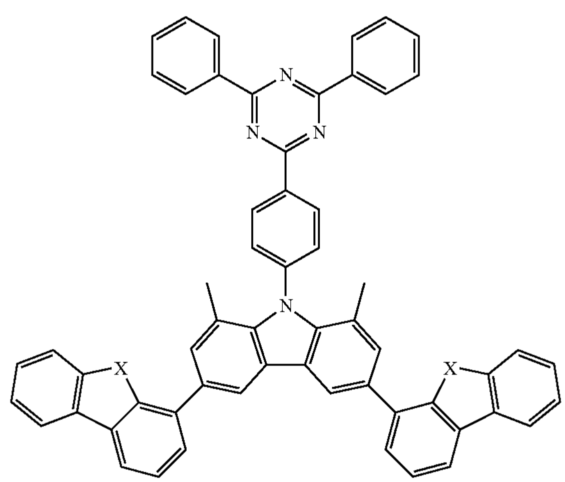

-continued

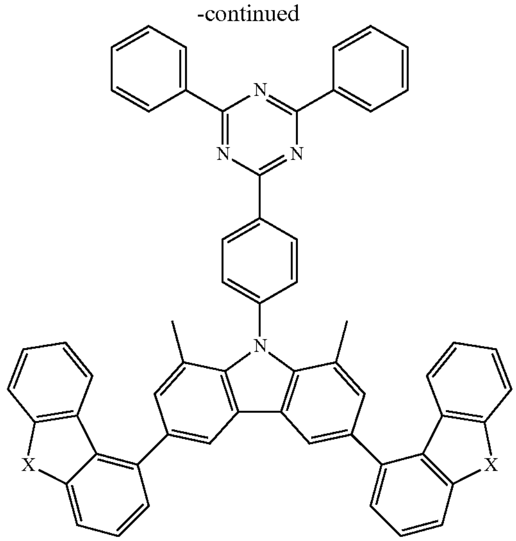

The compounds represented by the general formula (F) are described.

General Formula (F)

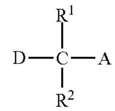

In the general formula (F), $R^1$ and $R^2$ each independently represents a fluoroalkyl group. D represents a substituent having a negative Hammett constant $\sigma_p$, and A represents a substituent having a positive Hammett constant $\sigma_p$.

As specific examples of the substituent that A includes, there are mentioned the specific examples (A-1 to A-77) of the substituent that A in the general formula (D) represents.

Specific examples of the compounds represented by the general formula (F) are shown below.

COMPOUND 1

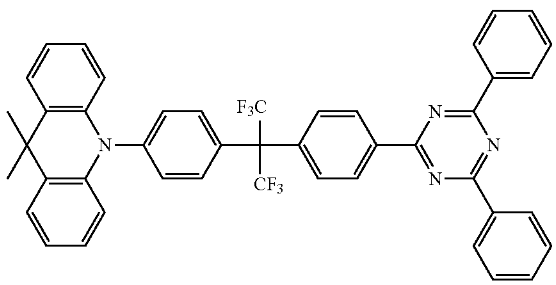

COMPOUND 2

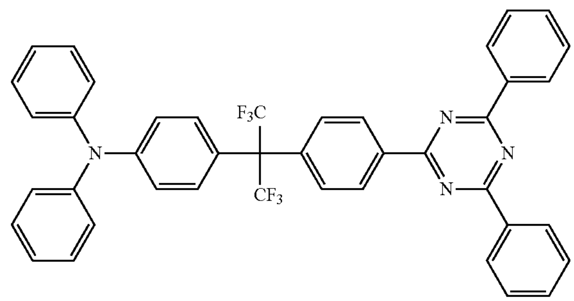

COMPOUND 3

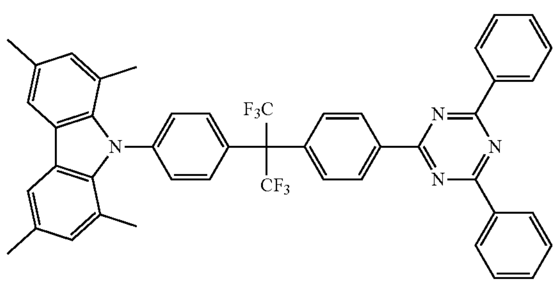

COMPOUND 4

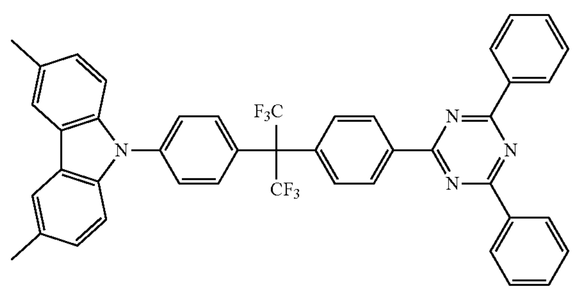

COMPOUND 5

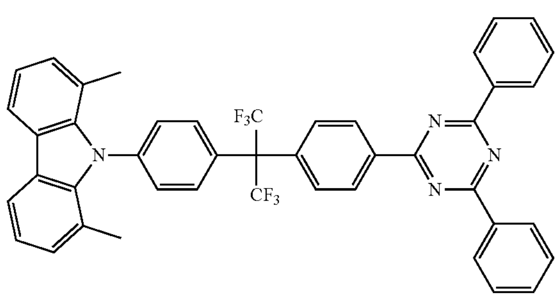

COMPOUND 6

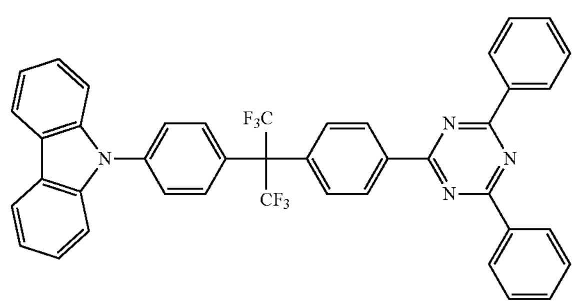

-continued
COMPOUND 7
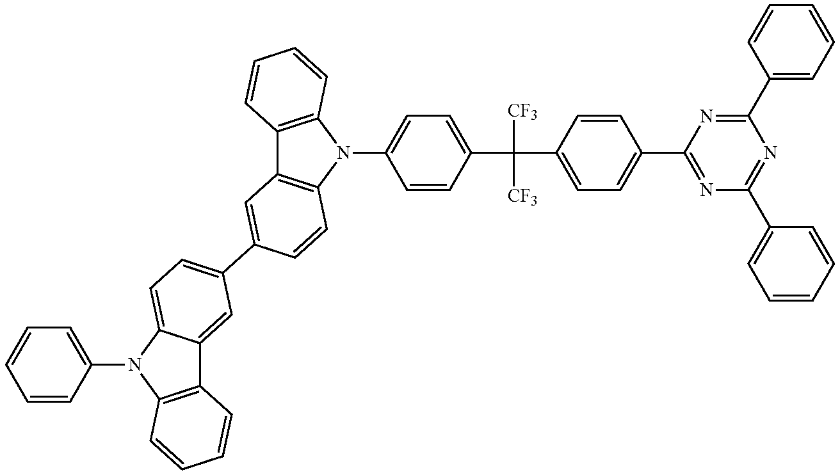
COMPOUND 8
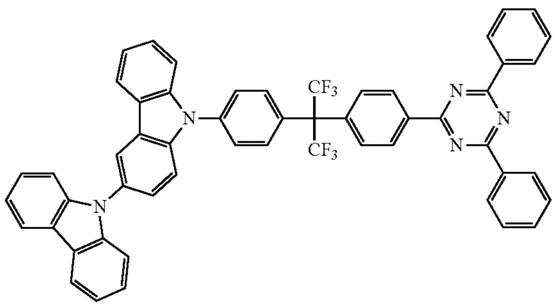
COMPOUND 9
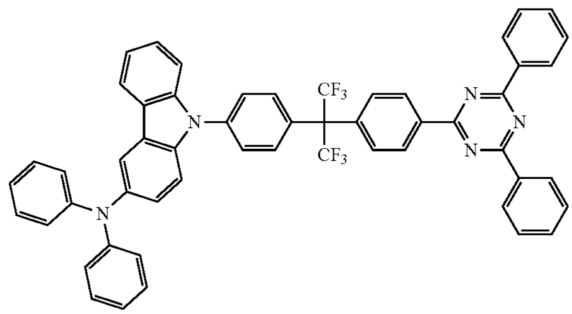
COMPOUND 10
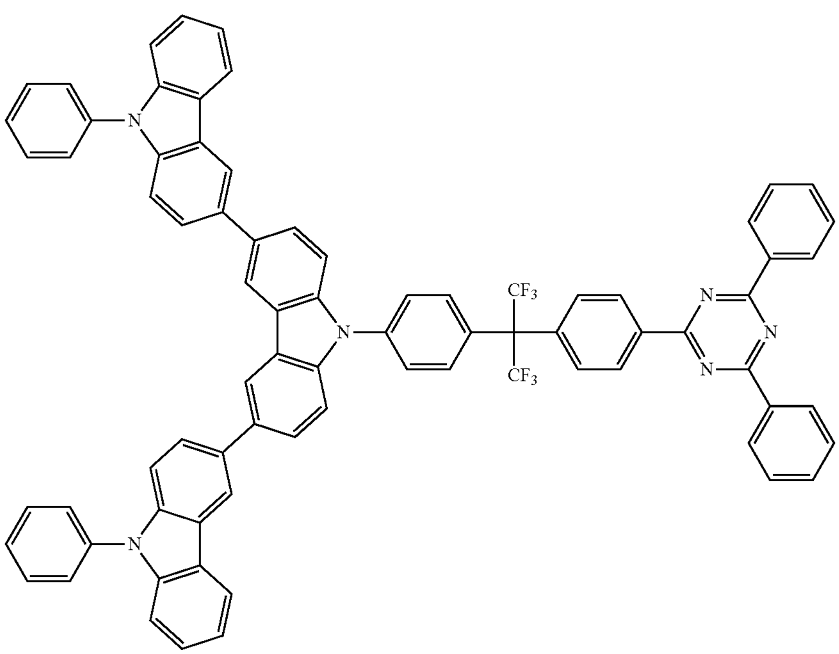

-continued
COMPOUND 11
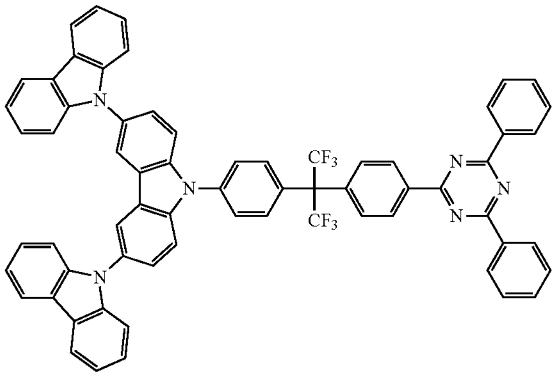
COMPOUND 12
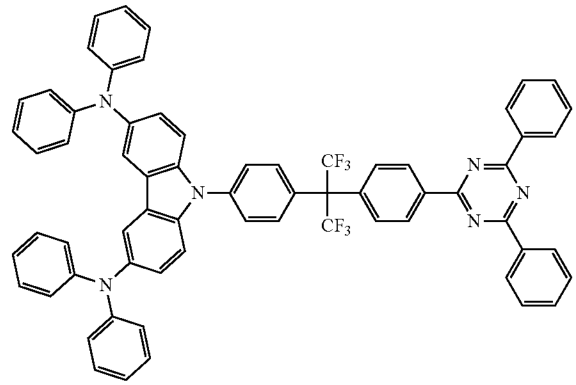
COMPOUND 13
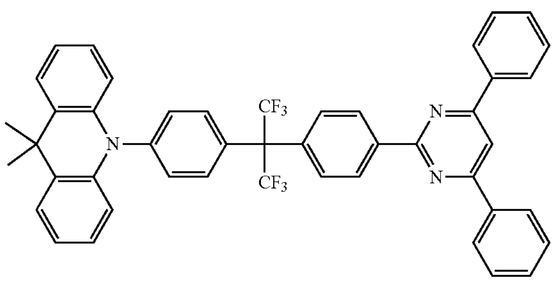
COMPOUND 14
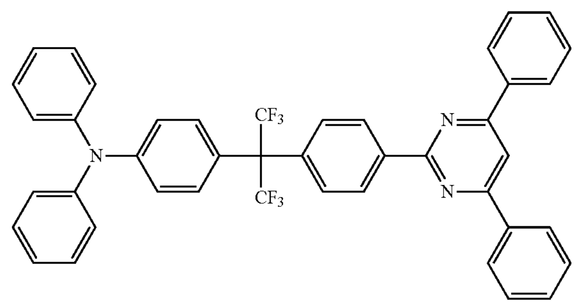
COMPOUND 15
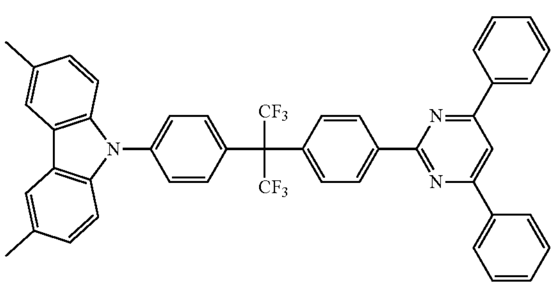
COMPOUND 16
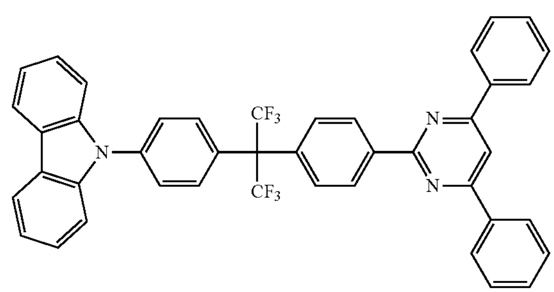
COMPOUND 17
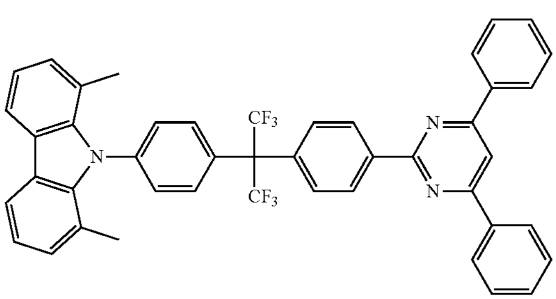
COMPOUND 18
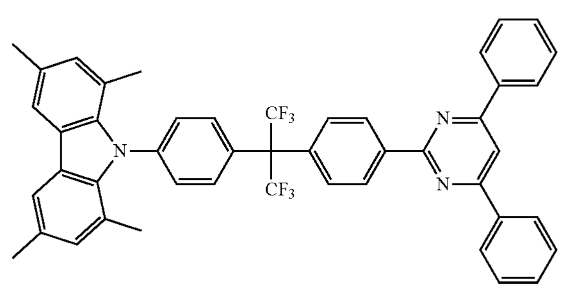

-continued
COMPOUND 19
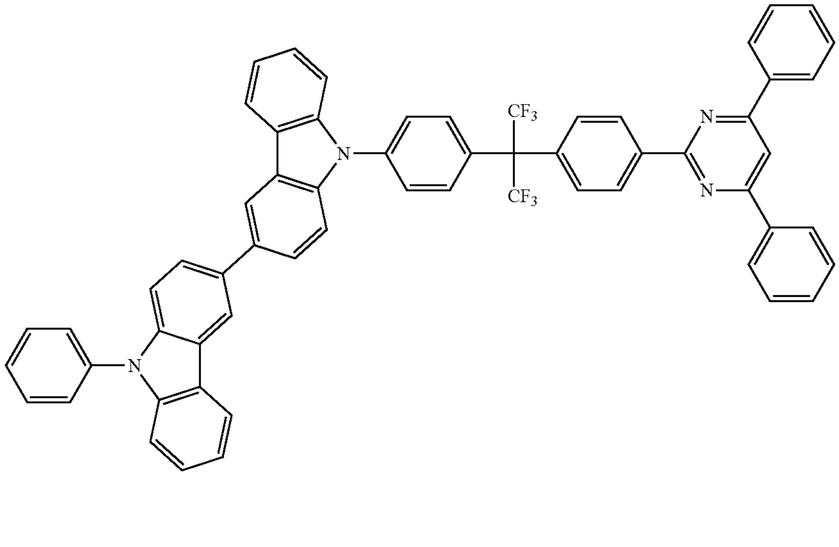
COMPOUND 20
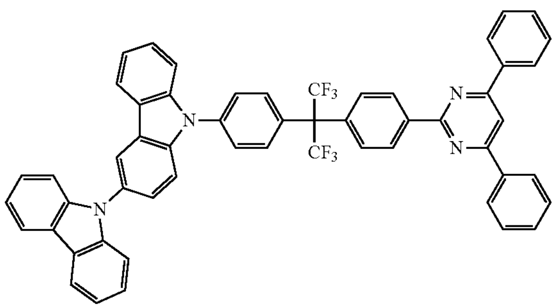
COMPOUND 21
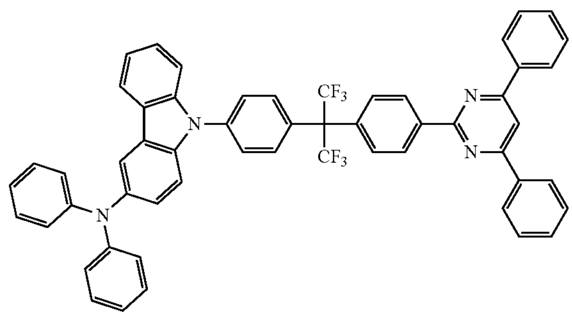
COMPOUND 22
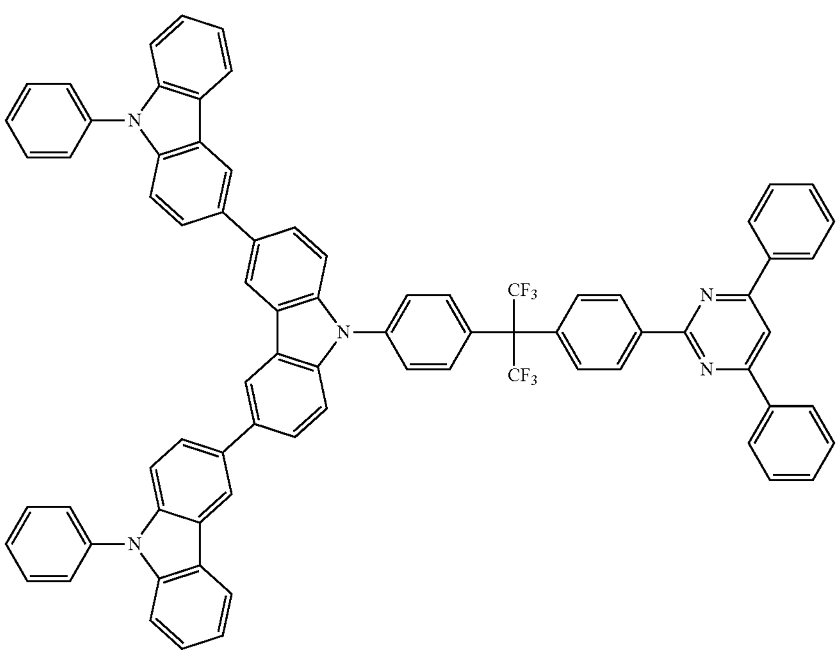

-continued
COMPOUND 23
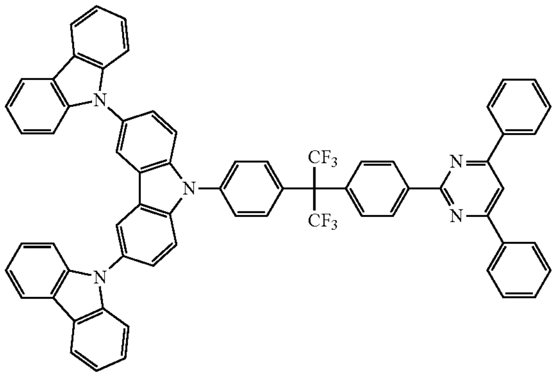
COMPOUND 24
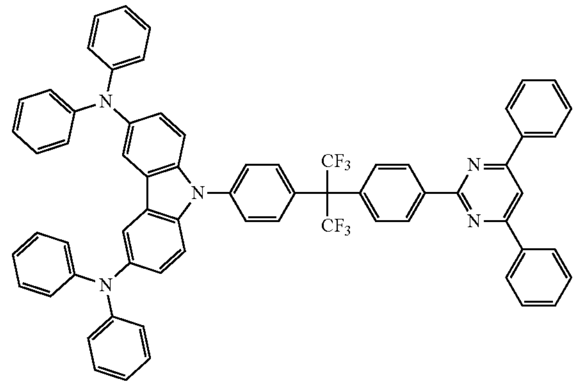
COMPOUND 25
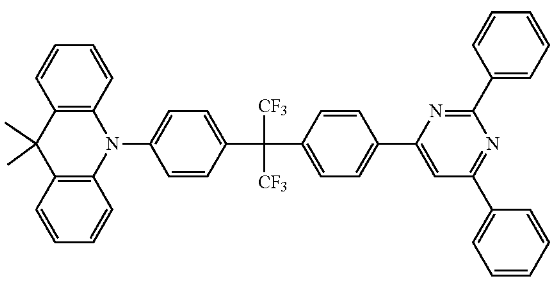
COMPOUND 26
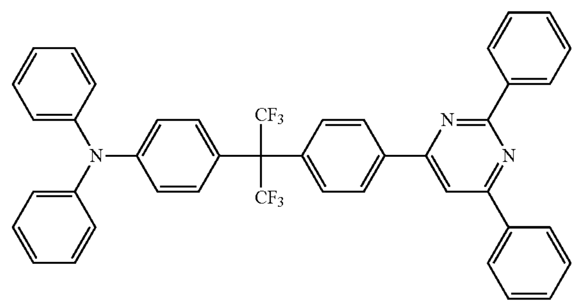
COMPOUND 27
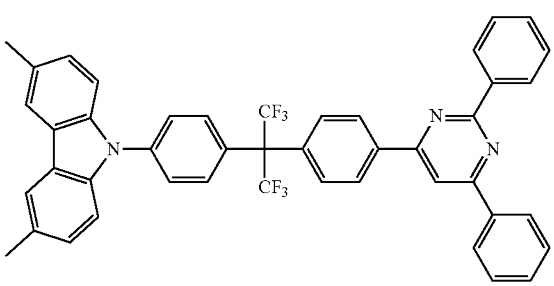
COMPOUND 28
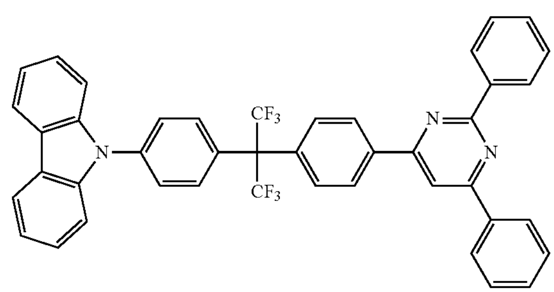
COMPOUND 29
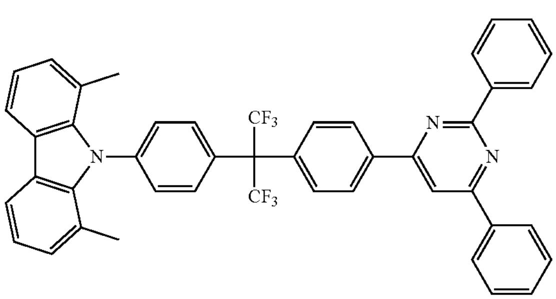
COMPOUND 30
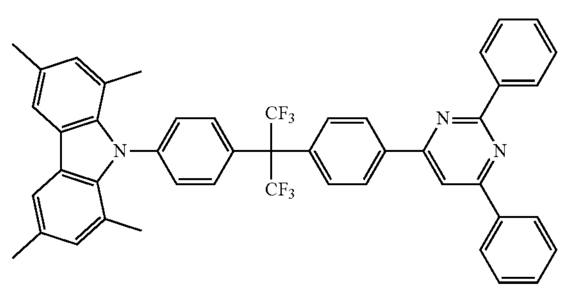

-continued
COMPOUND 31
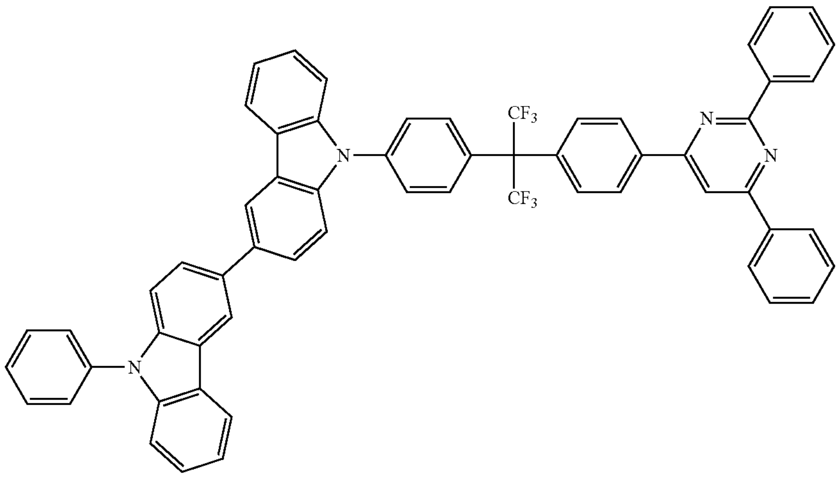
COMPOUND 32
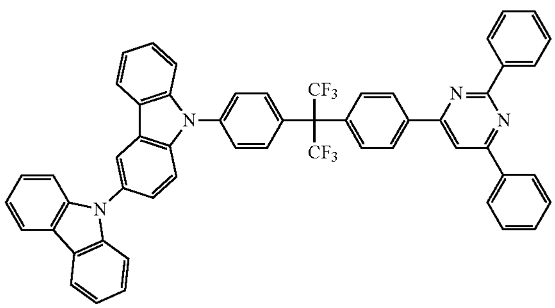
COMPOUND 33
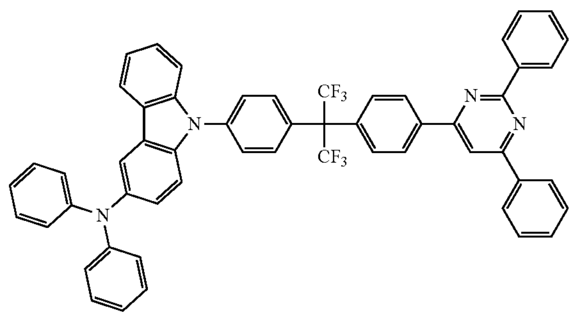
COMPOUND 34
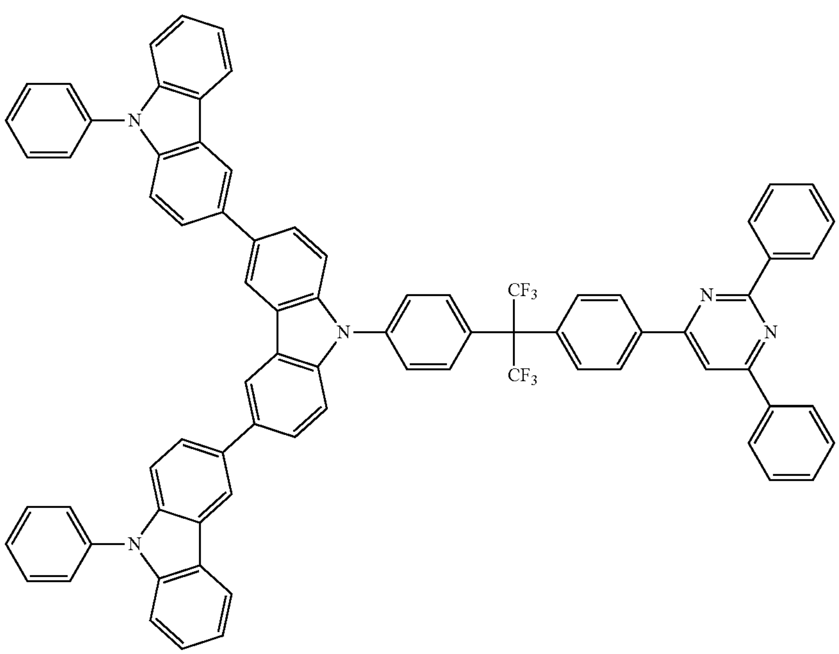

-continued
COMPOUND 35
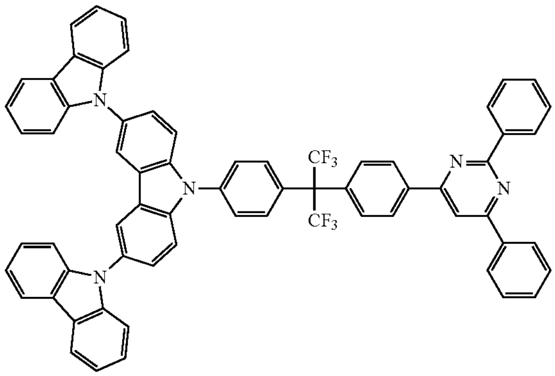
COMPOUND 36
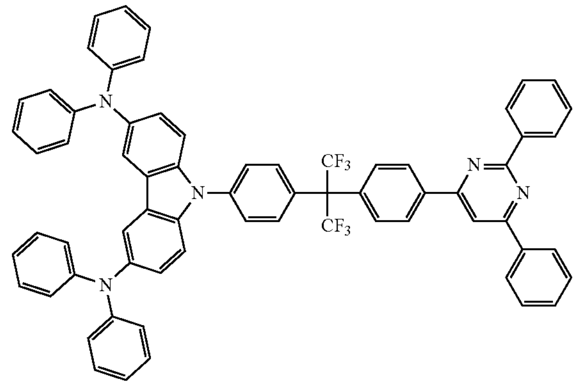
COMPOUND 37
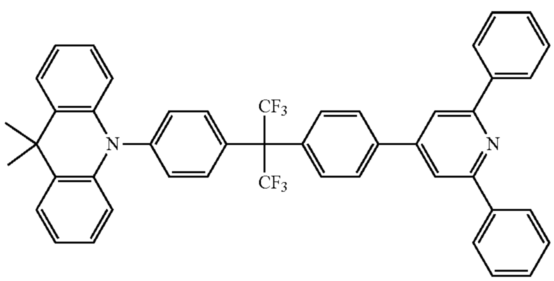
COMPOUND 38
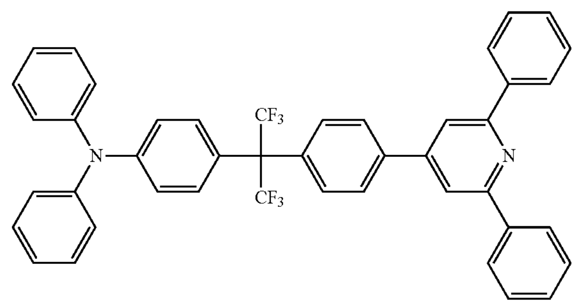
COMPOUND 39
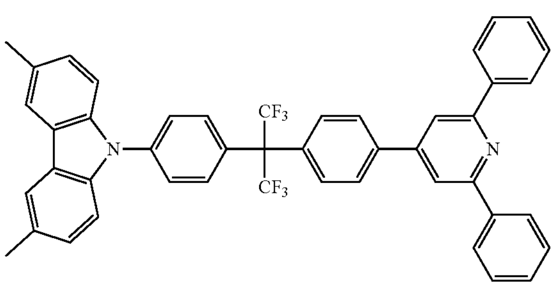
COMPOUND 40
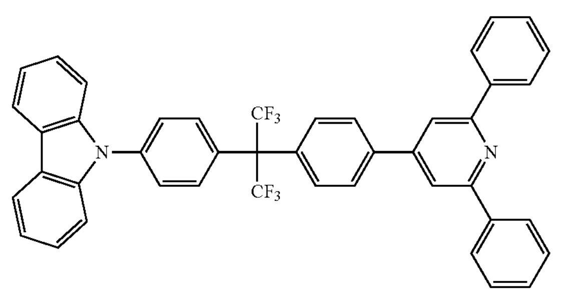
COMPOUND 41
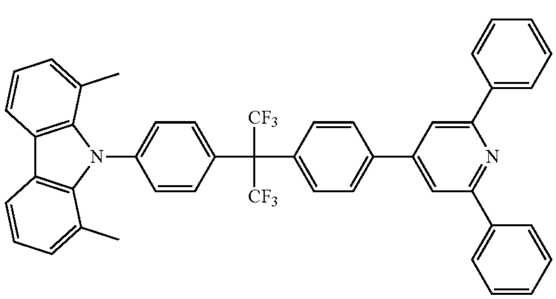
COMPOUND 42
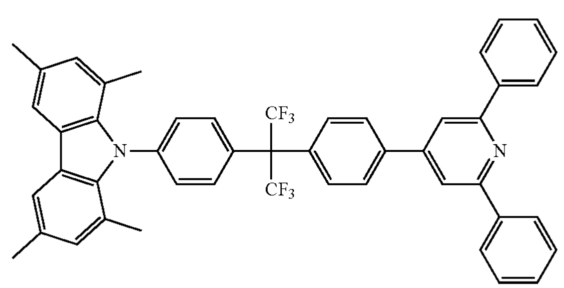

-continued
COMPOUND 43
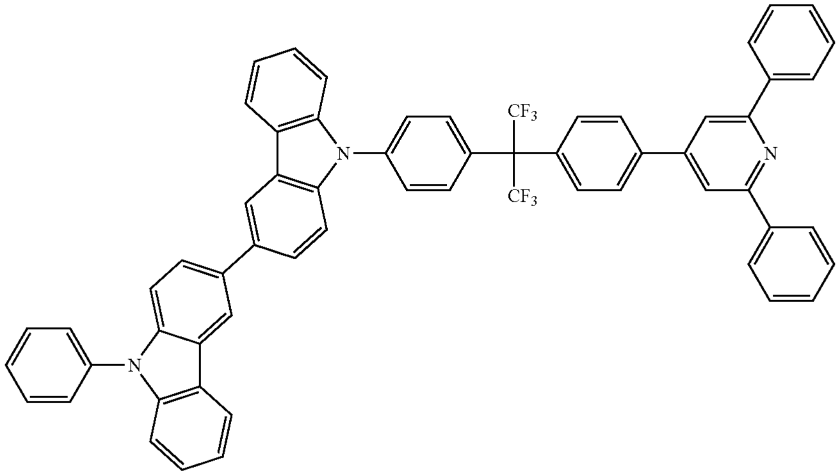
COMPOUND 44
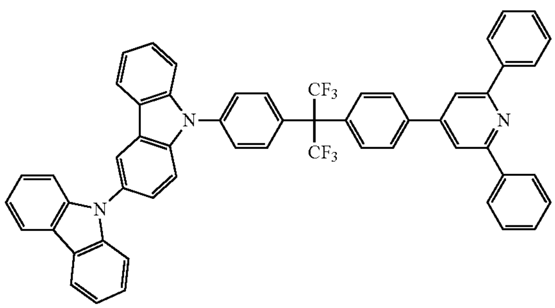
COMPOUND 45
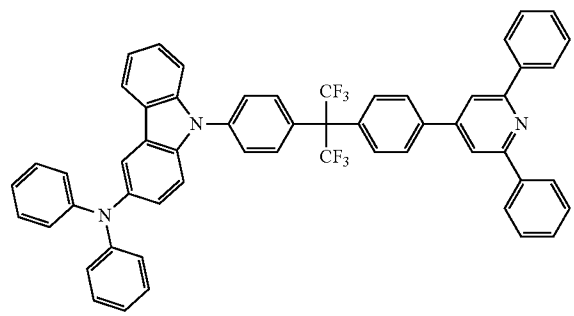
COMPOUND 46
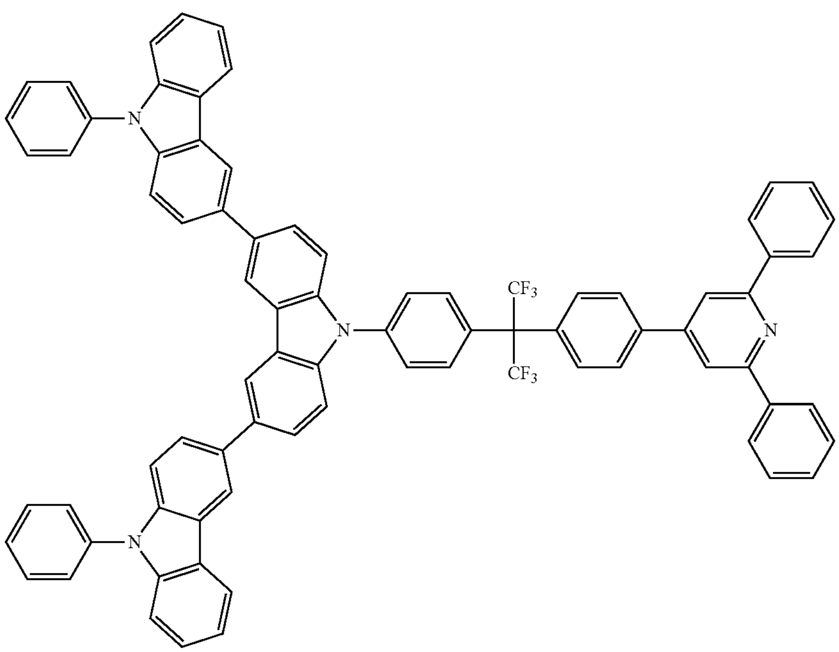

-continued
COMPOUND 47
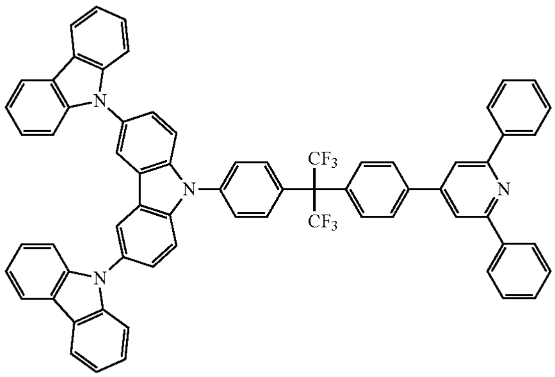
COMPOUND 48
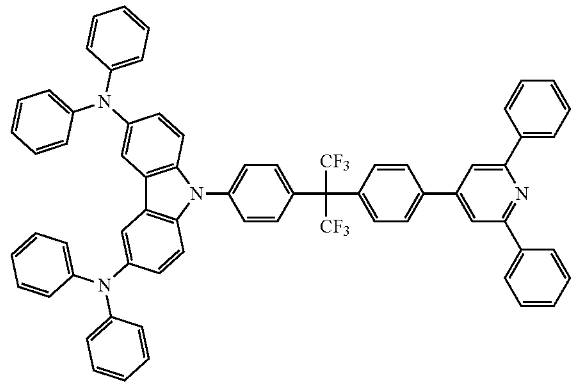
COMPOUND 49
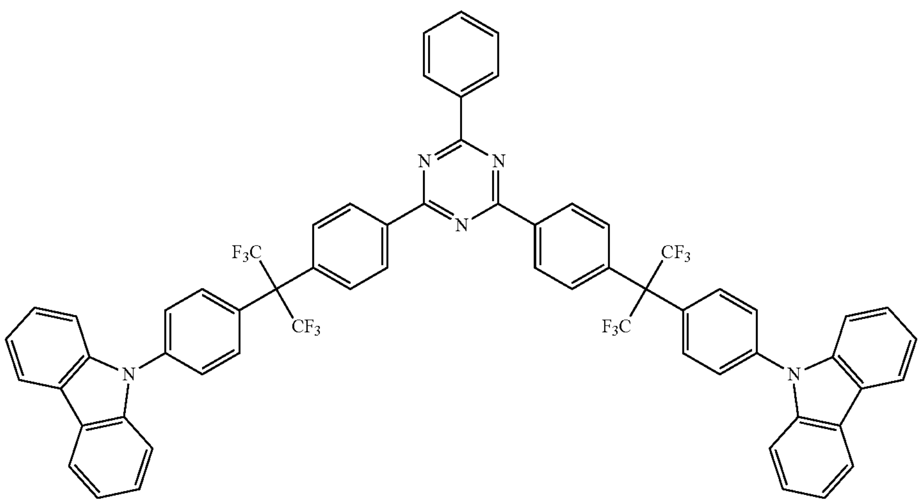
COMPOUND 50
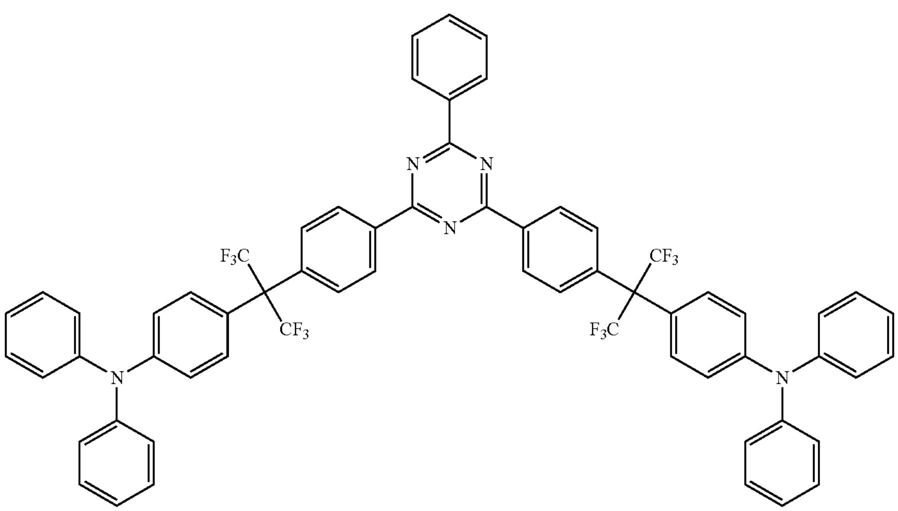

-continued
COMPOUND 51
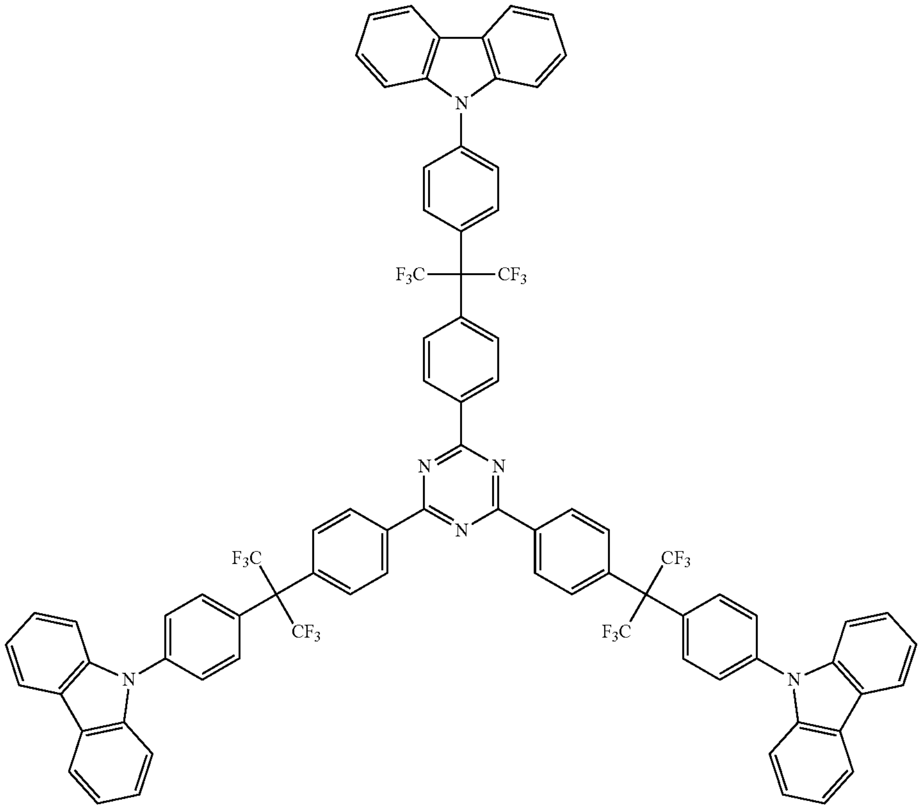
COMPOUND 52
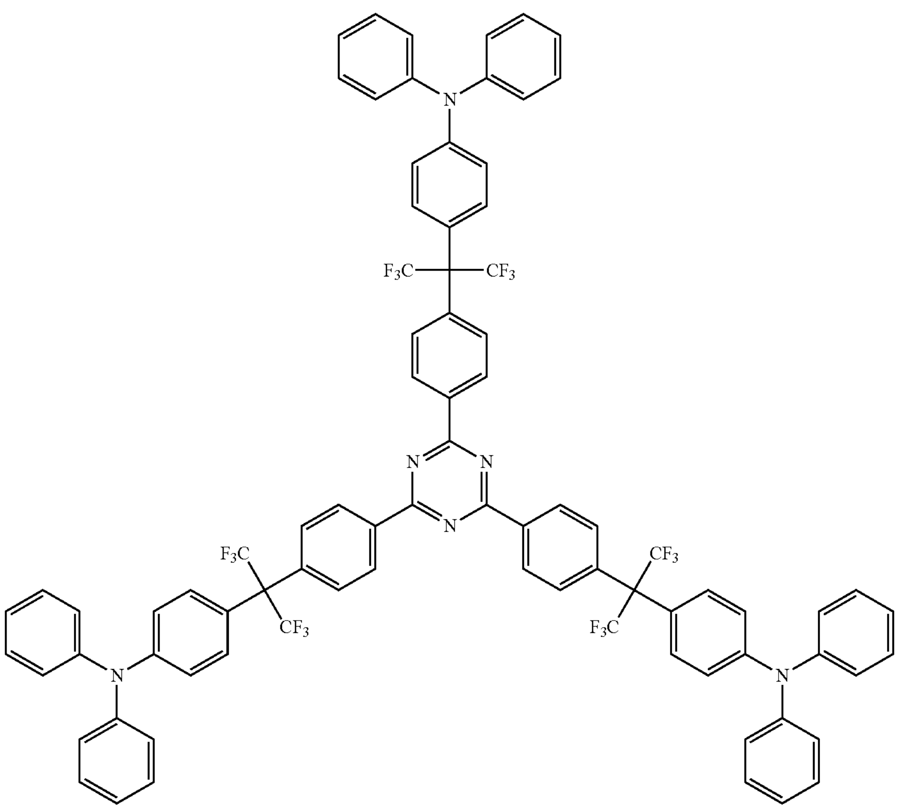

-continued
COMPOUND 53
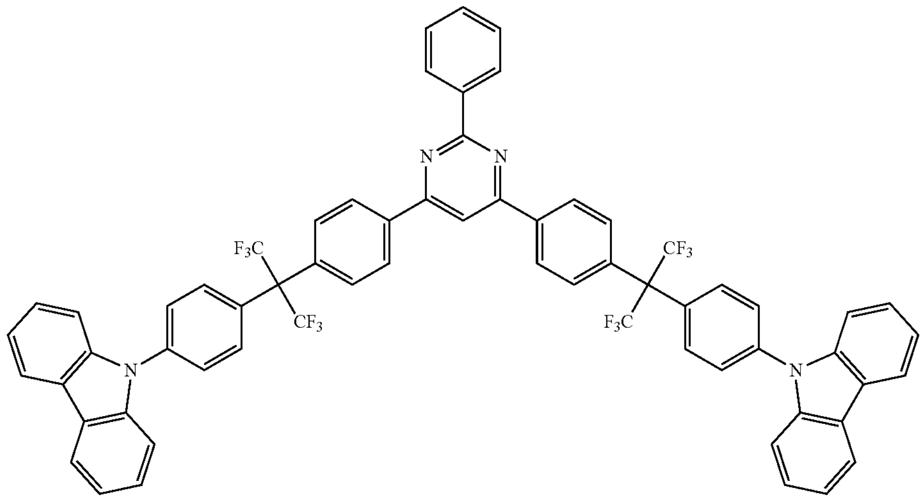
COMPOUND 54
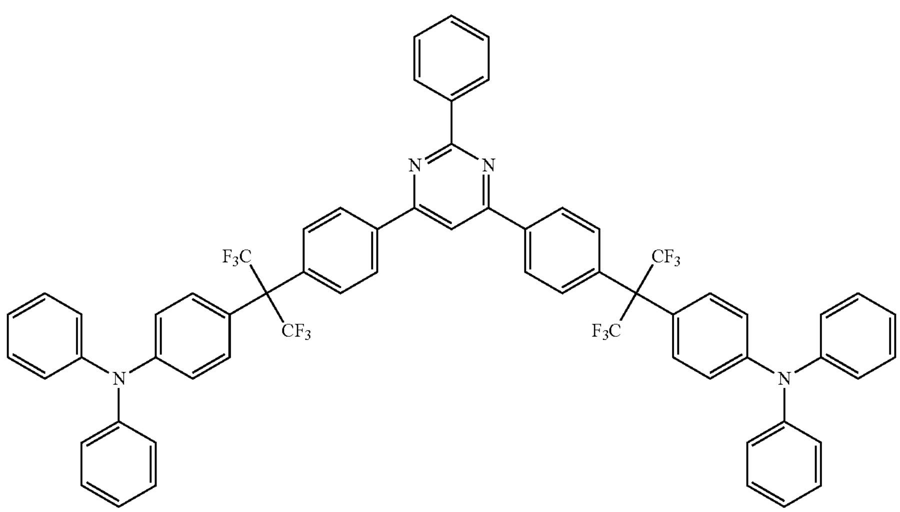

-continued
COMPOUND 55
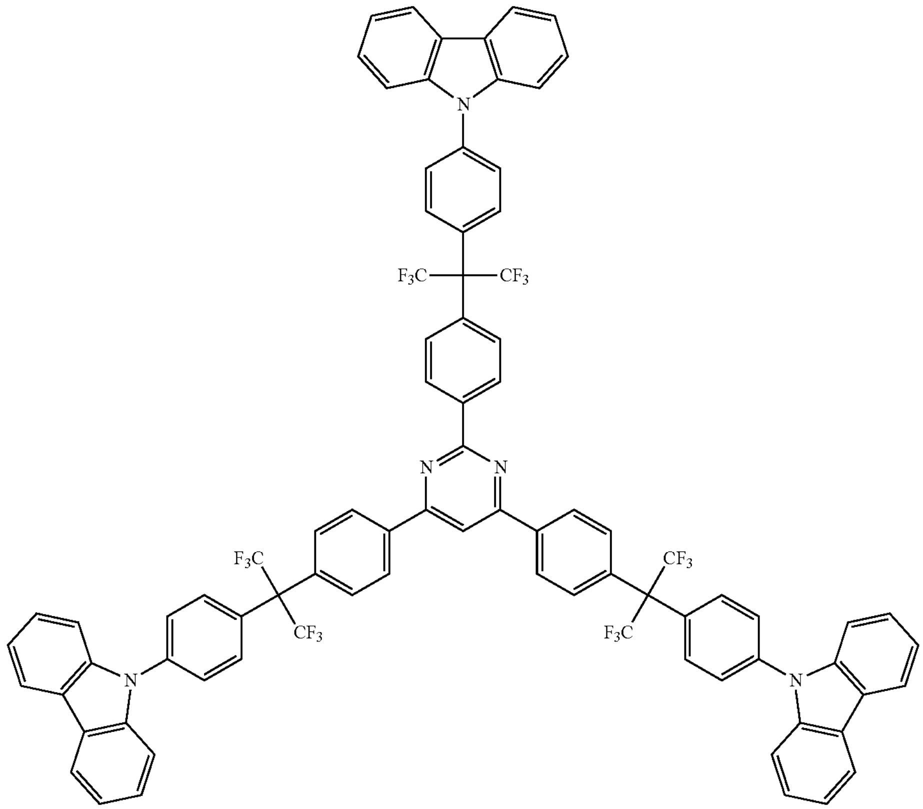
COMPOUND 56
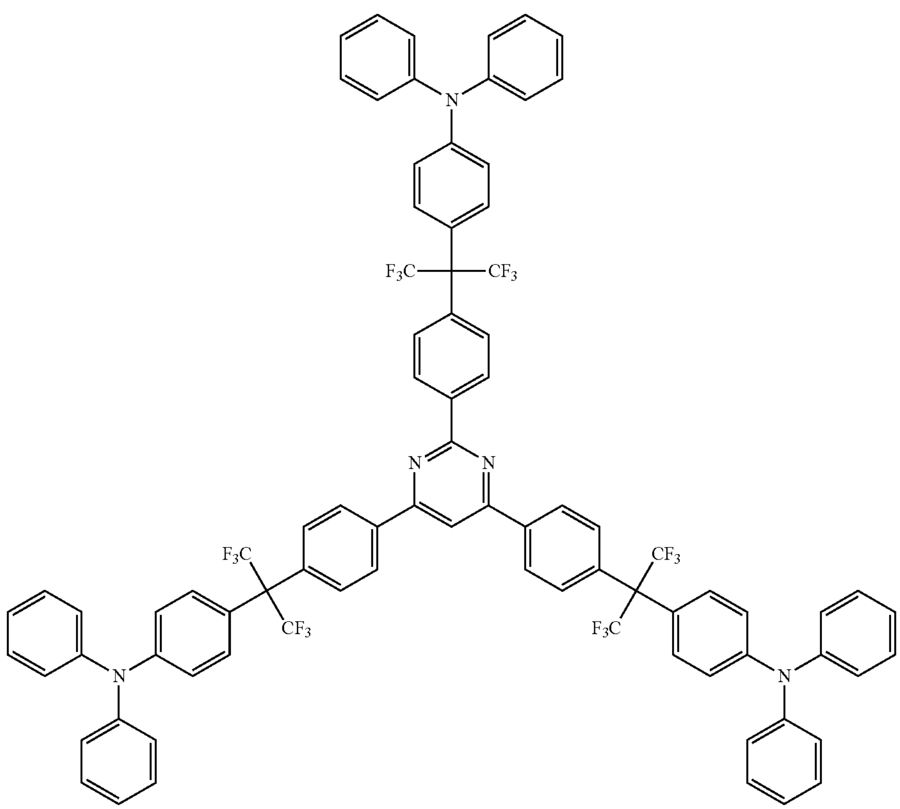

-continued
COMPOUND 57
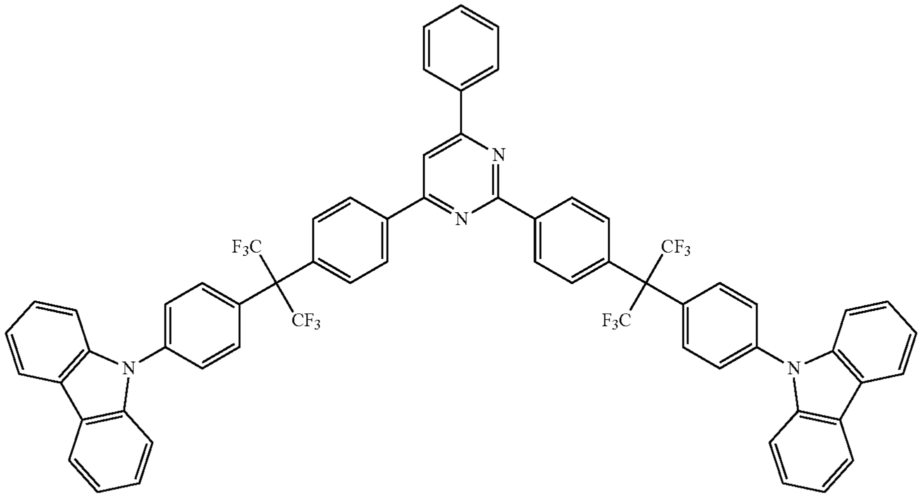
COMPOUND 58
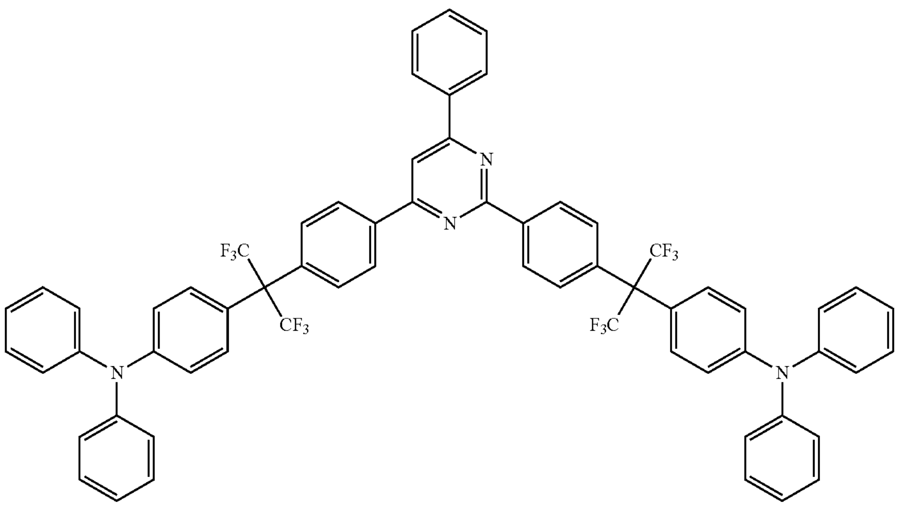
COMPOUND 59
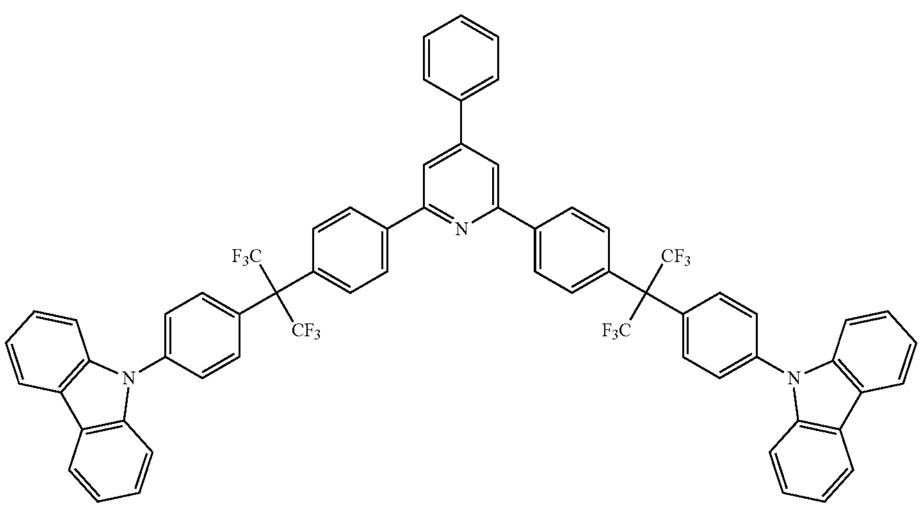

-continued

COMPOUND 60

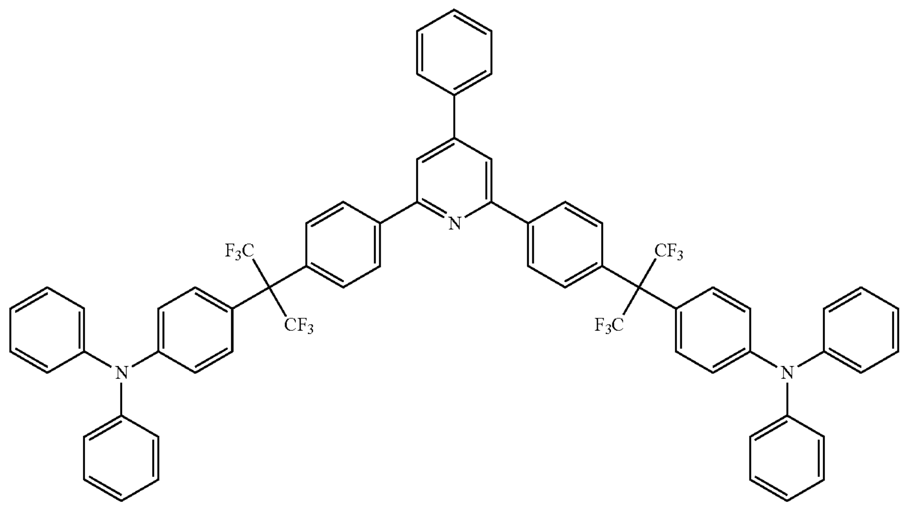

Next, the compounds represented by the general formula (G) are described.

General Formula (G)

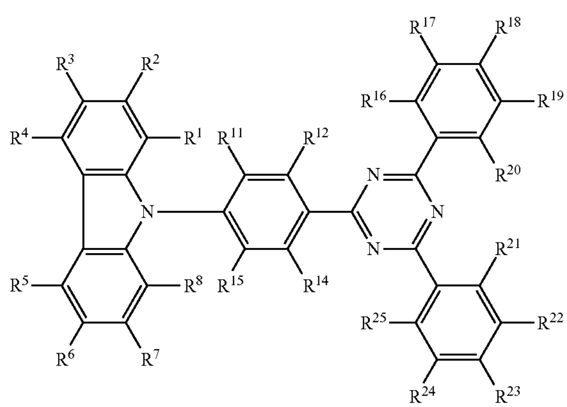

In the general formula (G), $R^1$ to $R^8$, $R^{12}$ and $R^{14}$ to $R^{25}$ each independently represent a hydrogen atom or a substituent, $R^{11}$ represents a substituted or unsubstituted alkyl group. However, at least one of $R^2$ to $R^4$ is a substituted or unsubstituted alkyl group, and at least one of $R^5$ to $R^7$ is a substituted or unsubstituted alkyl group.

Specific examples of the compounds represented by the general formula (G) are shown below.

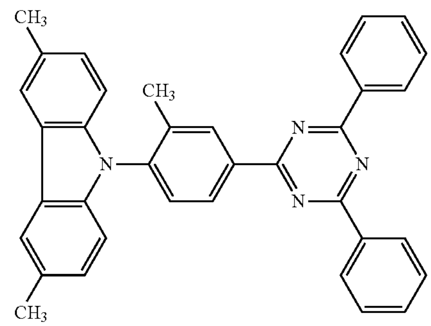

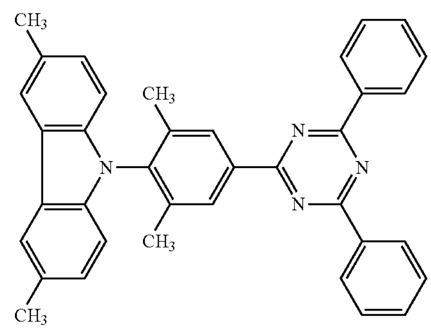

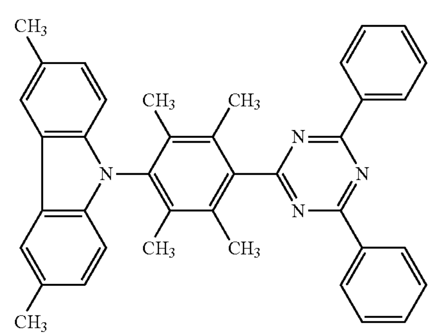

-continued

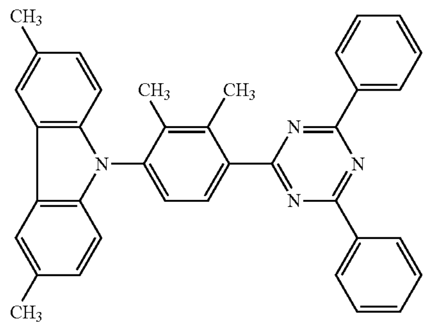

Specific examples of acceptor molecules and donor molecules capable of constituting an associate of an exciplex that emits delayed fluorescence are shown below. However, the exciplex that emits delayed fluorescence for use in the present invention should not be limitatively interpreted by these specific examples.

Acceptor Molecules

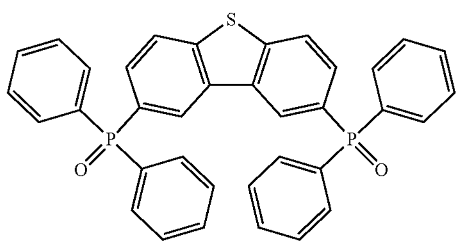

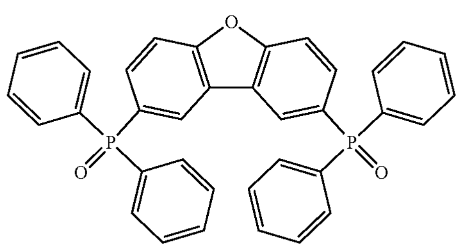

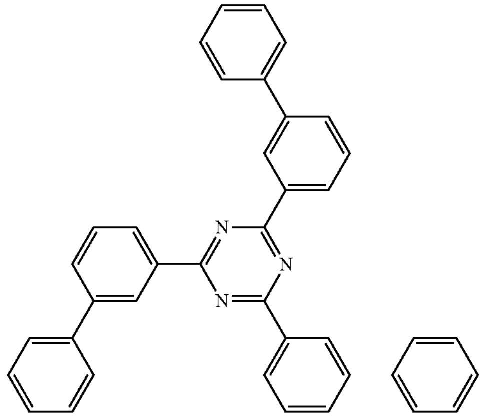

-continued

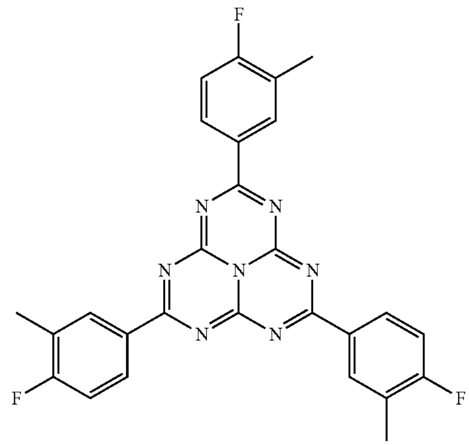

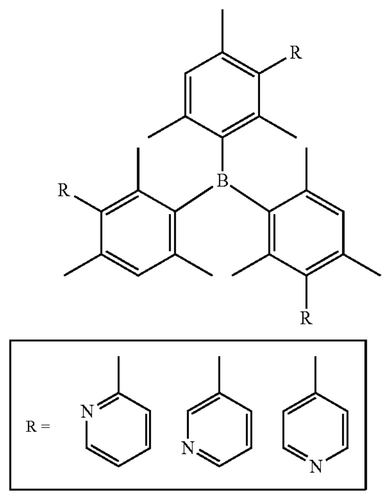

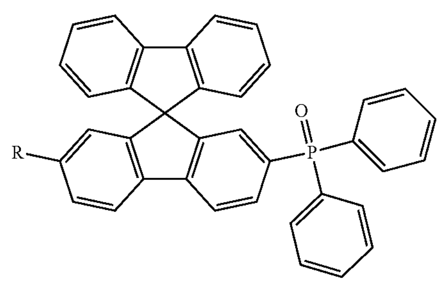

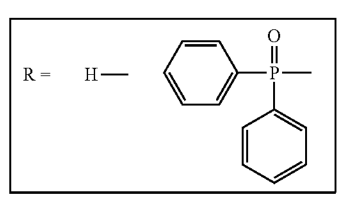

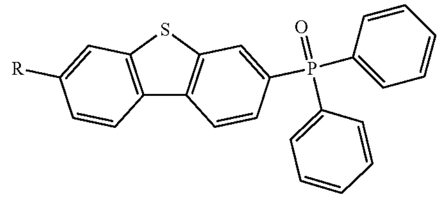

-continued
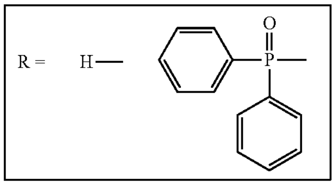
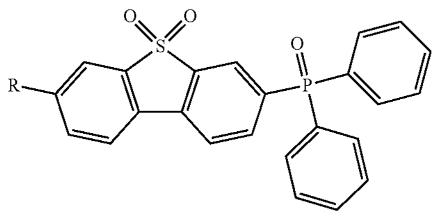
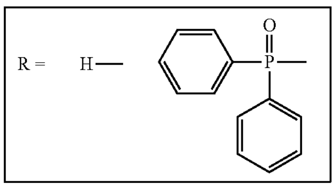
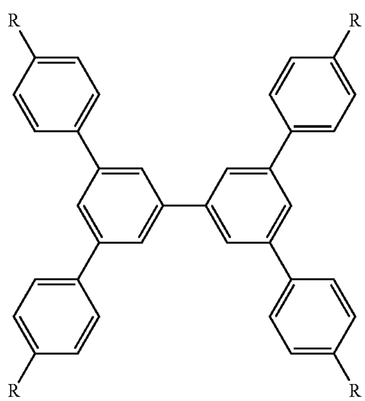
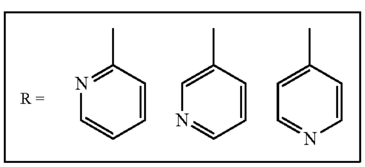
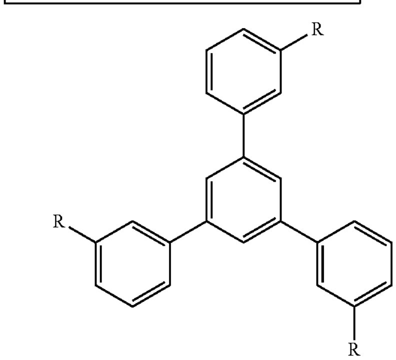
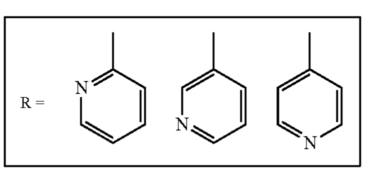
-continued
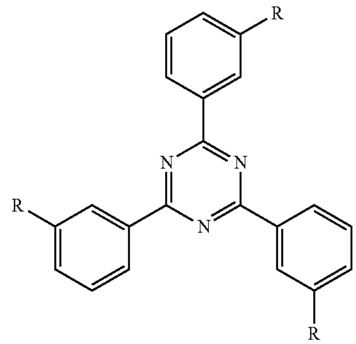
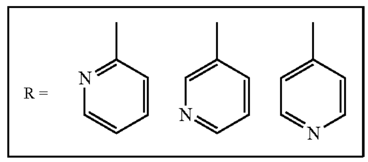
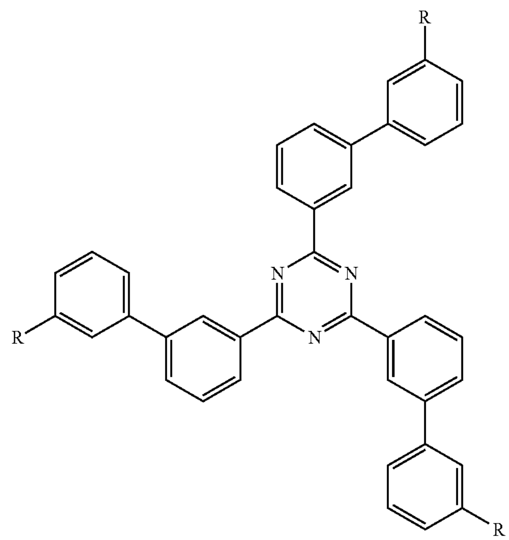
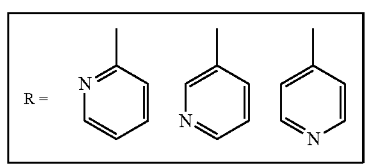
Donor Molecules
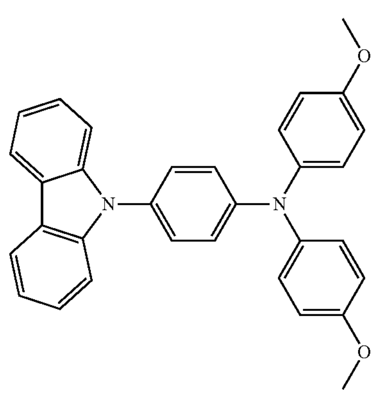

-continued
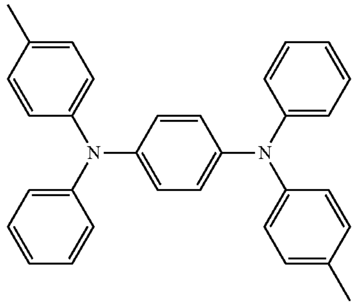
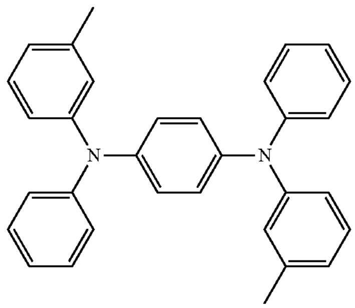
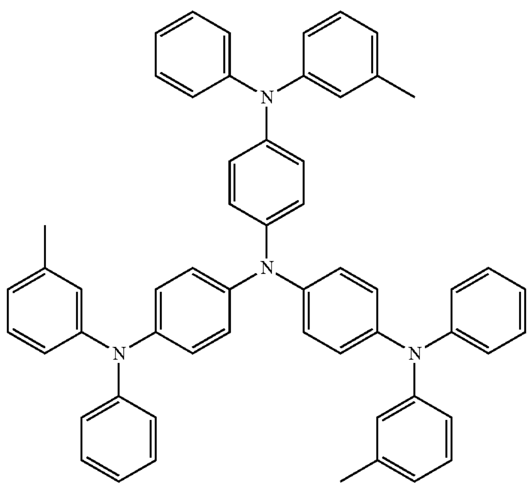
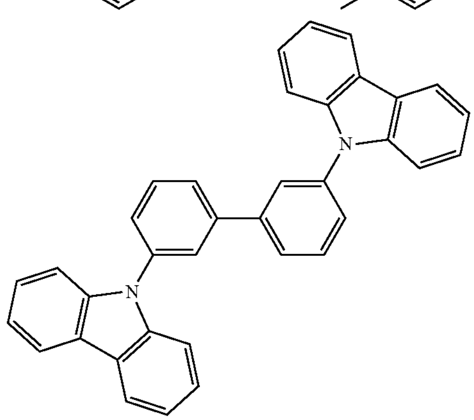
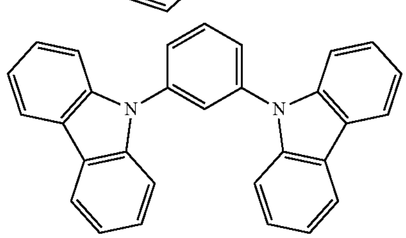
-continued
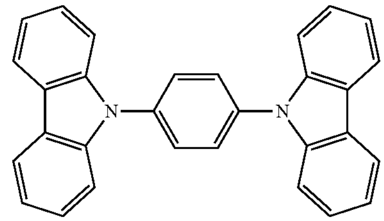
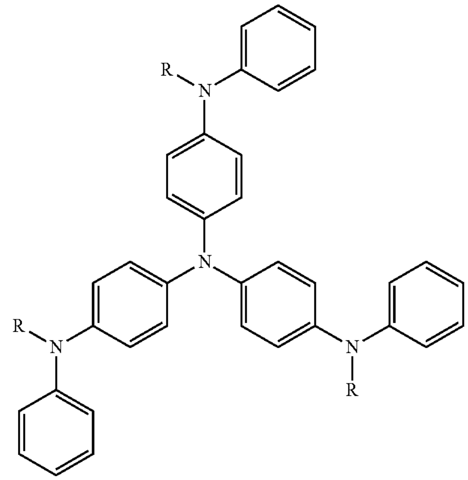
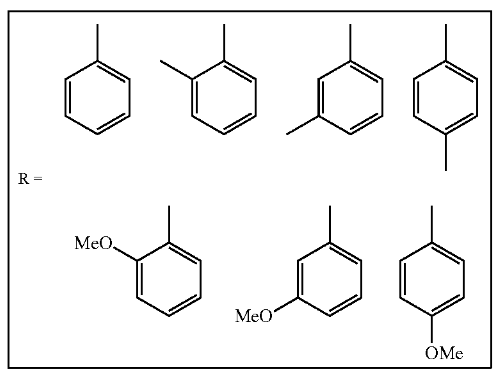
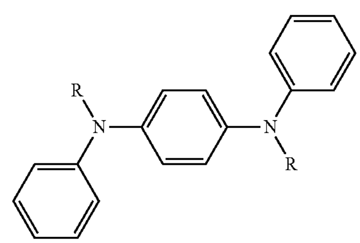
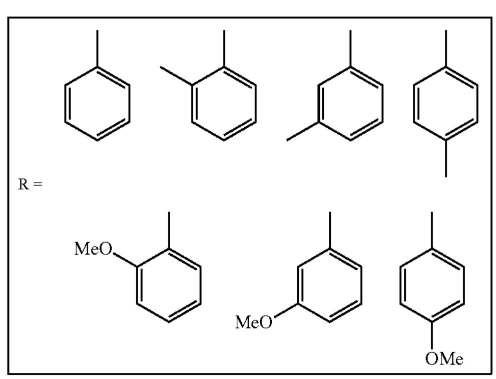

-continued
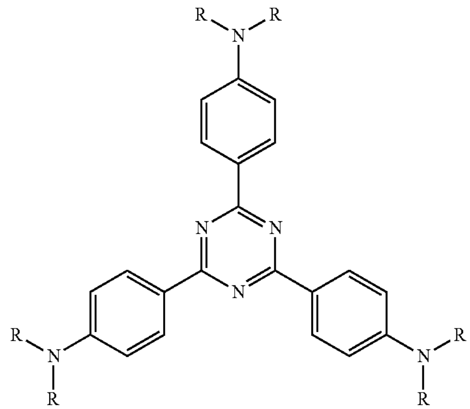
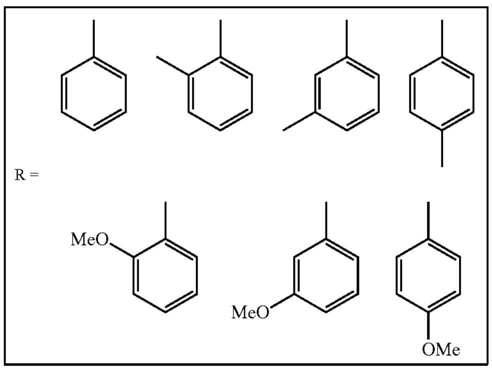
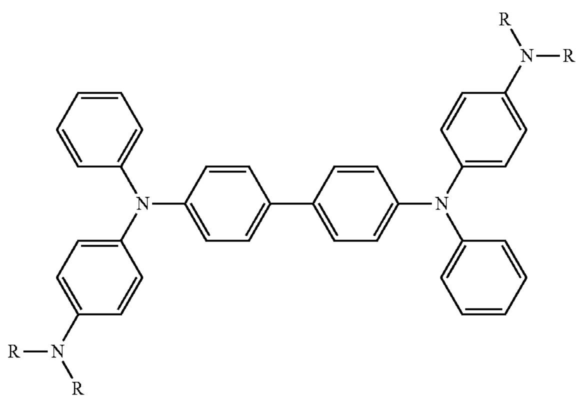
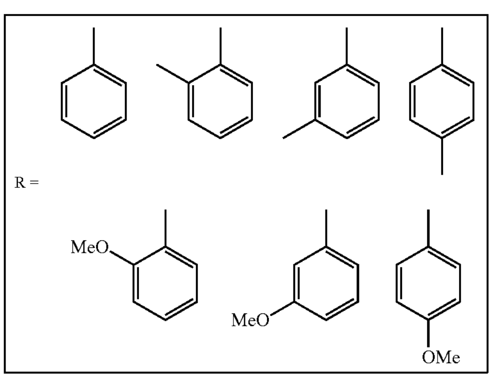
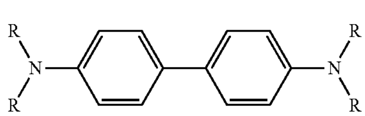
-continued
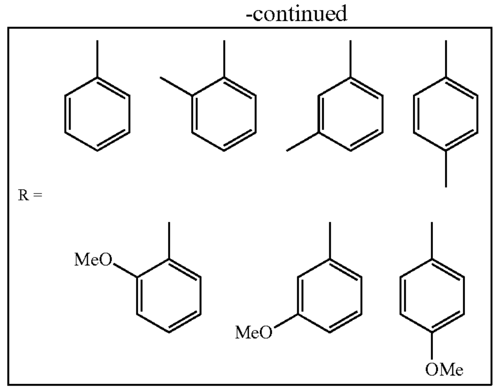
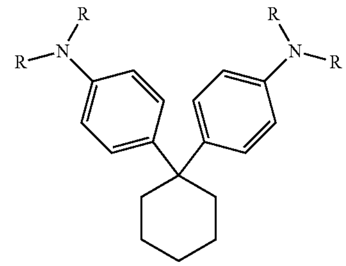
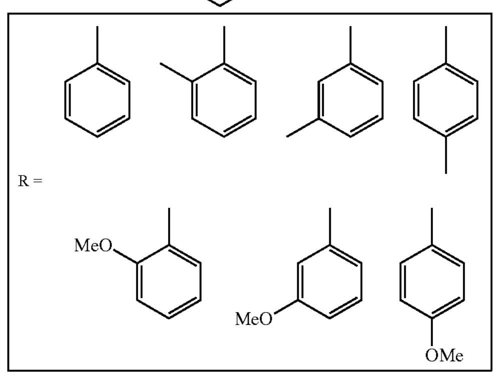
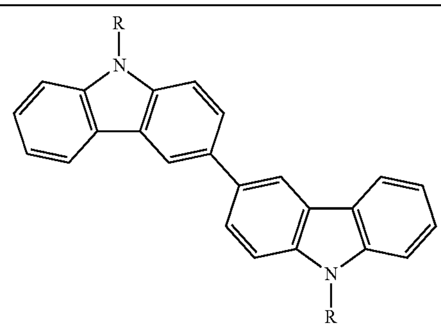
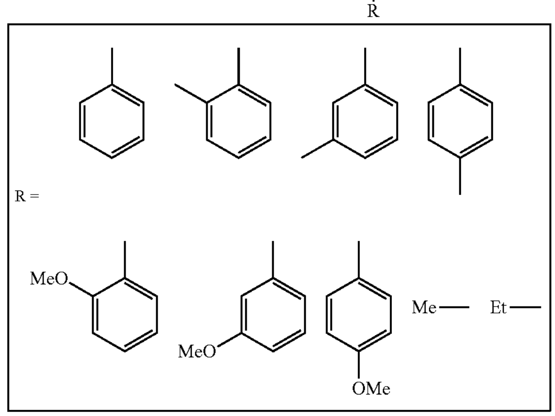

The exciton generation layer may be formed of a material composed of only a compound satisfying the expression (1) or an acceptor molecule and a donor molecule to constitute an exciplex that emits delayed fluorescence, or may contain any other material. The lower limit of the content of the compound satisfying the expression (1) or the acceptor molecule and the donor molecule constituting an exciplex to emit delayed fluorescence in the exciton generation layer may be, for example, more than 1% by mass, or more than 5% by mass or more than 10% by mass, and may even be more than 20% by mass, more than 50% by mass or more than 75% by mass. Further, the concentration may be not only constant throughout the layer but also may have a concentration gradient in the thickness direction of the exciton generation layer.

The other material includes a host material. The host material for use herein is preferably such that at least the lowest excited triplet energy level $E_{T1}$ thereof is higher than the lowest excited triplet energy level $E_{T1}$ of the compound satisfying the expression (1). With that, the energy of the host material in an excited triplet state may be smoothly transferred to the compound satisfying the expression (1) and the excited triplet energy of the compound satisfying the expression (1) may be confined in the molecule of the compound and therefore the energy can be effectively used for emission of the organic light emitting device. In the case where such a host material is used, the content of the compound satisfying the expression (1) in the exciton generation layer is preferably 50% by mass or less, and in consideration of efficiency, the content may be 25% by mass or less, 15% by mass or less, or 10% by mass or less.

Any known host materials usable in organic electroluminescent devices are usable herein. Examples of such host materials include carbazole derivatives such as 4,4'-bis(carbazole)biphenyl, 9,9-di(4-dicarbazole-benzyl)fluorene (CPF), 3,6-bis(triphenylsilyl)carbazole (mCP), poly(N-octyl-2,7-carbazole-O-9,9-dioctyl-2,7-fluorene) (PCF), 1,3,5-tris(carbazol-9-yl)benzene (TCP), and 9,9-bis[4-(carbazol-9-yl)-phenyl]fluorene (FL-2CBP); aniline derivatives such as 4-(diphenylphosphoryl)-N,N-diphenylaniline (HM-A1); fluorene derivatives such as 1,3-bis(9-phenyl-9H-fluoren-9-yl)benzene (mDPFB), and 1,4-bis(9-phenyl-9H-fluoren-9-yl)benzene (pDPFB); 1,3,5-tris[4-(diphenylamino)phenyl]benzene (TDAPB); 1,4-bistriphenylsilylbenzene (UGH-2); 1,3-bis(triphenylsilyl)benzene (UGH-3); 9-(4-tert-butylphenyl)-3,6-bis(triphenylsilyl)-9H-carbazole (CzSi).

In addition to a host material, and a compound satisfying the expression (1) and an acceptor molecule and a donor molecule to constitute an exciplex that emits delayed fluorescence, the exciton generation layer may further contain a dopant. The content of the dopant in the exciton generation layer is preferably smaller than the compound satisfying the expression (1) or the acceptor molecule and the donor molecule to constitute an exciplex that emits delayed fluorescence, and may be, for example, 10% by mass or less, 5% by mass or less, 3% by mass or less, 1% by mass or less, or 0.5% by mass or less, and may be 0.001% mass or more, 0.01% by mass or more, or 0.1% by mass or more. The dopant may be, for example, the same light emitting material as that used in the light emitting layer. Using the same light emitting material as that in the light emitting layer as the dopant in the exciton generation layer, energy transfer from the compound satisfying the expression (1) toward the dopant in the exciton generation layer and toward the light emitting material in the light emitting layer may be promoted and both the two may emit light. Accordingly, the energy of the compound satisfying the expression (1) may be more efficiently consumed for emission. The exciton generation layer containing such a dopant may also function as a light emitting layer since the dopant therein emits light.

As another embodiment thereof, the exciton generation layer may have such a configuration that the compound satisfying the expression (1) or the acceptor molecule and the donor molecule to constitute an exciplex that emits delayed fluorescence therein may be dispersed in a polymer material (binder resin) or an inorganic material.

The thickness of the exciton generation layer is not specifically limited. In any case where the exciton generation layer is arranged on one side of the light emitting layer, or the exciton generation layer is arranged on both sides of the light emitting layer, the thickness of the exciton generation layer is preferably 100 nm or less, more preferably 50 nm or less, even more preferably 30 nm or less, further more preferably 10 nm or less, and especially preferably 5 nm or less. With that, energy transfer from the compound satisfying the expression (1) and having transitioned in an excited triplet state or the exciplex to emit delayed fluorescence toward the light emitting material contained in the light emitting layer can be more surely prevented to realize high emission efficiency.

In the case where the organic light emitting device has plural exciton generation layers, the kind of the compound satisfying the expression (1) or the exciplex to emit delayed fluorescence to be contained in each exciton generation layer, as well as the kind of any optional material in each layer, the composition ratio therein and the thickness of each layer may be the same or different.

[Light Emitting Layer]

The light emitting layer contains a light emitting material. The light emitting layer may contain one kind alone of a light emitting material or may contain two or more kinds of light emitting materials in combination. In the case where the layer contains two or more kinds of light emitting materials, the emission color of each light emitting material may have the same hue or may have different hues. Using light emitting materials differing in hue, mixed color or white color can be emitted.

The kind of the light emitting material for use in the light emitting layer is not specifically limited, and any of a fluorescent light emitting material, a delayed fluorescent material or a phosphorescent light emitting material may be used in the layer. More preferred is a fluorescent light emitting material or a delayed fluorescent light emitting is used, and even more preferred is a fluorescent light emitting material. Also preferably, the light emitting material is such a compound that the difference $\Delta E_{ST}$ between the lowest excited singlet energy level $E_{S1}$ and the lowest excited triplet energy level $E_{T1}$ thereof is larger than that of the compound satisfying the expression (1), more preferably, a compound satisfying $\Delta E_{ST}>0.3$ eV, for example, a compound satisfying $\Delta E_{ST}>0.5$ eV.

Preferably, the light emitting material is such that the lowest excited singlet energy level $E_{S1}$ thereof is lower than that of the compound satisfying the expression (1) to be contained in the exciton generation layer. With that, the energy of the compound satisfying the expression (1) and having transitioned in an excited singlet state in the exciton generation layer can be smoothly transferred toward the light emitting material in the light emitting layer and the energy can be effectively consumed for emission of the light emitting material. In the case where the lowest excited singlet energy level $E_{S1}$ of the light emitting material is higher than that of the compound satisfying the expression (1) contained in the exciton generation layer, the difference in the lowest excited singlet energy level $E_{S1}$ between the two is preferably 0.5 eV or less, more preferably 0.3 eV or less, even more preferably 0.2 eV or less.

The kind of the light to be emitted by the light emitting material is not specifically limited, but preferred is visible light, IR light or UV light, and more preferred is visible light.

Preferred compounds for use as the light emitting material are specifically exemplified hereinunder, as differentiated in point of the emission color thereof. However, the light emitting material for use in the present invention should not be limitatively interpreted by the following compound exemplifications. In the structural formulae of the compounds exemplified hereinunder. Et represents an ethyl group, and i-Pr represents an isopropyl group.

(1) Green Light Emitting Compounds

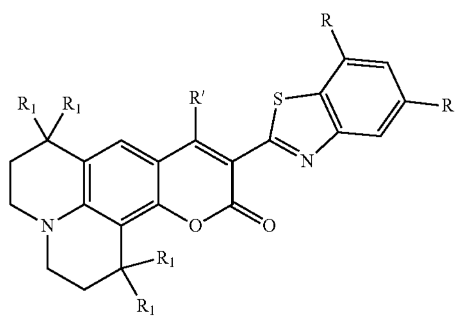

$R_1 = R = R' = H$,
$R_1 = CH_3$, $R = R' = H$,
$R_1 = CH_3$, $R = H$; $R' = CH_3$,
$R_1 = CH_3$, $R$ = t-butyl; $R'$ =H

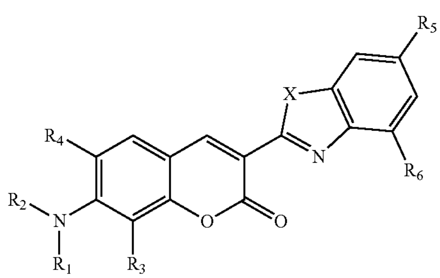

X = S, O

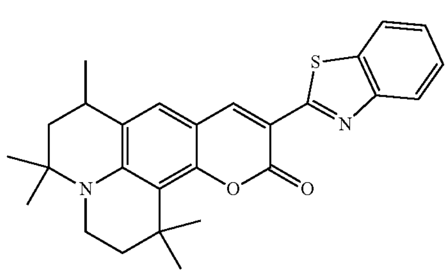

-continued

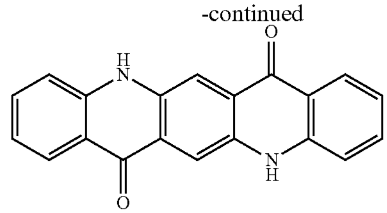

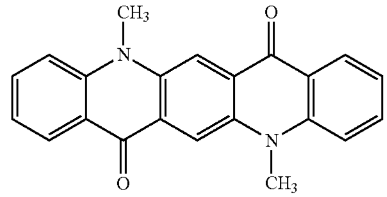

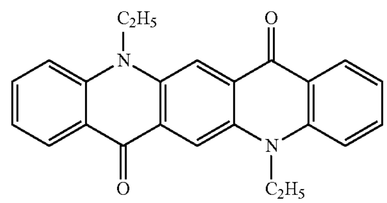

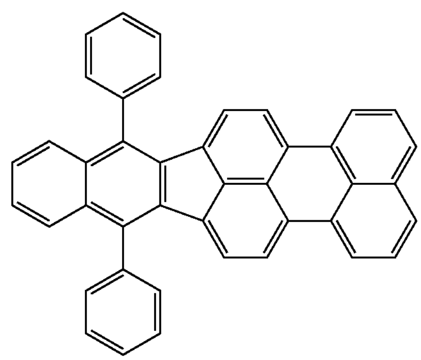

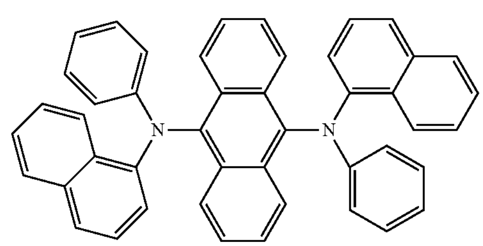

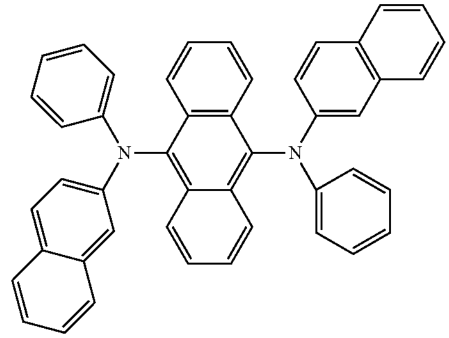

-continued
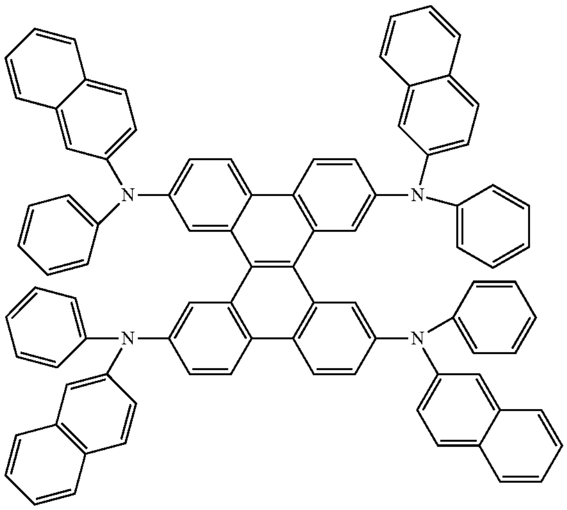
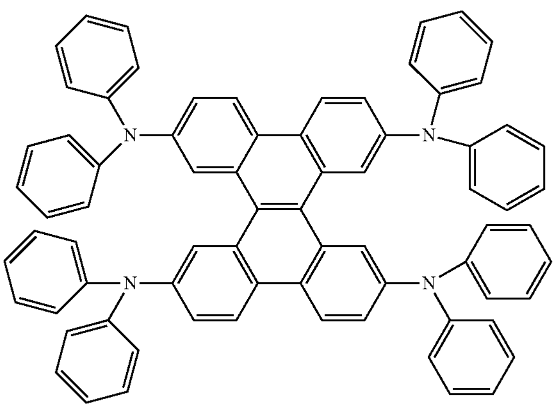
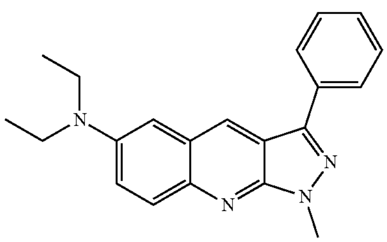
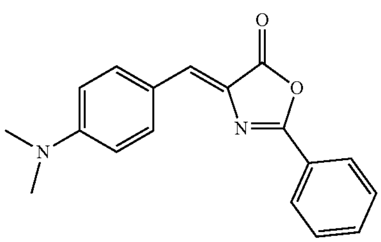
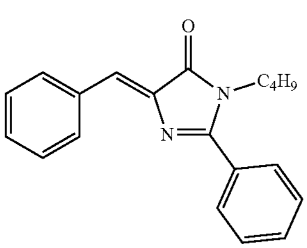
-continued
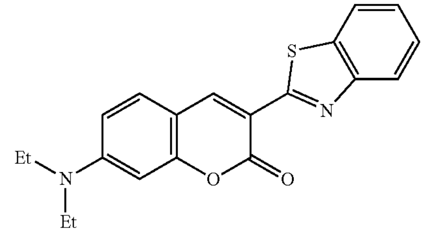
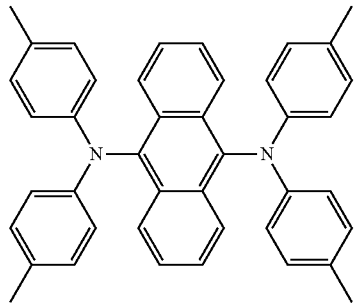
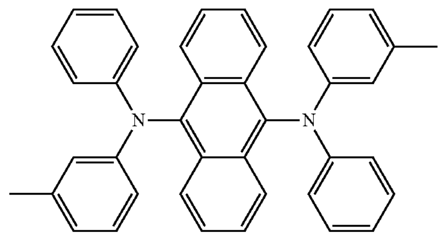
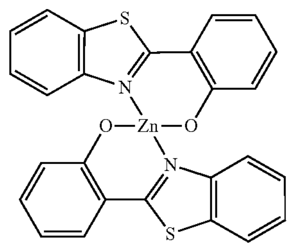
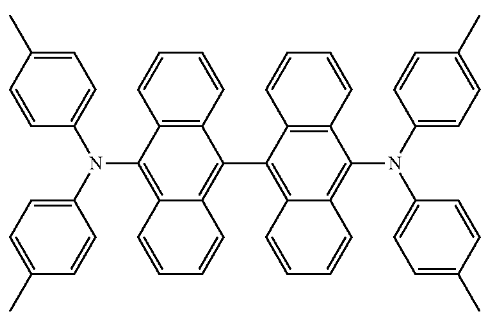
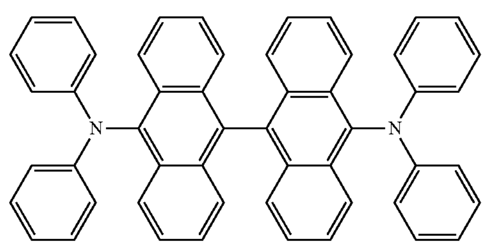

-continued
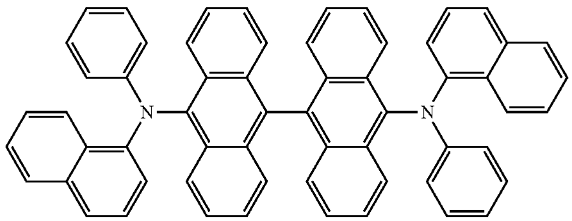
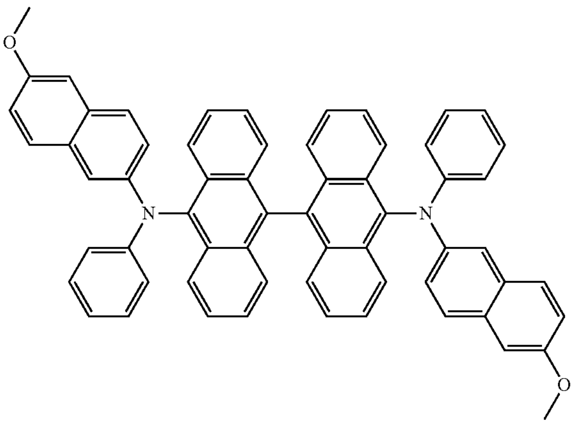
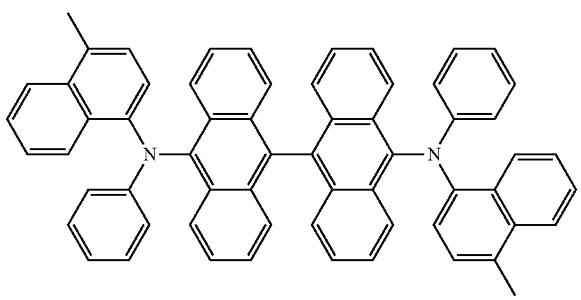
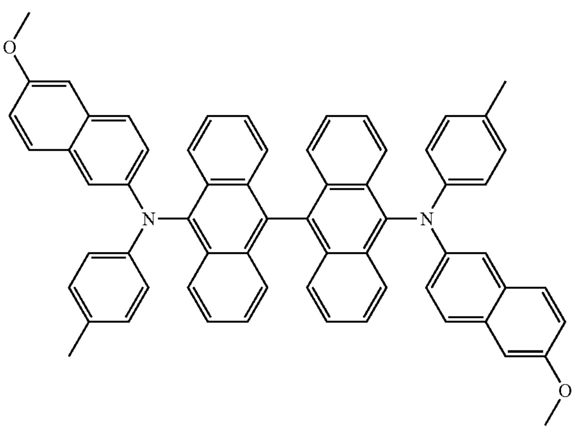
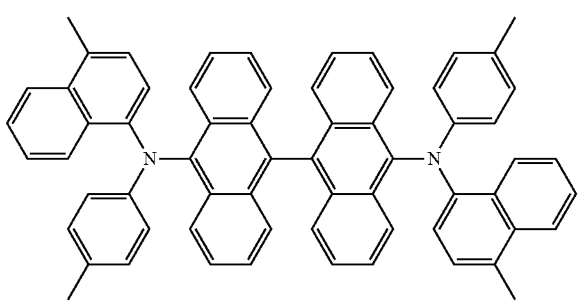
-continued
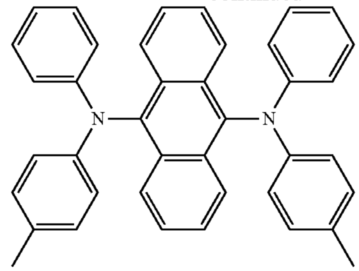
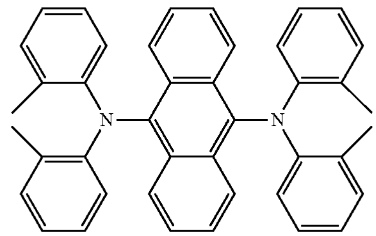
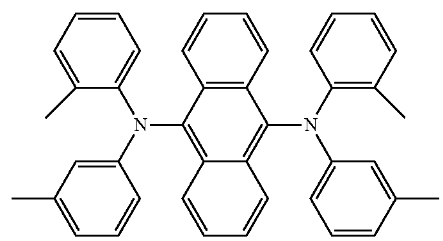
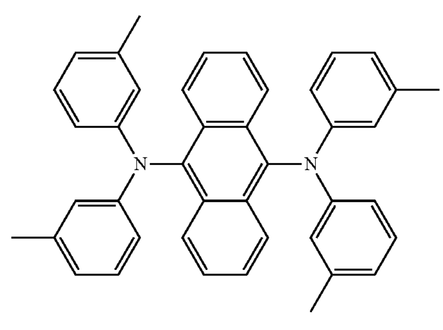
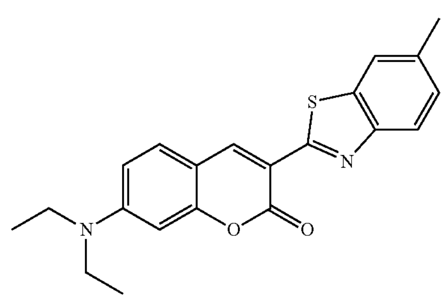

(2) Red Light Emitting Compounds
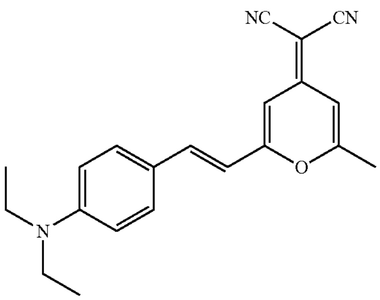
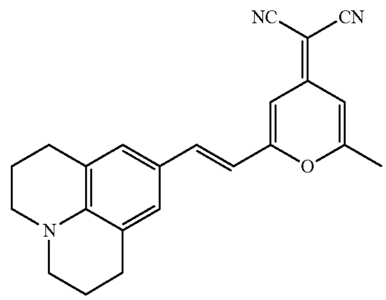
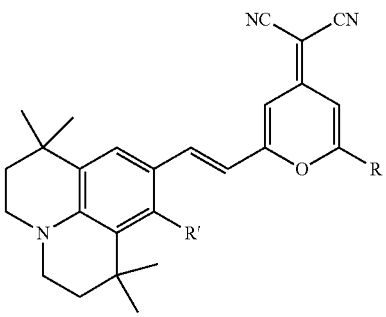
R = t-butyl; R′ = H,
R = i-Pr; R′ = H,
R = t-butyl; R′ = $OCH_3$
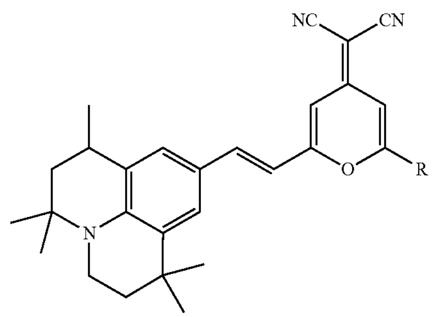
R = $CH_3$, $C_2H_5$, iso-propyl, t-butyl
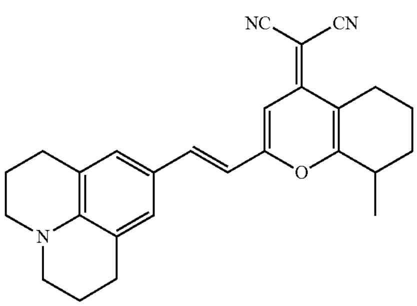
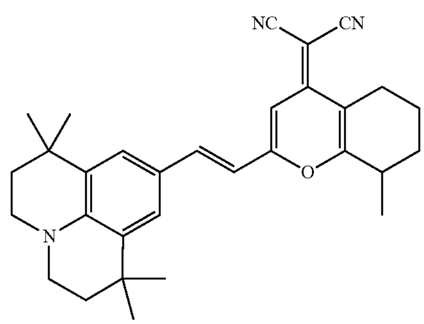
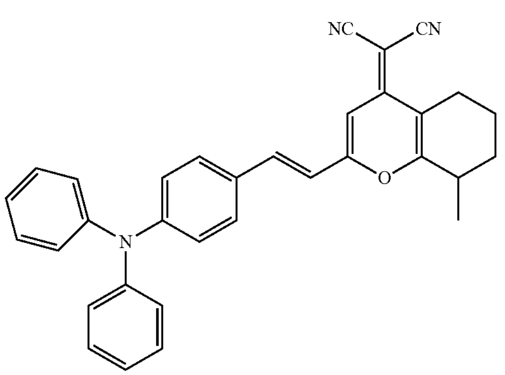
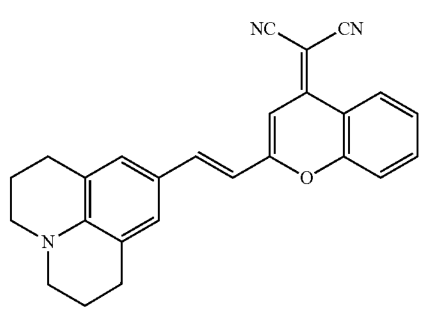

-continued
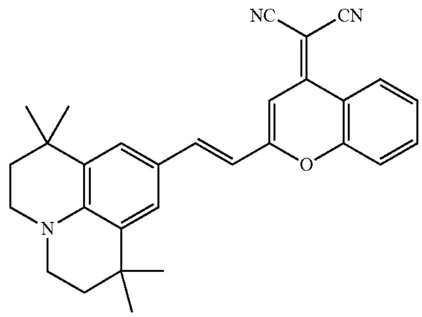
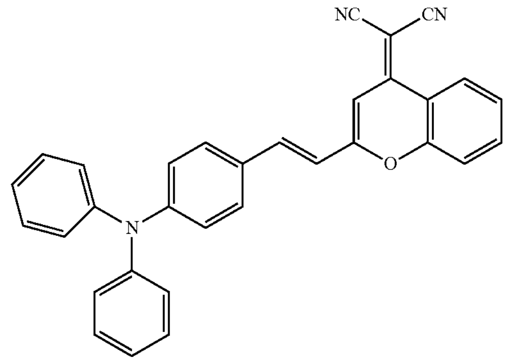
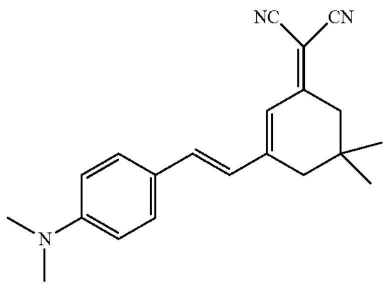
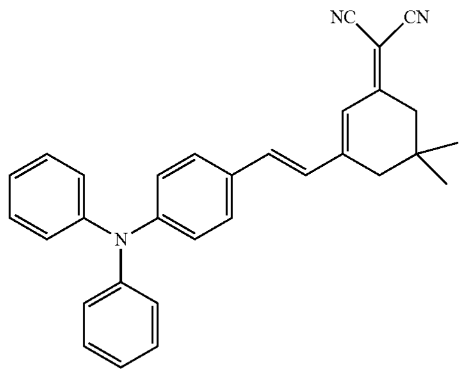
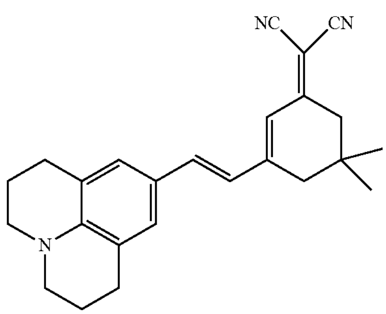
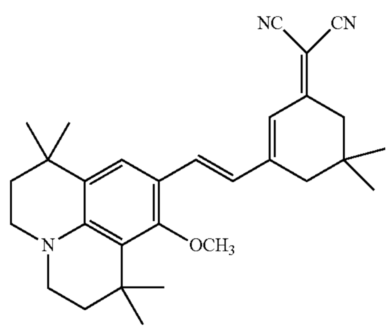
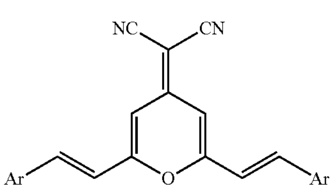
Ar =
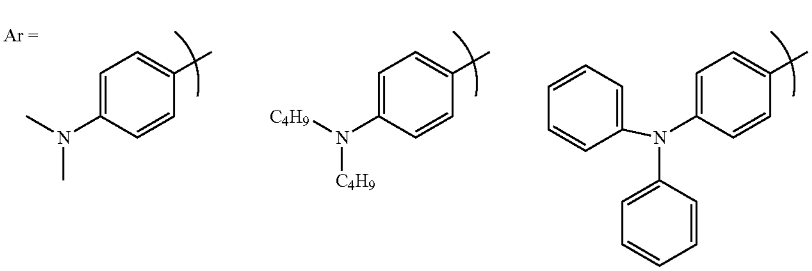

-continued
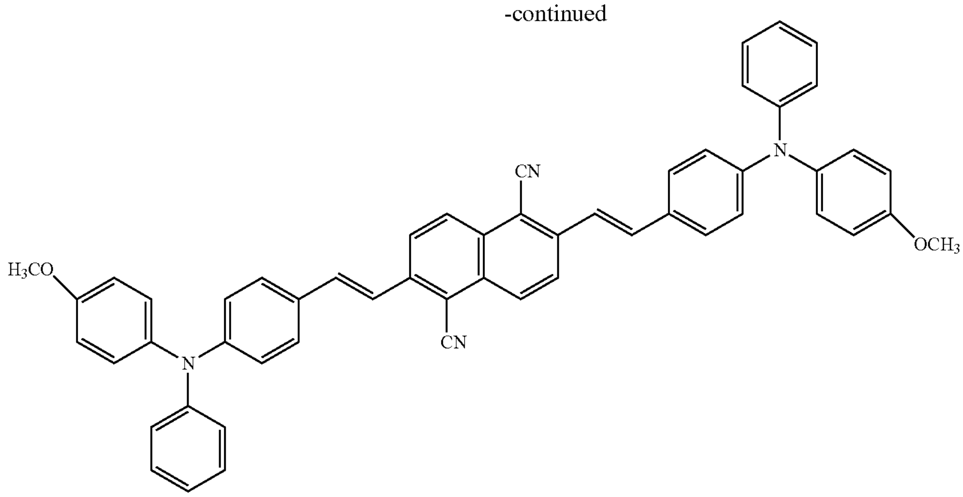
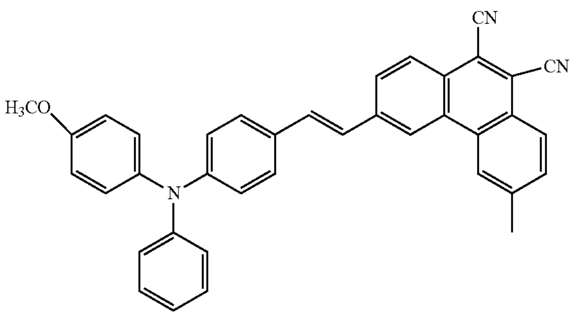
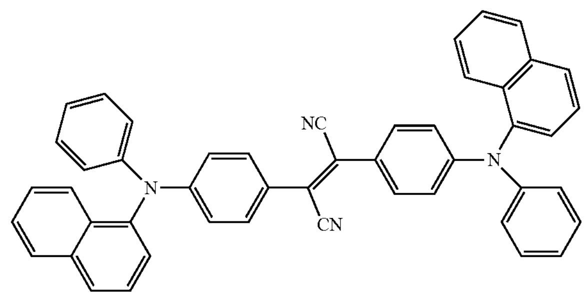
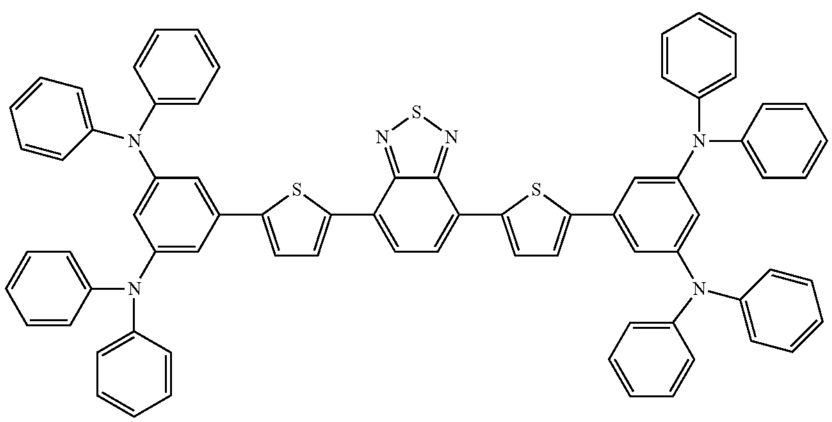
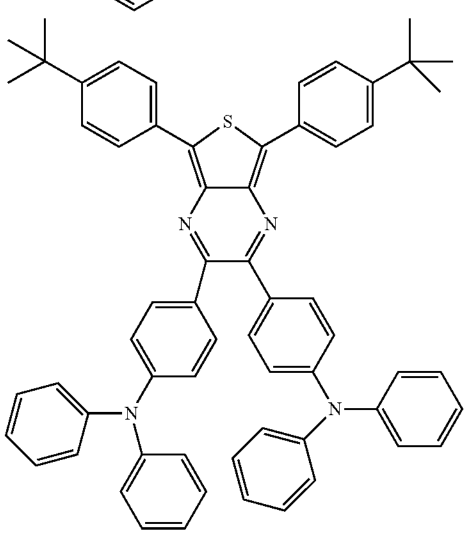
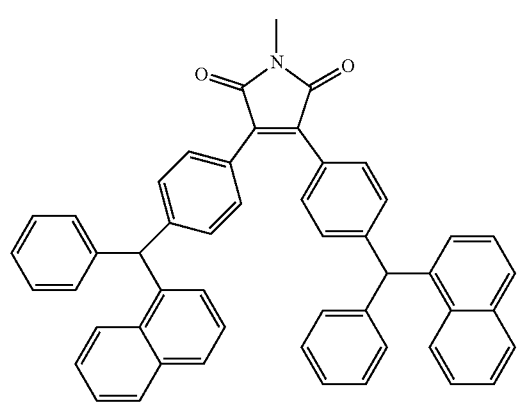

-continued
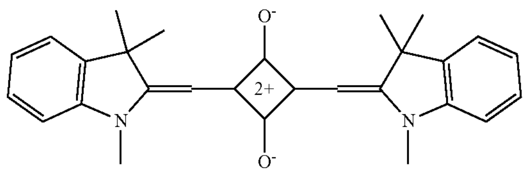
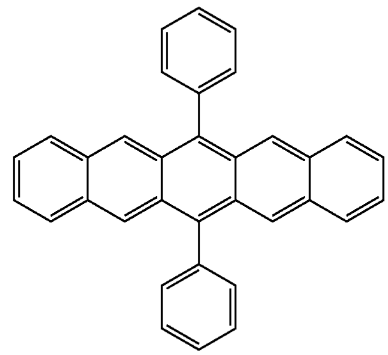
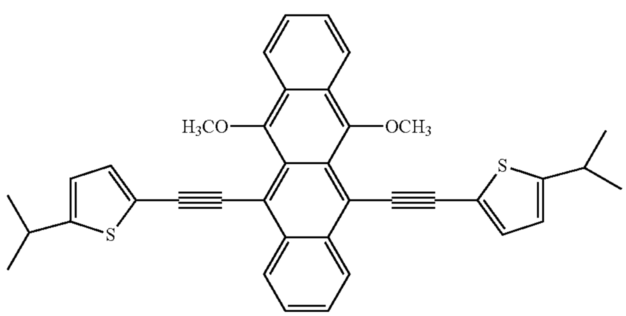
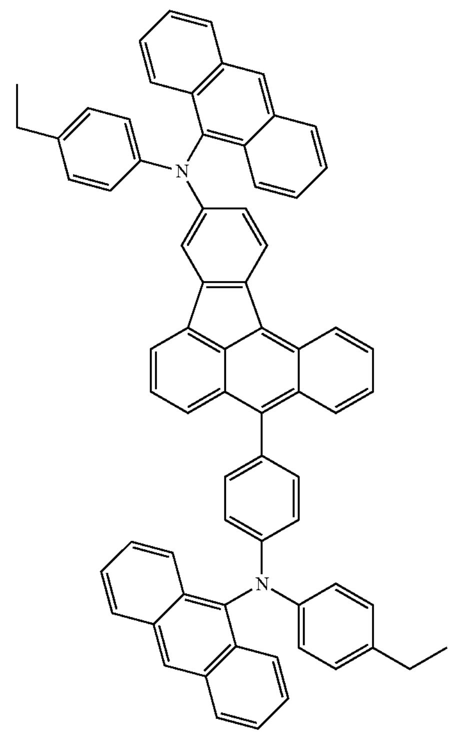
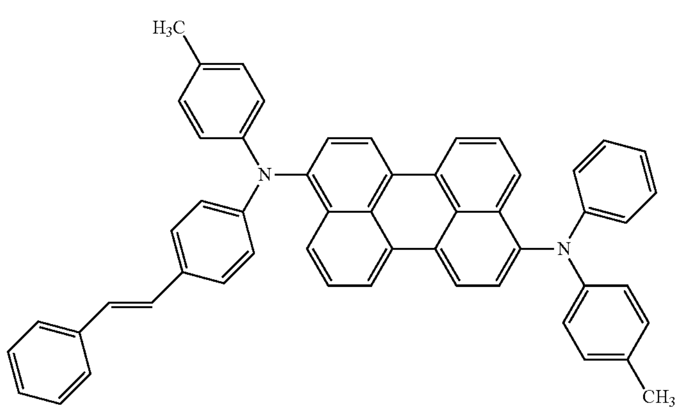
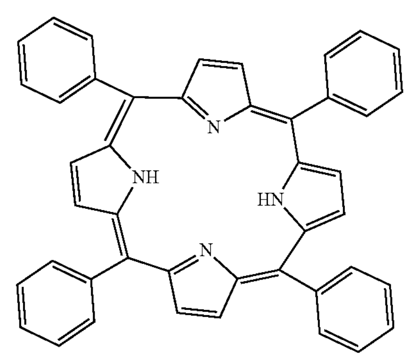

-continued
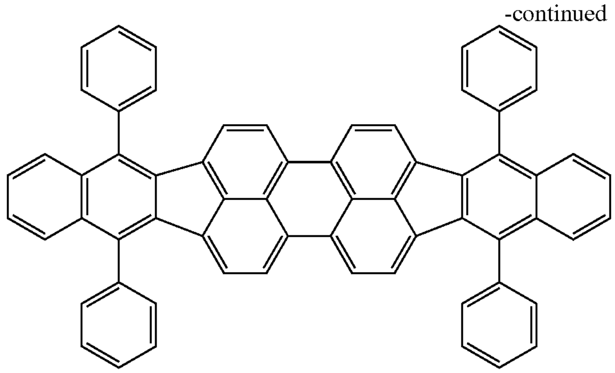
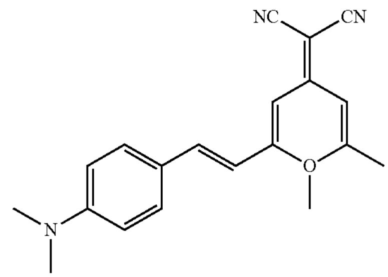
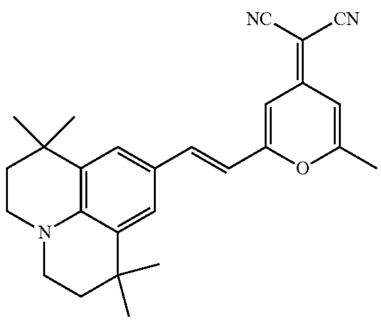
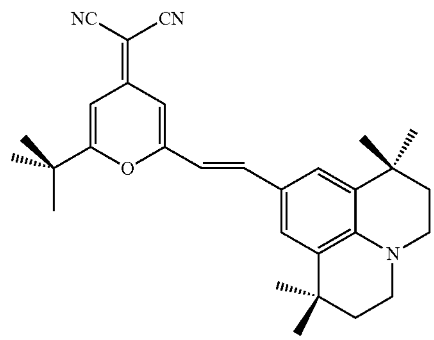
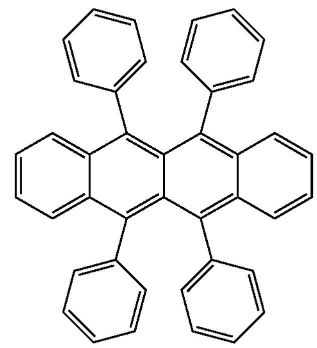
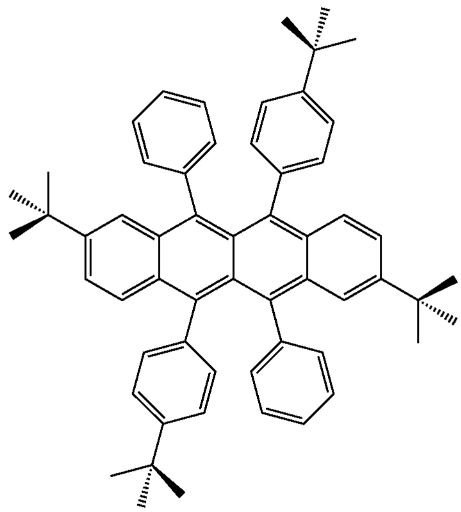
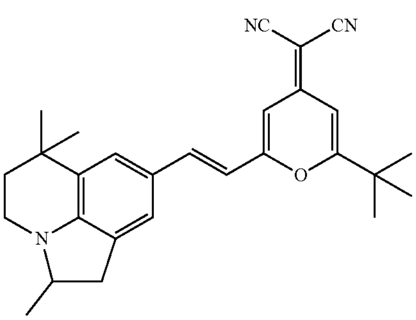
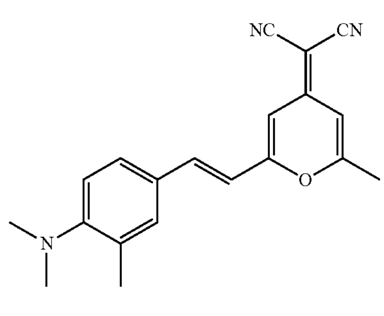

(3) Blue Light Emitting Compounds
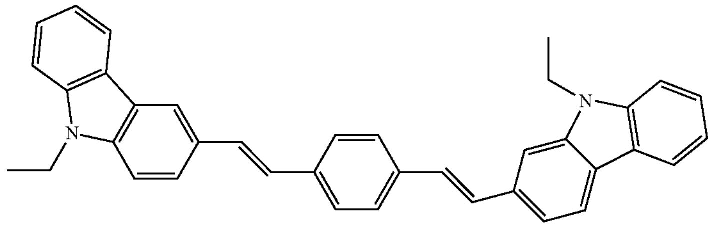
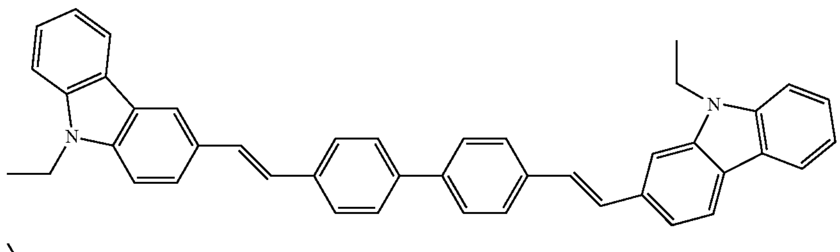
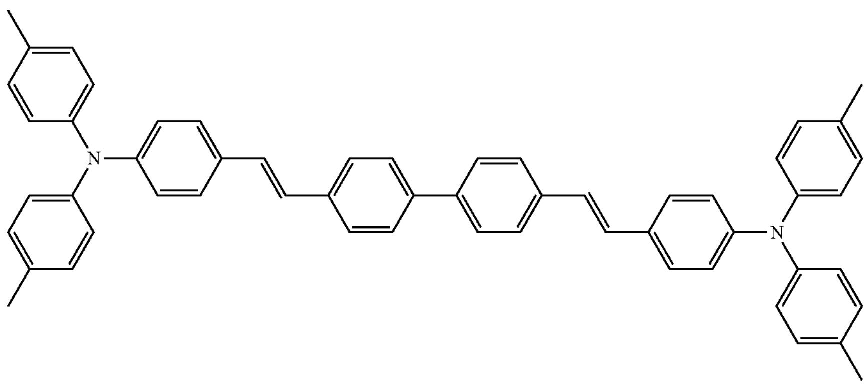
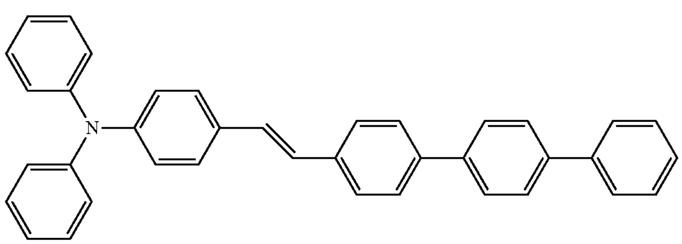
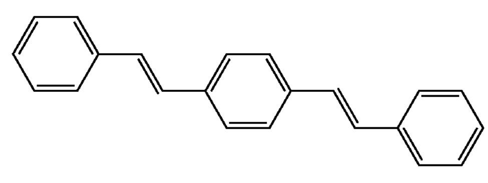
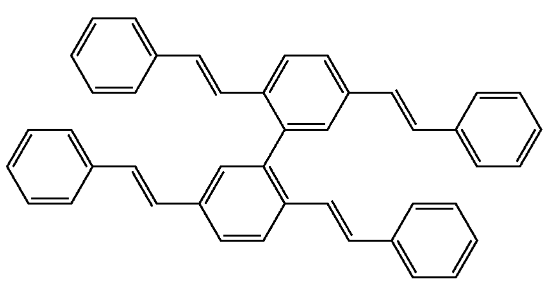
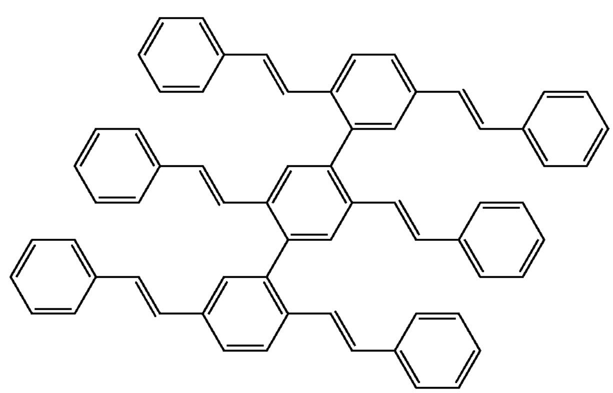

-continued
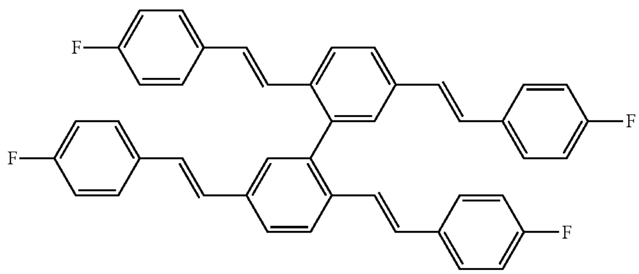
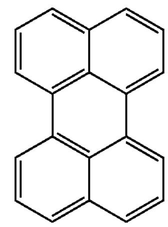
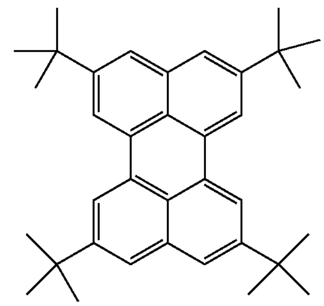
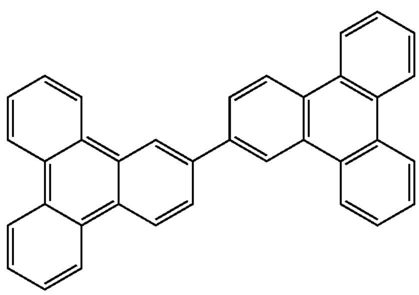
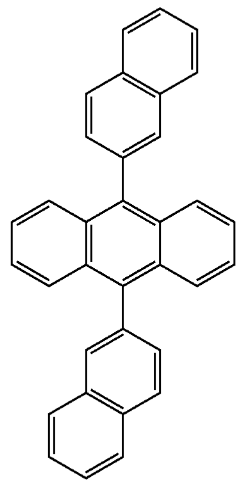
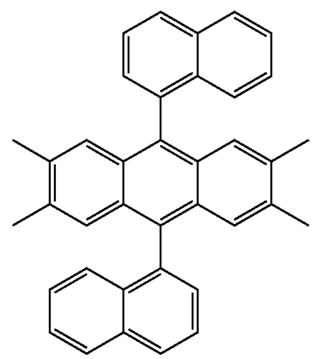
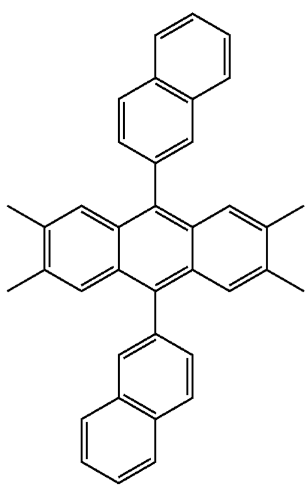
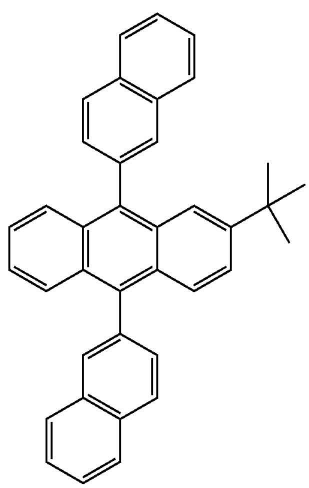
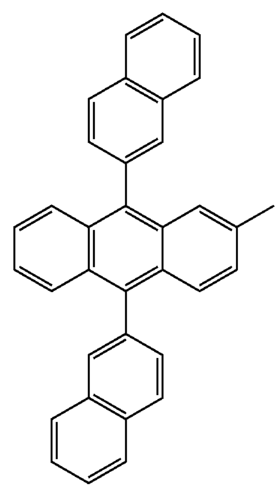
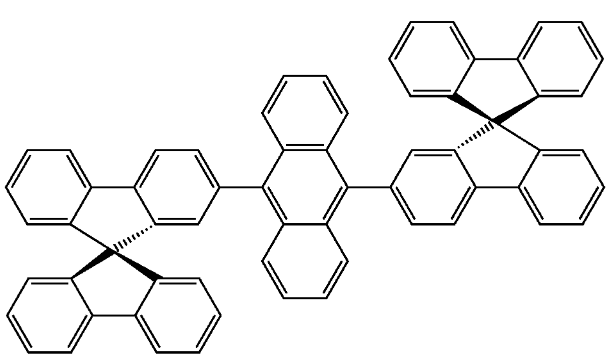

-continued
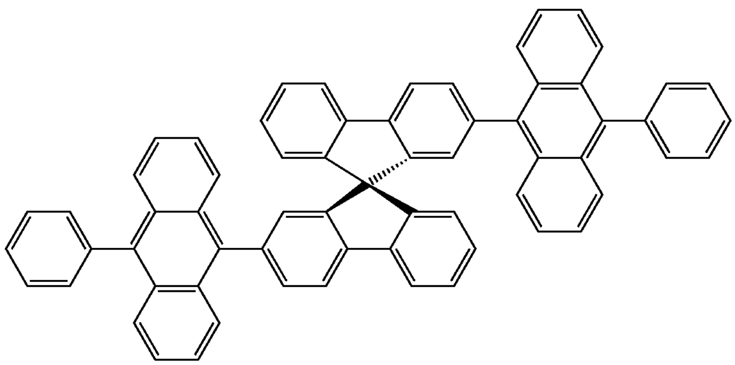
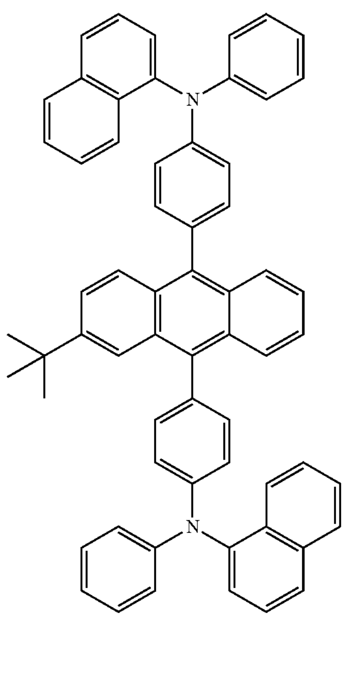
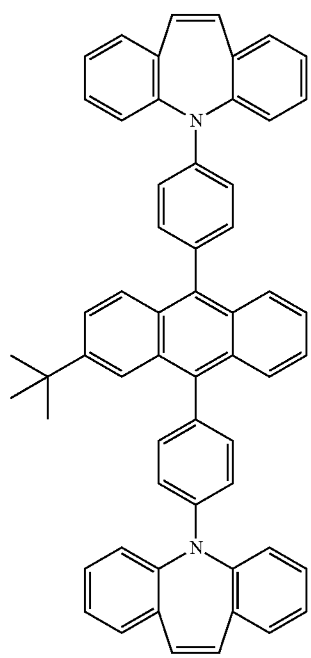
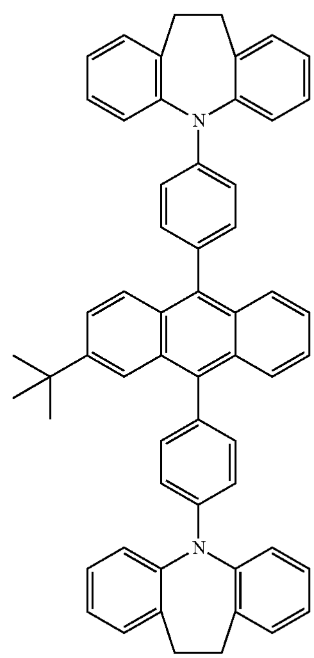

-continued
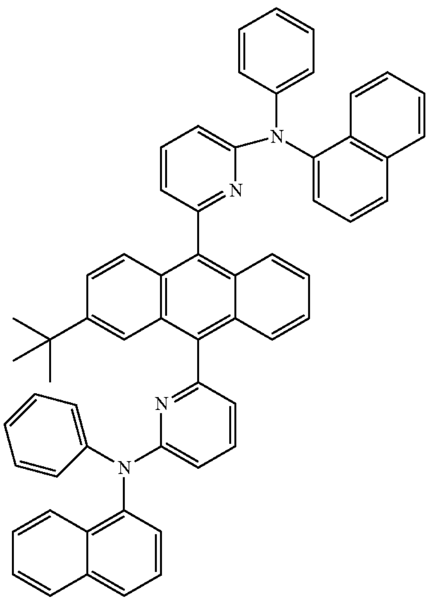
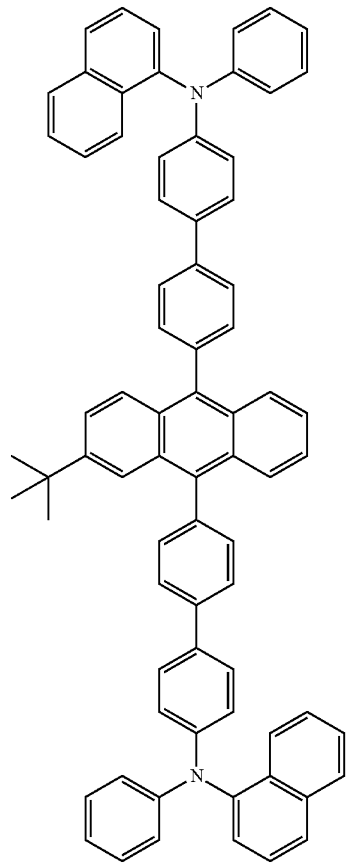
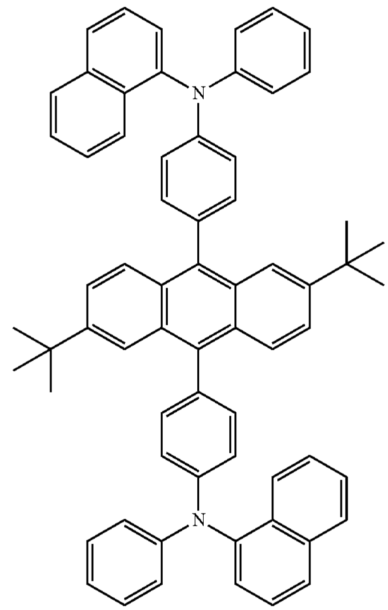
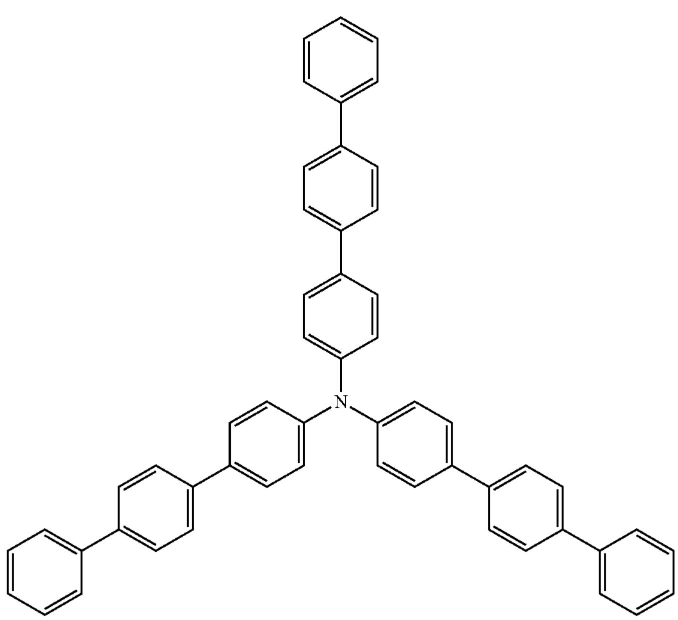
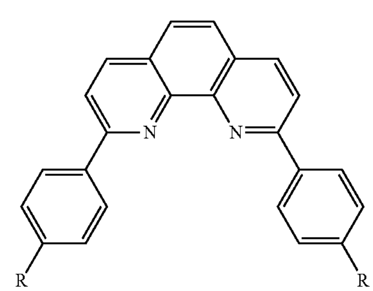

-continued
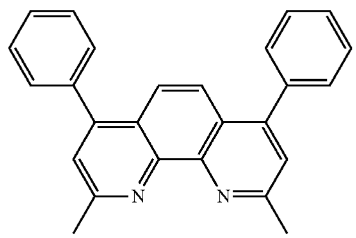
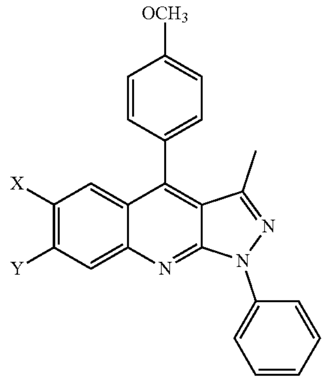
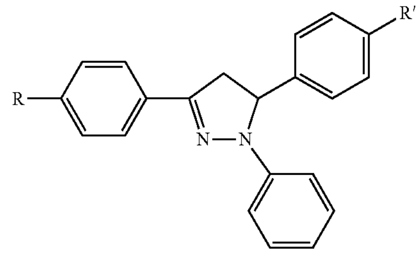
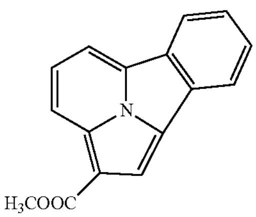
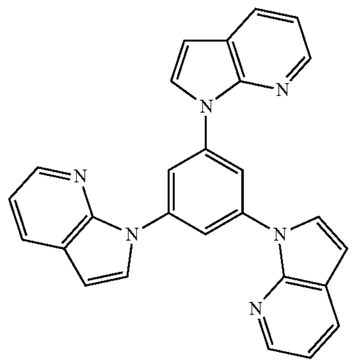
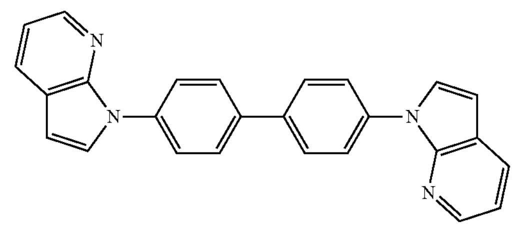
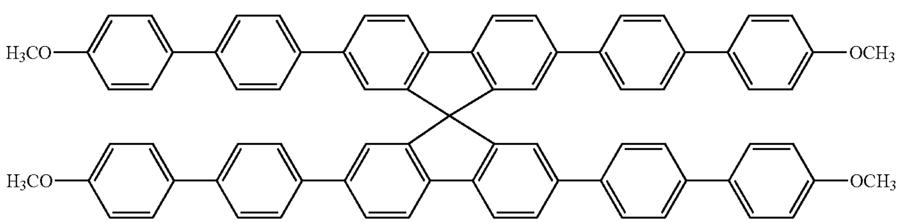
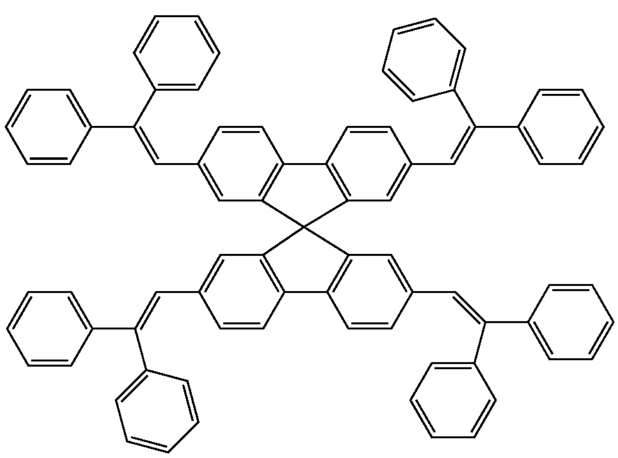

-continued
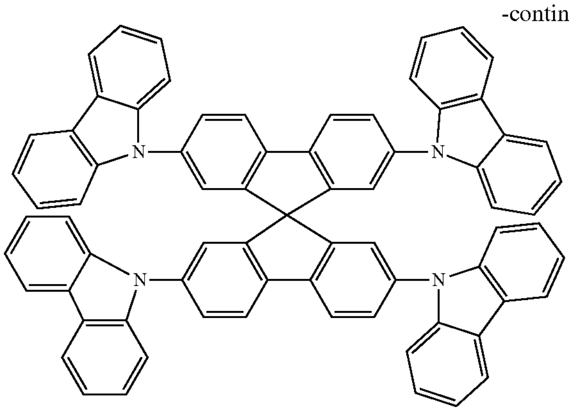
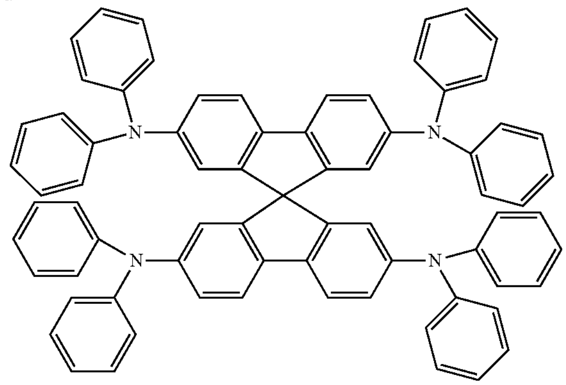
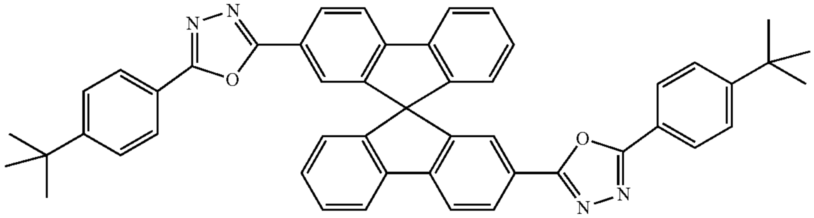
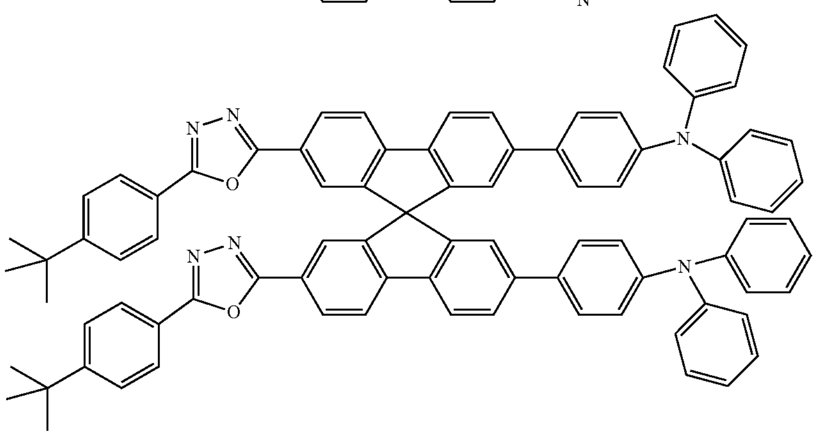
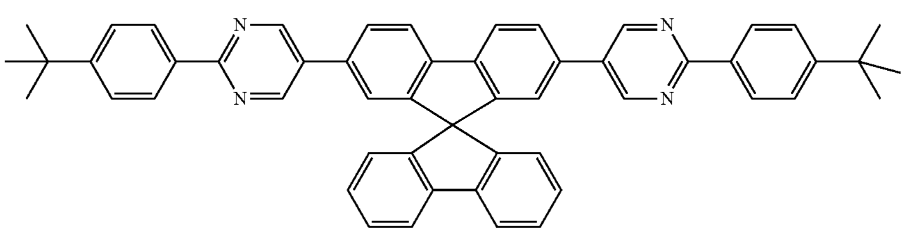
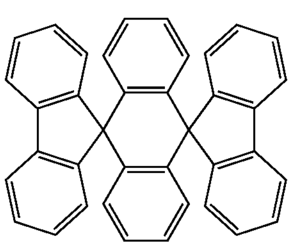
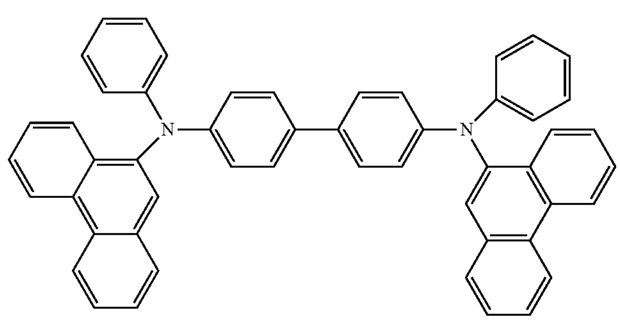

-continued
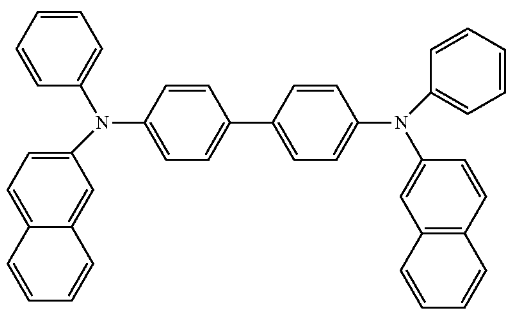
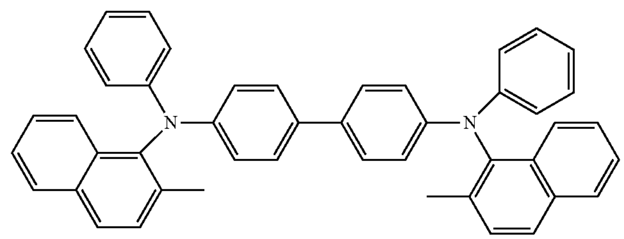
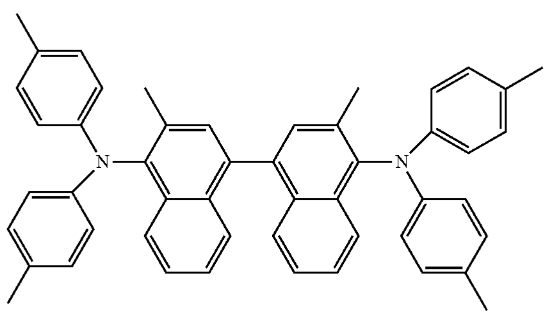
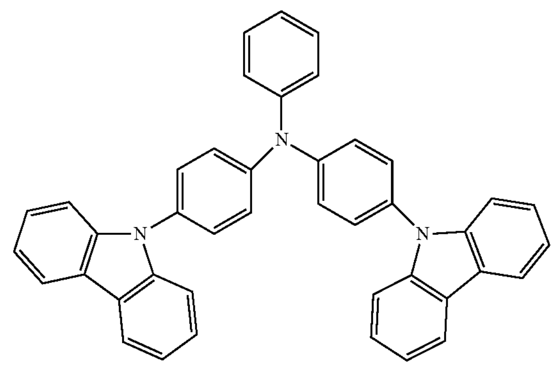
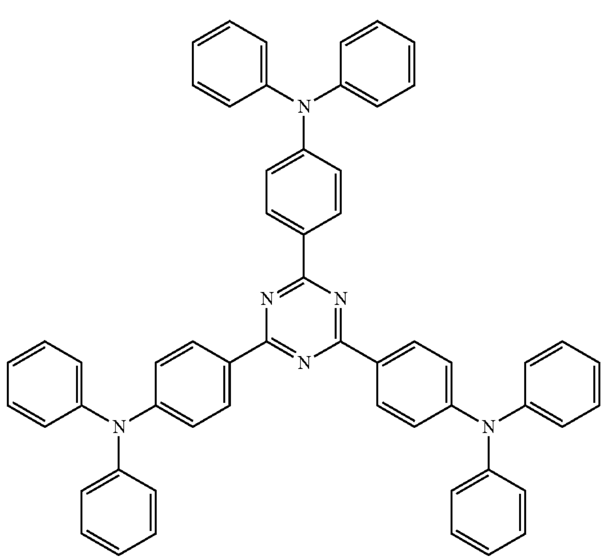
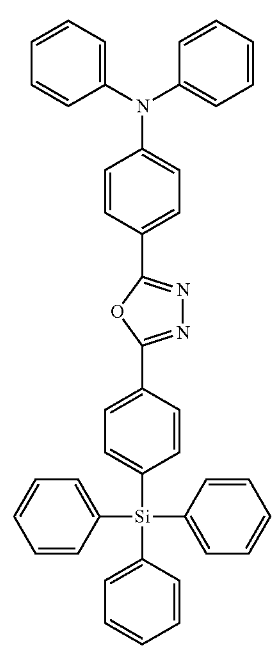

-continued
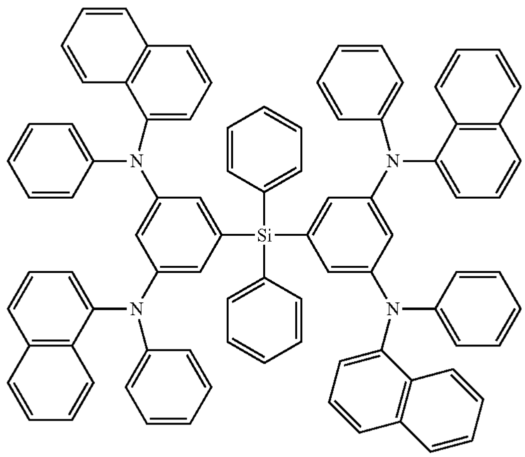
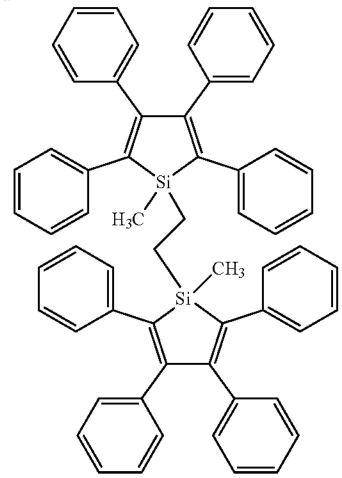
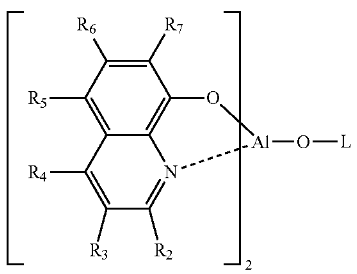
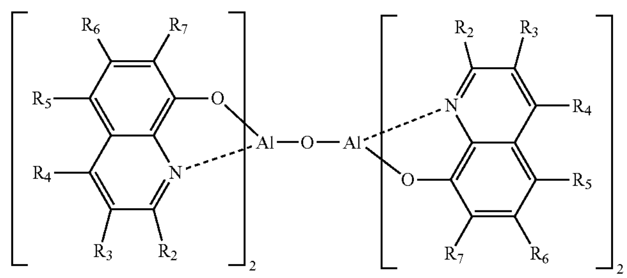
$R_2$ - $R_7$ = H or substituent
L = ligand
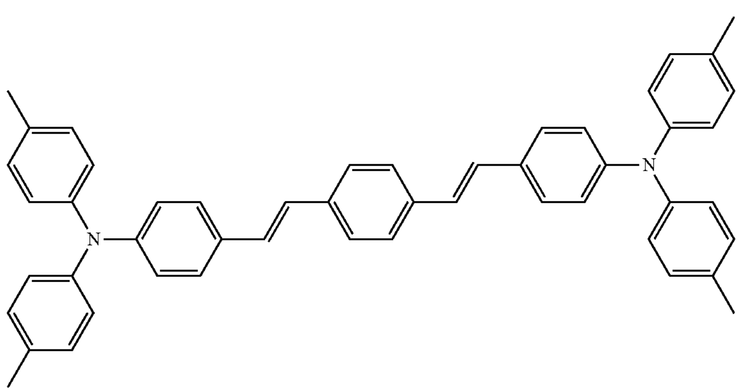
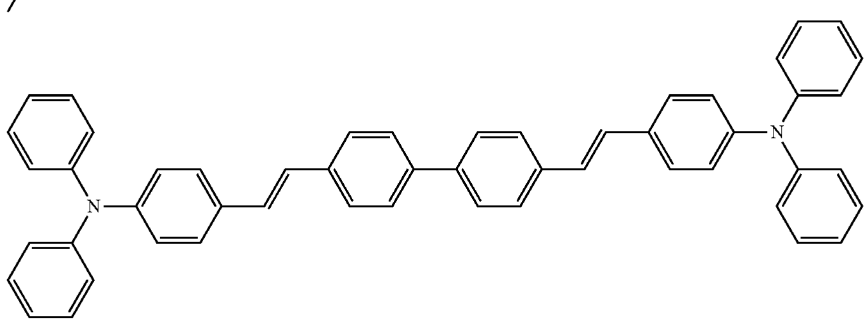

-continued
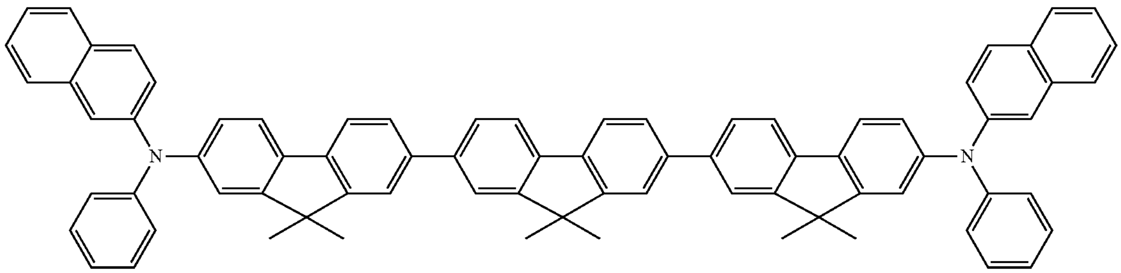
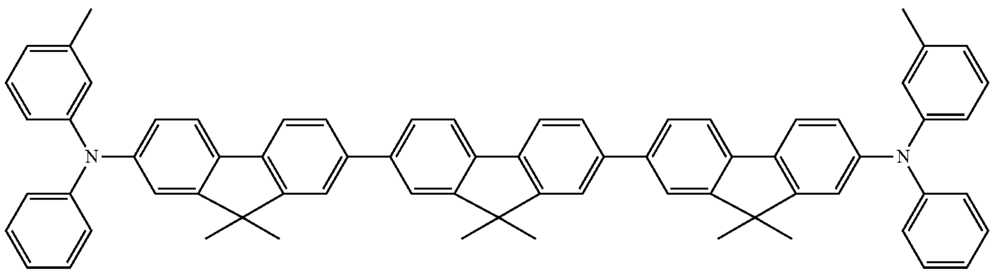
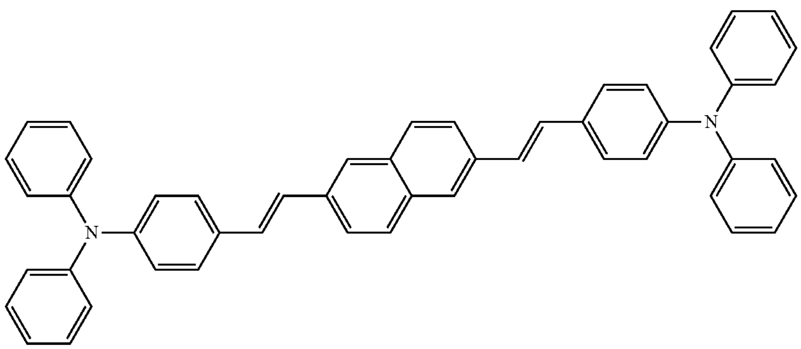
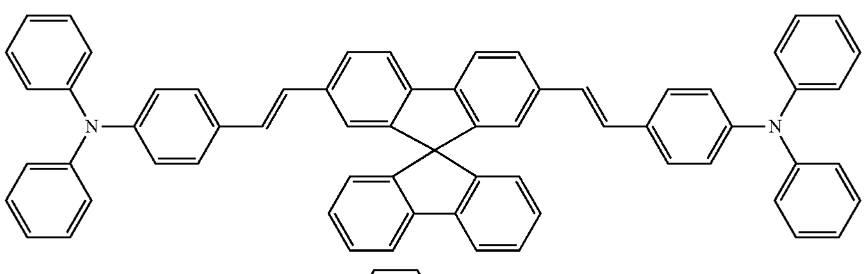
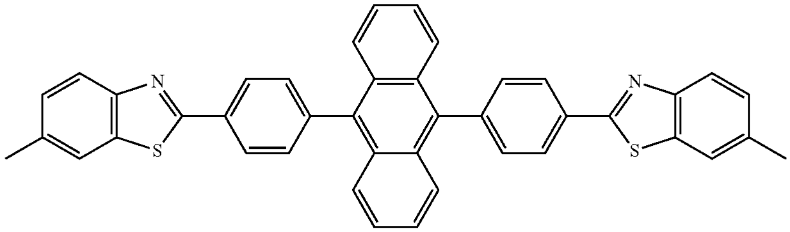
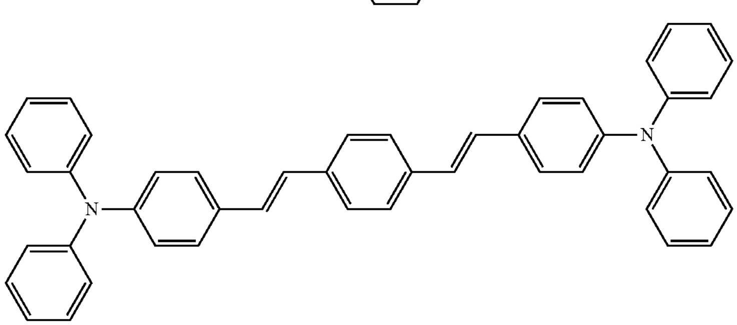

-continued
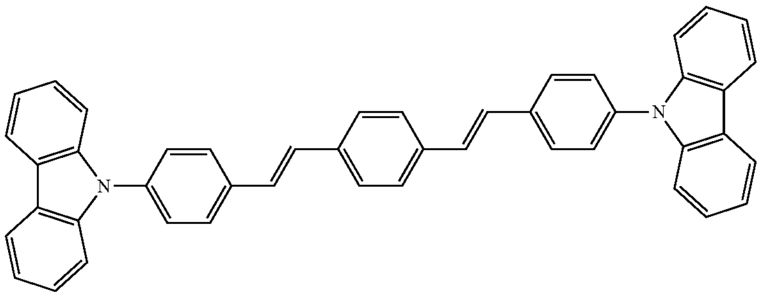
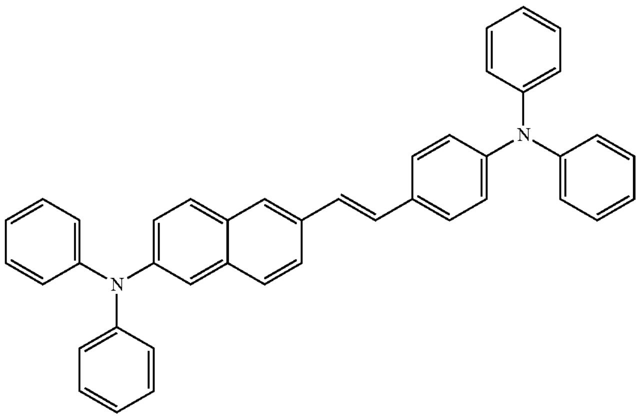
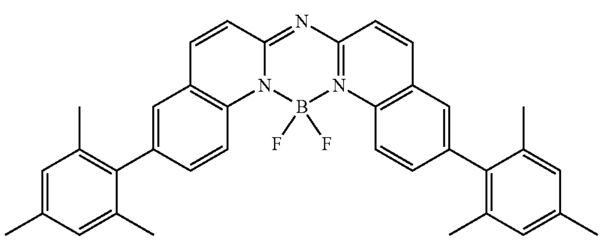
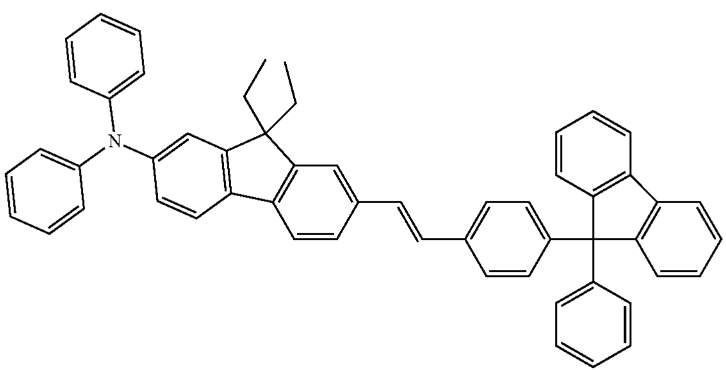
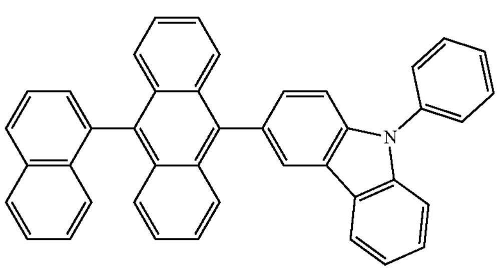

-continued
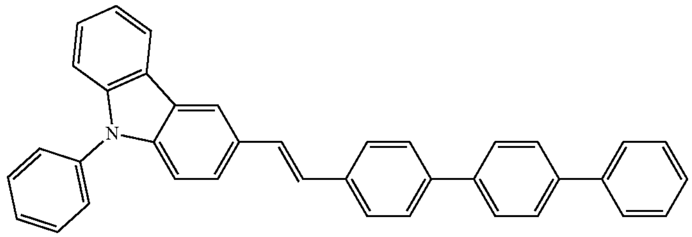
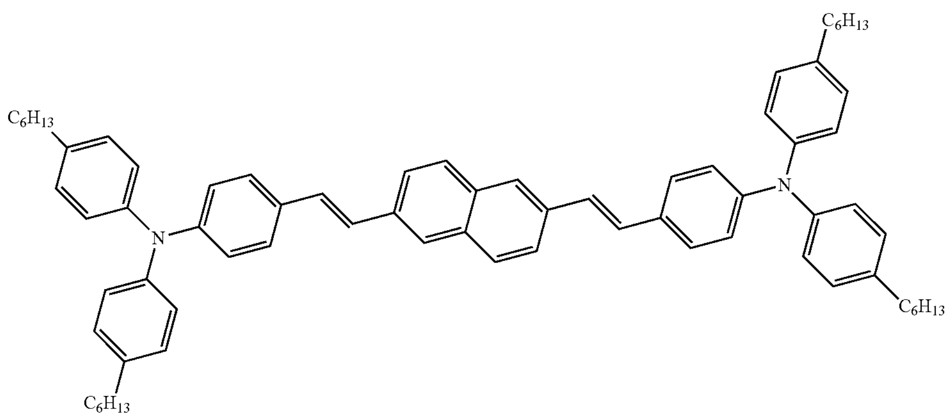
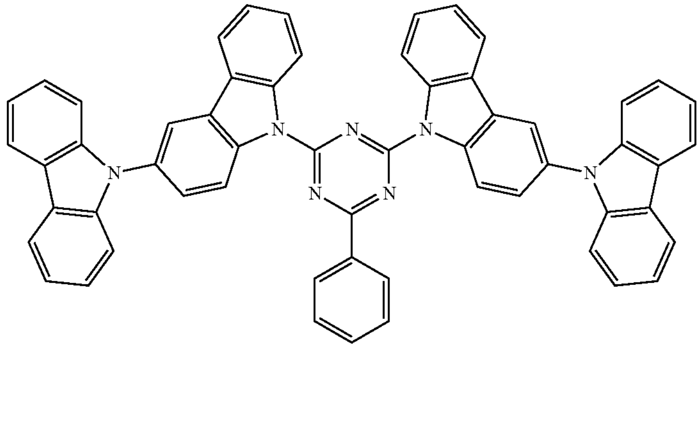
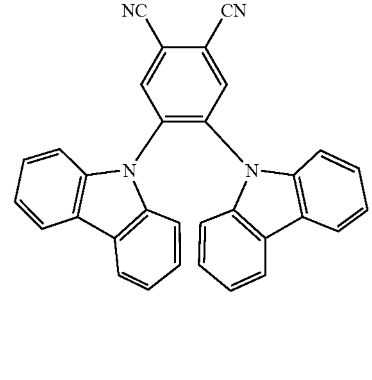

(4)

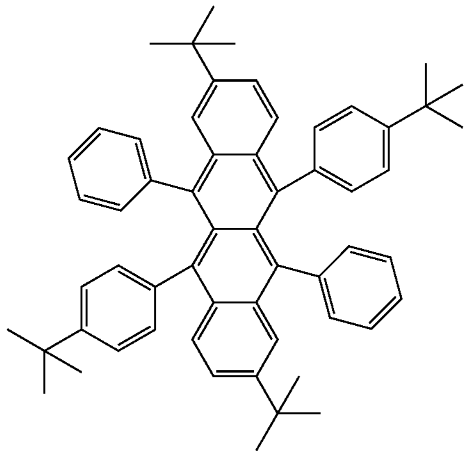

Yellow Light Emitting Compound

In addition to the above-mentioned color emitting compounds, the following compounds may also be used as light emitting materials.

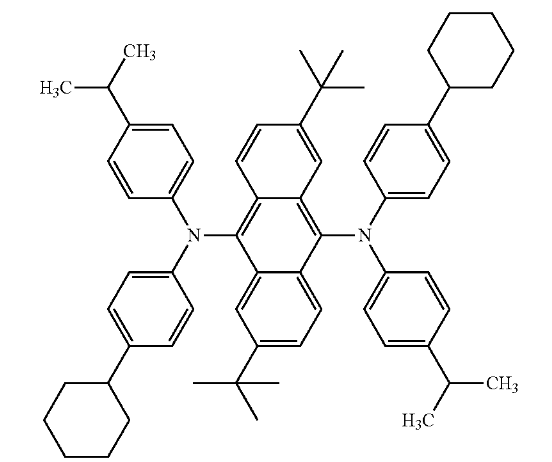

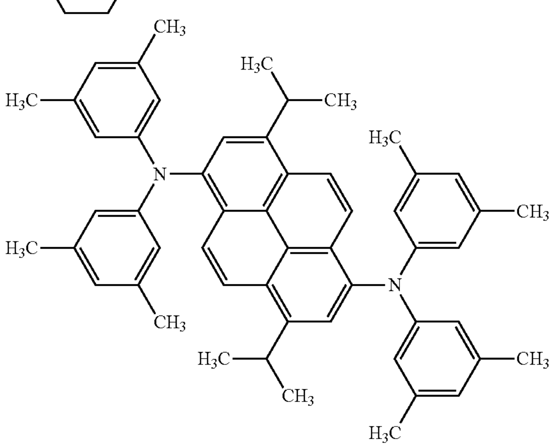

A quantum dot may also be used in the light emitting layer. A quantum dot is a nano-size semiconductor particle having a quantum confining effect. By controlling the constituent material species and the particle size of a quantum dot, the band gap value of the quantum dot may be controlled. Accordingly, a quantum dot has an advantage in that an intended quantum dot capable of emitting light in a desired wavelength range can be prepared. Consequently, using such a quantum dot, an intended emission chromaticity can be realized without using a color filer, and high efficiency can be realized. The diameter of the quantum dot usable in the present invention is preferably 2 to 10 nm, more preferably 4 to 8 nm, even more preferably 5 to 6 nm.

The constituent material species of the quantum dot for use herein is not specifically limited. In general, a quantum dot composed of one or more elements selected from Groups 14 to 16 of the Periodic Table is preferably used. For example, the quantum dot may be an elementary substance of a single element such as C, Si, Ge, Sn, P, Se or Te, or may be a compound of 2 or more elements. Examples of a quantum dot composed of 2 or more elements include SiC, $SnO_2$, $Sn(II)Sn(IV)S_3$, $SnS_2$, SnS, SnSe, SnTe, PbS, PbSe, PbTe, BN, BP, BAs, AlN, AlP AlAs, AlSb, GaN, GaP, GaAs, GaSb, InN, InP, InAs, InSb, $Al_2S_3$, $Al_2Se_3$, $Ga_2S_3$, $Ga_2Se_3$, $Ga_2Te_3$, $In_2O_3$, $In_2S_3$, $In_2Se_3$, $In_2Te_3$, TlCl, TlBr, TlI, ZnO, ZnS, ZnSe, ZnTe, CdO, CdS, CdSe, CdTe, HgS, HgSe, HgTe, $As_2S_3$, $As_2Se_3$, $As_2Te_3$, $Sb_2S_3$, $Sb_2Se_3$, $Sb_2Te_3$, $Bi_2S_3$, $Bi_2Se_3$, $Bi_2Te_3$, $Cu_2O$, $Cu_2Se$, CuCl, CuBr, CuI, AgCl, AgBr, NiO, CoO, CoS, $Fe_3O_4$, FeS, MnO, $MoS_2$, $WO_2$, VO, $VO_2$, $Ta_2O_5$, $TiO_2$, $Ti_2O_5$, $TiO_3$, $Ti_5O_9$, MgS, MgSe, $CdCr_2O_4$, $CdCr_2Se_4$, $CuCr_2S_4$, $HgCr_2Se_4$, and $BaTiO_3$. A mixture of these may also be used. Among these exemplifications, CdSe, ZnSe, CdS, and CdSeS/ZnS are preferably used. In the present invention, commercially-available quantum dots may also be used. For example, Model Numbers 753785 and 753742 by Aldrich Corporation are preferably used.

The quantum dot for use in the present invention may be surface-coated.

A film of such a quantum dot may be formed according to a spin-coating method using a suitable solvent. Examples of the solvent include toluene, hexane, halogen solvent, alcohol solvent, water.

The light emitting layer may be formed of a light emitting material alone, or may contain any other material. The lower limit of the content of the light emitting material in the light emitting layer may be, for example, more than 0.1% by mass, more than 1% by mass, more than 5% by mass, or more than 10% by mass, and even may be more than 20% by mass, more than 50% by mass, or more than 75% by mass. Further, the concentration may be not only constant throughout the layer but also may have a concentration gradient in the thickness direction of the light emitting layer. The other material includes a host material. The host material is preferably such that at least the lowest excited singlet energy level $E_{S1}$ thereof is higher than the lowest excited singlet energy level $E_{S1}$ of the light emitting material in the layer. With that, the energy of the host material in an excited singlet state may be smoothly transferred to the light emitting material and the excited singlet energy of the light emitting material may be confined in the molecule of the light emitting material and therefore the emission efficiency of the material can be sufficiently exhibited. Specific examples of the host material for use in the light emitting layer may be the same as the specific examples of the host material exemplified in the section of "Exciton Generation Layer" given hereinabove. The light emitting layer may have such a configuration that the light emitting material therein is dispersed in a polymer material (binder resin) or an inorganic material. In the case where a host material is used, preferably, the content of the light emitting material in the light emitting layer is 50% by weight or less, and in consideration of efficiency, the content may be 25% by weight or less, 10% or less, or 5% or less.

Preferably, the light emitting layer does not contain a compound satisfying the expression (1) or an exciplex (that is, the content thereof is zero). However, an embodiment that contains a compound satisfying the expression (1) or an exciplex to emit delayed fluorescence in a small amount within a range not having any negative influence on the advantageous effects of the present invention is not completely excluded. Specifically, the light emitting layer may contain a compound satisfying the expression (1) or an exciplex to emit delayed fluorescence in an amount falling within a range not having any negative influence on the advantageous effects of the present invention, for example, in an amount of 0.1% by weight or less, preferably 0.01% by weight or less, more preferably 0.001% by weight or less.

Not specifically limited, the thickness of the light emitting layer is preferably 1 nm or more, more preferably 3 nm or more, and may be 10 nm or more, or 50 nm or more. With that, the energy of the compound satisfying the expression (1) and having transitioned in an excited triplet state and the exciplex to emit delayed fluorescence can be more surely prevented from transferring toward the light emitting material in the light emitting layer to secure high emission efficiency. From the viewpoint of thinning the organic light emitting device, the thickness of the light emitting layer is preferably 10 nm or less, more preferably 8 nm or less, even more preferably 6 nm or less.

Preferably, the exciton generation layer and the light emitting layer contain a compound that differs from all the compound satisfying the expression (1) and the compound to emit delayed fluorescence contained in the exciton generation layer and the light emitting material contained in the light emitting layer. (In this description, such a compound is referred to as "a carrier transporting compound".) The carrier transporting compound is selected from a host compound, an electron transporting compound, and a compound functioning as an electron transporting compound. In the case where the organic light emitting device has an isolation layer, also preferably, the isolation layer contains such a carrier transporting compound. In the case where the device has two or more exciton generation layers, preferably, at least one of the layers contains a carrier transporting compound, and more preferably all the layers contain a carrier transporting compound. In the case where the device has two or more isolation layers, at least one of the layers preferably contains a carrier transporting compound, and more preferably all the layers contain a carrier transporting compound. When plural layers constituting the organic light emitting device contain a carrier transporting compound, the carrier transporting compounds in those layers may be the same as or different from each other. For example, the carrier transporting compound, if any, in the light emitting layer and the exciton generation layer may be the same as or different from each other.

The carrier transporting compound as referred to herein includes the compounds for use as a host material as described in the section of "Exciton Generation Layer" and "Light Emitting Layer". The exciton generation layer and the light emitting layer may be composed of a carrier transporting compound alone except the compound satisfying the expression (1) and the compound to emit delayed fluorescence therein, or a part thereof may be composed of a carrier transporting compound, but is preferably composed of a carrier transporting compound alone. The isolation layer may be composed of a carrier transporting compound alone, or a part thereof may be composed of a carrier transporting compound, but is preferably composed of a carrier transporting compound alone.

One kind or two or more kinds of carrier transporting compounds may be contained in each layer. In the case where two or more kinds of carrier transporting compounds are contained, the abundance ratio thereof may differ in each layer.

In the organic light emitting device of the present invention, the light emitting material that the light emitting layer therein contains assumes emission. However, a part of emission from the device may be from the compound satisfying the expression (1) or the exciplex to emit delayed fluorescence that the exciton generation layer therein contains or from the host material that the exciton generation layer or the isolation layer therein contains. In the present invention, preferably, 25% or more of emission is from the light emitting material, more preferably 50% or more of emission is from the light emitting material, even more preferably 80% or more of emission is from the light emitting material, further more preferably 90% or more of emission is from the light emitting material, and even further more preferably 99% or more of emission is from the light emitting material.

Emission is fluorescence emission, and may include delayed fluorescence emission or phosphorescence emission. Delayed fluorescence is fluorescence that is emitted by a compound having been in an excited state after given energy in such a manner that, after the compound has undergone reverse intersystem crossing to be in an excited singlet stat from an excited triplet state, the compound in the excited singlet state is restored to be a ground state to emit fluorescence, that is, the fluorescence is observed after the fluorescence (normal fluorescence) to be directly given from the original excited singlet state of the compound.

[Isolation Layer]

The organic light emitting device of the present invention may further has an isolation layer between the exciton generation layer and the light emitting layer therein. Having an isolation layer, the distance between the compound satisfying the expression (1) or the exciplex to emit delayed fluorescence contained in the exciton layer and the light emitting material contained in the light emitting layer in the device can be long, and therefore the energy of the compound satisfying the expression (1) and having transitioned to be in an excited triplet state or the exciplex to emit delayed fluorescence in the exciton generation layer can be more surely prevented from transferring to the light emitting material through Dexter electron transfer. As a result, it is presumed that the probability that the compound satisfying the expression (1) or the exciplex to emit delayed fluorescence may undergo reverse intersystem crossing to be in an excited singlet state from an excited triplet state could be high, and therefore the energy of the compound satisfying the expression (1) and having transitioned to be in an excited triplet state or the exciplex to emit delayed fluorescence can be efficiently consumed for fluorescence emission.

In the case where the exciton generation layer is arranged on both the anode side and the cathode side of the light emitting layer, an isolation layer may be arranged only between any one exciton generation layer and the light emitting layer, or an isolation layer may be arranged between both the exciton generation layers and the light emitting layer. Preferably, the isolation layer is arranged for both the exciton generation layers.

The material of the isolation layer may be an inorganic material, an organic material or an organic/inorganic composite material having an inorganic part and an organic part, but preferably contains an organic compound, and is more preferably composed of an organic compound alone.

In the case where the organic light emitting device has plural isolation layers, the material of each isolation layer may be the same or different, but preferably each isolation layer contains a carrier transporting compound. Plural isolation layers may be entirely composed of a carrier transporting compound, or may be partly composed of a carrier transporting compound, but preferably, the layers are entirely composed of a carrier transporting material. One kind of a carrier transporting material may form plural isolation layers, or two or more kinds of carrier transporting material may form plural isolation layers.

Preferably, at least one isolation layer and the light emitting layer contain a carrier transporting compound that differs from the light emitting material in the light emitting layer. Regarding the carrier transporting material that differs from the light emitting material, reference may be made to the compounds described for use as the host material in the section of "Light Emitting Layer". The isolation layer may be entirely composed of the same carrier transporting compound as in the light emitting layer, or may be partly composed of the same carrier transporting compound as in the light emitting layer, but preferably, the isolation layer is entirely composed of the same carrier transporting compound as in the light emitting layer. The remaining part of the material except the light emitting material in the light emitting layer may be entirely composed of the same carrier transporting compound as in at least one isolation layer, or a part of the remaining part thereof may be composed of the same carrier transporting compound as in the isolation layer, but preferably, the whole extent of the material except the light emitting material in the light emitting material is composed of the same carrier transporting compound as in the isolation layer. One kind or two or more kinds of carrier transporting compounds may form the light emitting layer or the isolation layer.

The thickness of the isolation layer is preferably 10 nm or less, more preferably 5 nm or less, even more preferably 3 nm or less, further more preferably 1.5 nm or less, and especially preferably 1.3 nm or less. With that, the driving voltage for the organic light emitting device may be lowered. The thickness of the isolation layer is, from the viewpoint of preventing transfer of excited triplet energy from the compound satisfying the expression (1) or the exciplex to emit delayed fluorescence to the light emitting material, preferably 0.1 nm or more, more preferably 0.5 nm or more, even more preferably 1 nm or more.

[Other Layers]

In the case where the organic light emitting device is an organic electroluminescent device, a layer may be further formed therein so as to be in direct contact with the layer existing nearest to the anode side among the light emitting layer and the exciton generation layer therein, or so as to be in direct contact with the layer existing nearest to the cathode side among the light emitting layer and the exciton generation layer, a layer may be formed on both sides of the layer. The layer to be formed in such direct contact is referred to as an outer layer for descriptive purposes. The organic light emitting device of the present invention may include a configuration of "outer layer/light emitting layer/(isolation layer)/exciton generation layer". "outer layer/exciton generation layer/light emitting layer", "light emitting layer/(isolation layer)/exciton generation layer/outer layer", and "exciton generation layer/(isolation layer)/light emitting layer/outer layer".

The material of the outer layer may be any of an inorganic material, an organic material or an organic/inorganic composite material having an inorganic part and an organic part, but preferably contains an organic/inorganic composite material or an organic compound. The layer may also be a co-deposited film containing an organic compound.

In the case where the device has an outer layer on both the anode side and the cathode side, the material of these outer layers may be the same or different. Preferably, the outer layer contains a carrier transporting compound. In the case where the light emitting layer and the exciton generation layer (and the isolation layer) contain a carrier transporting compound, preferably, the outer layer contains that compound. Regarding the compound, reference may be made to the host material described in the section of "Exciton Generation Layer" and "Light Emitting Layer". The outer layer may be entirely composed of the same carrier transporting compound as in the exciton generation layer and the light emitting layer (and the isolation layer), or a part thereof may be composed of the carrier transporting compound, but preferably the outer layer is entirely composed of the carrier transporting compound. The outer layer may contain one kind or two or more kinds of carrier transporting compounds.

The exciton generation layer, the light emitting layer, the isolation layer and the outer layer may optionally contain additives (e.g., donor, acceptor).

[Specific Embodiments of Organic Light Emitting Device]

The organic light emitting device of the present invention has, as described above, at least an exciton generation layer and a light emitting layer, and may have an isolation layer between them, and may have an outer layer on the anode side or the cathode side of the layers. In the following description, an entire laminate structure composed of an exciton generation layer and a light emitting layer, and an entire laminate structure having at least any one of an isolation layer and an outer layer added to the laminate structure of an exciton generation layer and a light emitting layer will be referred to as "light emitting part".

The organic light emitting device of the present invention may be any of an organic photoluminescent device (organic PL device) and an organic electroluminescent device (organic EL device). An organic photoluminescent device has a structure having at least a light emitting part formed on a substrate.

An organic electroluminescent device has a structure where an organic EL layer containing at least a light emitting part is sandwiched between a pair of electrodes. Preferably, an organic electroluminescent device has a configuration of a first electrode, an organic EL layer, and a second electrode laminated in that order on a substrate. In this case, the organic electroluminescent device may be a bottom emission type of taking the light generated in the light emitting part outside through the side of the substrate, or may be a top emission type of taking the light generated in the light emitting part outside through the opposite side of the substrate (on the second electrode side).

The first electrode and the second electrode function, as paired with each other, as an anode or a cathode of the organic electroluminescent device. Specifically, in the case where the first electrode is an anode, the second electrode is a cathode, and where the first electrode is a cathode, the second electrode is an anode.

The organic EL layer may be formed of a light emitting part, or may have one or more other functional layers in addition to a light emitting part. The other functional layers include a hole injection layer, a hole transport layer, an electron blocking layer, a hole blocking layer, an electron transport layer, an electron injection layer, and an exciton blocking layer. The hole transport layer may be a hole injection transport layer having a hole injecting function, or may be an electron injection transport layer having an electron injecting function. Specific layer configurations of the organic EL layer (organic layer) are shown below. However, the layer configuration of the organic EL layer for use in the present invention should not be limited to these exemplifications. In the following layer configurations, the hole injection layer, the hole transport layer and the electron blocking layer are arranged on the anode side than the light emitting part, and the hole blocking layer, the electron transport layer and the electron injection layer are arranged on the cathode side than the light emitting part.

(1) light emitting part (2) hole transport layer/light emitting part (3) light emitting part/electron transport layer (4) hole injection layer/light emitting part (5) hole transport layer/light emitting part/electron transport layer (6) hole injection layer/hole transport layer/light emitting part/electron transport layer (7) hole injection layer/hole transport layer/light emitting part/electron transport layer/electron injection layer (8) hole injection layer/hole transport layer/light emitting part/hole blocking layer/electron transport layer (9) hole injection layer/hole transport layer/light emitting part/hole blocking layer/electron transport layer/electron injection layer

(10) hole injection layer/hole transport layer/electron blocking layer/light emitting part/electron transfer layer

(11) hole injection layer/hole transport layer/electron blocking layer/light emitting part/electron transport layer/electron injection layer

(12) hole injection layer/hole transport layer/electron blocking layer/exciton blocking layer/light emitting part/hole blocking layer/electron transport layer

(13) hole injection layer/hole transport layer/electron blocking layer/exciton blocking layer/light emitting part/hole blocking layer/electron transport layer/electron injection layer

(14) hole injection layer/hole transport layer/electron blocking layer/light emitting part/exciton blocking layer/hole blocking layer/electron transport layer

(15) hole injection layer/hole transport layer/electron blocking layer/light emitting part/exciton blocking layer/hole blocking layer/electron transport layer/electron injection layer

(16) hole injection layer/hole transport layer/electron blocking layer/exciton blocking layer/light emitting part/exciton blocking layer/hole blocking layer/electron transport layer

(17) hole injection layer/hole transport layer/electron blocking layer/exciton blocking layer/light emitting part/exciton blocking layer/hole blocking layer/electron transport layer/electron injection layer

(18) hole injection layer/hole transport layer/electron blocking layer/light emitting part/hole blocking layer/electron transport layer

(19) hole injection layer/hole transport layer/electron blocking layer/light emitting part/hole blocking layer/electron transport layer/electron injection layer

(20) hole injection layer/hole transport layer/electron blocking layer/exciton blocking layer/light emitting part/exciton blocking layer/hole blocking layer/electron transport layer

(21) hole injection layer/hole transport layer/electron blocking layer/exciton blocking layer/light emitting part/exciton blocking layer/hole blocking layer/electron transport layer/electron injection layer FIG. 1 shows a typical example of an organic electroluminescent device having a layer configuration of (6). In FIG. 1, 1 is a substrate, 2 is an anode, 3 is a hole injection layer, 4 is a hole transport layer, 5 is a light emitting part, 6 is an electron transport layer, and 7 is a cathode.

The light emitting part is composed of an exciton generation layer, an isolation layer, a light emitting layer and others.

The layers constituting the light emitting part, and the hole injection layer, the hole transport layer, the electro blocking layer, the hole blocking layer, the electron transport layer and the electron injection layer each may have a single-layer configuration or a multilayer configuration, or each may be formed of two or more kinds of materials like a co-deposited film. The materials of the hole injection layer, the hole transport layer, the electron blocking layer, the hole blocking layer, the electron transport layer and the electron injection layer may be organic materials or may also be inorganic materials.

In the following, the members and the layers constituting an organic electroluminescent device are described in detail with reference to an example case where the first electrode (electrode on the substrate side) is an anode and the second electrode (electrode on the opposite side to the substrate) is a cathode. In this case, a hole injection layer, a hole transport layer and an electron blocking layer are arranged between the light emitting part and the first electrode (on the substrate side than the light emitting part), and an electron injection layer, an electron transport layer and a hole blocking layer are arranged between the light emitting part and the second electrode. On the other hand, in the case where the first electrode (electrode on the substrate side) is a cathode and the second electrode (electrode on the opposite side to the substrate) is an anode, an electron injection layer, an electron transport layer and a hole blocking layer are arranged between the light emitting part and the first electrode (on the substrate side than the light emitting part), and a hole injection layer, a hole transport layer and an electron blocking layer are arranged between the light emitting part and the second electrode. Regarding the explanation and the preferred range of each layer of the organic EL layer in this case and the specific examples of the constituent materials, reference may be made to the description and the preferred range of the corresponding layers mentioned below and the specific examples of the constituent materials thereof. The description of the substrate and the light emitting part made herein may apply also to an organic photoluminescent device.

[Substrate]

The organic electroluminescent device of the invention is preferably supported by a substrate. The substrate is not particularly limited and may be those that have been commonly used in an organic electroluminescent device, and examples thereof used include those formed of glass, transparent plastics, quartz, and silicon.

[Anode (First Electrode)]

In this embodiment, an anode is arranged on the surface of the substrate as a first electrode.

The anode of the organic electroluminescent device used is preferably formed of as an electrode material a metal, an alloy or an electroconductive compound each having a large work function (4 eV or more), or a mixture thereof. Specific examples of the electrode material include a metal, such as Au, and an electroconductive transparent material, such as CuI, indium tin oxide (ITO), $SnO_2$ and ZnO, and an Au alloy, and an Al alloy. A material that is amorphous and is capable of forming a transparent electroconductive film, such as IDIXO ($In_2O_3$—ZnO), may also be used. The anode may have a single-layer configuration or a multilayer configuration formed by layering two or more kinds of conductive films. A preferred example of the anode having a multilayer configuration is a laminate configuration of a metal film and a transparent conductive film, and a laminate configuration of ITO/Ag/ITO is more preferred. The anode may be formed in such a manner that the electrode material is formed into a thin film by such a method as vapor deposition or sputtering, and the film is patterned into a desired pattern by a photolithography method, or in the case where the pattern may not require high accuracy (for example, approximately 100 μm or more), the pattern may be formed with a mask having a desired shape on vapor deposition or sputtering of the electrode material. Alternatively, in the case where a material capable of being applied as a coating, such as an organic electroconductive compound, is used, a wet film forming method, such as a printing method and a coating method, may be used.

A preferred range of light transmittance of the anode differs depending on the direction in which emitted light is taken out. In the case of a bottom emission configuration of taking out the emitted light through the substrate side, preferably, the light transmittance is more than 10%, and also preferably, the anode is formed of a transparent or semitransparent material. On the other hand, in the case of a top emission configuration of taking out the emitted light from the cathode (second electrode) side, the transmittance of the anode is not specifically limited, that is, the anode may be opaque. Different from these embodiments, in the case where the second electrode is an anode, the transmittance of the anode is preferably more than 10% in the top emission configuration, but is not specifically limited in the bottom emission configuration, that is, the anode may be opaque.

The anode preferably has a sheet resistance of several hundred Ohm per square or less. The thickness thereof may be generally selected from a range of from 10 to 1,000 nm, and preferably from 10 to 200 nm, while depending on the material used.

[Cathode (Second Electrode)]

In this embodiment, a cathode is arranged on the opposite side to the anode of the organic EL layer as a second electrode.

The cathode may be formed of an electrode material of a metal having a small work function (4 eV or less) (referred to as an electron injection metal), an alloy or an electroconductive compound each having a small work function (4 eV or less), or a mixture thereof. Specific examples of the electrode material include sodium, a sodium-potassium alloy, magnesium, lithium, a magnesium-cupper mixture, a magnesium-silver mixture, a magnesium-aluminum mixture, a magnesium-indium mixture, an aluminum-aluminum oxide ($Al_2O_3$) mixture, indium, a lithium-aluminum mixture, and a rare earth metal. Among these, a mixture of an electron injection metal and a second metal that is a stable metal having a larger work function than the electron injection metal, for example, a magnesium-silver mixture, a magnesium-aluminum mixture, a magnesium-indium mixture, an aluminum-aluminum oxide ($Al_2O_3$) mixture, a lithium-aluminum mixture, and aluminum, are preferred from the standpoint of the electron injection property and the durability against oxidation and the like. The cathode may be produced by forming the electrode material into a thin film by such a method as vapor deposition or sputtering.

A preferred range of light transmittance of the cathode differs depending on the direction in which emitted light is taken out. In the case where the emitted light is taken out from the cathode side (second electrode side) (that is, in the case of a top emission configuration), preferably, the light transmittance is more than 10%, and also preferably, the cathode is formed of a transparent or semitransparent material. The transparent or semitransparent cathode may be formed using the conductive transparent material that has been described hereinabove as the material for the anode. On the other hand, in the case of taking out the emitted light from the substrate side (that is, in the case of a bottom emission configuration), the transmittance of the cathode is not specifically limited, and the cathode may be opaque. Different from these embodiments, in the case where the first electrode is a cathode, the transmittance of the cathode is preferably more than 10% in the bottom emission configuration, but is not specifically limited in the top emission configuration, that is, the cathode may be opaque.

The cathode preferably has a sheet resistance of several hundred Ohm per square or less, and the thickness thereof may be generally selected from a range of from 10 nm to 5 μm, and preferably from 50 to 200 nm.

Here, the electrode to be on the light taking-out side of the first electrode and the second electrode may be provided with a polarizer. The polarizer may be, for example, a combination of a known linearly polarizing plate and a λ/4 plate. Provided with a polarizer, the light emitting device can prevent external light reflection from the first electrode and the second electrode and can prevent external light reflection on the surface of the substrate or the sealant substrate to thereby improve the contrast of a color conversion light emitting device.

[Microcavity Structure]

In the case where the organic electroluminescent device of the present invention has a top emission configuration, if desired, the device may form a microcavity structure where the first electrode and the second electrode are reflective electrodes and the optical distance L between these electrodes is controlled. In this case, preferably, a reflective electrode is used as the first electrode and a semitransparent electrode is used as the second electrode.

The semitransparent electrode may be a single-layer semitransparent electrode of a metal, or a may have a laminate structure of a semitransparent electrode of a metal and a transparent electrode of any other material. From the viewpoint of light reflectivity and transmittance, preferably used is a semitransparent electrode of silver or a silver alloy.

The thickness of the second electrode of a semitransparent electrode is preferably 5 to 30 nm. Having a thickness of 5 nm or more, the semitransparent electrode can sufficiently reflect light and can sufficiently realize an interfering effect. Having a thickness of 30 nm or less, the electrode can prevent any sudden reduction in light transmittance and can therefore prevent reduction in brightness and emission efficiency.

Also preferably, an electrode having a high light reflectance is used as the first electrode of a reflective electrode. Examples of the electrode of the type include a light-reflective metal electrode of aluminum, silver gold, aluminum-lithium alloy, aluminum-neodymium alloy, or aluminum-silicon alloy, or a composite electrode of a transparent electrode combined with a light-reflective metal electrode.

When the first electrode and the second electrode form a microcavity structure, the light emitted by the organic EL layer may be focused in the light taking-out direction owing to the interfering effect of the first electrode and the second electrode. Specifically, the organic EL layer may be made to have directionality in point of emission from the layer, and therefore the emission loss around the circumference thereof can be reduced and the emission efficiency can be thereby improved. In addition, a microcavity structure can control the emission spectrum from the organic EL layer to attain a desired emission peak wavelength and a desired full width at half maximum in the spectrum.

[Light Emitting Part]

The light emitting part is a layer in which holes and electrons injected from the anode and the cathode recombine to form excitons to give emission, and includes at least an exciton generation layer and a light emitting layer. In this, an isolation layer may exist between these layers, and an outer layer may exist on the anode side or the cathode side of these layers. Regarding the description and the preferred range and specific examples of the layers constituting the light emitting part, reference may be made to the sections of "Exciton Generation Layer", "Light Emitting Layer", "Isolation Layer" and "Other Layers" given hereinabove.

[Injection Layer and Charge Transport Layer]

The charge transport layer is a layer to be arranged between the electrode and the light emitting part for the purpose of efficiently transporting charges injected from the electrodes toward the light emitting part, and includes a hole transport layer and an electron transport layer.

The injection layer is a layer to be arranged between the electrode and the organic layer for the purpose of lowering a driving voltage and improving emission brightness, and includes a hole injection layer and an electron injection layer. The layer may be arranged between the anode and the light emitting part or the hole transport layer, and between the cathode and the light emitting part or the electron transport layer. The injection layer is an optional layer that may be arranged in the light emitting device as needed.

[Hole Injection Layer and Hole Transport Layer]

The hole injection layer and the hole transport layer are arranged between the anode and the light emitting part, for the purpose of more efficiently injecting the holes from the first electrode of an anode and for transporting (injecting) them into the light emitting part. Any one of the hole injection layer and the hole transport layer may be arranged, or both the two may be arranged, or one layer having both the two functions (hole injection transport layer) may be arranged.

The hole injection layer and the hole transport layer may be formed each using a known hole injection material and a known hole transport material. In the case where both the hole injection layer and the hole transport layer are arranged, the material to form the hole injection layer is, from the viewpoint of efficiently attaining injection and transport of holes from the anode, preferably a material having a lower highest occupied molecular orbital (HOMO) energy level than the material for use for the hole transport layer, and the material to form the hole transport material is preferably a material having a higher hole mobility than the material for use for the hole injection layer.

The hole transport material has at least any of injection and transport of holes and barrier to electrons, and may be any of an organic material or an inorganic material. Examples of known hole transport materials usable herein include oxides such as vanadium oxide ($V_2O_5$), and molybdenum oxide ($MoO_2$); inorganic p-type semiconductor materials; aromatic tertiary amine compounds such as N,N'-bis(3-methylphenyl)-N,N'-bis(phenyl)-benzidine (TPD), and N,N'-dinaphthalen-1-yl)-N,N'-diphenyl-benzidine (NPD); other low-molecular materials such as quinacridone compounds, and styrylamine compounds; high-molecular materials such as polyaniline (PANI), and polyaniline-camphorsulfonic acid (PANI-CSA), 3,4-polyethylene-dioxythiophene/polystyrene-sulfonate (PEDOT/PSS), poly(triphenylamine) derivative (Poly-TPD), polyvinylcarbazole (PVCz), poly(p-phenylene-vinylene) (PPV), and poly(p-naphthalene-vinylene) (PNV); triazole derivatives, oxadiazole derivatives, imidazole derivatives, carbazole derivatives, indolocarbazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline copolymers, and conductive high-molecular oligomers, especially thiophene oligomers. Use of porphyrin compounds, aromatic tertiary amine compounds and styrylamine compounds is preferred, and use of aromatic tertiary amine compounds is more preferred.

Examples of hole injection materials usable herein include, though not limited thereto, phthalocyanine derivatives such as copper phthalocyanine; amine compounds such as 4,4',4"-tris(3-methylphenylphenylamino)triphenylamine, 4,4',4"-tris(1-naphthylphenylamino)triphenylamine, 4,4',4"-tris(2-naphthylphenylamino)triphenylamine, 4,4',4"-tris[biphenyl-2-yl(phenyl)amino]triphenylamine, 4,4',4"-tris[biphenyl-3-yl(phenyl)amino]triphenylamine, 4,4',4"-tris[biphenyl-4-yl(3-methylphenyl)amino]triphenylamine, 4,4',4"-tris[9,9-dimethyl-2-fluorenyl(phenyl)amino]triphenylamine; and oxides such as vanadium oxide ($V_2O_5$), and molybdenum oxide ($MoO_2$).

The hole injection layer and the hole transport layer each may be formed of the above-mentioned hole injection material or hole transport material, but may optionally contain a compound satisfying the expression (1) or any other additives (donor, acceptor, etc.), or may be formed of a composite material with the above-mentioned hole injection material or hole transport material dispersed in a polymer material (binder resin) or in an inorganic material.

When the hole injection layer and the hole transport layer are doped with an acceptor, the hole injectability and the hole transportability thereof may be enhanced. The acceptor may be any one known as an acceptor material for organic electroluminescent devices. Specific examples of the acceptor material include inorganic materials such as Au, Pt, W, Ir, $POCl_3$, $AsF_6$, Cl, Br, I, vanadium oxide ($V_2O_5$), and molybdenum oxide ($MoO_2$); compounds having a cyano group such as TCNQ (7,7,8,8,-tetracyanoquinodimethane), TCNQF4 (tetrafluorotetracyanoquinodimethane), TCNE (tetracyanoethylene), HCNB (hexacyanobutadiene), and DDQ (dicyclodicyanobenzoquinone); compounds having a nitro group such as TNF (trinitrofluorenone), and DNF (dinitrofluorenone); and other organic materials such as fluoranil, chloranil, and bromanil. Among these, compounds having a cyano group such as TCNQ, TCNQF4, TCNE, HCNB, and DDQ are preferred as they are effective for increasing a carrier concentration.

[Electron Injection Layer and Electron Transport Layer]

The electron injection layer and the electron transport layer are arranged between the cathode and the light emitting part for the purpose of efficiently carrying out injection of electrons from the second electrode of a cathode and transport (injection) thereof into the light emitting part. Any one of the electron injection layer and the electron transport layer may be arranged, or both of them may be arranged, or one layer serving as both the two layers (electron injection transport layer) may be arranged.

The electron injection layer and the electron transport layer each may be formed of a known electron injection material or a known electron transport material. In the case where both the electron injection layer and the electron transport layer are arranged, the material to form the electron injection layer is, from the viewpoint of efficiently attaining injection and transport of electrons from the cathode, preferably a material having a higher lowest unoccupied molecular orbital (LUMO) energy level than the material for use for the electron transport layer, and the material to form the electron transport material is preferably a material having a higher electron mobility than the material for use for the electron injection layer.

The electron transport material (optionally serving as a hole blocking material) may be any one that has a function of transmitting the electrons injected from the cathode to the light emitting part. Examples of the electron transport material usable herein include inorganic materials of n-type semiconductors, nitro-substituted fluorene derivatives, diphenylquinone derivatives, thiopyran dioxide derivatives, carbodiimides, fluorenylidenemethane derivatives, anthraquinodimethane and anthrone derivatives, and oxadiazole derivatives. Further, thiadiazole derivatives derived from the above-mentioned oxadiazole derivatives by substituting the oxygen atom in the oxadiazole ring therein with a sulfur atom, as well as quinoxaline derivatives having a quinoxaline ring known as an electron attractive group are also usable as the electron transport material. In addition, polymer materials prepared by introducing these materials into a polymer chain or having these material in the polymer main chain are also usable.

As the electron injection material, in particular, fluorides such as lithium fluoride (LiF) and barium fluoride ($BaF_2$), and oxides such as lithium oxide ($Li_2O$) are exemplified.

The electron injection layer and the electron transport layer each may be formed of the above-mentioned electron injection material or electron transport material alone, or may optionally contain a compound satisfying the expression (1) or any other additive (donor, acceptor, etc.), or may be formed of a composite material with the above-mentioned electron injection material or electron transport material dispersed in a polymer material (binder resin) or in an inorganic material.

When the electron injection layer and the electron transport layer are doped with a donor, the electron injectability and the electron transportability thereof may be enhanced. The acceptor may be any one known as a donor material for organic EL devices. Examples of the donor material include inorganic materials such as alkali metals, alkaline earth metals, rare earth elements, Al, Ag, Cu, and In; as well as organic compounds including compounds having an aromatic tertiary amine as the skeleton thereof, such as anilines; phenylenediamines; benzidines such as N,N,N',N'-tetraphenylbenzidine, N,N'-bis-(3-methylphenyl)-N,N'-bis-(phenyl)-benzidine, and N,N'-di(naphthalen-1-yl)-N,N'-diphenyl-benzidine; triphenylamine compounds such as triphenylamine, 4,4',4"-tris(N,N-diphenyl-amino)-triphenylamine, 4,4',4"-tris(N-3-methylphenyl-N-phenylamino)-triphenylamine, and 4,4',4"-tris(N-(1-naphthyl)-N-phenylamino)-triphenylamine; triphenyldiamines such as N,N'-di-(4-methylphenyl)-N,N'-diphenyl-1,4-phenylenediamine; condensed polycyclic compounds such as phenanthrene, pyrene, perylene, anthracene, tetracene, and pentacene (provided that the condensed polycyclic compounds may have a substituent); and TTFs (tetrathiafulvalenes), dibenzofuran, phenothiazine, and carbazol.

[Blocking Layer]

The blocking layer is a layer that is capable of inhibiting charges (electrons or holes) and/or excitons present in the light emitting part from being diffused outside the light emitting part. The electron blocking layer may be disposed between the light emitting part and the hole transport layer, and inhibits electrons from passing through the light emitting part toward the hole transport layer. Similarly, the hole blocking layer may be disposed between the light emitting part and the electron transport layer, and inhibits holes from passing through the light emitting part toward the electron transport layer. The blocking layer may also be used for inhibiting excitons from being diffused outside the light emitting part. Thus, the electron blocking layer and the hole blocking layer each may also have a function as an exciton blocking layer. The term "the electron blocking layer" or "the exciton blocking layer" referred to herein is intended to include a layer that has both the functions of an electron blocking layer and an exciton blocking layer by one layer.

[Hole Blocking Layer]

The hole blocking layer has the function of an electron transport layer in a broad sense. The hole blocking layer has a function of inhibiting holes from reaching the electron transport layer while transporting electrons, and thereby enhances the recombination probability of electrons and holes in the light emitting part. Regarding the material to form the hole blocking layer, reference may be made to the same materials as those exemplified hereinabove to form the above-mentioned electron transport layer and electron injection layer.

[Electron Blocking Layer]

The electron blocking layer has the function of transporting holes in a broad sense. The electron blocking layer has a function of inhibiting electrons from reaching the hole transport layer while transporting holes, and thereby enhances the recombination probability of electrons and holes in the light emitting part. Regarding the material to form the electron blocking layer, reference may be made to the same materials as those exemplified hereinabove to form the above-mentioned hole transport layer and hole injection layer.

[Exciton Blocking Layer]

The exciton blocking layer has a function of preventing the energy of excitons formed in the light emitting layer from transferring to the hole transport layer or the electron transport layer to deactivate the excitons. By inserting the exciton blocking layer, the energy of excitons may be more effectively consumed for emission and the emission efficiency of the device can be thereby enhanced.

The exciton blocking layer may be inserted adjacent to the light emitting part on any of the side of the anode and the side of the cathode, and on both the sides. Specifically, in the case where the exciton blocking layer is present on the side of the anode, the layer may be inserted between the hole transport layer and the light emitting part and adjacent to the light emitting part. In the case where the exciton blocking layer is on the cathode side, the layer may be inserted between the electron transport layer and the light emitting part so as to be adjacent to the light emitting part. Further, the exciton blocking layer may be inserted between the hole transport layer and the light emitting part and between the electron transport layer and the light emitting part to be adjacent to the light emitting part. Between the anode and the exciton blocking layer that is adjacent to the light emitting part on the side of the anode, a hole injection layer, an electron blocking layer and the like may be arranged, and between the cathode and the exciton blocking layer that is adjacent to the light emitting part on the side of the cathode, an electron injection layer, an electron transport layer, a hole blocking layer and the like may be arranged. In the case where the blocking layer is arranged, preferably, at least one of the excited singlet energy and the excited triplet energy of the material to form the blocking layer is higher than the excited singlet energy and the excited triplet energy of the light emitting material. As the constituent material to form the exciton blocking layer, any known exciton blocking material is usable herein.

For forming the light emitting part, the hole transport layer, the electron transport layer, the hole injection layer, the electron injection layer, the hole blocking layer, the electron blocking layer and the exciton blocking layer to constitute organic EL layers, there are exemplified: a method of forming them according to a known wet process using organic EL layers forming compositions prepared by dissolving or dispersing the materials for the layers in a solvent, such as a coating method of a spin coating method, a dipping method, a doctor blade coating method, an ejection coating method, and a spray coating method, or a printing method of an inkjet method, a relief printing method, an intaglio printing method, a screen printing method, and a micro gravure coating method; a method of forming them according to a known dry process method such as a resistance heating evaporation method, an electron beam (EB) evaporation method, a molecular beam epitaxial (MBE) method, a sputtering method, and an organic vapor phase deposition (OVPD) method; and a method of forming them according to a laser transfer method. In the case where the organic EL layers are formed according to a wet process, the organic EL layers forming compositions may contain additives for controlling the properties of the compositions, such as a leveling agent and a viscosity improver.

Preferably, the thickness of each layer to constitute the organic EL layers is 1 to 1000 nm, more preferably 10 to 200 nm. When the thickness of each layer to constitute the organic EL layers is 10 nm or more, the properties that are said to be intrinsically necessary for the organic light emitting device [properties of injecting, transporting and confining charges (electrons, holes)] can be realized with a further higher degree of accuracy to enhance the effect of preventing pixel defects owing to impurities in the layers. In addition, when the thickness of each layer to constitute the organic EL layers is 200 nm or less, the effect of preventing increase in power consumption owing to increase in driving voltage can be enhanced.

Specific examples of the materials usable in the organic electroluminescent device are shown below. However, the materials usable in the present invention should not be limitatively interpreted by the compounds exemplified below. In the following, compounds exemplified as those for a material having a specific function may also be used as a different material having any other function. In the structural formulae of the compounds exemplified below, R, R', and $R_1$ to $R_{10}$ each independently represent a hydrogen atom or a substituent. X represents a carbon atom or a hetero atom to form the ring skeleton, n represents an integer of 3 to 3. Y represents a substituent, and m represents an integer of 0 or more.

First, preferred compounds for use as a host material in each layer to constitute the light emitting part are shown below.

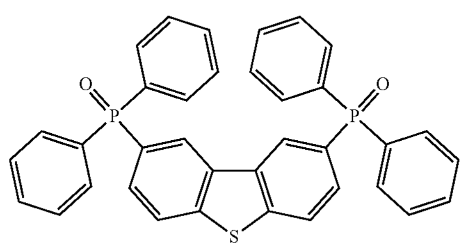

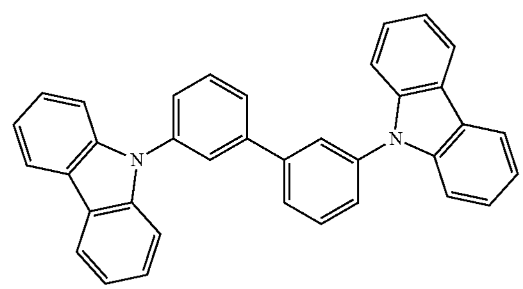

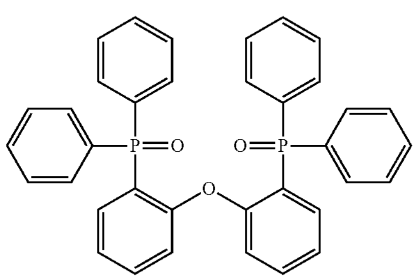

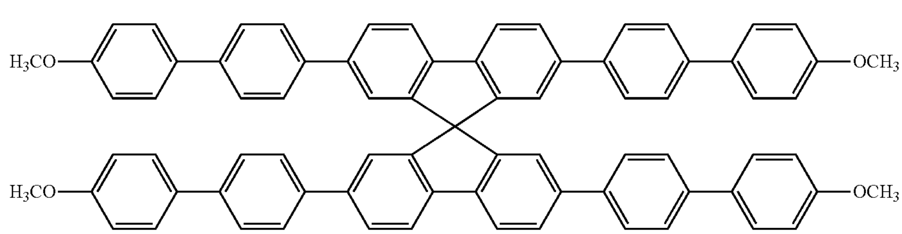

-continued
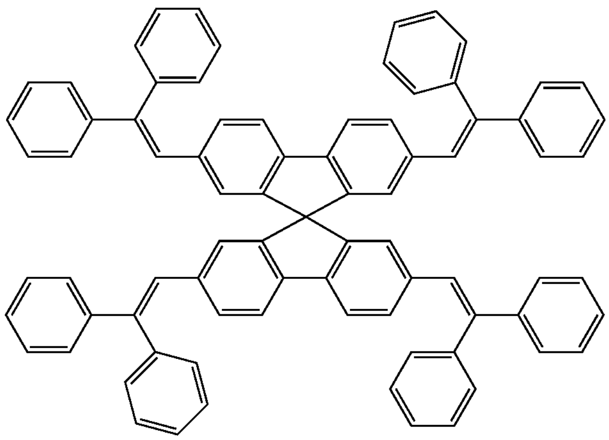
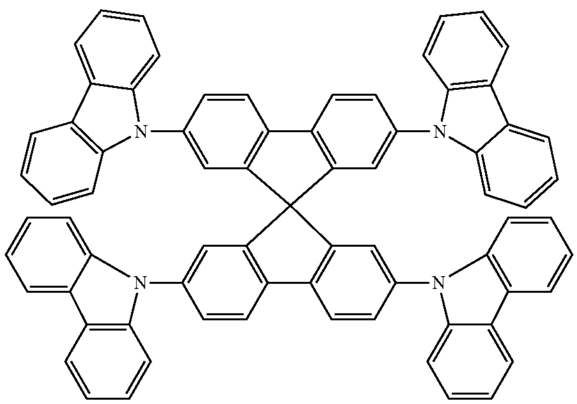
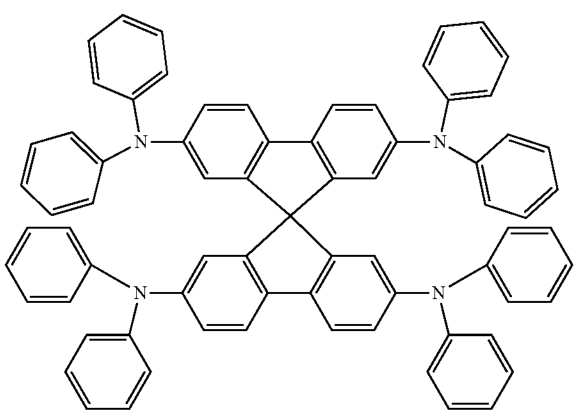
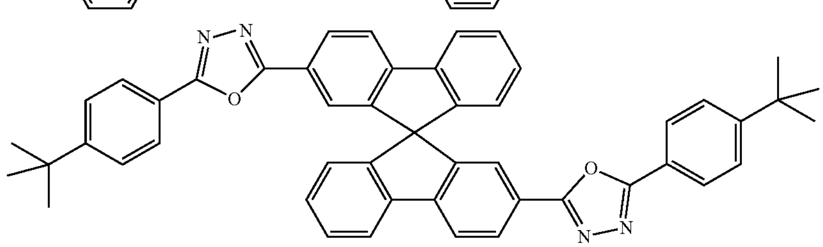

-continued
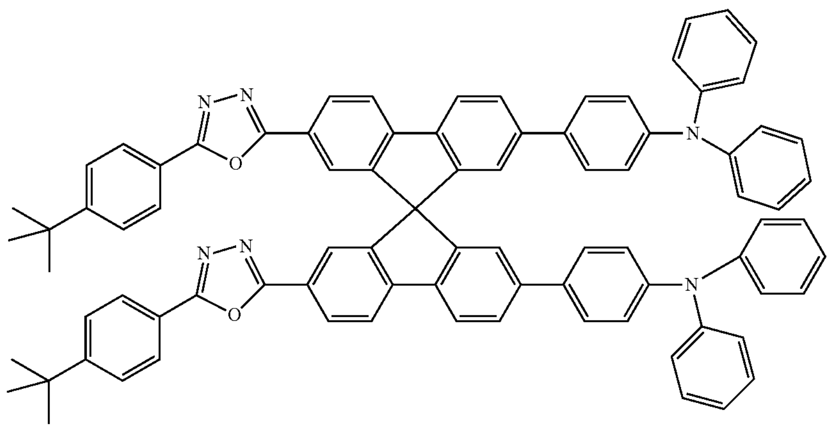
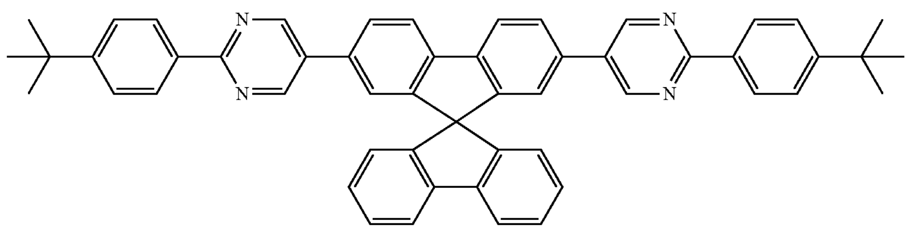
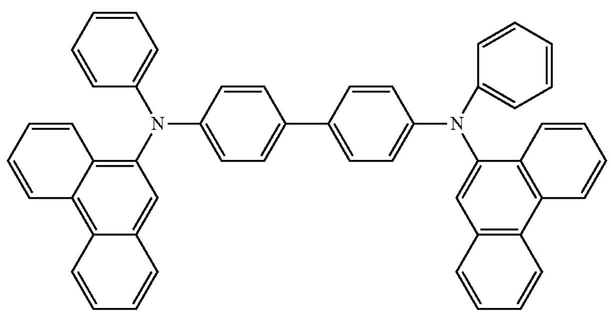
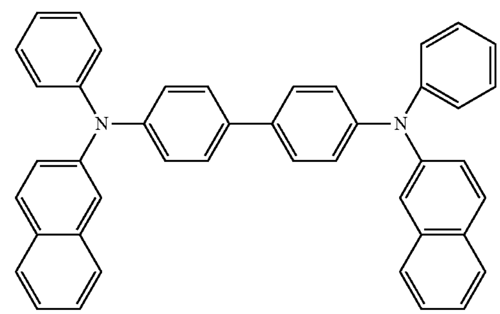
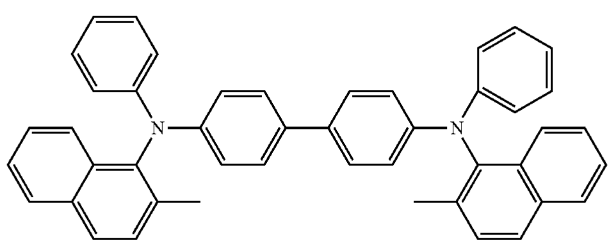
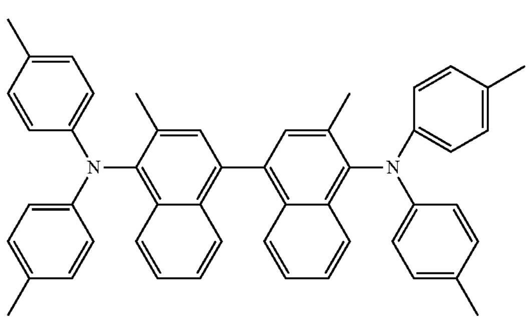

-continued
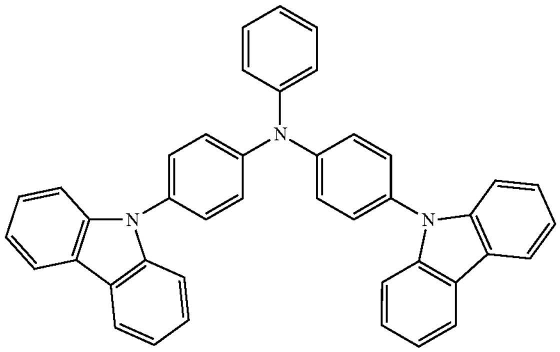
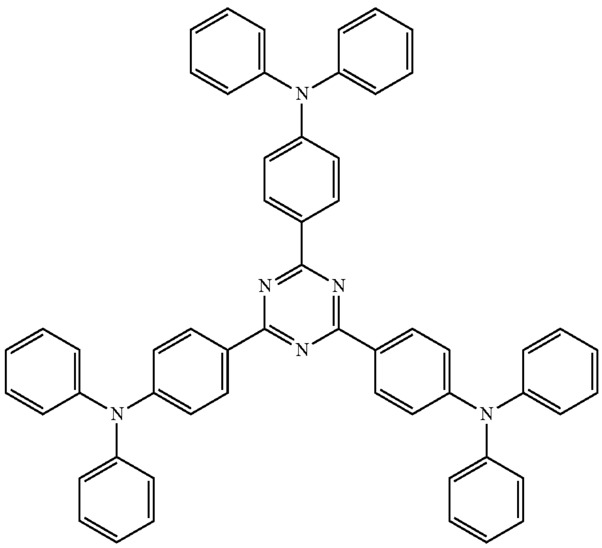
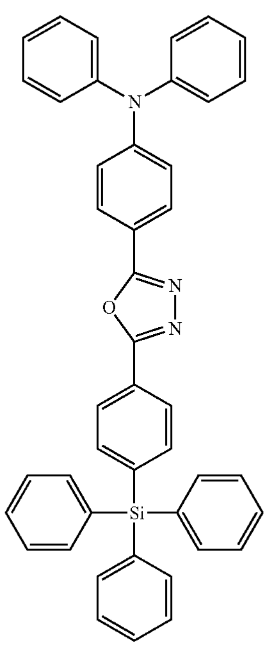
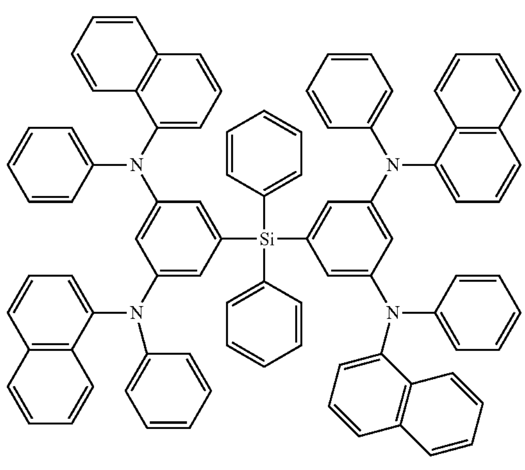

-continued
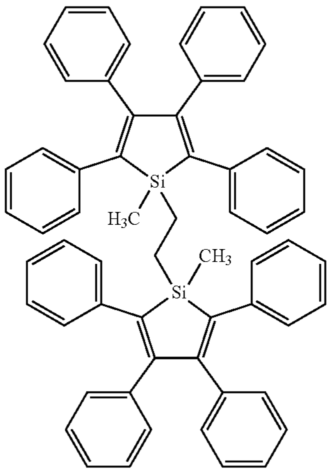
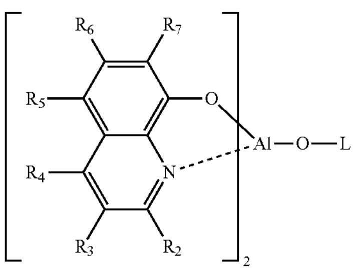
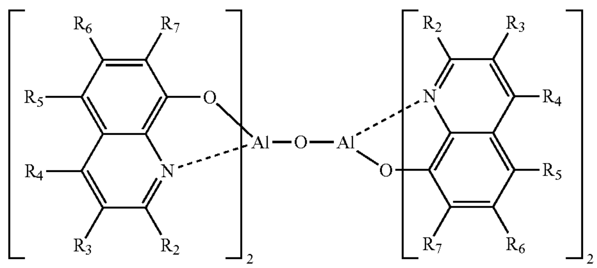
$R_2$ - $R_7$ = H or substituent
L = ligand
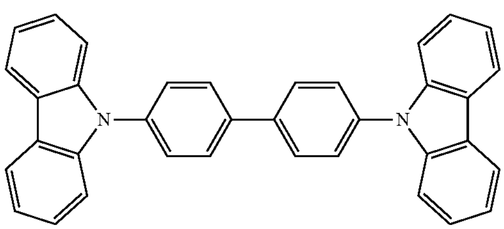
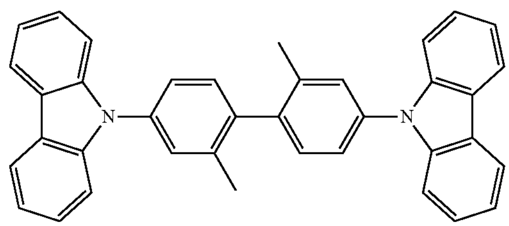
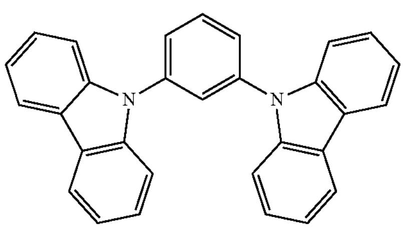
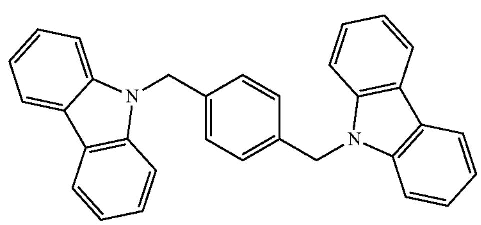
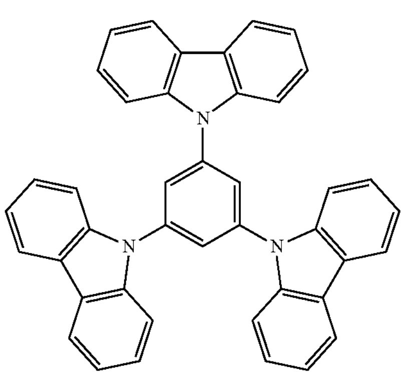
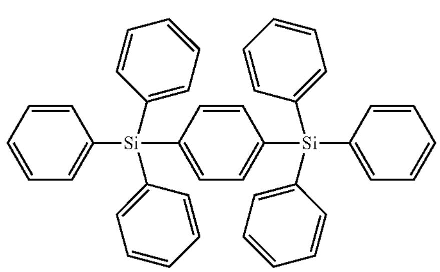

-continued
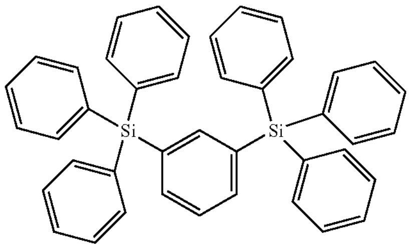
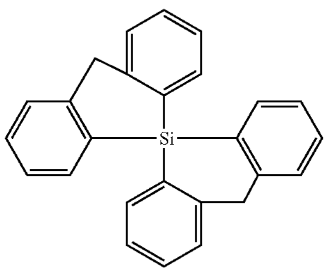
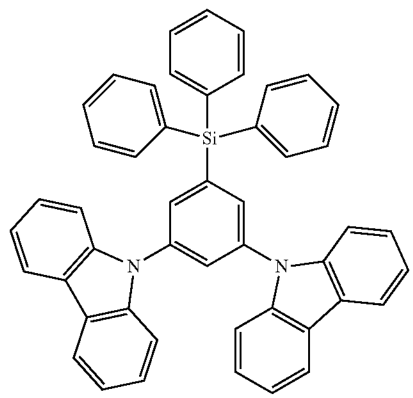
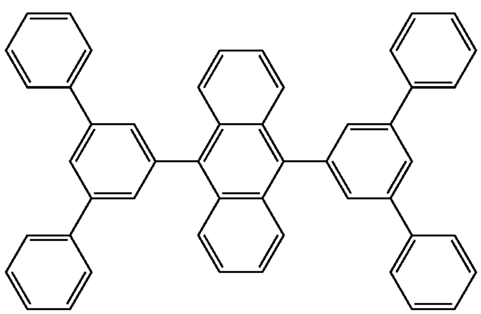
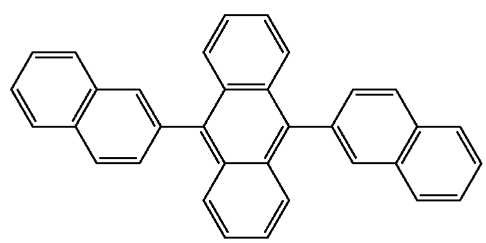
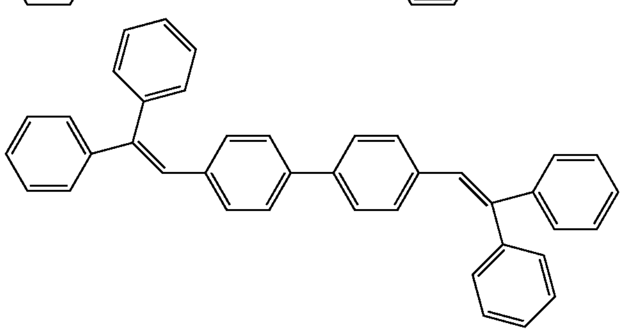
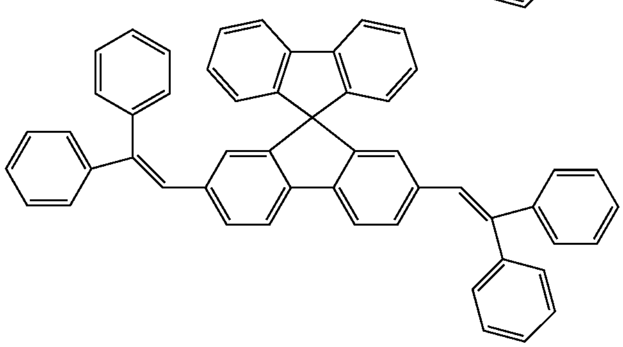

-continued
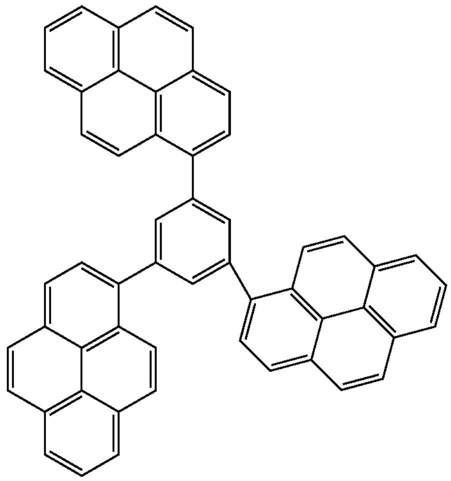
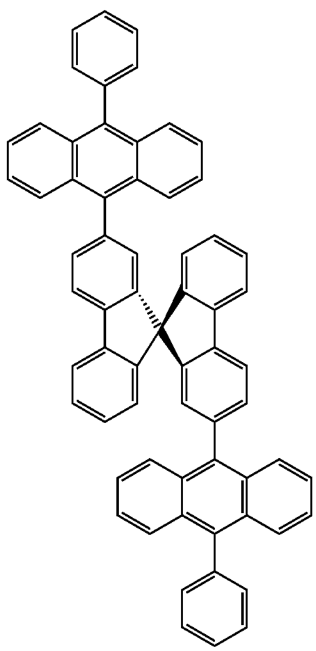
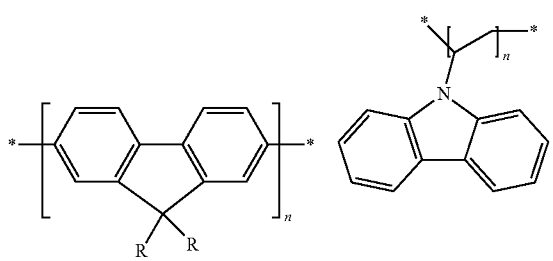
R = alkyl, aryl

-continued
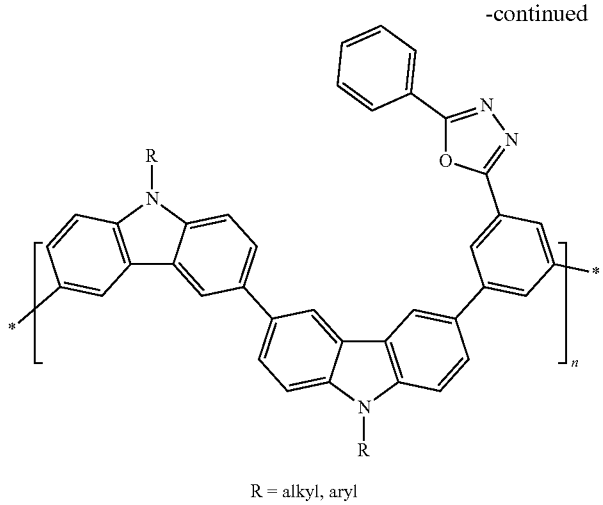
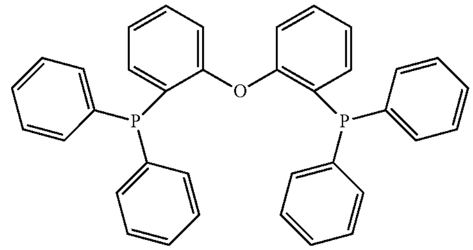
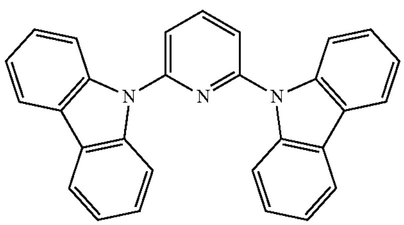
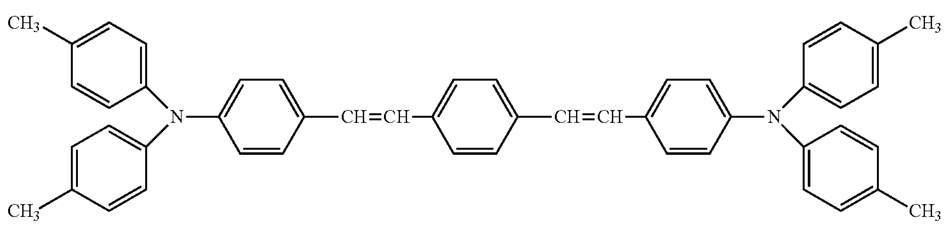
45
Next, preferred compounds for use as a hole injection material are shown below.
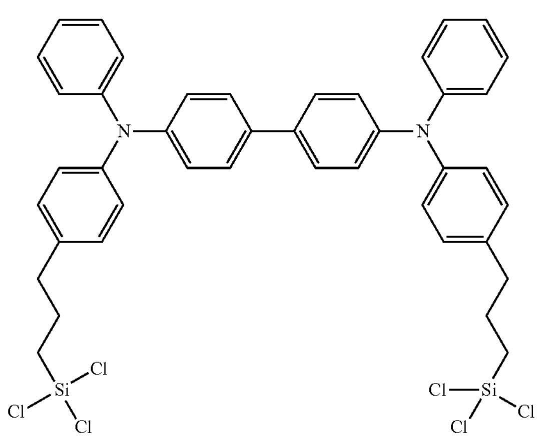
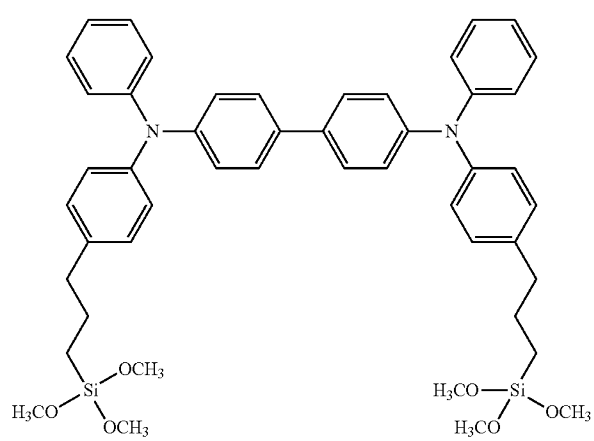

-continued
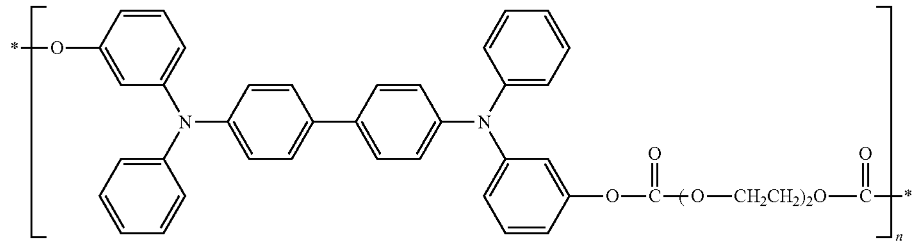
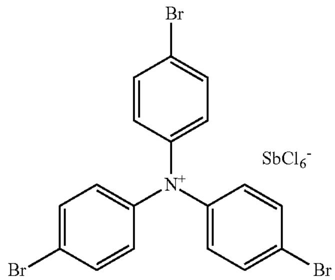
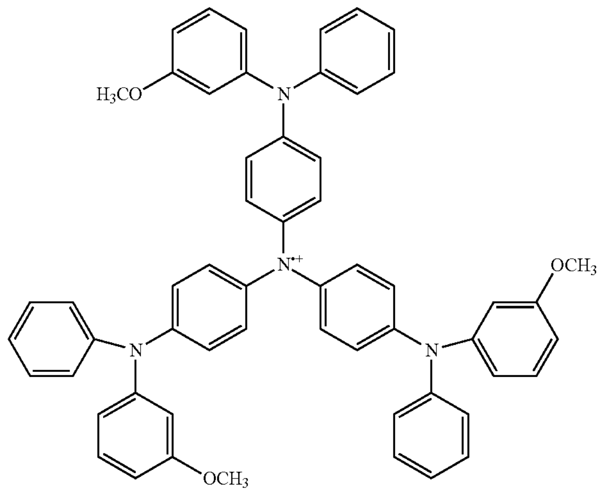
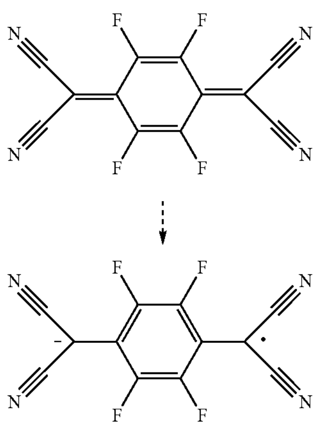
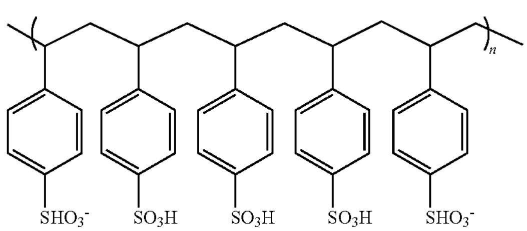
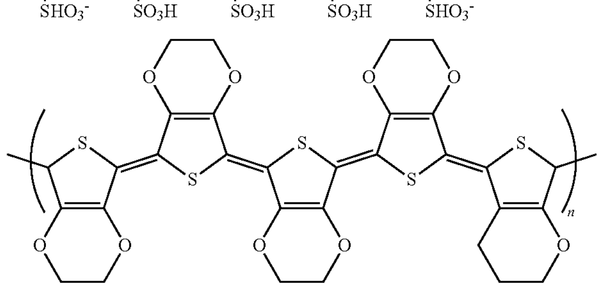

-continued
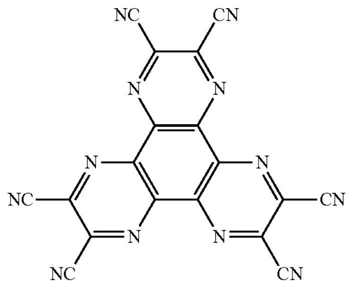
Next, preferred compounds for use as a hole injection material are shown below.
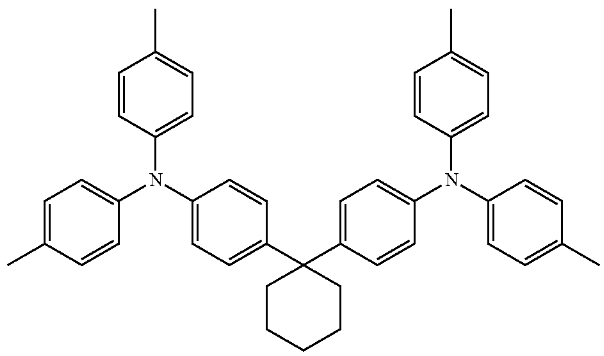
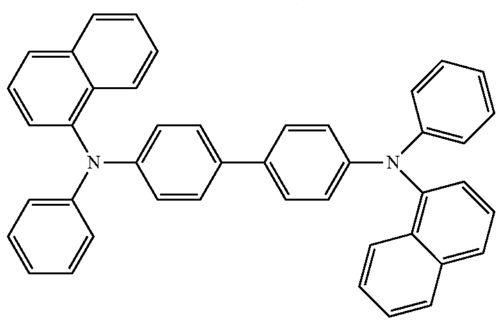
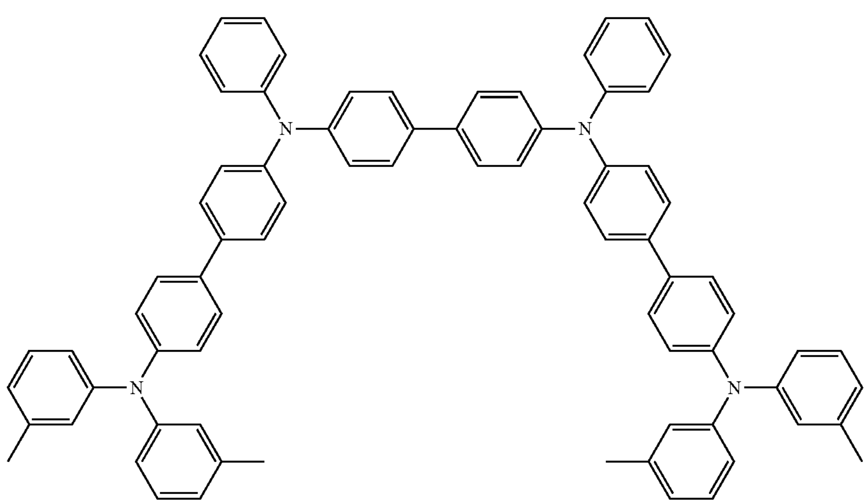

-continued
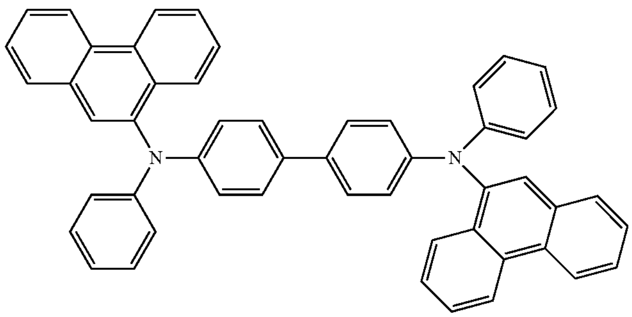
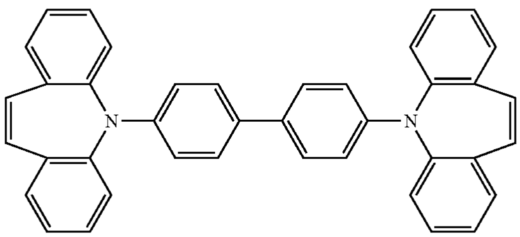
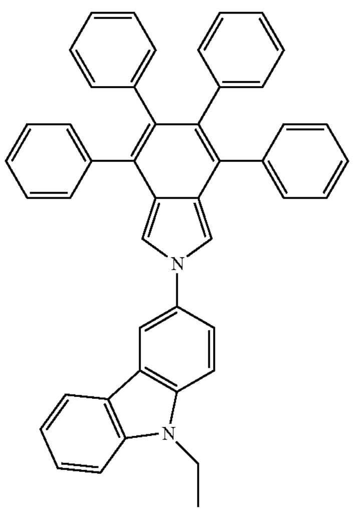
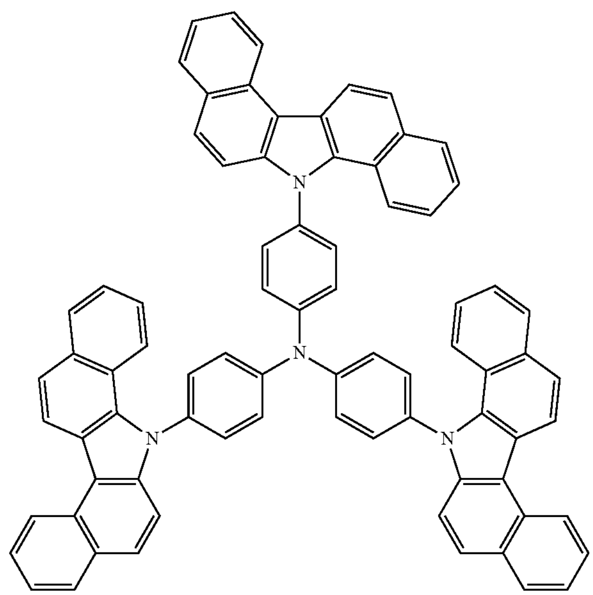
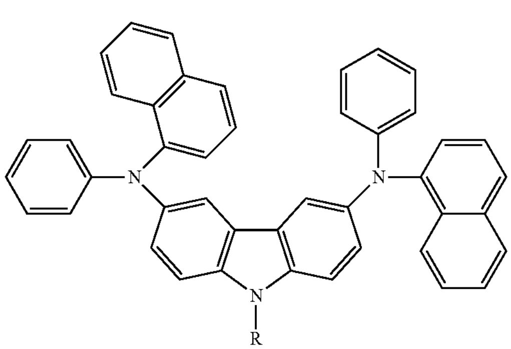
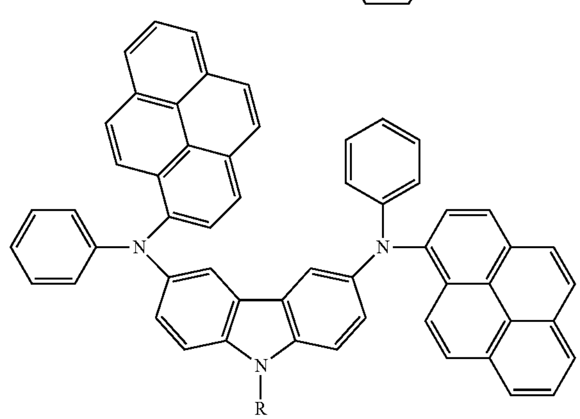
R = alkyl, aryl, alkoxy, aryloxy,
9,9′-dialkylfluorene -continued
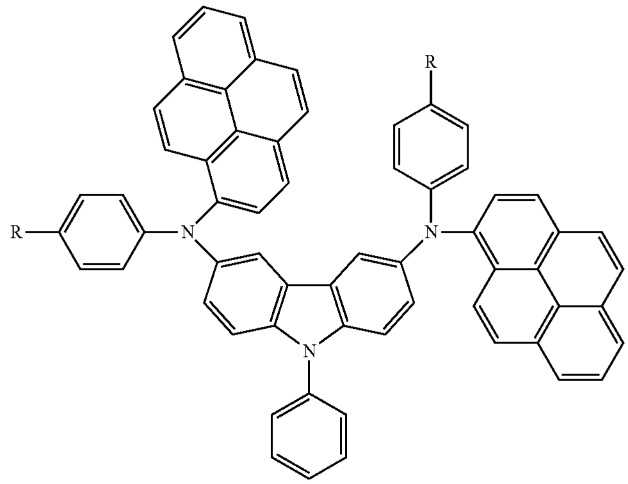
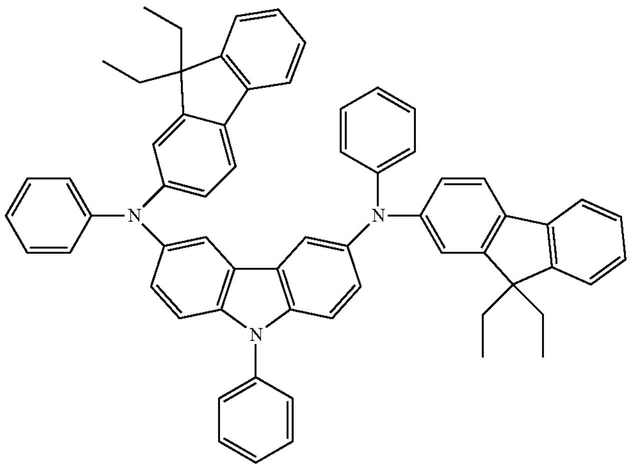
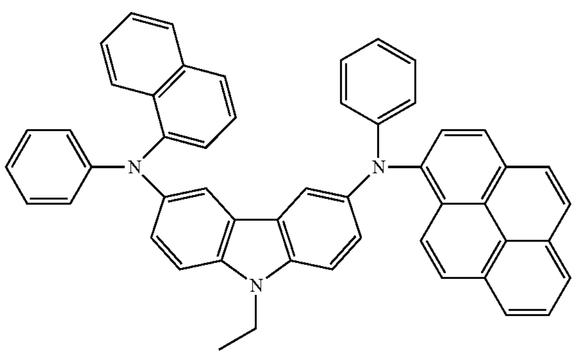
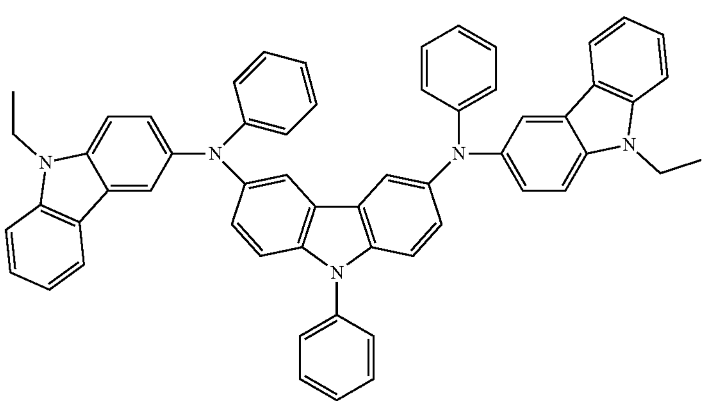

-continued
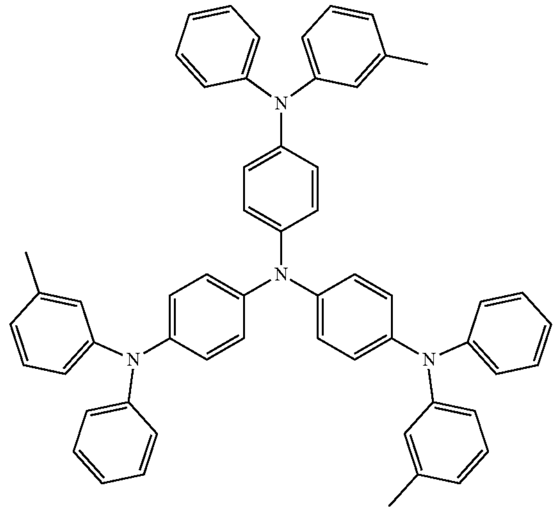
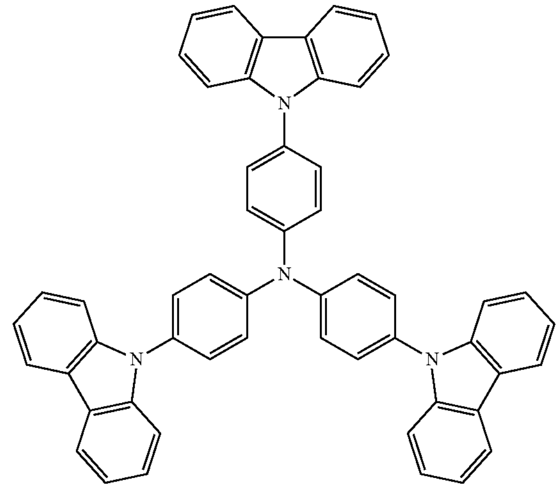
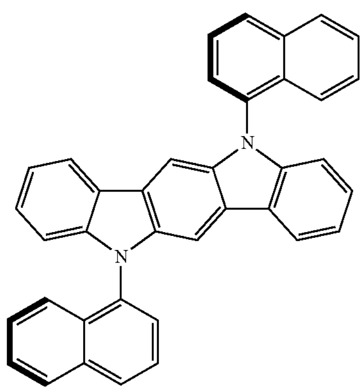
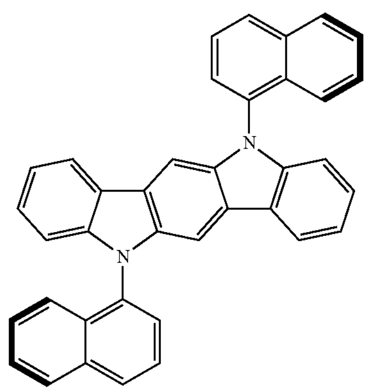
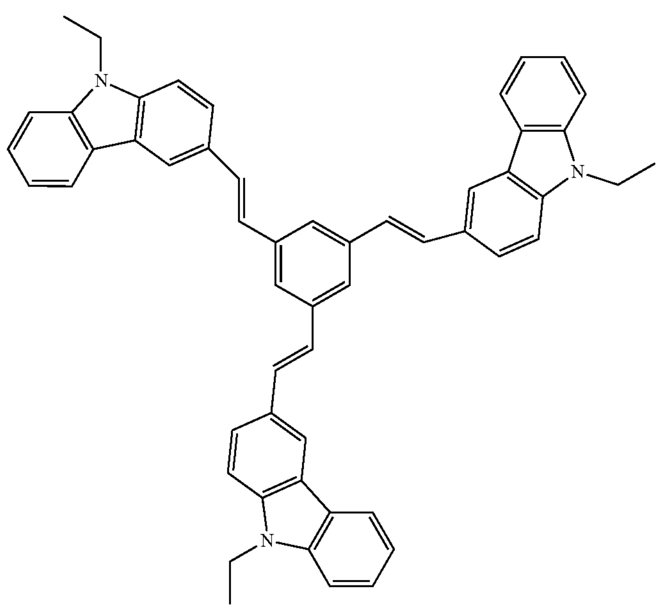

-continued
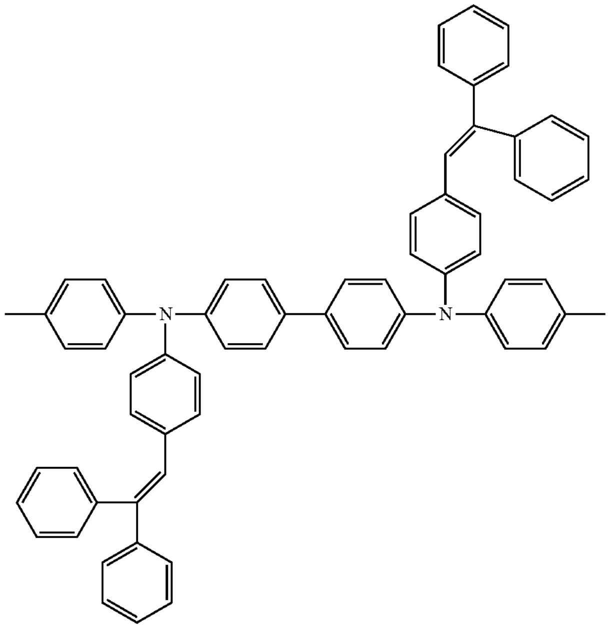
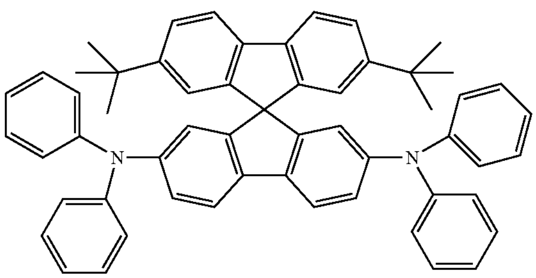
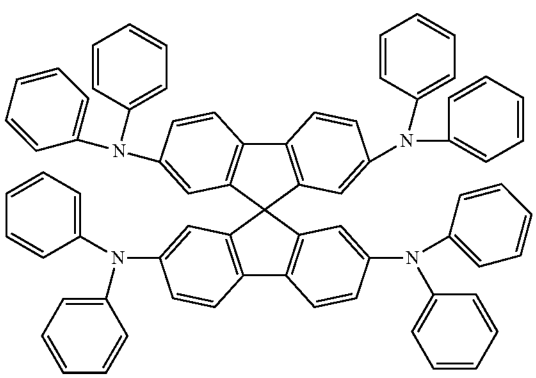
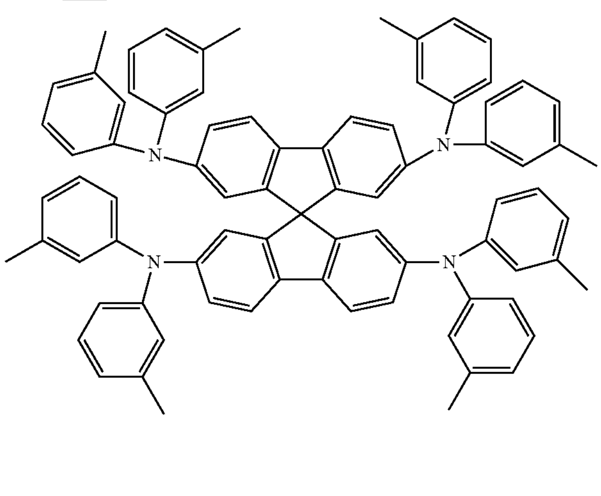

-continued
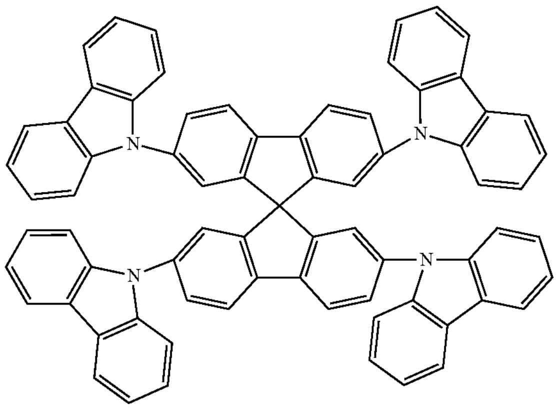
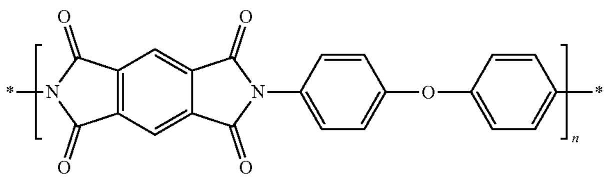
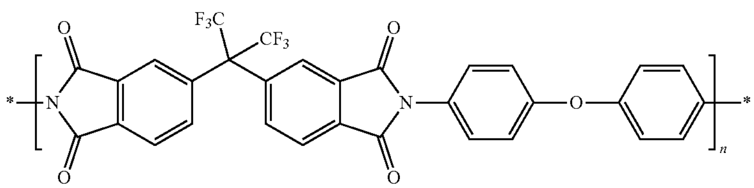
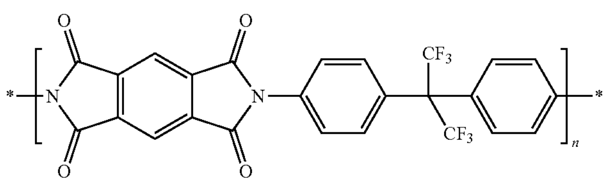
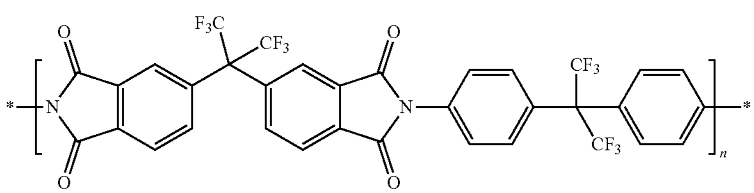
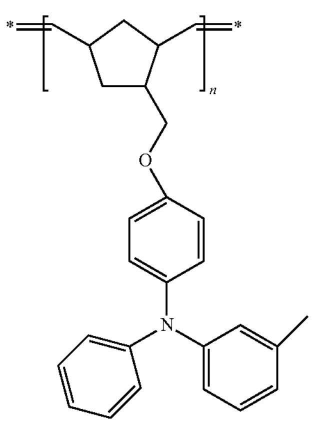

-continued
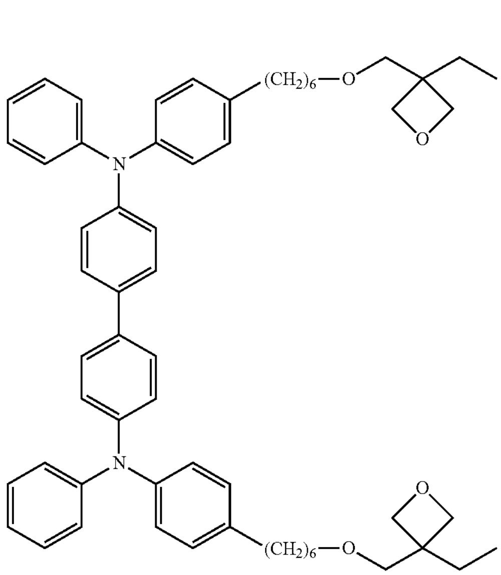
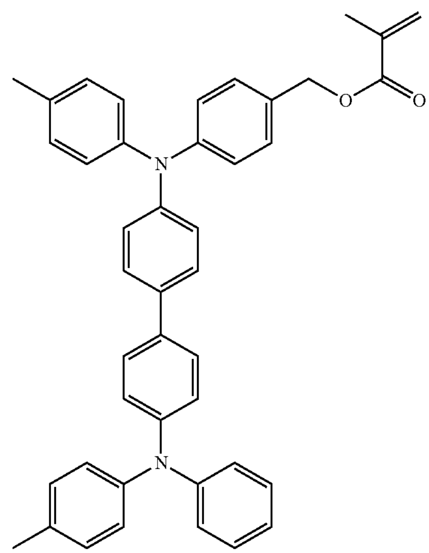
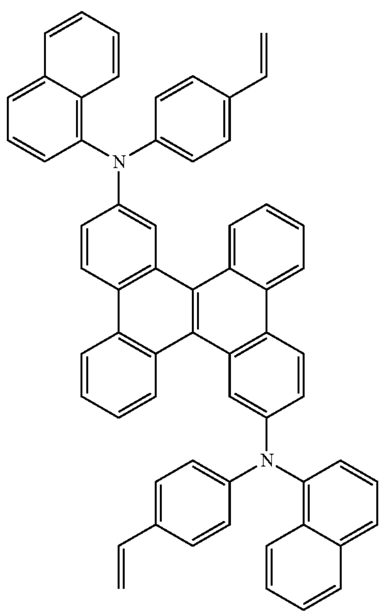
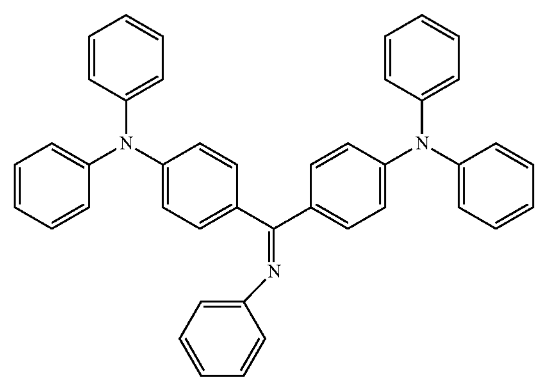
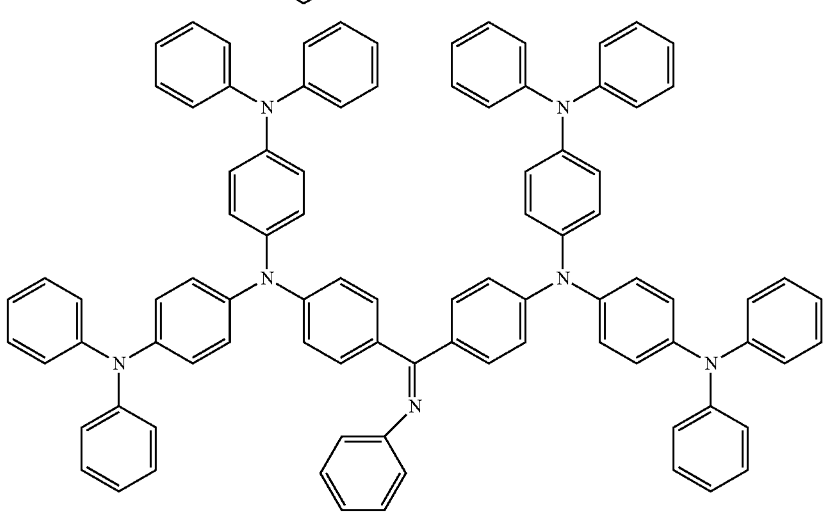

-continued
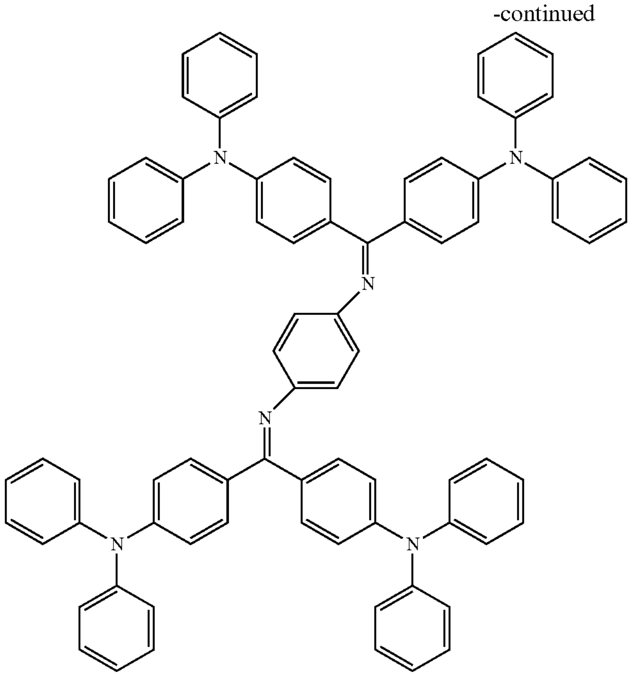
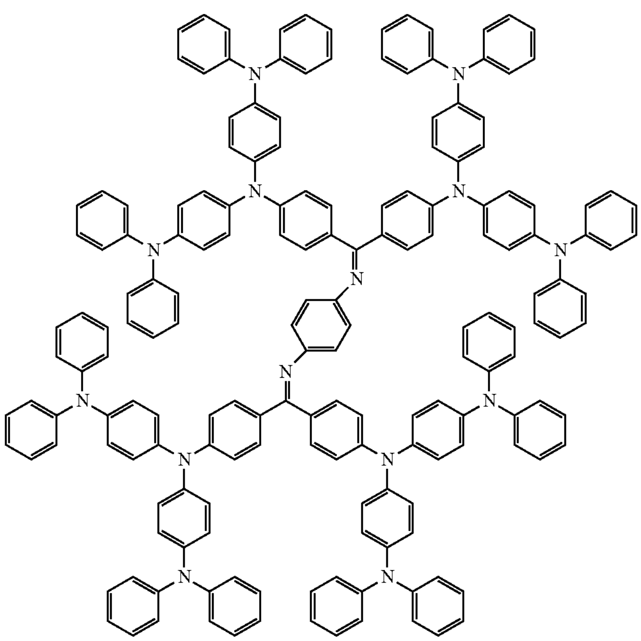

-continued
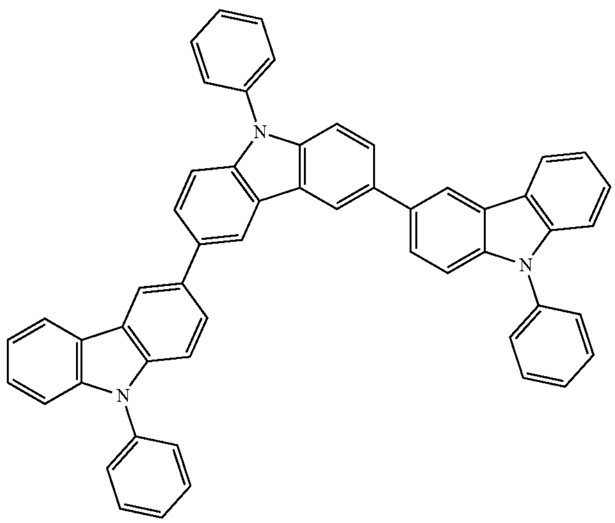
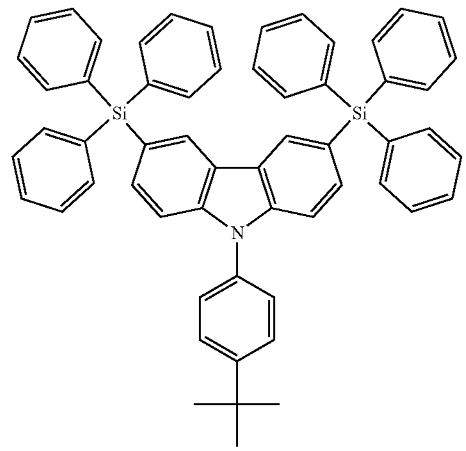
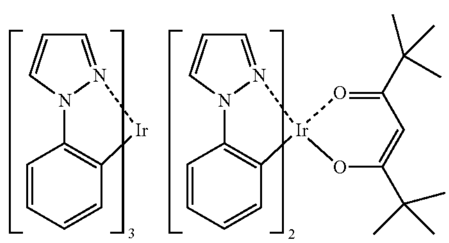
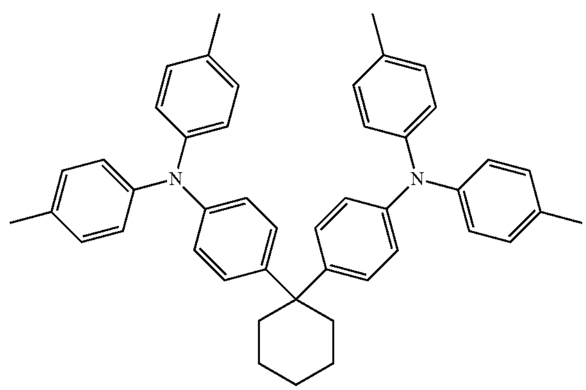
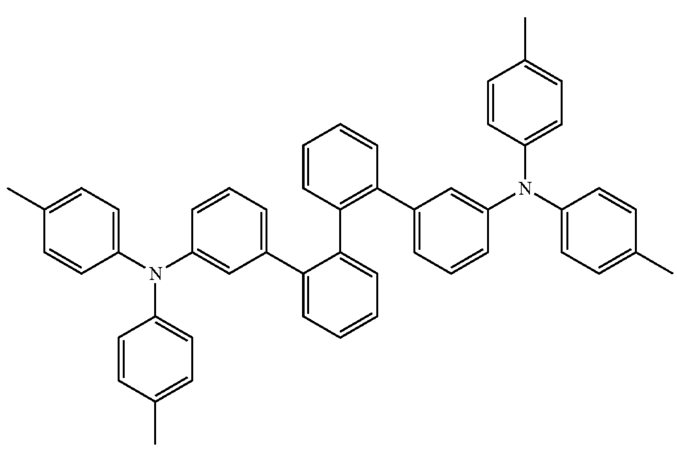

-continued
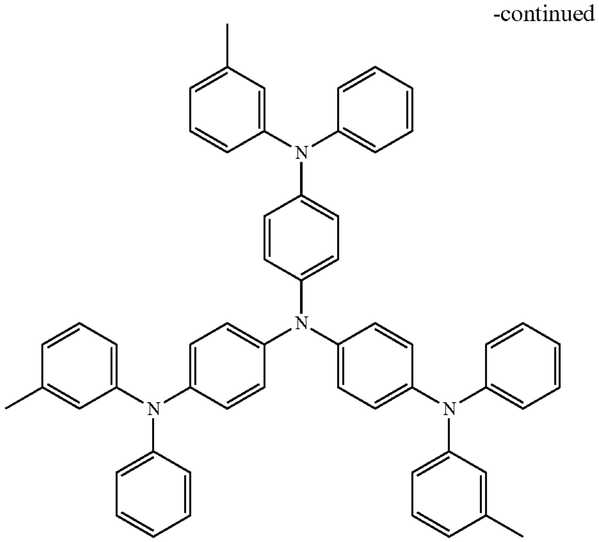
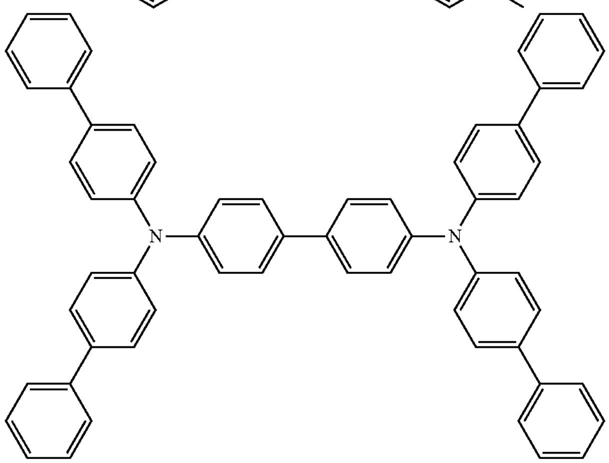
Next, preferred compounds for use as an electron blocking material are shown below.
Next, preferred compounds for use as a hole blocking material are shown below.
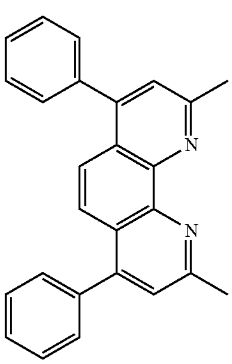
-continued
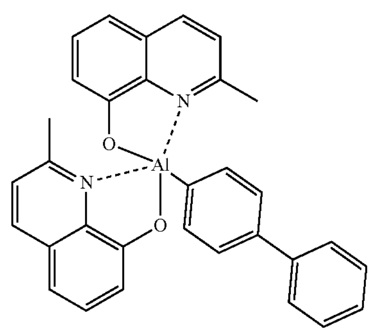
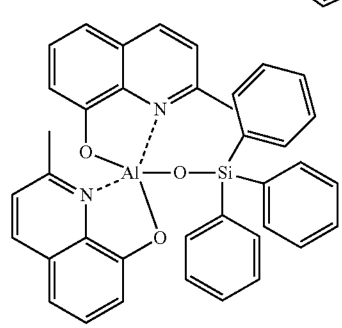

-continued
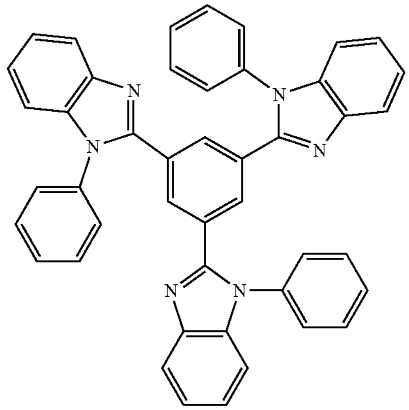
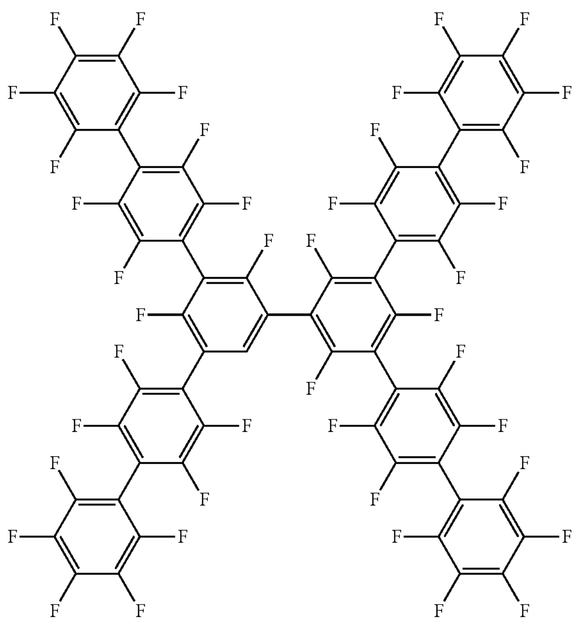
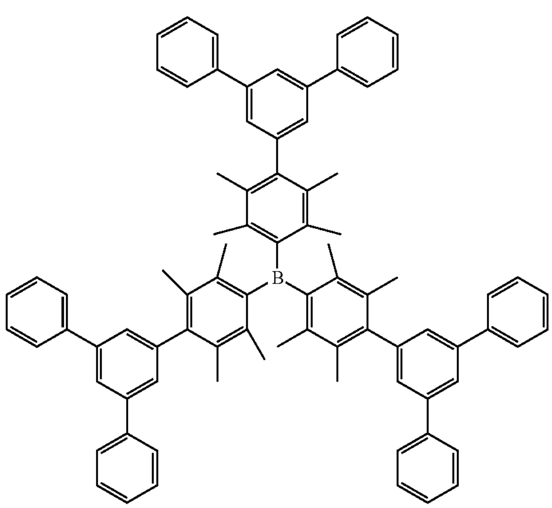
-continued
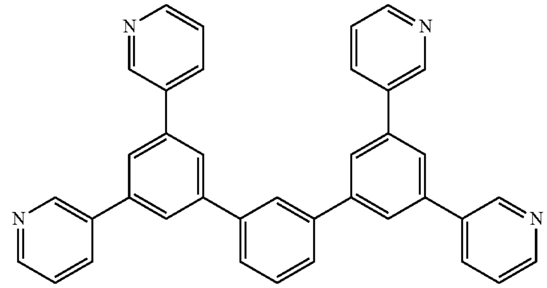
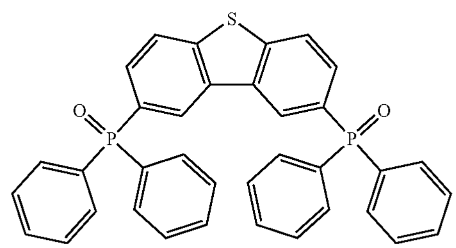
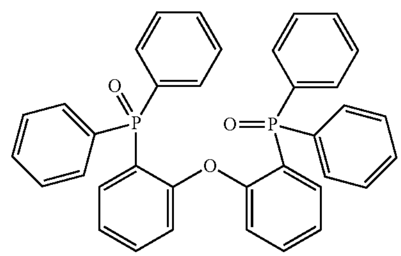
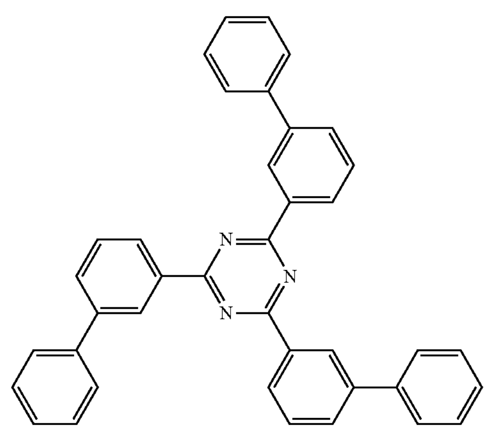
Next preferred compounds for use as an electron transport material are shown below.

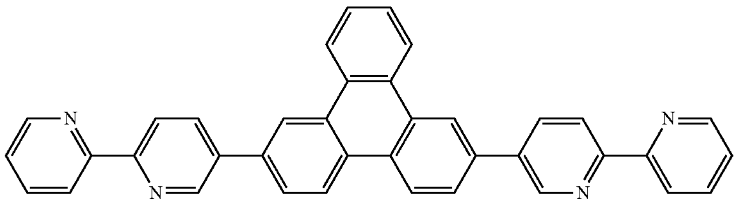
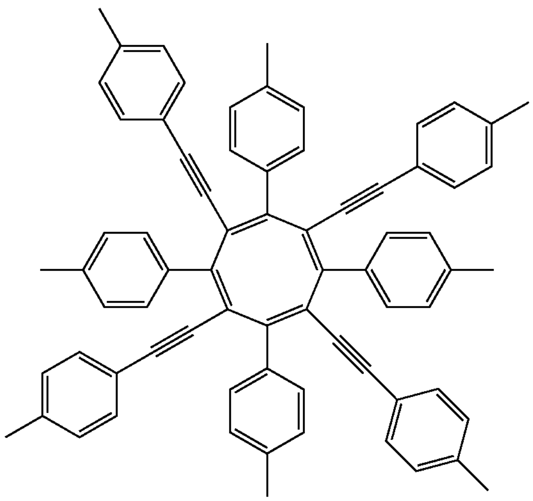
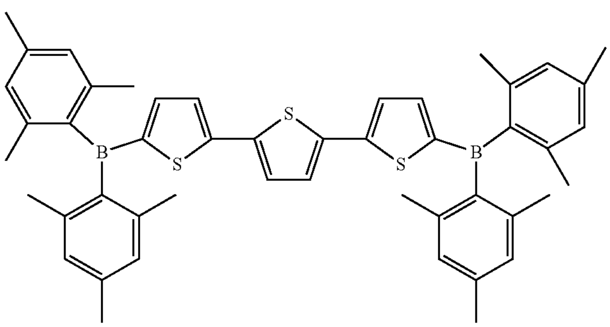
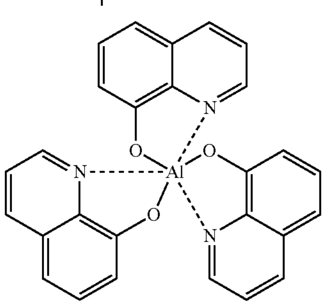
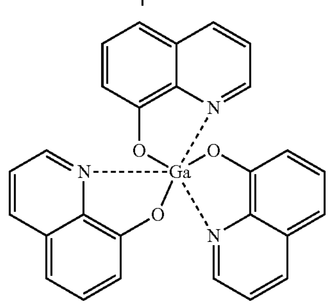
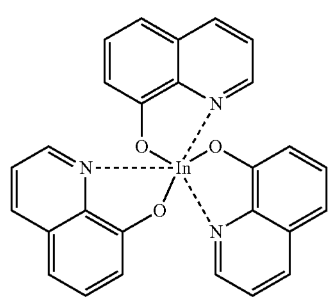
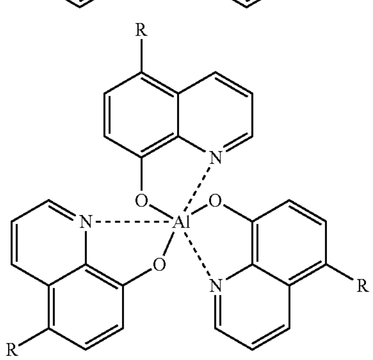
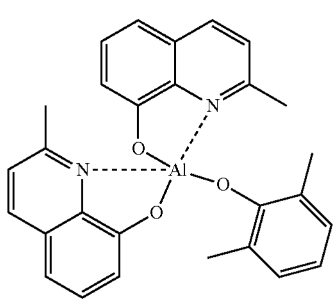
R = H, alkyl, aryl, heteroaryl -continued
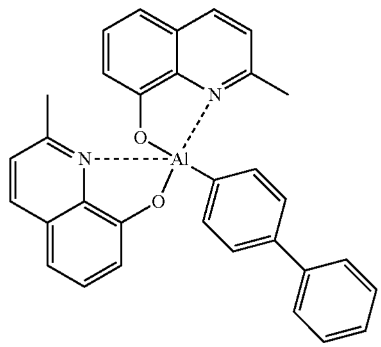
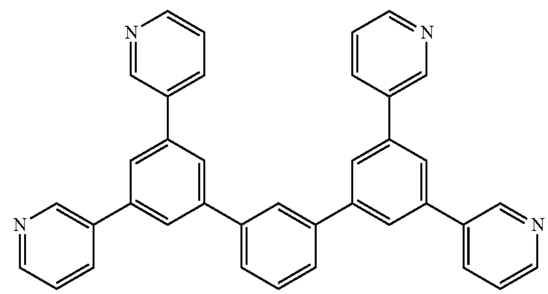
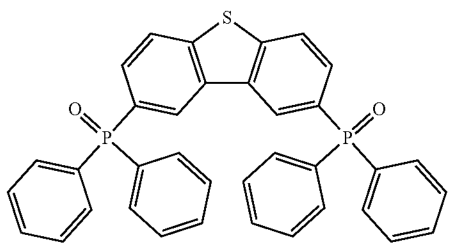
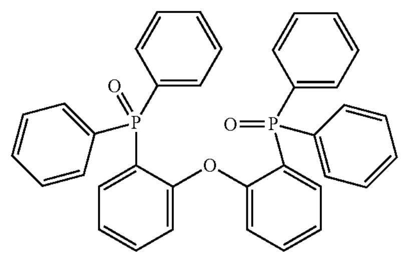
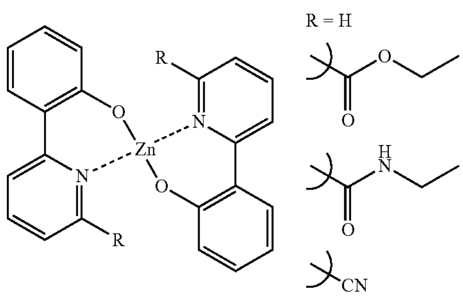
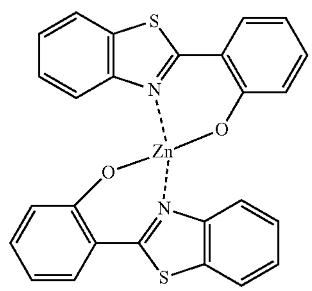
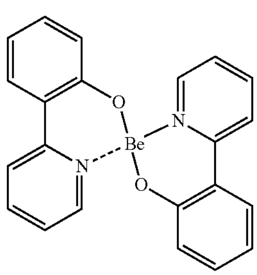
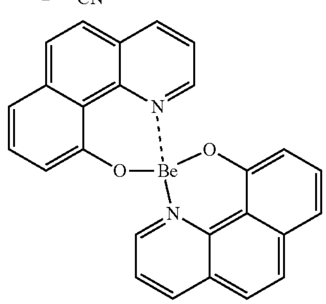
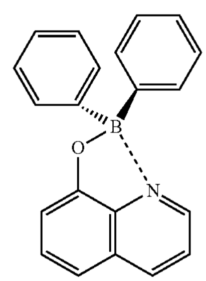
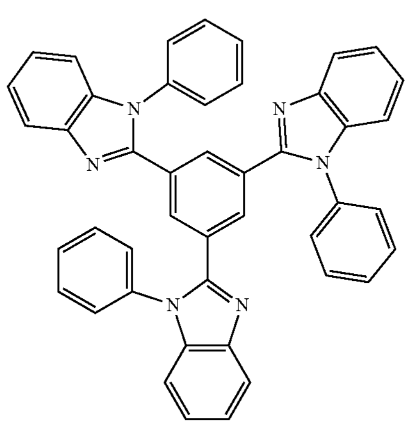

-continued
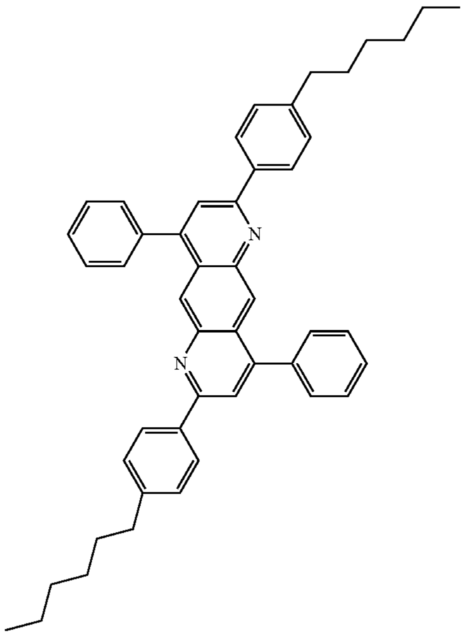
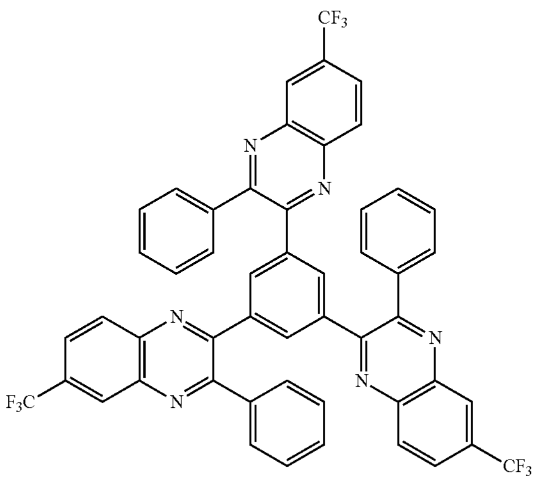
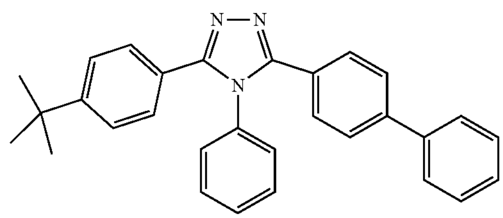
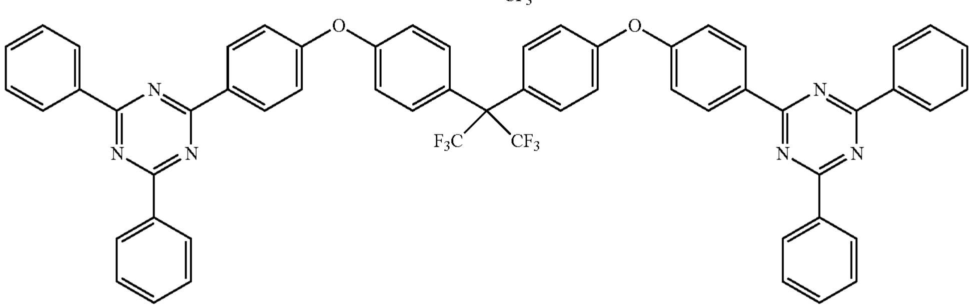
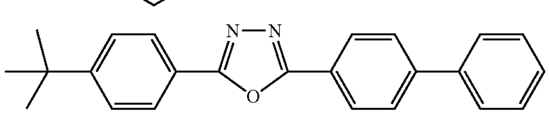
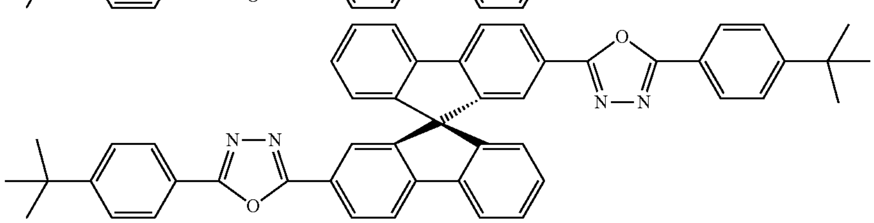

-continued
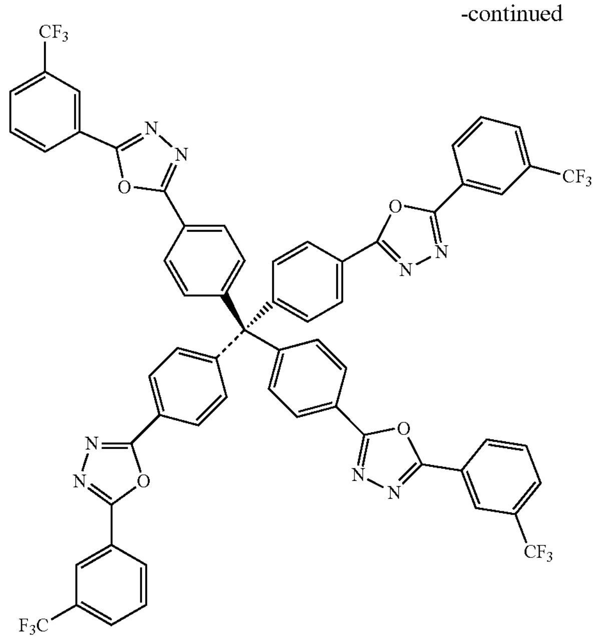
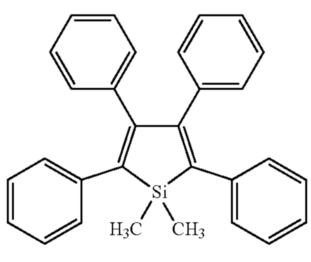
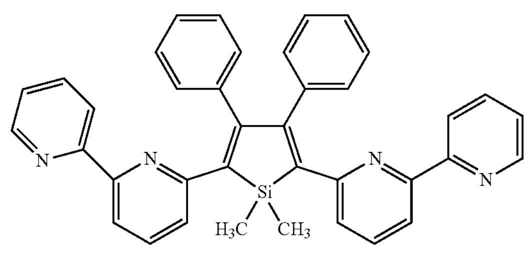
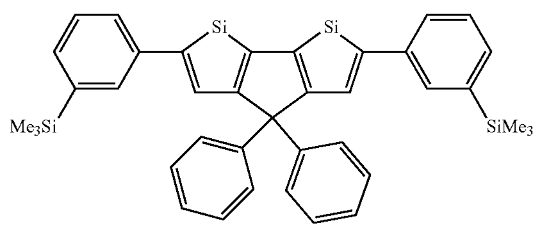
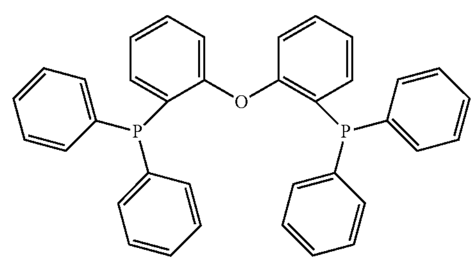
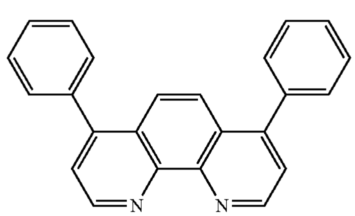
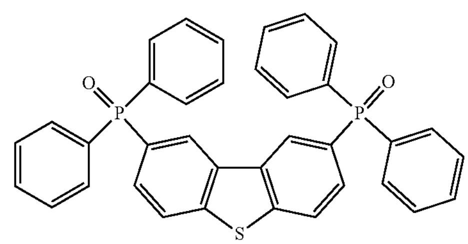

Next preferred compounds for use as an electron injection material are shown below.

LiF, CsF

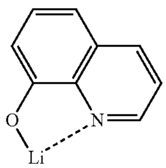

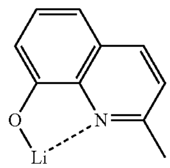

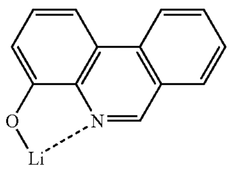

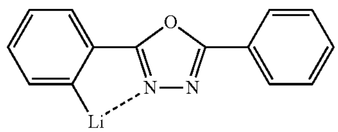

Further, preferred compounds for use as an additive material are shown below. For example, the compounds may be added as a stabilizer material.

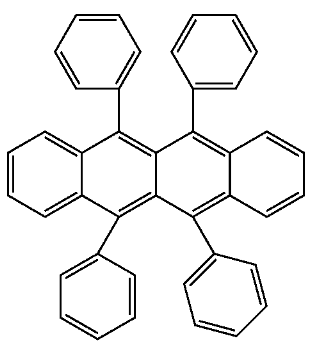

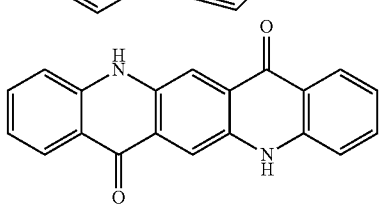

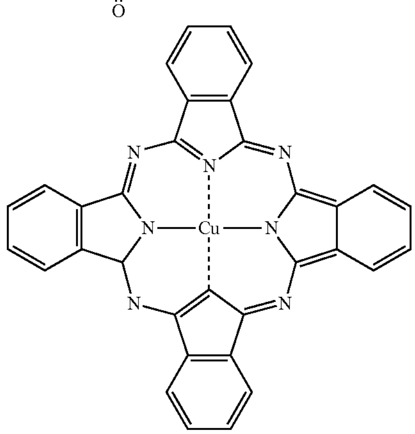

-continued

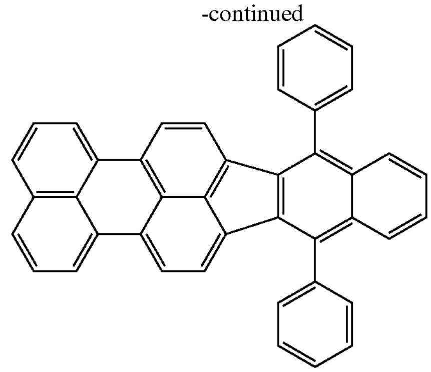

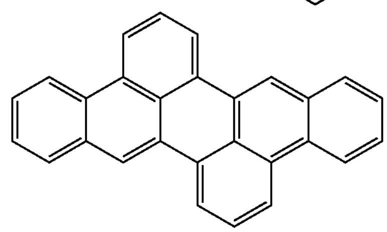

The organic electroluminescent device produced according to the above-mentioned method emits light when given an electric field between the anode and the cathode therein. At this time, when the emission is by excited singlet energy, light having a wavelength in accordance with the energy level is recognized as fluorescence. Also at this time, delayed fluorescence may be recognized. When the emission is by excited triplet energy, the wavelength in accordance with the energy level is recognized as phosphorescence. Ordinary fluorescence has a shorter fluorescence lifetime than delayed fluorescence, and therefore the emission lifetime can be differentiated between fluorescence and delayed fluorescence.

On the other hand, regarding phosphorescence, excited triplet energy in an ordinary organic compound is unstable and is converted into heat, that is, the lifetime is short and the compound is immediately deactivated, and therefore phosphorescence is observed little at room temperature. For measuring the excited triplet energy of an ordinary organic compound, emission from the compound under an extremely low temperature condition may be observed for the measurement.

The driving system of the organic electroluminescent device of the present invention is not specifically limited, and an active driving system or a passive driving system may be employed, but an active driving system is preferred for the device. Employing an active driving system, the emission time can be prolonged more than that of the organic light emitting device in a passive driving system, and under the condition, the driving voltage to attain a desired brightness can be reduced to secure power saving.

[Organic Electroluminescent Display Apparatus]

In the following, one example of an organic electroluminescent display apparatus to drive an organic electroluminescent device in an active driving system is described.

An organic electroluminescent display apparatus in an active driving system is composed of, for example, the above-mentioned electroluminescent device added with a TFT (thin film transistor) circuit, an interlayer insulating film, a flattening film and a sealing structure. Specifically, the organic electroluminescent display apparatus in such an active driving system is, as an outline configuration thereof, composed of a TFT circuit-having substrate (circuit substrate), an organic electroluminescent device (organic EL device) arranged on the circuit substrate via an interlayer insulating film and a flattening film therebetween, an inorganic sealing film to cover the organic EL device, a sealing substrate arranged on the inorganic sealing film, and a sealant material filled between the substrate and the sealing substrate, and this is referred to as a top emission configuration of taking out the emitted light from the side of the sealing substrate.

The organic EL device to be used in the organic electroluminescent display apparatus has a laminate structure composed of a first electrode, an organic EL layer and a second electrode in the remaining part except the substrate.

The TFT substrate is composed of a substrate and a TFT circuit arranged on the substrate.

Examples of the substrate include, though not limited thereto, an insulating substrate such as an inorganic material substrate of glass or quartz, a plastic substrate of polyethylene terephthalate, polycarbazole or polyimide, or a ceramic substrate of alumina; a metal substrate of aluminum (Al) or iron (Fe) a substrate formed by coating the surface of the above-mentioned substrate with an organic insulating material of silicon oxide ($SiO_2$) or the like; and a substrate formed by treating the surface of a metal substrate of Al for electric insulation through anodic oxidation.

The TFT circuit has plural TFTs (thin film transistors) arranged in an X-Y matrix form and various wirings (signal electrode wires, scanning electrode wires, common electrode wires, first driving electrode and second driving electrode), and these are previously formed on a substrate before an organic EL layer is formed thereon. The TFT circuit functions as a switching circuit and a driving circuit for the electroluminescent device. In the electroluminescent device in an active driving system in the present invention, a metal-insulator-metal (MIM) diode may be provided on the substrate in place of the TFT circuit.

TFT is configured to have an active layer, a gate insulating film, a source electrode, a drain electrode and a gate electrode. The type of TFT is not specifically limited, and any conventionally known ones including a staggered TFT, an inversely-staggered TFT, a top gate TFT and a coplanar TFT may be used here.

The material of the active layer includes an inorganic semiconductor material such as amorphous silicon, polycrystalline silicon (polysilicon), microcrystalline silicon, and cadmium selenide; an oxide semiconductor material such as zinc oxide, and indium oxide-gallium oxide-zinc oxide; and an organic semiconductor material such as polythiophene derivatives, thiophene oligomers, poly(p-phenylenevinylene) derivatives, naphthacene, and pentacene.

The gate insulating film may be formed of any known material. Specifically, examples of the gate insulating film material include $SiO_2$ formed according to a plasma enhanced chemical vapor deposition (PECVD) method or a low pressure chemical vapor deposition (LPCVD) method, as well as $SiO_2$ formed through thermal oxidation of a polysilicon film.

The source electrode, the drain electrode and the gate electrode, as well as the signal electrode wire, the scanning electrode wire, the common electrode wire, the first driving electrode and the second driving electrode of the wiring circuits may be formed using a known material of, for example, tantalum (Ta), aluminum (Al) or copper (Cu).

The interlayer insulating film is formed to cover the top face of the substrate and the TFT circuits.

The interlayer insulating film may be formed using a known material of, for example, an inorganic material such as silicon oxide ($SiO_2$), silicon nitride (SiN, $Si_2N_4$, or tantalum oxide (TaO, $Ta_2O_5$); or an organic material such as an acrylic resin or a resist material. As a method for forming the interlayer insulating film, for example, herein employable is a dry process of a chemical vapor deposition (CVD) method or a vacuum evaporation method, as well as a wet process of a spin coating method. If desired, the film may be patterned through photolithography.

Preferably, the interlayer insulating film is made to have a light blocking effect by itself, or an interlayer insulating film and a light-blocking insulating film are combined for use herein. In the organic electroluminescent display apparatus, the emitted light is taken out from the sealing substrate side, and therefore most members thereof are formed of a light transmissive material. Consequently, there may be a risk of external light incident on TFT circuits to destabilize the TFT properties. As opposed to this, when the interlayer insulating film is made to have a light blocking effect by itself or the interlayer insulating film is combined with a light blocking insulating film, external light may be prevented from entering TFT circuits and stable TFT properties can be attained. Examples of the materials for a light blocking interlayer insulating film and a light blocking insulating film include those prepared by dispersing a pigment or a dye such as phthalocyanine or quinacridone in a polymer resin such as polyimide, as well as color resists, black matrix materials, and inorganic insulating materials such as $NixZnyFe_2O_4$.

The flattening film is arranged on the interlayer insulating film. The flattening film is arranged for the purpose of preventing occurrence of defects in the organic EL device (for example, deficits in the first electrode and the organic EL layer, wire breaking of the second electrode, short circuit between the first electrode and the second electrode, withstanding pressure reduction) to result from the surface roughness of the TFT circuits. The flattening film may be omitted.

Though not specifically limited thereto, the flattening film may be formed using a known material such as an inorganic material of silicon oxide, silicon nitride or tantalum oxide, or an organic material of a polyimide, an acrylic resin or a resist material. For the method of forming the flattening film, herein employable is, though not limited thereto, a dry process of a CVD method or a vacuum evaporation method, or a wet process of a spin coating method. The flattening film may be any of a single-layer film or a multilayer film.

The organic EL device is composed of the first electrode, the organic EL layer and the second electrode, and these are arranged on the flattened film in such a manner that the first electrode side is on the side of the flattened film. However, in the case where the flattened film is not arranged, the organic EL device is so configured that the first electrode side is on the side of the interlayer insulating film therein.

The organic EL device has plural first electrodes arranged in an X-Y matrix form so that each first electrode may correspond to each pixel, and is connected to the drain electrode of TFT. The first electrode functions as a pixel electrode of the organic electroluminescent display apparatus. Preferably, the first electrode is an electrode having a high optical reflectivity (reflective electrode) for enhancing the light taking-out efficiency through the light emitting part. Examples of the electrode of the type include a light reflective metal electrode of aluminum, silver, gold, aluminum-lithium alloy, aluminum-neodymium alloy, or aluminum-silicon alloy, or a composite electrode of a transparent electrode combined with the light reflective metal electrode (reflective electrode).

An edge cover of an insulating material is arranged at the edge along the periphery of each first electrode. This prevents leakage between the first electrode and the second electrode. The edge cover may be arranged by forming a coating film according to a known method of an EB evaporation method, a sputtering method, an ion plating method or a resistance heating evaporation method, and patterning the film through known dry-etching or wet-etching photolithography. The insulating material to constitute the edge cover may be any known light transmissive material such as SiO, SiON, SiN, SiOC, SiC, HfSiON, ZrO, HfO or LaO.

The thickness of the edge cover is preferably 100 to 2000 nm. When the edge cover thickness is 100 nm or more, sufficient insulation can be realized and power consumption increase or occurrence of non-emission to be caused by leakage between the first electrode and the second electrode can be effectively prevented. On the other hand, when the edge cover thickness is 2000 nm or less, productivity reduction in the film formation process and wire cutting of the second electrode in the edge cover can be effectively prevented.

On the other hand, the second electrode of the organic EL device functions as a counter electrode to face the pixel electrode. In the organic electroluminescent display apparatus, the light emitted by the light emitting part of the organic EL device therein is taken out from the sealing substrate side via the second electrode, and therefore the second electrode is preferably a semi-transparent electrode. The semi-transparent electrode may be a single layer of a semi-transparent electrode of a metal, or a laminate structure composed of the semi-transparent electrode of a metal and a transparent electrode of any other material, but from the viewpoint of optical reflectivity and transmittance, a semi-transparent electrode formed of silver or a silver alloy is preferably used.

The organic EL layer is so arranged between the first electrode and the second electrode as to have a flat form that is almost the same as the form of the first electrode. Regarding the description and the preferred range of the organic EL layer, and the specific examples of the materials to form the constituent layers, reference may be made to the corresponding description relating to the organic electroluminescent device given hereinabove.

The inorganic sealing film is so arranged as to cover the top face and the side face of the organic EL device formed on the flattened film. The inorganic sealing film may be formed using, for example, a light transmissive inorganic material such as SiO, SiON or SiN. For forming the inorganic sealing film, for example, a plasma CVD method, an ion plating method, an ion beam method or a sputtering method may be employed.

A sealing substrate is arranged on the inorganic sealing film, and a sealant material is filled around the organic EL device arranged between the circuit substrate and the sealing substrate. With that, external oxygen or moisture may be prevented from entering the organic EL layer, and the lifetime of the organic electroluminescent display apparatus can be prolonged.

The sealing substrate may be the same as the substrate used for the circuit substrate, but the emitted light is taken out from the sealing substrate side, the sealing substrate must be a light transmissive substrate. A color filter may be attached to the sealing substrate for increasing color purity.

As the sealant material, any known sealant material may be used and may be formed according to a known method. An example of the sealant material is a resin (curable resin). In this case, for example, a curable resin composition (photocurable resin composition, thermosetting resin composition) is applied to the top face and/or the side face of the inorganic sealing film on the substrate having, as formed thereon, an organic EL device and an inorganic sealing film, or on the sealing substrate, according to a spin coating method or a lamination method, then the substrate and the sealing substrate are stuck together via the coating layer arranged therebetween, and thereafter the curable resin composition is photocured or thermally cured to form the intended sealing material. The sealing material must be a light transmissive one.

As the sealing material, an inert gas such as nitrogen gas or argon gas may also be used. In this case, a method of sealing up an inert gas such as nitrogen gas or argon gas with the sealing substrate of glass or the like may be employed. Further in this case, for the purpose of effectively preventing degradation of the organic EL part by moisture, a moisture absorbent such as barium oxide is preferably sealed up along with the inert gas.

The organic electroluminescent device of the present invention may be applied to any of a single device, a structure with plural devices disposed in an array, and a structure having anodes and cathodes disposed in an X-Y matrix. According to the present invention of forming the exciton generation layer and the light emitting layer as different layers, high efficiency and a long driving lifetime can be realized, and an organic light emitting device excellent in practical utility can be obtained. The organic light-emitting device such as the organic electroluminescent device of the present invention may be applied to a further wide range of purposes. For example, as described above, an organic electroluminescent display apparatus may be produced with the organic electroluminescent device of the invention, and for the details thereof, reference may be made to S. Tokito, C. Adachi and H. Murata, "Yuki EL Display" (Organic EL Display) (Ohmsha, Ltd.). In particular, the organic electroluminescent device of the invention may be applied to organic electroluminescent illuminations and backlights which are highly demanded.

EXAMPLES

The features of the present invention will be described more specifically with reference to Examples given below. The materials, processes, procedures and the like shown below may be appropriately modified unless they deviate from the substance of the invention. Accordingly, the scope of the invention is not construed as being limited to the specific examples shown below. The emission characteristics were evaluated using a source meter (2400 Series, produced by Keithley Instruments Inc.), a semiconductor parameter analyzer (E5273A, produced by Agilent Technologies, Inc.), an optical power meter (1930C, produced by Newport Corporation), an optical spectrometer (USB2000, produced by Ocean Optics, Inc.), a spectroradiometer (SR-3, produced by Topcon Corporation), and a streak camera (Model C4334, produced by Hamamatsu Photonics K.K.).

In these Examples, fluorescence having an emission lifetime of 0.05 μs or more is judged as delayed fluorescence.

The unit of "thickness" in the following Tables to show layer configurations of light emitting devices mentioned below is nm. In the case where one layer contains two or more kinds of materials, the host material is expressed as "material 1" and the dopant material is as "material 2". In the case of a three-component system, the host material is expressed as "material 1" and the other two components are as "material 2" for convenience sake. In the column of "material 2", the concentration (unit: % by weight) of the material 2 in the layer is shown. In Tables, "HIL" represents a hole injection layer, "HTL" represents a hole transport layer, "EBL" represents an electron blocking layer, "INT" represents an isolation layer, "ASL" represents an exciton generation layer. "EML" represents a light emitting layer, "HBL" represents a hole blocking layer, and "ETL" represents an electron transfer layer.

Example 1

On a glass substrate having, as formed thereon, an anode of indium tin oxide (ITO) having a thickness of 100 nm, each thin film was layered according to a vacuum evaporation method under a vacuum degree of $2\times10^{-5}$ Pa.

First, on ITO, HAT-CN was deposited in a thickness of 10 nm to form a hole injection layer, and on this, TrisPCz was deposited in a thickness of 30 nm to form a hole transport layer. Subsequently, mCBP was deposited in a thickness of 6.5 nm to form an electron blocking layer.

Next, TBRb and mCBP were co-deposited from different evaporation sources to form a light emitting layer having a thickness of 5 nm. At this time, the concentration of TBRb was 1% by weight. On this, 4CzIPNMe and mCBP were co-deposited from different evaporation sources to form an exciton generation layer having a thickness of 10 nm. At this time, the concentration of 4CzIPNMe was 10% by weight.

Next, T2T was deposited in a thickness of 12 nm to form a hole blocking layer, and on this, BpyTP2 was deposited in a thickness of 55 nm to form an electron transport layer. Further, Liq was formed to have a thickness of 1 nm, and then aluminum (Al) was formed in a thickness of 100 nm to form a cathode.

According to the above-mentioned process, an organic electroluminescent device of Example 1 having a layer configuration as shown in Table 1 was produced.

Examples 2 to 8

Organic electroluminescent devices were produced in the same manner as in Example 1 except that the concentration of TBRb in the light emitting layer was changed as in Table 1.

Comparative Example 1

An organic electroluminescent device of Comparative Example 1 was produced in the same manner as in Example 1. In this, however, the exciton generation layer was not formed, and the light emitting layer is a layer formed through co-evaporation of 4CzIPNMe and TBRb and mCBP from different evaporation sources to have a thickness of 15 nm. In forming the light emitting layer, the concentration of 4CzIPNMe was 10% by weight and the concentration of TBRb was 1% by weight. The layer configuration of the organic electroluminescent device of Comparative Example 1 is shown in Table 1.

Comparative Examples 2 to 8

Organic electroluminescent devices were produced in the same manner as in Comparative Example 1 except that the concentration of TBRb in the light emitting layer was changed as in Table 1.

$\Delta E_{ST}$ of 4CzIPNMe used in Examples and Comparative Examples was 0.02 eV.

TABLE 1

| | Anode | | HIL | | HTL | | EBL | | EML | | |
|---|---|---|---|---|---|---|---|---|---|---|---|
| Example No. | Material | Thickness | Material | Thickness | Material | Thickness | Material | Thickness | Material 1 | Material 2 | Material 2 |
| Example 1 | ITO | 100 | HAT-CN | 10 | TrisPCz | 30 | mCBP | 6.5 | mCBP | — | 1 wt % TBRb |
| Example 2 | ITO | 100 | HAT-CN | 10 | TrisPCz | 30 | mCBP | 6.5 | mCBP | — | 2 wt % TBRb |
| Example 3 | ITO | 100 | HAT-CN | 10 | TrisPCz | 30 | mCBP | 6.5 | mCBP | — | 3 wt % TBRb |
| Example 4 | ITO | 100 | HAT-CN | 10 | TrisPCz | 30 | mCBP | 6.5 | mCBP | — | 5 wt % TBRb |
| Example 5 | ITO | 100 | HAT-CN | 10 | TrisPCz | 30 | mCBP | 6.5 | mCBP | — | 25 wt % TBRb |
| Example 6 | ITO | 100 | HAT-CN | 10 | TrisPCz | 30 | mCBP | 6.5 | mCBP | — | 50 wt % TBRb |
| Example 7 | ITO | 100 | HAT-CN | 10 | TrisPCz | 30 | mCBP | 6.5 | mCBP | — | 75 wt % TBRb |
| Example 8 | ITO | 100 | HAT-CN | 10 | TrisPCz | 30 | mCBP | 6.5 | mCBP | — | 100 wt % TBRb |
| Comparative Example 1 | ITO | 100 | HAT-CN | 10 | TrisPCz | 30 | mCBP | 6.5 | mCBP | 10 wt % 4CzIPNMe | 1 wt % TBRb |
| Comparative Example 2 | ITO | 100 | HAT-CN | 10 | TrisPCz | 30 | mCBP | 6.5 | mCBP | 10 wt % 4CzIPNMe | 2 wt % TBRb |
| Comparative Example 3 | ITO | 100 | HAT-CN | 10 | TrisPCz | 30 | mCBP | 6.5 | mCBP | 10 wt % 4CzIPNMe | 3 wt % TBRb |
| Comparative Example 4 | ITO | 100 | HAT-CN | 10 | TrisPCz | 30 | mCBP | 6.5 | mCBP | 10 wt % 4CzIPNMe | 5 wt % TBRb |
| Comparative Example 5 | ITO | 100 | HAT-CN | 10 | TrisPCz | 30 | mCBP | 6.5 | mCBP | 10 wt % 4CzIPNMe | 25 wt % TBRb |

TABLE 1-continued

| | | | | | | | | | | |
|---|---|---|---|---|---|---|---|---|---|---|
| Comparative Example 6 | ITO | 100 | I1AT-CN | 10 | TrisPCz | 30 | mCBP | 6.5 | mCBP | 10 wt % 4CzIPNMe | 50 wt % TBRb |
| Comparative Example 7 | ITO | 100 | HAT-CN | 10 | TrisPCz | 30 | mCBP | 6.5 | mCBP | 10 wt % 4CzIPNMe | 75 wt % TBRb |
| Comparative Example 8 | ITO | 100 | HAT-CN | 10 | TrisPCz | 30 | mCBP | 6.5 | mCBP | 10 wt % 4CzIPNMe | 90 wt % TBRb |

| | | EGL | | | HBL | | ETL | | cathode | |
|---|---|---|---|---|---|---|---|---|---|---|
| Example No. | EML Thickness | Material 1 | Material 2 | Thickness | Material | Thickness | Material | Thickness | Material | Thickness |
| Example 1 | 5 | mCBP | 10 wt % 4CzIPNMe | 10 | T2T | 12 | BpyTP2 | 55 | Liq/Al | 1.0/100 |
| Example 2 | 5 | mCBP | 10 wt % 4CzIPNMe | 10 | T2T | 12 | BpyTP2 | 55 | Liq/Al | 1.0/100 |
| Example 3 | 5 | mCBP | 10 wt % 4CzIPNMe | 10 | T2T | 12 | BpyTP2 | 55 | Liq/Al | 1.0/100 |
| Example 4 | 5 | mCBP | 10 wt % 4CzIPNMe | 10 | T2T | 12 | BpyTP2 | 55 | Liq/Al | 1.0/100 |
| Example 5 | 5 | mCBP | 10 wt % 4CzIPNMe | 10 | T2T | 12 | BpyTP2 | 55 | Liq/Al | 1.0/100 |
| Example 6 | 5 | mCBP | 10 wt % 4CzIPNMe | 10 | T2T | 12 | BpyTP2 | 55 | Liq/Al | 1.0/100 |
| Example 7 | 5 | mCBP | 10 wt % 4CzIPNMe | 10 | T2T | 12 | BpyTP2 | 55 | Liq/Al | 1.0/100 |
| Example 8 | 5 | mCBP | 10 wt % 4CzIPNMe | 10 | T2T | 12 | BpyTP2 | 55 | Liq/Al | 1.0/100 |
| Comparative Example 1 | 5 | | | | T2T | 12 | BpyTP2 | 55 | Liq/Al | 1.0/100 |
| Comparative Example 2 | 5 | | | | T2T | 12 | BpyTP2 | 55 | Liq/Al | 1.0/100 |
| Comparative Example 3 | 5 | | | | T2T | 12 | BpyTP2 | 55 | Liq/Al | 1.0/100 |
| Comparative Example 4 | 5 | | | | T2T | 12 | BpyTP2 | 55 | Liq/Al | 1.0/100 |
| Comparative Example 5 | 5 | | | | T2T | 12 | BpyTP2 | 55 | Liq/Al | 1.0/100 |
| Comparative Example 6 | 5 | | | | T2T | 12 | BpyTP2 | 55 | Liq/Al | 1.0/100 |
| Comparative Example 7 | 5 | | | | T2T | 12 | BpyTP2 | 55 | Liq/Al | 1.0/100 |
| Comparative Example 8 | 5 | | | | T2T | 12 | BpyTP2 | 55 | Liq/Al | 1.0/100 |

Of each organic electroluminescent device produced in Examples and Comparative Examples, the transient decay curve of the emission intensity was measured, which confirmed delayed fluorescence emission from each device.

Of each organic electroluminescent device produced in Examples, the emission peak wavelength measured at 1000 cd/m$^2$, the external quantum efficiency and the chromaticity coordinate (x, y) are shown in Table 2; and of each organic electroluminescent device produced in Comparative Examples, the emission peak wavelength measured at 1000 cd/m$^2$, the external quantum efficiency and the chromaticity coordinate (x) are shown in Table 3.

TABLE 2

| Example No. | TBRb Concentration in light emitting layer (% by weight) | External Quantum Efficiency (%) | Emission Peak Wavelength (nm) | Chromaticity Coordinate x | y |
|---|---|---|---|---|---|
| Example 1 | 1 | 12.9 | 549.1 | 0.40 | 0.57 |
| Example 2 | 2 | 12.8 | 549.8 | 0.41 | 0.56 |
| Example 3 | 3 | 11.8 | 554.2 | 0.42 | 0.56 |
| Example 4 | 5 | 11.9 | 557.6 | 0.42 | 0.55 |
| Example 5 | 25 | 8.9 | 563.8 | 0.43 | 0.55 |

TABLE 2-continued

| Example No. | TBRb Concentration in light emitting layer (% by weight) | External Quantum Efficiency (%) | Emission Peak Wavelength (nm) | Chromaticity Coordinate x | y |
|---|---|---|---|---|---|
| Example 6 | 50 | 6.8 | 564.7 | 0.44 | 0.54 |
| Example 7 | 75 | 5.4 | 564.3 | 0.44 | 0.53 |
| Example 8 | 100 | 4.4 | 567.6 | 0.46 | 0.53 |

TABLE 3

| Example No. | TBRb Concentration in light emitting layer (% by weight) | External Quantum Efficiency (%) | Emission Peak Wavelength (nm) | Chromaticity Coordinate x | y |
|---|---|---|---|---|---|
| Comparative Example 1 | 1 | 11.9 | 561.1 | 0.46 | 0.53 |
| Comparative Example 2 | 2 | 11.6 | 563.4 | 0.47 | 0.52 |
| Comparative Example 3 | 3 | 9.5 | 567.7 | 0.49 | 0.50 |

TABLE 3-continued

| Example No. | TBRb Concentration in light emitting layer (% by weight) | External Quantum Efficiency (%) | Emission Peak Wavelength (nm) | Chromaticity Coordinate x | Chromaticity Coordinate y |
|---|---|---|---|---|---|
| Comparative Example 4 | 5 | 7.7 | 568.3 | 0.50 | 0.49 |
| Comparative Example 5 | 25 | 2.1 | 572.3 | 0.52 | 0.48 |
| Comparative Example 6 | 50 | 1.2 | 572.2 | 0.52 | 0.47 |
| Comparative Example 7 | 75 | 0.8 | 573.4 | 0.52 | 0.47 |
| Comparative Example 8 | 90 | 0.7 | 572.2 | 0.52 | 0.47 |

In Table 2 and Table 3, the devices having the same TBRb concentration in the light emitting layer were compared with each other. It is known that the organic electroluminescent devices of Examples 1 to 8 all have a higher external quantum efficiency than the organic electroluminescent devices of Comparative Examples 1 to 8, the emission peak wavelength of the former is shorter than the latter, and the blue color purity of the former is higher than the latter. The maximum external quantum efficiency of the organic electroluminescent devices of Examples 1 to 8 was measured and was more than 10%, that is, the devices all have a favorable result. In particular, the maximum external quantum efficiency of the organic electroluminescent devices of Examples 1 to 4 is 13 to 14%, and these devices have a more favorable result.

Further, among the organic electroluminescent devices produced in Examples and Comparative Examples, those having a TBRb concentration in the light emitting layer of 25% by weight, 50% by weight and 75% by weight (devices produced in Example 5 to Example 7, and devices produced in Comparative Examples 5 to 7) were tested for continuous driving at a constant current and at a controlled initial brightness of about 1000 cd/m$^2$, and the time LT95% taken until the brightness of each device became 95% of the initial brightness was measured. The measurement results of LT95% are shown in Table 4.

TABLE 4

| Example No. | TBRb Concentration in light emitting layer (% by weight) | LT95% (hour) |
|---|---|---|
| Example 5 | 25 | 360 |
| Example 6 | 50 | 385 |
| Example 7 | 75 | 556 |
| Comparative Example 5 | 25 | 61 |
| Comparative Example 6 | 50 | 36 |
| Comparative Example 7 | 75 | 17 |

In Table 4, the devices having the same TBRb concentration in the light emitting layer were compared with each other. It is known that the organic electroluminescent devices of Examples 5 to 8 all have a markedly long LT95% as compared with the organic electroluminescent devices of Comparative Examples 5 to 8, that is, the former all have a long lifetime.

From these, it is known that, when an exciton generation layer containing a compound having $\Delta E_{ST}$ of 0.3 or less and a light emitting layer containing a light emitting material are formed as different layers, the efficiency and the lifetime of the organic electroluminescent devices are significantly improved as compared with the case where a single light emitting layer containing both the two is formed.

Examples 9 to 12

Organic electroluminescent devices of Examples 9 to 12 were produced according to the same method as in Example 1. However, in these, between the electron blocking layer and the light emitting layer, an exciton generation layer and an isolation layer were formed in that order from the side of the electron blocking layer, and between the light emitting layer and the hole blocking layer, an isolation layer, an exciton generation layer and an isolation layer were formed in that order from the side of the light emitting layer. The layer configurations of the organic electroluminescent devices of Examples 9 to 12 are shown in the following Table.

TABLE 5

| Example No. | Anode Material | Anode Thickness | HIL Material | HIL Thickness | HTL Material | HTL Thickness | EBL Material | EBL Thickness | EGL Material 1 | EGL Material 2 | EGL Thickness |
|---|---|---|---|---|---|---|---|---|---|---|---|
| Example 9 | ITO | 100 | HAT-CN | 10 | TrisPCz | 30 | mCBP | 6.5 | mCBP | 10 wt % 4CzIPNMe | 5 |
| Example 10 | ITO | 100 | HAT-CN | 10 | TrisPCz | 30 | mCBP | 5.5 | mCBP | 10 wt % 4CzIPNMe | 5 |
| Example 11 | ITO | 100 | HAT-CN | 10 | TrisPCz | 30 | mCBP | 5.5 | mCBP | 10 wt % 4CzIPNMe | 5 |
| Example 12 | ITO | 100 | HAT-CN | 10 | TrisPCz | 30 | mCBP | 6.5 | mCBP | 10 wt % 4CzIPNMe | 5 |

| Example No. | INT Material | INT Thickness | EML Material 1 | EML Material 2 | EML Thickness | INT Material | INT Thickness | EGL Material 1 | EGL Material 2 |
|---|---|---|---|---|---|---|---|---|---|
| Example 9 | mCBP | 1 | mCBP | 1 wt % TBRb | 5 | mCBP | 1 | mCBP | 10 wt % 4CzIPNMe |
| Example 10 | mCBP | 2 | mCBP | 1 wt % TBRb | 5 | mCBP | 2 | mCBP | 10 wt % 4CzIPNMe |
| Example 11 | mCBP | 2 | mCBP | 1 wt % TBRb | 5 | mCBP | 2 | mCBP | 10 wt % 4CzIPNMe |

TABLE 5-continued

| | | | | | | | | | |
|---|---|---|---|---|---|---|---|---|---|
| Example 12 | mCBP | 1 | mCBP | 1 wt % TBRb | 5 | mCBP | 1 | mCBP | 10 wt % 4CzIPNMe |

| | EGL | INT | | HBL | | ETL | | cathode | |
|---|---|---|---|---|---|---|---|---|---|
| Example No. | Thickness | Material | Thickness | Material | Thickness | Material | Thickness | Material | Thickness |
| Example 9 | 5 | mCBP | 2 | T2T | 10 | BpyTP2 | 55 | Liq/Al | 1.0/100 |
| Example 10 | 5 | mCBP | 1 | T2T | 10 | BpyTP2 | 55 | Liq/Al | 1.0/100 |
| Example 11 | 5 | T2T | 1 | T2T | 10 | BpyTP2 | 55 | Liq/Al | 1.0/100 |
| Example 12 | 5 | T2T | 2 | T2T | 10 | BpyTP2 | 55 | Liq/Al | 1.0/100 |

The emission peak wavelength was 546.0 nm in the organic electroluminescent device of Example 9, 545.0 nm in the organic electroluminescent device of Example 10, 545.8 nm in the organic electroluminescent device of Example 11, and 548.1 nm in the organic electroluminescent device of Example 12.

Examples were compared in point of current density. The organic electroluminescent devices of Examples 9 and 12 where the thickness of the isolation layer formed between the exciton generation layer and the light emitting layer is 1 nm have a higher current density than that of the organic electroluminescent devices of Examples 10 and 11 where the thickness of the isolation layer is 2 nm. From this, it is known that the thickness of the isolation layer to be formed between the exciton generation layer and the light emitting layer is preferably smaller than 2 nm. The maximum external quantum efficiency of the organic electroluminescent devices of Examples 9 to 12 is 13 to 14%, that is, the devices all have a high emission efficiency.

Comparative Example 9, Example 13, Example 14

Organic electroluminescent devices of Comparative Example 9, Example 13 and Example 14 were produced according to the same method as in Example 1. However, in Example 13 and Example 14, the light emitting layer was formed between the exciton generation layer and the hole blocking layer. The layer configurations of the organic electroluminescent devices of Comparative Example 9, Example 13 and Example 14 are shown in the following Table.

TABLE 6

| | Anode | | HIL | | HTL | | EBL | | EML | | | EGL (EML in Comparative Example 9) |
|---|---|---|---|---|---|---|---|---|---|---|---|---|
| Example No. | Material | Thickness | Material | Thickness | Material | Thickness | Material | Thickness | Material 1 | Material 2 | Thickness | Material 1 |
| Comparative Example 9 | ITO | 100 | HAT-CN | 10 | TrisPCz | 30 | mCBP | 6.5 | | | | mCBP |
| Example 13 | ITO | 100 | HAT-CN | 10 | TrisPCz | 30 | mCBP | 6.5 | | | | mCBP |
| Example 14 | ITO | 100 | HAT-CN | 10 | TrisPCz | 30 | mCBP | 6.5 | mCBP | 5 wt % TBRb | 5 | mCBP |

| | EGL (EML in Comparative Example 9) | | | EML | | | HBL | | ETL | | cathode | |
|---|---|---|---|---|---|---|---|---|---|---|---|---|
| Example No. | Material 2 | Material 2 | Thickness | Material 1 | Material 2 | Thickness | Material | Thickness | Material | Thickness | Material | Thickness |
| Comparative Example 9 | 20 wt % 4CzIPNMe | 5 wt % TBRb | 5 | | | | T2T | 12 | BpyTP2 | 55 | Liq/Al | 1.0/100 |
| Example 13 | 20 wt % 4CzIPNMe | | 5 | T2T | 5 wt % TBRb | 5 | T2T | 12 | BpyTP2 | 55 | Liq/Al | 1.0/100 |
| Example 14 | 20 wt % 4CzIPNMe | | 5 | T2T | 5 wt % TBRb | 5 | T2T | 12 | BpyTP2 | 55 | Liq/Al | 1.0/100 |

Of the organic electroluminescent devices of Comparative Example 9, Example 13 and Example 14, the transient decay curve of the emission intensity was measured, which confirmed delayed fluorescence emission from each device.

The current density-external quantum efficiency characteristics of each organic electroluminescent device are shown in FIG. 2. As compared with that of Comparative Example 9, each organic electroluminescent device of Example 13 and Example 14 shows a higher emission efficiency. From this, it is confirmed that the exciton generation layer formed in the device improves the emission efficiency of the device.

Example 15

A mixture of zinc acetate 1 g, monoethanolamine 0.28 g and 2-methoxyethanol 10 ml was stirred overnight at room temperature, and then applied a glass substrate having, as formed thereon, a cathode of indium tin oxide (ITO) having a thickness of 100 nm, according to a spin coating method (5000 rpm, 60 seconds). Subsequently, this was annealed at 200° C. for 10 minutes to form an electron injection layer. On this, a quantum dot/toluene solution (by Aldrich. Model No. 753785, particle size 6 nm, concentration 1 mg/ml, fluorescence peak wavelength 575 nm) was applied according to a spin coating method (1000 rpm, 60 seconds), and annealed at 100° C. for 10 minutes to form a light emitting layer having a thickness of about 12 nm. Subsequently, the following thin films were layered thereon according to a vacuum evaporation method under a vacuum degree of $2\times10^{-5}$ Pa. First, 4CzIPN and mCBP were co-deposited from different evaporation sources in a thickness of 15 nm to form an exciton generation layer. At this time, the concentration of 4CzIPN was 20%. Next, mCBP was deposited in a thickness of 5 nm to form an electron blocking layer, and on this, TrisPCz was deposited in a thickness of 30 nm to form a hole transport layer. Subsequently, HAT-CN was deposited in a thickness of 20 nm to form a hole injection layer, and then aluminum (Al) was formed in a thickness of 100 nm to form an anode.

According to the above-mentioned process, an organic electroluminescent device of Example 15 having a layer configuration shown in Table 7 was produced.

$\Delta E_{ST}$ of 4CzIPN used in Example 15 was 0.06 eV.

Comparative Example 10

An organic electroluminescent device of Comparative Example 10 was produced according to the same method as in Example 15. However, in forming a layer corresponding to the exciton generation layer in this, 4CzIPN was not co-deposited but a layer of mCBP alone was formed to have a thickness of 15 nm. The layer configuration of the organic electroluminescent device of Comparative Example 10 is shown in Table 7.

TABLE 7

| | cathode | | EIL | | EML | | EGL (EBL in Comparative Example 9) | | |
|---|---|---|---|---|---|---|---|---|---|
| Example No. | Material | Thickness | Material | Thickness | Material | Thickness | Material 1 | Material 2 | Thickness |
| Example 15 | ITO | 100 | ZnO | 50 | Red-QD | about 12 | mCBP | 20 wt % 4CzIPN | 15 |
| Comparative Example 10 | ITO | 100 | ZnO | 50 | Red-QD | about 12 | mCBP | | 15 |

| | EBL | | HTL | | HIL | | Anode | |
|---|---|---|---|---|---|---|---|---|
| Example No. | Material 1 | Thickness | Material | Thickness | Material | Thickness | Material | Thickness |
| Example 15 | mCBP | 5 | TrisPCz | 30 | HAT-CN | 20 | Al | 100 |
| Comparative Example 10 | mCBP | 5 | TrisPCz | 30 | HAT-CN | 20 | Al | 100 |

Of the organic electroluminescent devices of Example 15 and Comparative Example 10, the transient decay curve of the emission intensity was measured. In Example 15, delayed fluorescence was confirmed, but in Comparative Example 10, delayed fluorescence was not confirmed.

The external quantum efficiency of each organic electroluminescent device was measured at 0.1 $mA/cm^2$, and was 3.5% in Comparative Example 10, but was 5% and was high in Example 15. This confirms that, even in the organic electroluminescent device using a quantum dot, the emission efficiency is improved when an exciton generation layer is formed therein.

Example 16

According to the same method as in Example 1, an anode, a hole injection layer, a hole transport first layer, a hole transport second layer, an electron blocking layer, an exciton generation layer, an isolation layer, a light emitting layer, a hole blocking layer, an electron transport layer, and a cathode were formed in order to produce an organic electroluminescent device of Example 16. The layer configuration of the device is shown in Table 8.

Comparative Example 11

An organic electroluminescent device of Comparative Example 11 was produced according to the same method as in Example 16. However, in this, in place of the isolation layer, the light emitting layer and the hole blocking layer in Example 16, one hole blocking layer having the same total thickness was formed, and the other part of the layer configuration was the same as in Example 16. The layer configuration of the organic electroluminescent device of Comparative Example 11 is shown in Table 8. The exciton generation layer in Example 16 functions as a light emitting layer in Comparative Example 11.

TABLE 8

| | Anode | | HIL | | HTL | | HTL | | EBL | | EGL | | |
|---|---|---|---|---|---|---|---|---|---|---|---|---|---|
| Example No. | Material | Thickness | Material | Thickness | Material | Thickness | Material | Thickness | Material | Thickness | Material 1 | Material 2 | Material 2 |
| Example 16 | ITO | 100 | HAT-CN | 10 | NPD | 10 | TrisPCz | 15 | mCBP | 5 | mCBP | 25 wt % 4CzIPNMe | 0.5 wt % TBRb |

| | EGL | INT | | EML | | | HBL | | ETL | | cathode | |
|---|---|---|---|---|---|---|---|---|---|---|---|---|
| Example No. | Thickness | Material | Thickness | Material 1 | Material 2 | Thickness | Material | Thickness | Material | Thickness | Material | Thickness |
| Example 16 | 30 | T2T | 3 | T2T | 5 wt % TBRb | 10 | T2T | 5 | BpyTP2 | 35 | Liq/Al | 1.0/100 |

| | Anode | | HIL | | HTL | | HTL | | EBL | | EML | | |
|---|---|---|---|---|---|---|---|---|---|---|---|---|---|
| Comparative Example No. | Material | Thickness | Material | Thickness | Material | Thickness | Material | Thickness | Material | Thickness | Material 1 | Material 2 | Material 2 |
| Comparative Example 11 | ITO | 100 | HAT-CN | 10 | NPD | 10 | TrisPCz | 15 | mCBP | 5 | mCBP | 25 wt % 4CzIPNMe | 0.5 wt % TBRb |

| | EML | INT | | EML | | | HBL | | ETL | | cathode | |
|---|---|---|---|---|---|---|---|---|---|---|---|---|
| Comparative Example No. | Thickness | Material | Thickness | Material 1 | Material 2 | Thickness | Material | Thickness | Material | Thickness | Material | Thickness |
| Comparative Example 11 | 30 | — | — | — | — | — | T2T | 18 | BpyTP2 | 35 | Liq/Al | 1.0/100 |

Of the organic electroluminescent devices of Example 16 and Comparative Example 11, the transient decay curve of the emission intensity was measured. In both devices, delayed fluorescence was confirmed. In these, the emission peak wavelength was on the same level.

The external quantum efficiency of each organic electroluminescent device was measured at 0.1 mA/cm$^2$, and was 13.1% in Comparative Example 10, but was 13.4% and was high in Example 16. This confirms that, even when an exciton generation layer is formed using a delayed fluorescent material as an assist dopant, the emission efficiency can improve.

TrisPCz

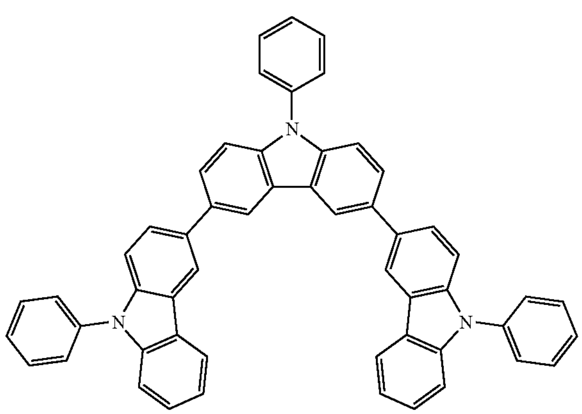

-continued mCBP

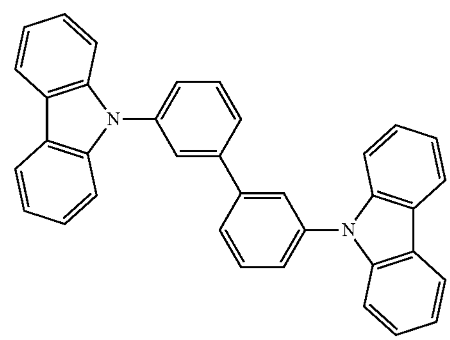

TBRb

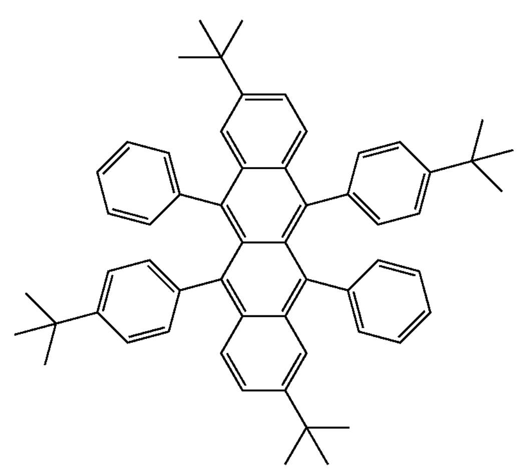

-continued

T2T

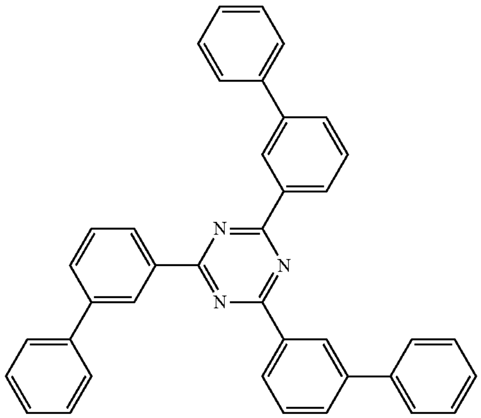

BpyTP2

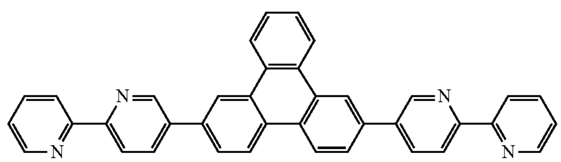

Liq

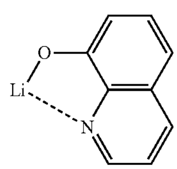

HAT-CN

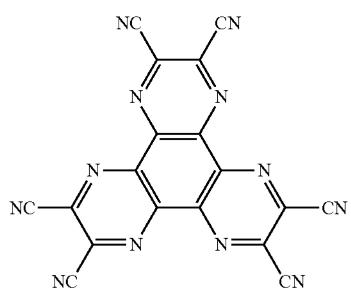

4CzIPNMe

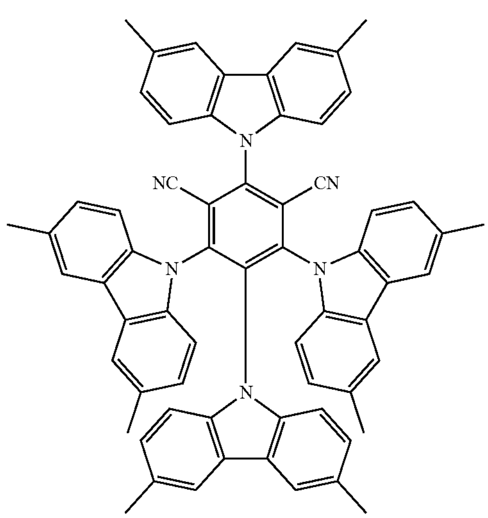

INDUSTRIAL APPLICABILITY

The organic light emitting device of the present invention has a high efficiency and a long lifetime, and can be therefore effectively used as a light emitting device for display systems and lighting systems. Consequently, the industrial applicability of the present invention is great.

REFERENCE SIGNS LIST

1 Substrate
2 Anode
3 Hole Injection Layer
4 Hole Transport Layer
5 Light Emitting Layer
6 Electron Transport Layer
7 Cathode

The invention claimed is:

1. An organic light emitting device having (i) an exciton generation layer containing a compound that satisfies the following expression (1) or an exciplex that emits delayed fluorescence, and (ii) a light emitting layer containing a light emitting material:

$$\Delta E_{ST} \leq 0.3 \text{ eV} \quad (1)$$

wherein $\Delta E_{ST}$ is a difference between the lowest excited singlet energy level $E_{S1}$ and the lowest excited triplet energy level $E_{T1}$ of the compound, and wherein:

the exciton generation layer contains a carrier transporting compound;

the carrier transporting compound differs from the exciton generation layer compound satisfying expression (1);

the carrier transporting compound differs from the exciplex that emits delayed fluorescence;

the carrier transporting compound differs from the light emitting material contained in the light emitting layer; and the carrier transporting compound is also contained in the light emitting layer.

2. The organic light emitting device according to claim 1, having an isolation layer between the exciton generation layer and the light emitting layer.

3. The organic light emitting device according to claim 1, having an anode and a cathode on opposite sides of the light emitting layer, wherein the exciton generation layer is on the anode side or the cathode side of the light emitting layer.

4. The organic light emitting device according to claim 1, having an anode and a cathode on opposite sides of the light emitting layer, wherein the exciton generation layer is on both of the anode side and the cathode side of the light emitting layer.

5. The organic light emitting device according to claim 4, having a first isolation layer between the light emitting layer and the exciton generation layer formed on the anode side of the light emitting layer, and having a second isolation layer between the light emitting layer and the exciton generation layer formed on the cathode side of the light emitting layer.

6. The organic light emitting device according to claim 1, having an anode and a cathode on opposite sides of the light emitting layer, wherein the light emitting layer is on each of the anode side and the cathode side of the exciton generation layer.

7. The organic light emitting device according to claim 6, having an anode and a cathode on opposite sides of the light emitting layer, wherein a first isolation layer is between the exciton generation layer and the light emitting layer formed on the anode side of the exciton generation layer, and having a second isolation layer between the exciton generation layer and the light emitting layer formed on the cathode side of the exciton generation layer.

8. The organic light emitting device according to claim 5, wherein the first isolation layer and the second isolation layer contain a carrier transporting compound, and wherein the carrier transporting compound is different from the exciton generation layer compound which satisfies the expression (1) or the exciton generation layer containing the delayed fluorescence emitting exciplex, and different from the light emitting material.

9. The organic light emitting device according to claim 1, wherein the light emitting layer contains a carrier transporting compound, and wherein the carrier transporting compound is different from the exciton generation layer compound which satisfies the expression (1) or the exciton generation layer containing the delayed fluorescence emitting exciplex, and different from the light emitting material.

10. The organic light emitting device according to claim 9, having an anode and a cathode on opposite sides of the light emitting layer, wherein the light emitting layer is in direct contact with the anode side of the exciton generation layer.

11. The organic light emitting device according to claim 9, having an anode and a cathode on opposite sides of the light emitting layer, wherein the light emitting layer is in direct contact with the cathode side of the exciton generation layer.

12. The organic light emitting device according to claim 1, wherein the light emitting layer contains a quantum dot.

13. The organic light emitting device according to claim 1, which emits delayed fluorescence.

14. The organic light emitting device according to claim 1, wherein the carrier transporting compound in the exciton generation layer is a host compound, and the compound that satisfies the expression (1) is contained in the exciton generation layer in an amount of 25% by mass or less.

15. The organic light emitting device according to claim 1, wherein the exciton generation layer contains a dopant that is a light emitting material, and wherein the dopant is different from the exciton generation layer compound which satisfies the expression (1) or the exciton generation layer containing the delayed fluorescence emitting exciplex.

16. The organic light emitting device according to claim 1, having an isolation layer between the exciton generation layer and the light emitting layer, wherein the isolation layer and the exciton generation layer contain the same carrier transporting compound, and wherein the carrier transporting compound is different from the exciton generation layer compound which satisfies the expression (1) or the exciton generation layer containing the delayed fluorescence emitting exciplex, and different from the light emitting material.

17. The organic light emitting device according to claim 16, wherein the isolation layer has a thickness of 1.5 nm or less.

18. The organic light emitting device according to claim 11, having an electron transport layer between the layer containing a carrier transporting compound and the cathode.

* * * * *